US011136341B2

(12) United States Patent
Hatakeyama et al.

(10) Patent No.: US 11,136,341 B2
(45) Date of Patent: Oct. 5, 2021

(54) POLYCYCLIC AROMATIC COMPOUND AND LIGHT EMISSION LAYER-FORMING COMPOSITION

(71) Applicants: Kwansei Gakuin Educational Foundation, Nishinomiya (JP); SK Materials JNC Co., Ltd., Gyeonggi-do (KR)

(72) Inventors: Takuji Hatakeyama, Hyogo (JP); Yasuhiro Kondo, Chiba (JP); Keiichi Nakamoto, Chiba (JP); Motoki Yanai, Chiba (JP)

(73) Assignees: Kwansei Gakuin Educational Foundation, Hyogo (JP); SK Materials JNC Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/803,392

(22) Filed: Feb. 27, 2020

(65) Prior Publication Data

US 2020/0190116 A1 Jun. 18, 2020

Related U.S. Application Data

(62) Division of application No. 15/559,912, filed as application No. PCT/JP2016/056398 on Mar. 2, 2016, now Pat. No. 10,689,402.

(30) Foreign Application Priority Data

Mar. 25, 2015 (JP) ................................ 2015-061841

(51) Int. Cl.

*C07F 5/02* (2006.01)
*C09K 11/06* (2006.01)
*H01L 51/50* (2006.01)
*H01L 51/00* (2006.01)

(52) U.S. Cl.

CPC ................ *C07F 5/02* (2013.01); *C07F 5/027* (2013.01); *C09K 11/06* (2013.01); *H01L 51/008* (2013.01); *H01L 51/0052* (2013.01); *H01L 51/0058* (2013.01); *H01L 51/0059* (2013.01); *H01L 51/0071* (2013.01); *H01L 51/0072* (2013.01); *H01L 51/50* (2013.01); *C09K 2211/1096* (2013.01); *H01L 51/5012* (2013.01)

(58) Field of Classification Search

None

See application file for complete search history.

(56) References Cited

U.S. PATENT DOCUMENTS

2002/0048687 A1 4/2002 Hosokawa et al.
2013/0214259 A1 8/2013 Watanabe et al.
2013/0292665 A1 11/2013 Ono
2014/0058099 A1 2/2014 Wakamiya et al.
2018/0094000 A1 4/2018 Hatakeyama et al.

FOREIGN PATENT DOCUMENTS

EP 1640430 A1 3/2006
EP 3109253 A1 12/2016
JP 2013-247179 A 12/2013

OTHER PUBLICATIONS

Hatakeyama et al,. "Ultrapure Blue Thermally Activated Delayed Fluorescence Molecules: Efficient HOMO-LUMO Separation by the Multiple Resonance Effect," Adv. Mater., Apr. 13, 2016, 28(14):2777-2781, abstract only.

Hirai et al., "One-Step Borylation of 1,3-Diaryloxybenzenes Towards Efficient Materials for Organic Light-Emitting Diodes," Angew Chem. Int. Ed. Engl., Sep. 18, 2015, 54(46):13581-13585, abstract only.

Hirai et al., "Synthesis of Phenoxaborine Analogs as Materials for Organic Electroluminescence," The 95$^{th}$ CSJ Annual Meeting, Mar. 11, 2015, 3D3-04, p. 1093, with English abstract.

Nakajima et al., "Synthesis and Physical Properties of BN-Containing Polycyclic Aromatic Compounds by Electrophilic C-H Borylation," the 95$^{th}$ Annual CSJ Annual Meeting, Mar. 11, 2015, 3D3-06, p. 1094, with English abstract.

(Continued)

*Primary Examiner* — Joseph R Kosack
(74) *Attorney, Agent, or Firm* — Foley & Lardner LLP

(57) ABSTRACT

The objective of the invention is to provide a polycyclic aromatic compound in which solubility to a solvent, film formability, wet coatability, thermal stability, and in-plane orientation are improved. This objective is achieved by a light emission layer-forming composition comprising: as a first component, at least one type of dopant material selected from the group consisting of polycyclic aromatic compounds represented by general formula (A) and polycyclic aromatic oligomer compounds including a plurality of structures represented by general formula (A); as a second component, a specific low-molecular-weight host material; and, as a third component, at least one type of organic solvent. In formula (A), ring A, ring B, and ring C each independently represent an aryl ring or a hetero aryl ring, $Y^1$ is B, and $X^1$ and $X^2$ each independently represent O or N—R wherein at least one of $X^1$ and $X^2$ is N—R.

(A)

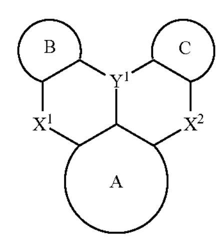

11 Claims, 2 Drawing Sheets

(56) References Cited

OTHER PUBLICATIONS

Nakatsuka et al., "Synthesis and Physical Properties of Heteroatom-Fused Dinaphthopentacene Analogs," The 95$^{th}$ CSJ Annual Meeting, Mar. 11, 2015, 3D3-05, p. 1093, with English abstract.
Tai et al., "Theoretical Design of π-Conjugated Heteropolycyclic Compounds Containing a Tricoordinated Boron Center," The Journal of Physical Chemistry, Jul. 3, 2013, 117:14999-15008, abstract only.

POLYCYCLIC AROMATIC COMPOUND AND LIGHT EMISSION LAYER-FORMING COMPOSITION

CROSS-REFERENCE TO RELATED APPLICATIONS

This application is a Divisional of U.S. application Ser. No. 15/559,912, which is the U.S. National Stage application of PCT/JP2016/056398, filed Mar. 2, 2016, which claims priority from Japanese application JP2015-061841, filed Mar. 25, 2015.

TECHNICAL FIELD

The present invention relates to a polycyclic aromatic compound, a light emitting layer-forming composition using the same, and an organic electroluminescent element (organic EL element) manufactured using the composition. More specifically, the present invention relates to a light emitting layer-forming composition containing a polycyclic aromatic compound containing boron, nitrogen, or oxygen as a dopant, capable of wet film formation, and exhibiting excellent characteristics in a case of use as a constituent component of an organic EL element. In addition, the present invention relates to a polycyclic aromatic compound containing a functional group and boron, nitrogen, or oxygen.

BACKGROUND ART

An organic EL element can manufacture a display element and lighting which are driven by low power, are thin and light, and have excellent flexibility, and has been therefore actively studied as a next generation light emitting display element.

An organic EL element has a structure having a pair of electrodes composed of a positive electrode and a negative electrode, and a single layer or a plurality of layers which are disposed between the pair of electrodes and contain an organic compound. Examples of a layer containing an organic compound include a light emitting layer and a charge transport/injection layer for transporting or injecting a charge such as a hole or an electron. As a method for forming these organic layers, a vacuum deposition method or a wet film formation method is used.

The vacuum deposition method is advantageous in that a high-quality film can be formed uniformly on a substrate, a luminescent element which can be easily laminated and has excellent characteristics can be easily obtained, an extremely small amount of impurities derived from a manufacturing process are mixed, and the like. Many organic EL elements which are practically used now are obtained by the vacuum deposition method using a low molecular weight material. Meanwhile, a vacuum deposition apparatus used in the vacuum deposition method has such problems that the apparatus is generally expensive, continuous manufacturing is difficult, and manufacturing cost is high when all the steps are performed in vacuum.

On the other hand, the wet film formation method does not require a vacuum process, does not require an expensive vacuum deposition apparatus, and therefore makes it possible to form a layer at relatively low cost. In addition, the wet film formation method is advantageous in that an area can be large, continuous manufacturing is possible, a plurality of materials having various functions can be contained in one layer (coating liquid), and the like. Meanwhile, in the wet film formation method, lamination is difficult, and it is difficult to obtain a high-quality and uniform coating film which does not contain impurities derived from a manufacturing process (for example, a solvent).

In particular, development of an ink for forming a hole injection layer, a hole transport layer, and a light emitting layer has been positively carried out for material development for a wet film formation method. Among these developments, regarding inks for a hole injection layer and a hole transport layer, characteristics of each layer formed by the wet film formation method using these inks have reached a practical level. Regarding an ink for forming a light emitting layer, development of inks for a red light-emitting layer and a green light-emitting layer is progressing toward improvement of characteristics. However, regarding an ink for a blue light-emitting layer, in general, development of a composition using a polycyclic aromatic compound having an aromatic ring, such as anthracene, a styryl derivative, or the like has been carried out, but has not obtained practical characteristics. In particular, at present, an ink for a blue light-emitting layer having high color purity has not been developed.

CITATION LIST

Patent Literature

Patent Literature 1: WO2001/072673 A
Patent Literature 2: WO2012/102333 A
Patent Literature 3: JP2006-045503 A
Patent Literature 4: JP2013-168411 A
Patent Literature 5: JP2013-247179 A
Patent Literature 6: US 2013/214259 A

SUMMARY OF INVENTION

Technical Problem

An object of the present invention is to provide a polycyclic aromatic compound for a blue light-emitting material, having excellent solubility in a solvent and high color purity despite of a low molecular weight material. Another object of the present invention is to provide a polycyclic aromatic compound in which at least one of solubility, film formability, wet coatability, thermal stability, and in-plane orientation of the compound is improved by imparting a functional group to the polycyclic aromatic compound, and is desirably to provide a polycyclic aromatic compound having solubility, film formability, wet coatability and in-plane orientation (more desirably thermal stability) improved. Still another object of the present invention is to provide a light emitting layer-forming composition in which in-plane orientation of a coating film is improved by imparting a functional group to molecules as a host and a dopant in the light emitting layer-forming composition. Further still another object of the present invention is to provide an organic EL element exhibiting blue light emission with high color purity, and having low voltage, high efficiency, and long lifetime by optimizing a composition containing the compound as a constituent component of the organic EL element and using a wet film formation method.

Solution to Problem

As a result of intensive studies to solve the above problems, the present inventors have found that a novel polycyclic aromatic compound in which a plurality of aromatic rings is linked with a boron atom, a nitrogen atom, an oxygen atom, or the like has excellent solubility in a solvent, and has an excellent color taste in a case where being applied to an organic EL element despite of a low molecular weight material. In addition, the present inventors have found that at least one of solubility, film formability, wet coatability, thermal stability, and in-plane orientation of the compound can be improved by imparting a functional group to the above polycyclic aromatic compound. Furthermore, the present inventors have found that a light emitting layer-forming composition in which in-plane orientation of a coating film has been improved can be provided by imparting a functional group to molecules as a host and a dopant in the light emitting layer-forming composition. In addition, the present inventors have found that an organic EL element manufactured using a light emitting layer-forming composition using the above polycyclic aromatic compound as a dopant has excellent efficiency, lifetime and driving voltage. Furthermore, the present inventors have found that an organic EL element manufactured using a light emitting layer-forming composition using a compound to which a functional group has been imparted as a host and the above polycyclic aromatic compound as a dopant has better efficiency, lifetime and driving voltage. Furthermore, the present inventors have found that an organic EL element manufactured using a light emitting layer-forming composition using a polycyclic aromatic compound to which a functional group has been imparted as a dopant has better efficiency, lifetime and driving voltage.

[1]

A light emitting layer-forming composition for applying and forming a light emitting layer of an organic electroluminescent element, comprising:

at least one selected from the group consisting of a polycyclic aromatic compound represented by the following general formula (A) and a polycyclic aromatic multimer compound having a plurality of structures represented by the following general formula (A) as a first component;

at least one selected from the group consisting of compounds represented by the following general formulas (B-1) to (B-6) as a second component; and at least one organic solvent as a third component.

(A)

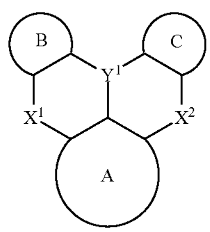

(In the above formula (A), ring A, ring B, and ring C each independently represent an aryl ring or a heteroaryl ring, at least one hydrogen atom in these rings may be substituted, $Y^1$ represents B, $X^1$ and $X^2$ each independently represent O or N—R, while at least one of $X^1$ and $X^2$ represents N—R, R of the N—R is an optionally substituted aryl, an optionally substituted heteroaryl or alkyl, R of the N—R may be bonded to the ring A, ring B, and/or ring C with a linking group or a single bond, at least one hydrogen atom in a compound or a structure represented by the above formula (A) may be substituted by a group represented by the following general formula (FG-1), a group represented by the following general formula (FG-2), an alkyl having 1 to 24 carbon atoms, a halogen atom, or a deuterium atom, further any $—CH_2—$ in the alkyl may be substituted by —O— or $—Si(CH_3)_2—$, any $—CH_2—$ excluding $—CH_2—$ directly bonded to the compound or structure represented by the above formula (A) in the alkyl may be substituted by an arylene having 6 to 24 carbon atoms, and any hydrogen atom in the alkyl may be substituted by a fluorine atom.)

(B-1)

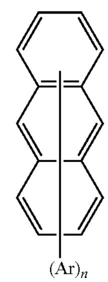

(B-2)

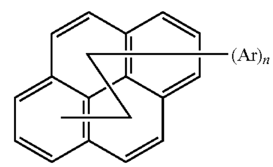

(B-3)

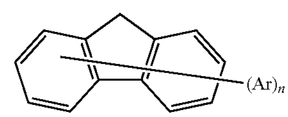

(B-4)

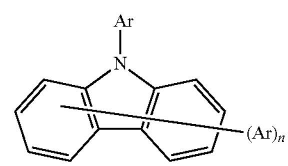

(B-5)

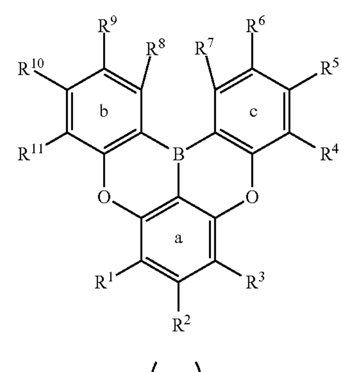

(B-6)

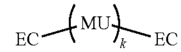

(In the above formulas (B-1) to (B-4),

Ar's each independently represent a hydrogen atom, an aryl, a heteroaryl, a diarylamino, a diheteroarylamino, an arylheteroarylamino, or an aryloxy, at least one hydrogen atom in these may be further substituted by an aryl, a heteroaryl, or a diarylamino, adjacent groups among Ar's may be bonded to each other to form an aryl ring or a heteroaryl ring together with a mother skeleton of an anthracene ring, a pyrene ring, a fluorene ring, or a carbazole ring, at least one hydrogen atom in the ring thus formed may be substituted by an aryl, a heteroaryl, a diarylamino, a diheteroarylamino, an arylheteroarylamino, or an aryloxy, and n represents an integer of 1 to a maximum substitutable number.)

(In the above formula (B-5), $R^1$ to $R^{11}$ each independently represent a hydrogen atom, an aryl, a heteroaryl, a diarylamino, a diheteroarylamino, an arylheteroarylamino, or an aryloxy, at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, and at least one hydrogen atom in these may be further substituted by an aryl, a heteroaryl, or a diarylamino.)

(In the above formula (B-6), monomer units (MU's) each independently represent at least one selected from the group consisting of divalent groups of compounds represented by the above general formulas (B-1) to (B-5), two hydrogen atoms in MU are substituted by an endcap unit (EC) or MU, EC's each independently represent a hydrogen atom, an aryl, a heteroaryl, a diarylamino, a diheteroarylamino, an arylheteroarylamino, or an aryloxy, at least one hydrogen in these may be further substituted by an aryl, a heteroaryl, or a diarylamino, and k is an integer of 2 to 50,000.)

(At least one hydrogen atom in compounds represented by the above formulas (B-1) to (B-5), a divalent group of compounds represented by the above formulas (B-1) to (B-5) in the above formula (B-6), or EC in the above formula (B-6) may be substituted by a group represented by the following general formula (FG-1), a group represented by the following general formula (FG-2), an alkyl having 1 to 24 carbon atoms, a halogen atom, or a deuterium atom, further any —$CH_2$— in the alkyl may be substituted by —O— or —$Si(CH_3)_2$—, any —$CH_2$— in the alkyl excluding —$CH_2$— directly bonded to compounds represented by the above formulas (B-1) to (B-6), a divalent group of a compound represented by the above formulas (B-1) to (B-5) in the above formula (B-6), or EC in the above formula (B-6) may be substituted by an arylene having 6 to 24 carbon atoms, and any hydrogen atom in the alkyl may be substituted by a fluorine atom.)

(FG-1)

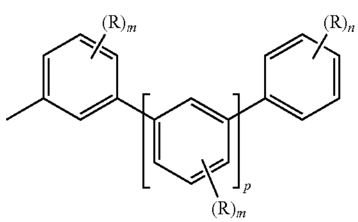

(In the above formula (FG-1),

R's each independently represent a fluorine atom, a trimethylsilyl, a trifluoromethyl, an alkyl having 1 to 24 carbon atoms, or a cycloalkyl having 3 to 24 carbon atoms, any —$CH_2$— in the alkyl may be substituted by —O—, any —$CH_2$-excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4, n represents an integer of 0 to 5, and p represents an integer of 1 to 5.)

(FG-2)

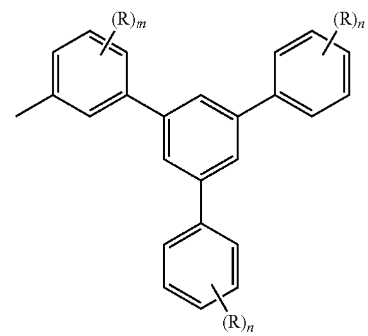

(In the above formula (FG-2),

R's each independently represent a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m represents an integer of 0 to 4, and n's each independently represent an integer of 0 to 5.)

[2]

The light emitting layer-forming composition described in [1], in which the first component is at least one selected from the group consisting of a polycyclic aromatic compound represented by the following general formula (A') and a polycyclic aromatic multimer compound having a plurality of structures represented by the following general formula (A').

(A')

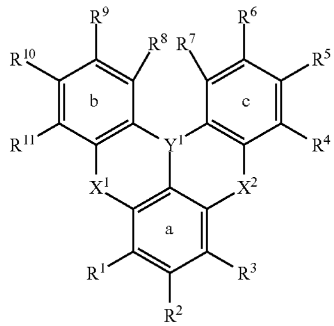

(In the above formula (A'), $R^1$ to $R^{11}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, at least one hydrogen atom in these may be further substituted by an aryl, a heteroaryl, or a diarylamino, $Y^1$ represents B, $X^1$ and $X^2$ each independently represent O or N—R, while at least one of $X^1$ and $X^2$ represents N—R, R of the N—R is an aryl or an alkyl, R of the N—R may be bonded to ring b and/or ring c with —O—, —S—, —C(—R)$_2$—, or a single bond, R in the —C(—R)$_2$— represents an alkyl having 1 to 24 carbon atoms, at least one hydrogen atom in a compound or a structure represented by the above formula (A') may be substituted by a group represented by the above general formula (FG-1), a group represented by the above general formula (FG-2), an alkyl having 1 to 24 carbon atoms, a halogen atom, or a deuterium atom, further any —$CH_2$— in the alkyl may be substituted by —O— or —$Si(CH_3)_2$—, any —$CH_2$— excluding —$CH_2$— directly bonded to the compound or structure represented by the above formula (A') in the alkyl may be substituted by an arylene having 6 to 24 carbon atoms, and any hydrogen atom in the alkyl may be substituted by a fluorine atom.)

[3]

The light emitting layer-forming composition described in [2], in which $R^1$ to $R^{11}$ each independently represent a hydrogen atom, an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), adjacent groups among $R^1$ to $R^{11}$ may be bonded to each other to form an aryl ring having 9 to 16 carbon atoms or a heteroaryl ring having 6 to 15 carbon atoms together with ring a, ring b, or ring c, at least one hydrogen atom in the ring thus formed may be substituted by an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), $Y^1$ represents B, $X^1$ and $X^2$ each independently represent O or N—R, while at least one of $X^1$ and $X^2$ represents N—R, R of the N—R is an aryl having 6 to 18 carbon atoms or an alkyl having 1 to 12 carbon atoms, at least one hydrogen atom in a compound or a structure represented by the above formula (A') may be substituted by a group represented by the above formula (FG-1), a group represented by the above formula (FG-2), an alkyl having 1 to 24 carbon atoms, a halogen atom, or a deuterium atom.

[4]

The light emitting layer-forming composition described in any one of [1] to [3], in which the polycyclic aromatic multimer compound is a dimer compound or a trimer compound having two or three structures represented by the above formula (A) or the above formula (A').

[5]

The light emitting layer-forming composition described in [4], in which the polycyclic aromatic multimer compound is a dimer compound having two structures represented by the above formula (A) or the above formula (A').

The light emitting layer-forming composition described in any one of [1] to [5], in which in the above formulas (B-1) to (B-4), Ar's each independently represent a hydrogen atom, an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), adjacent groups among Ar's may be bonded to each other to form an aryl ring having 9 to 16 carbon atoms or a heteroaryl ring having 6 to 15 carbon atoms together with a mother skeleton of an anthracene ring, a pyrene ring, a fluorene ring, or a carbazole ring, at least one hydrogen atom in the ring thus formed may be substituted by an aryl having 6 to 30 carbon atoms, a heteroaryl having 2 to 30 carbon atoms or a diarylamino (the aryl is an aryl having 6 to 12 carbon atoms), n represents an integer of 1 to 8, in the above formula (B-5), $R^1$ to $R^{11}$ each independently represent a hydrogen atom, an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), adjacent groups among $R^1$ to $R^{11}$ may be bonded to each other to form an aryl ring having 9 to 16 carbon atoms or a heteroaryl ring having 6 to 15 carbon atoms together with ring a, ring b, or ring c, at least one hydrogen atom in the ring thus formed may be substituted by an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), in the above formula (B-6), MU's each independently represent at least one selected from the group consisting of divalent groups of compounds represented by the above general formulas (B-1) to (B-5), two hydrogen atoms in MU are substituted by EC or MU, EC's each independently represent a hydrogen atom, an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), k is an integer of 100 to 40000, at least one hydrogen atom in the compounds represented by the above formulas (B-1) to (B-5), a divalent group of compounds represented by the above formulas (B-1) to (B-5) in the above formula (B-6), or EC in the above formula (B-6) may be substituted by a group represented by the above formula (FG-1), a group represented by the above formula (FG-2), an alkyl having 1 to 24 carbon atoms, a halogen atom, or a deuterium atom.

[7]

The light emitting layer-forming composition described in any one of [1] to [6], in which at least one compound in the first component or the second component is substituted by a group represented by the above formula (FG-1), a group represented by the above formula (FG-2), or an alkyl having 7 to 24 carbon atoms.

[8]

The light emitting layer-forming composition described in any one of [1] to [7], in which at least one compound in the second component is substituted by a group represented by the above formula (FG-1), a group represented by the above formula (FG-2), or an alkyl having 7 to 24 carbon atoms.

[9]

The light emitting layer-forming composition described in any one of [1] to [8], in which the second component comprises at least one selected from the group consisting of compounds represented by the above formulas (B-1) to (B-5).

[10]

The light emitting layer-forming composition described in any one of [1] to [9], in which the second component comprises at least one selected from the group consisting of a compound represented by the above formula (B-1) and a compound represented by the above formula (B-5).

[11]

The light emitting layer-forming composition described in any one of [1] to [10], in which the second component comprises a compound represented by the above formula (B-5).

[12]

The light emitting layer-forming composition described in any one of [1] to [11], in which Ar's in the above formulas (B-1) to (B-4), $R^1$ to $R^{11}$ in the above formula (B-5), and EC in the above formula (B-6) each independently represent any one selected from the group consisting of a hydrogen atom and groups represented by the following formulas (RG-1) to (RG-10), and each of groups represented by the following formulas (RG-1) to (RG-10) is bonded to the above formulas (B-1) to (B-6) at *.

(RG-1)

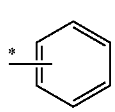

-continued (RG-2)

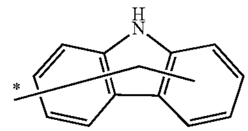

(RG-3)

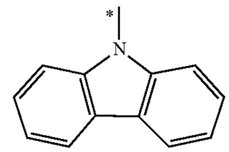

(RG-4)

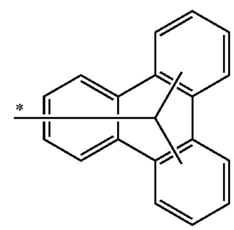

(RG-5)

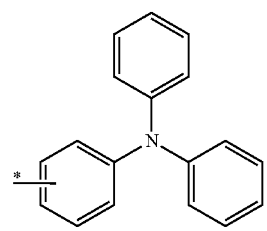

(RG-6)

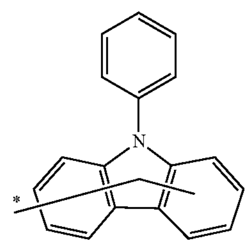

(RG-7)

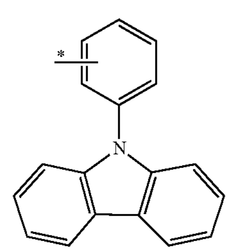

(RG-8)

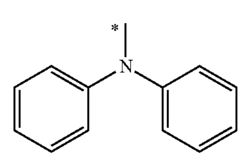

-continued
(RG-9)
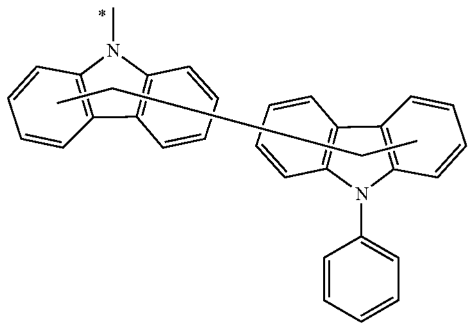
(RG-10)
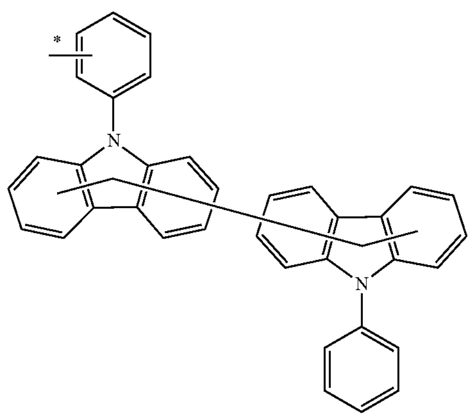
[13]
The light emitting layer-forming composition described in any one of [1] to [12], in which
a compound represented by the above formula (B-5) is a compound represented by the following formula (B-5-1-z), (B-5-49-z), (B-5-91-z), (B-5-100-z), (B-5-152-z), (B-5-176-z) (B-5-1048-z), (B-5-1049-z), (B-5-1050-z), (B-5-1069-z), (B-5-1101-z), (B-5-1102-z), or (B-5-1103-z).
(B-5-1-z)
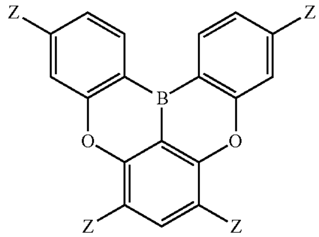
-continued
(B-5-49-z)
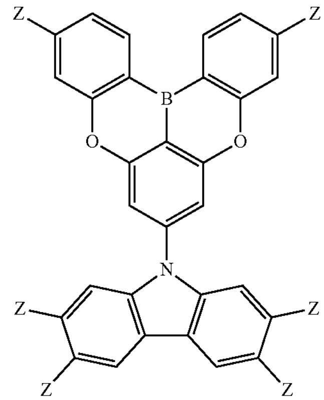
(B-5-91-z)
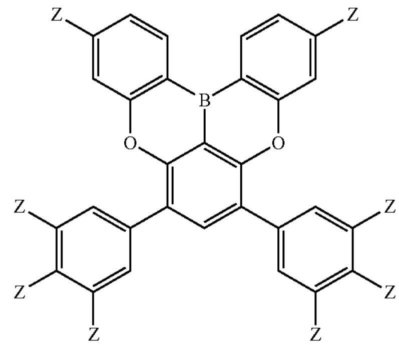
(B-5-100-z)
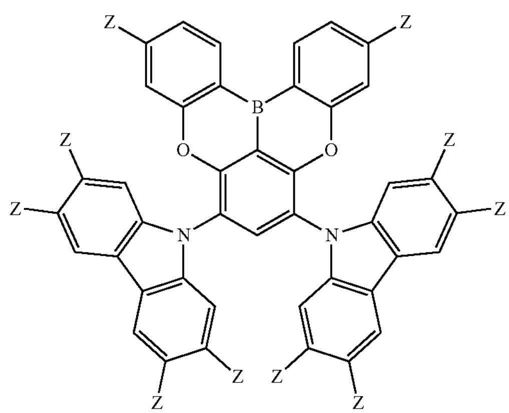
(B-5-152-z)
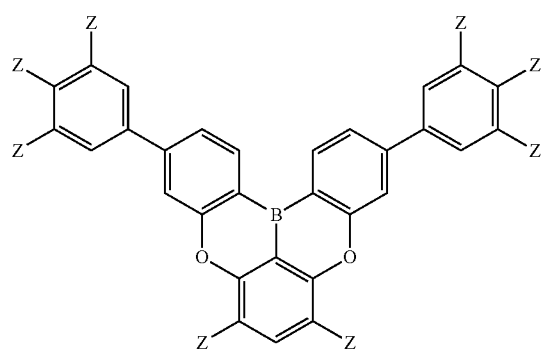

-continued
(B-5-176-z)
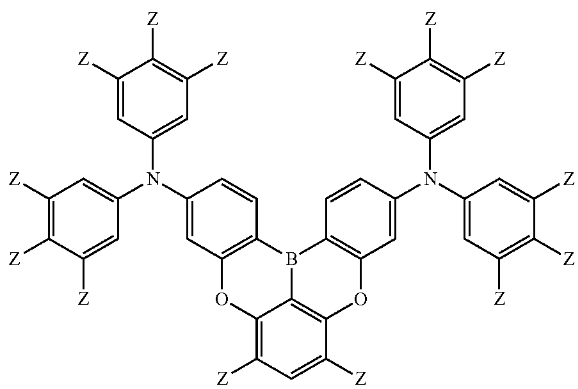
(B-5-1048-z)
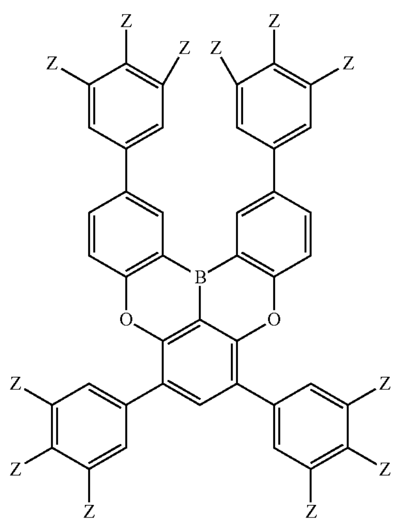
(B-5-1049-z)
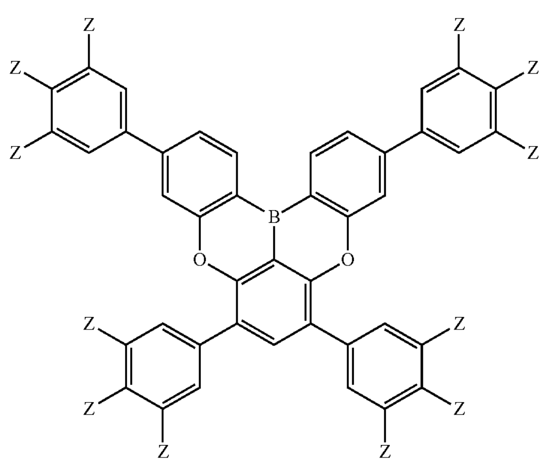
-continued
(B-5-1050-z)
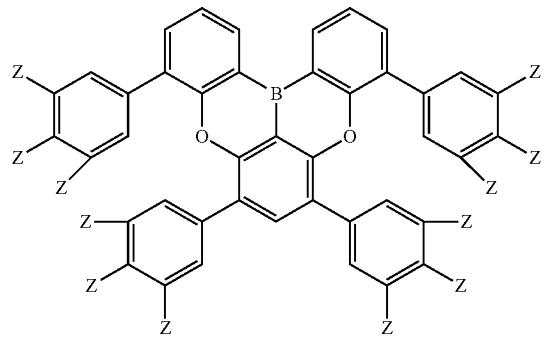
(B-5-1069-z)
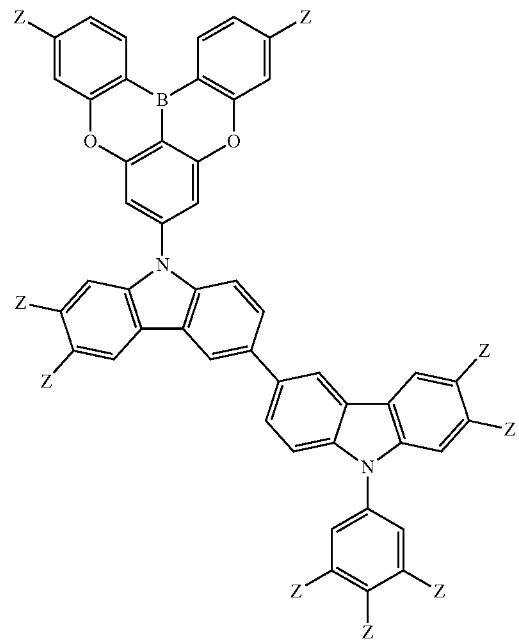
(B-5-1101-z)
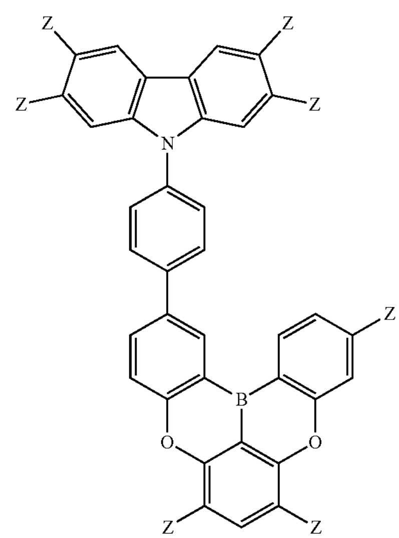

-continued (B-5-1102-z)

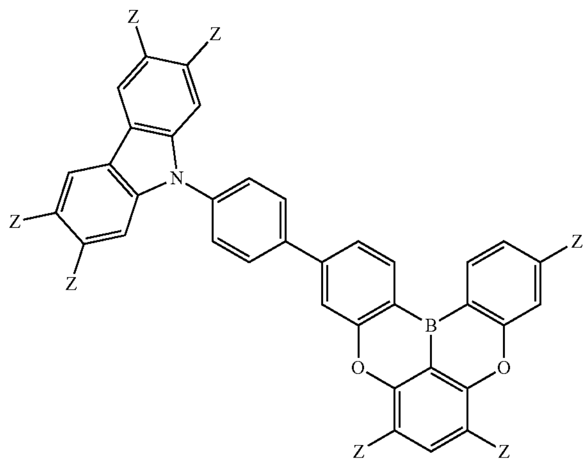

(B-5-1103-z)

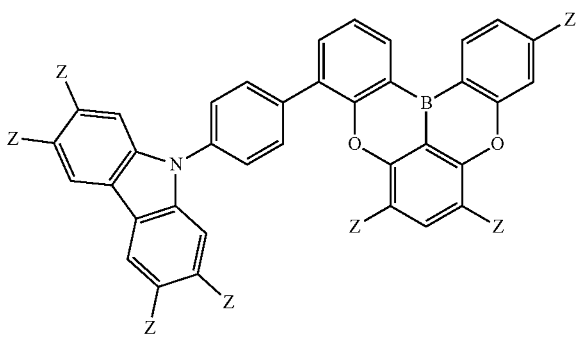

(z's in the above formulas each represent a hydrogen atom, a group represented by the above formula (FG-1), a group represented by the above formula (FG-2), or an alkyl having 7 to 24 carbon atoms, and not all z's represent hydrogen atoms.)

[14]

The light emitting layer-forming composition described in any one of [10] to [13], in which the second component comprises a compound represented by the above formula (B-1).

[15]

The light emitting layer-forming composition described in any one of [1] to [14], in which the compound represented by the above formula (B-1) is a compound represented by the following general formula (B-11).

(B-11)

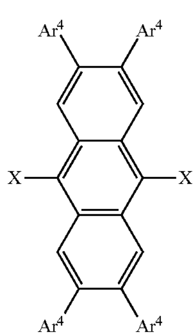

-continued (B-11-X1)

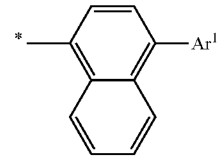

(B-11-X2)

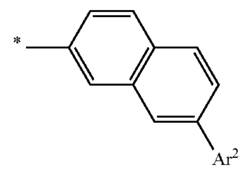

(B-11-X3)

$* — Ar^3$ (In the above formula (B-11),

X's each independently represent a group represented by the above formula (B-11-X1), (B-11-X2), or (B-11-X3), anaphthylene moiety in formula (B-11-X1) or (B-11-X2) may be fused with one benzene ring, a group represented by formula (B-11-X1), (B-11-X2), or (B-11-X3) is bonded to formula (B-11) at *, two X's do not simultaneously represent a group represented by formula (B-11-X3), $Ar^1$, $Ar^2$, and $Ar^3$ each independently represent a hydrogen atom (excluding $Ar^3$), a phenyl, a biphenylyl, a terphenylyl, a quaterphenylyl, a naphthyl, a phenanthryl, a fluorenyl, a benzofluorenyl, a chrysenyl, a triphenylenyl, a pyrenylyl, a carbazolyl, a benzocarbazolyl, or a phenyl-substituted carbazolyl, $Ar^3$ may be further substituted by aphenyl, abiphenylyl, a terphenylyl, a naphthyl, a phenanthryl, a fluorenyl, a chrysenyl, a triphenylenyl, a pyrenylyl, a carbazolyl, or a phenyl-substituted carbazolyl, $Ar^4$'s each independently represent a hydrogen atom, aphenyl, a biphenylyl, a terphenylyl, a naphthyl, or a silyl substituted by an alkyl having 1 to 4 carbon atoms, and at least one hydrogen atom in a compound represented by the above formula (B-11) may be substituted by a group represented by the above formula (FG-1), a group represented by the above formula (FG-2), or an alkyl having 7 to 24 carbon atoms.)

[16]

The light emitting layer-forming composition described in [15], in which,

X's each independently represent a group represented by the above formula (B-11-X1), (B-11-X2), or (B-11-X3), the group represented by formula (B-11-X1), (B-11-X2), or (B-11-X3) is bonded to formula (B-11) at *, two X's do not simultaneously represent a group represented by formula (B-11-X3), $Ar^1$, $Ar^2$, and $Ar^3$ each independently represent a hydrogen atom (excluding $Ar^3$), a phenyl, a biphenylyl, a terphenylyl, a naphthyl, a phenanthryl, a fluorenyl, a chrysenyl, a triphenylenyl, a pyrenylyl, a carbazolyl, or a phenyl-substituted carbazolyl, $Ar^3$ may be further substituted by a phenyl, a biphenylyl, a terphenylyl, a naphthyl, a phenanthryl, a fluorenyl, a chrysenyl, a triphenylenyl, a pyrenylyl, a carbazolyl, or a phenyl-substituted carbazolyl, $Ar^4$'s each independently represent a hydrogen atom, aphenyl, or a naphthyl, and at least one hydrogen atom in a compound represented by the above formula (B-11) may be substituted by a group represented by the above formula (FG-1), a group represented by the above formula (FG-2), or an alkyl having 7 to 24 carbon atoms.

[17]

The light emitting layer-forming composition described in [15], in which,

X's each independently represent a group represented by the above formula (B-11-X1), (B-11-X2), or (B-11-X3), the group represented by formula (B-11-X1), (B-11-X2), or (B-11-X3) is bonded to formula (B-11) at *, two X's do not simultaneously represent a group represented by formula (B-11-X3), $Ar^1$, $Ar^2$, and $Ar^3$ each independently represent a hydrogen atom (excluding $Ar^3$), a phenyl, a biphenylyl, a terphenylyl, a naphthyl, a phenanthryl, a fluorenyl, a carbazolyl, or a phenyl-substituted carbazolyl, $Ar^3$ may be further substituted by a phenyl, a naphthyl, a phenanthryl, or a fluorenyl, $Ar^4$'s each independently represent a hydrogen atom, aphenyl, or a naphthyl, and at least one hydrogen atom in a compound represented by the above formula (B-11) may be substituted by a group represented by the above formula (FG-1), a group represented by the above formula (FG-2), or an alkyl having 7 to 24 carbon atoms.

[18]

The light emitting layer-forming composition described in any one of [1] to [17], in which the compound represented by the above formula (B-1) is a compound represented by the following formula (B-1-1), (B-1-2), (B-1-3), (B-1-4), (B-1-5), (B-1-6), (B-1-7), or (B-1-8), and at least one hydrogen atom in these compounds may be substituted by a group represented by the above formula (FG-1), a group represented by the above formula (FG-2), or an alkyl having 7 to 24 carbon atoms.

(B-1-1)

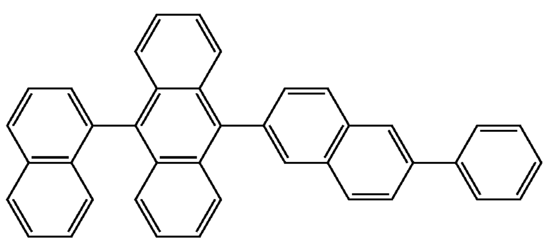

(B-1-2)

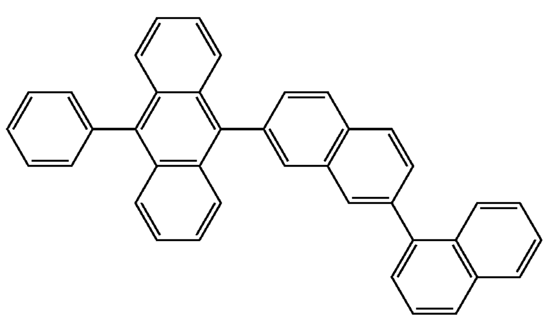

(B-1-3)

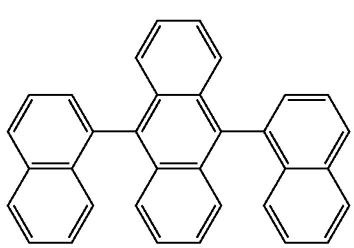

-continued (B-1-4)

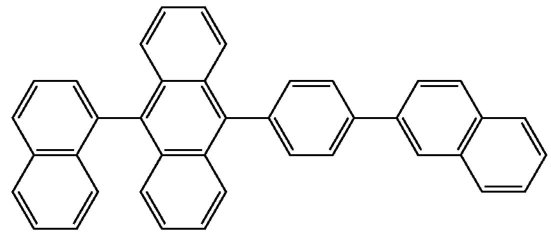

(B-1-5)

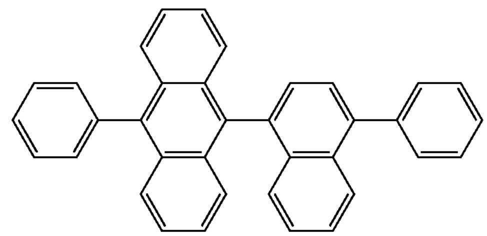

(B-1-6)

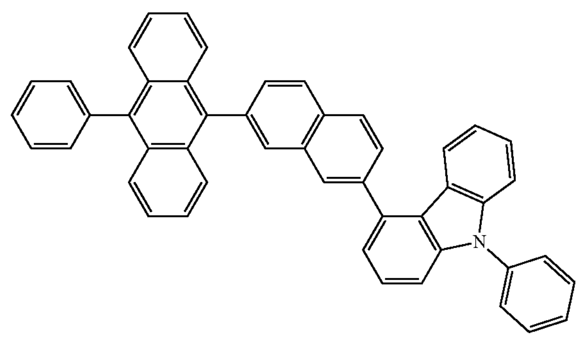

(B-1-7)

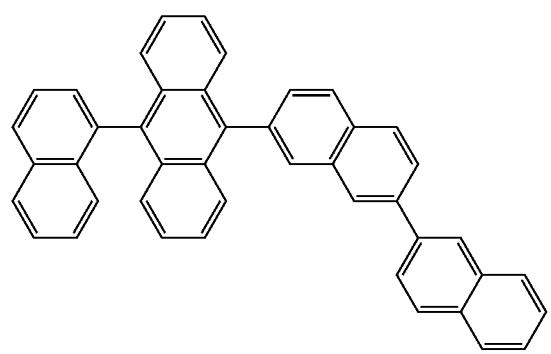

(B-1-8)

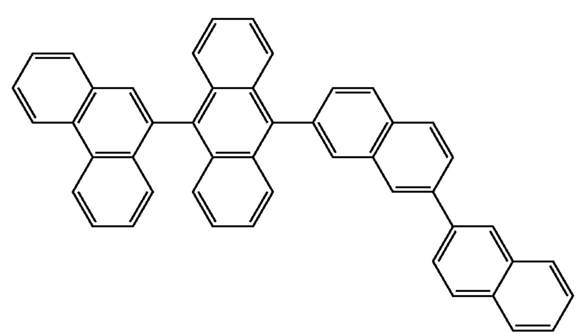

[19]

The light emitting layer-forming composition described in any one of [1] to [18], in which at least one compound in the first component is substituted by a group represented by the above formula (FG-1), a group represented by the above formula (FG-2), or an alkyl having 7 to 24 carbon atoms.

[20]

The light emitting layer-forming composition described in any one of [1] to [19], in which $X_1$ and $X_2$ each represent N—R.

[21]

The light emitting layer-forming composition described in any one of [1] to [19], in which $X_1$ represents O, and $X_2$ represents N—R.

[22]

The light emitting layer-forming composition described in any one of [2] to [21], in which in the above formula (A'), $R^1$ to $R^{11}$ each independently represent any one selected from the group consisting of a hydrogen atom and groups represented by the following formulas (RG-1) to (RG-10), and the groups represented by the following formulas (RG-1) to (RG-10) are each bonded to the above formula (A') at *.

(RG-1)

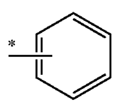

(RG-2)

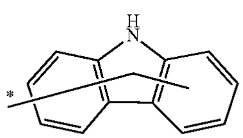

(RG-3)

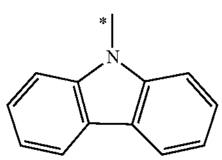

(RG-4)

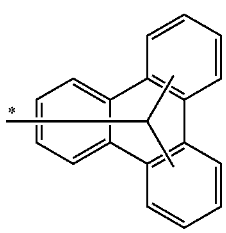

(RG-5)

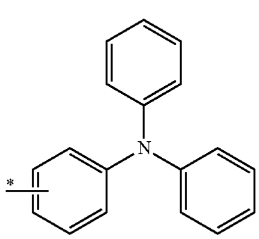

-continued (RG-6)

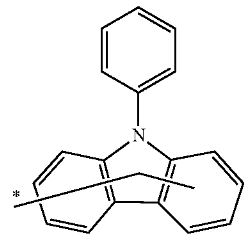

(RG-7)

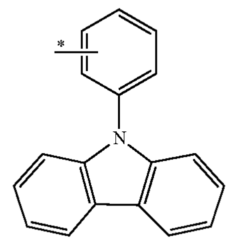

(RG-8)

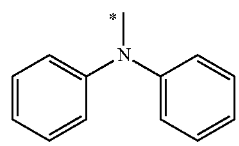

(RG-9)

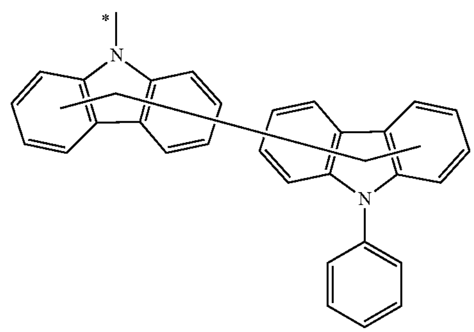

(RG-10)

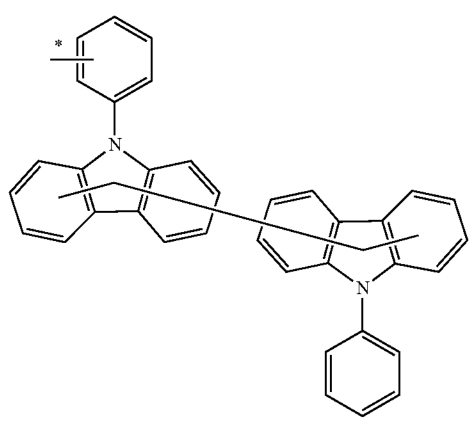

The light emitting layer-forming composition described in any one of [1] to [22], in which the compound represented by the above formula (A) is a compound represented by the following formula (1-401-z), (1-411-z), (1-422-z), (1-447-z), (1-1152-z), (1-1159-z), (1-1201-z), (1-1210-z), (1-2623-z), or (1-2679-z).

-continued
(1-401-z)
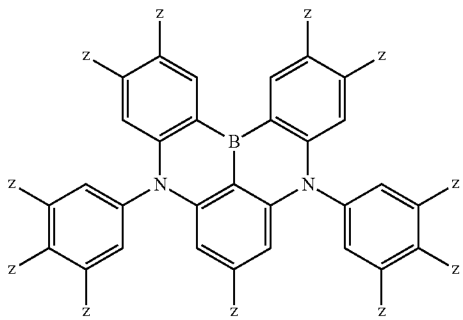
(1-411-z)
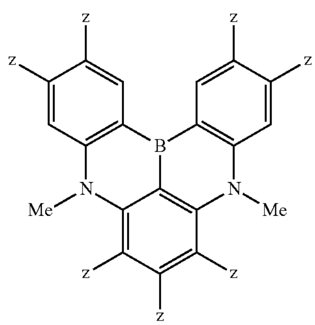
(1-422-z)
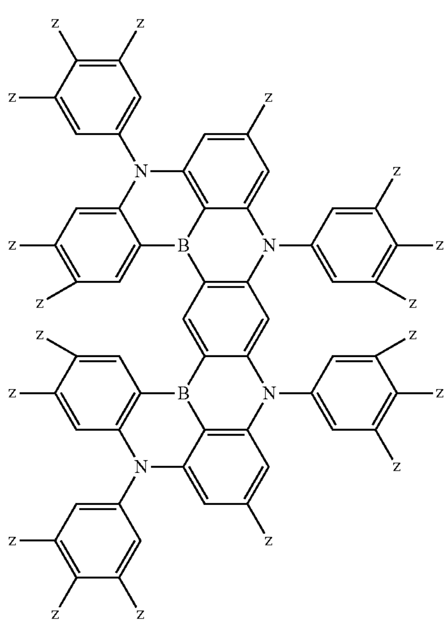
(1-447-z)
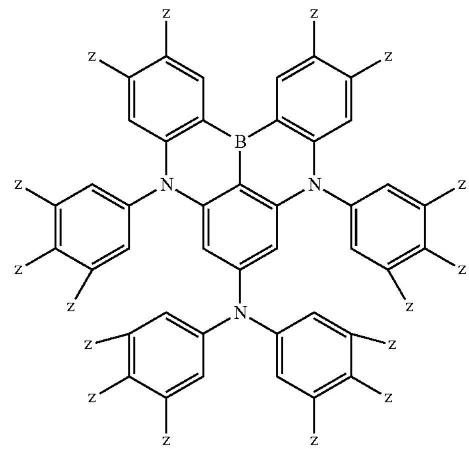
(1-1152-z)
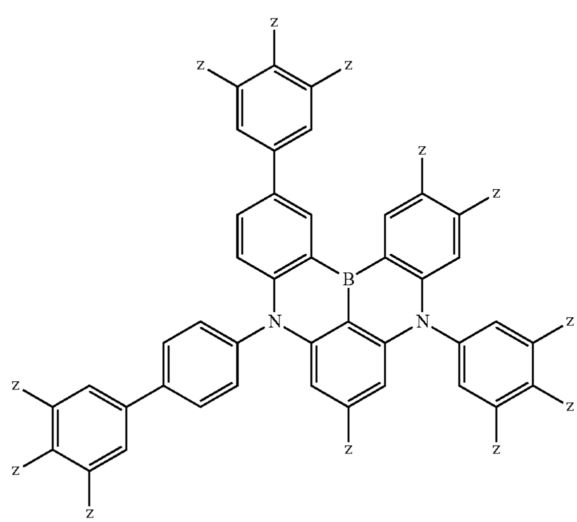
(1-1159-z)
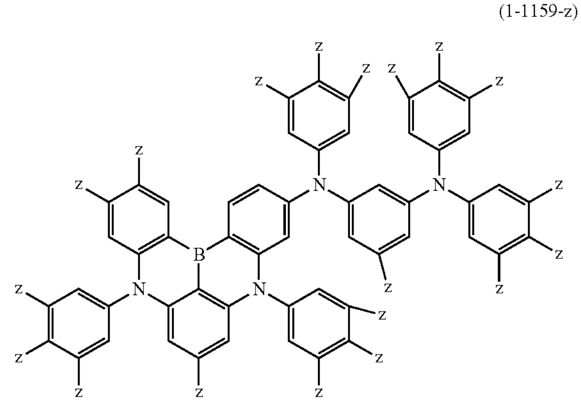

-continued (1-1201-z)

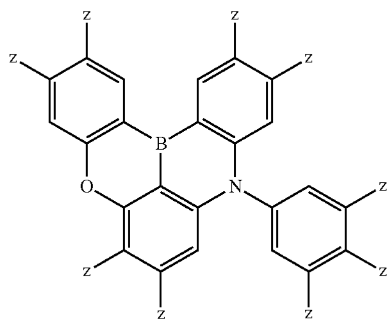

(1-1210-z)

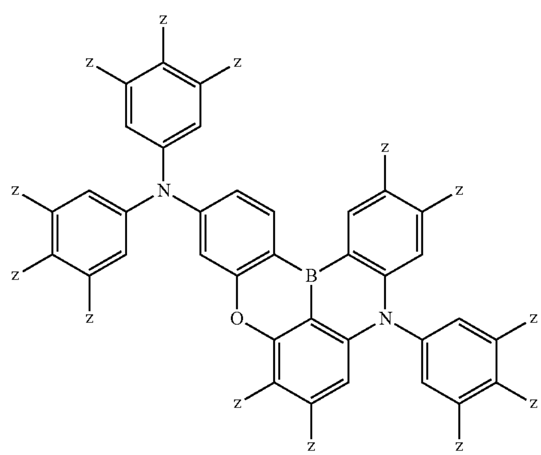

(1-2623-z)

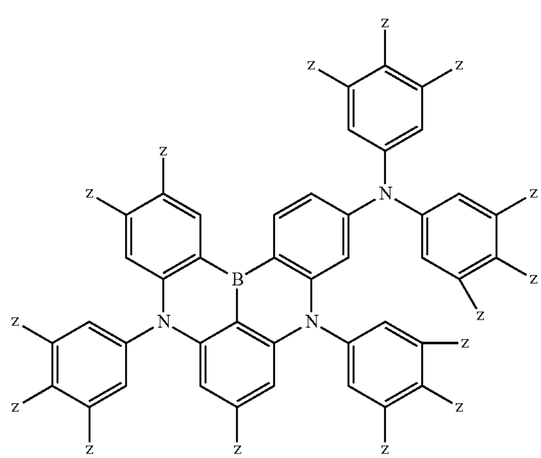

-continued (1-2679-z)

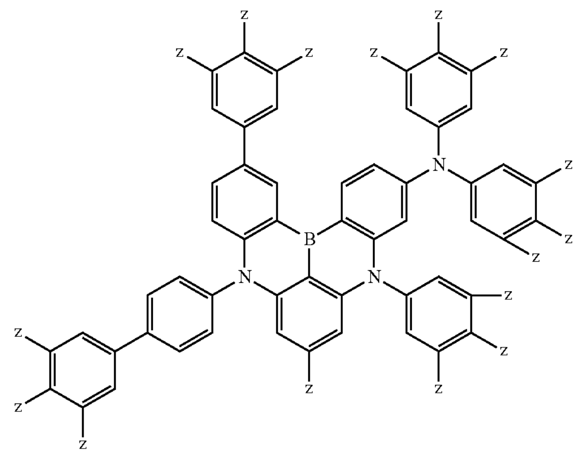

(z's in the above formulas each represent a hydrogen atom, a group represented by the above formula (FG-1), a group represented by the above formula (FG-2), or an alkyl having 7 to 24 carbon atoms, and not all z's represent hydrogen atoms.)

[24]

The light emitting layer-forming composition described in [23], in which the compound represented by the above formula (A) is a compound represented by the above formula (1-422-z), (1-1152-z), or (1-2679-z).

The light emitting layer-forming composition described in any one of [1] to [24], in which in the above formula (FG-1), m and n each represent 0, and p represents an integer of 1 to 3, and in the formula (FG-2), m and n each represent 0.

[26]

The light emitting layer-forming composition described in any one of [1] to [25], in which at least one compound in the first component or the second component is substituted by a group represented by the above formula (FG-1).

[27]

The light emitting layer-forming composition described in any one of [1] to [26], in which the boiling point of at least one organic solvent in the third component is from 130° C. to 300° C.

[28]

The light emitting layer-forming composition described in any one of [1] to [27], in which the third component comprises a good solvent (GS) and a poor solvent (PS) for at least one compound represented by the above formulas (B-1) to (B-6), and the boiling point ($BP_{GS}$) of the good solvent (GS) is lower than the boiling point ($BP_{PS}$) of the poor solvent (PS).

[29]

The light emitting layer-forming composition described in any one of [1] to [28], in which the content of the first component is from 0.0001% by weight to 2.0% by weight with respect to the total weight of the light emitting layer-forming composition, the content of the second component is from 0.0999% by weight to 8.0% by weight with respect to the total weight of the light emitting layer-forming composition, and the content of the third component is from 90.0% by weight to 99.9% by weight with respect to the total weight of the light emitting layer-forming composition.

[30]

An organic electroluminescent element comprising a light emitting layer formed using the light emitting layer-forming composition described in any one of [1] to [29].

[31]

A display apparatus comprising the organic electroluminescent element described in [30].

[32]

A polycyclic aromatic compound represented by the following general formula (A') or a polycyclic aromatic multimer compound comprising a plurality of structures represented by the following general formula (A').

(A')

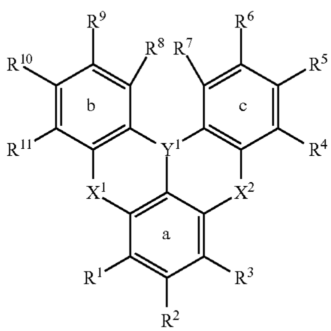

(In general formula (A), $R^1$ to $R^{11}$ each independently represent a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, at least one hydrogen atom in these may be further substituted by an aryl, a heteroaryl, or a diarylamino, $Y^1$ represents B, $X^1$ and $X^2$ each independently represent O or N—R, while at least one of $X^1$ and $X^2$ represents N—R, R of the N—R is an aryl or an alkyl, R in the N—R may be bonded to ring b and/or ring c with —O—, —S—, —C(—R)$_2$—, or a single bond, R in the —C(—R)$_2$— represents an alkyl having 1 to 24 carbon atoms, at least one hydrogen atom in a compound or a structure represented by the above formula (A') is substituted by a group represented by the following general formula (FG-1), a group represented by the following general formula (FG-2), or an alkyl having 7 to 24 carbon atoms, further any —$CH_2$— in the alkyl may be substituted by —O— or —$Si(CH_3)_2$—, any —$CH_2$— excluding —$CH_2$— directly bonded to a compound or structure represented by the above formula (A') in the alkyl may be substituted by an arylene having 6 to 24 carbon atoms, any hydrogen atom in the alkyl may be substituted by a fluorine atom, and at least one hydrogen atom in the compound or structure represented by the above formula (A') may be further substituted by a halogen atom or a deuterium atom.)

(FG-1)

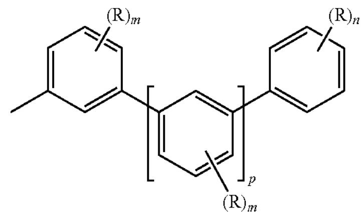

(In general formula (FG-1),

R's each independently represent a fluorine atom, a trimethylsilyl, a trifluoromethyl, an alkyl having 1 to 24 carbon atoms, or a cycloalkyl having 3 to 24 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4, n represents an integer of 0 to 5, and p represents an integer of 1 to 5.)

(FG-2)

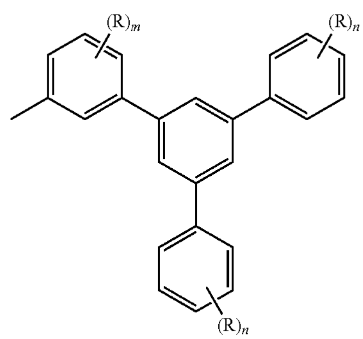

(In general formula (FG-2),

R's each independently represent a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m represents an integer of 0 to 4, and n's each independently represent an integer of 0 to 5.)

Advantageous Effects of Invention

According to a preferable embodiment of the present invention, for example, a polycyclic aromatic compound that can be used as a material for an organic EL element cam be provided, and a light emitting layer-forming composition having good film formability can be provided by a wet film formation method utilizing excellent solubility, film formability, wet coatability, and thermal stability of this polycyclic aromatic compound. Furthermore, when a host and a dopant each having a functional group in a molecule are used, it is possible to provide a light emitting layer-forming composition having better solubility, film formability, wet coatability, and in-plane orientation. Furthermore, use of this light emitting layer-forming composition can provide an excellent organic EL element.

DESCRIPTION OF EMBODIMENTS

1. Light Emitting Layer-Forming Composition

Figure 1:
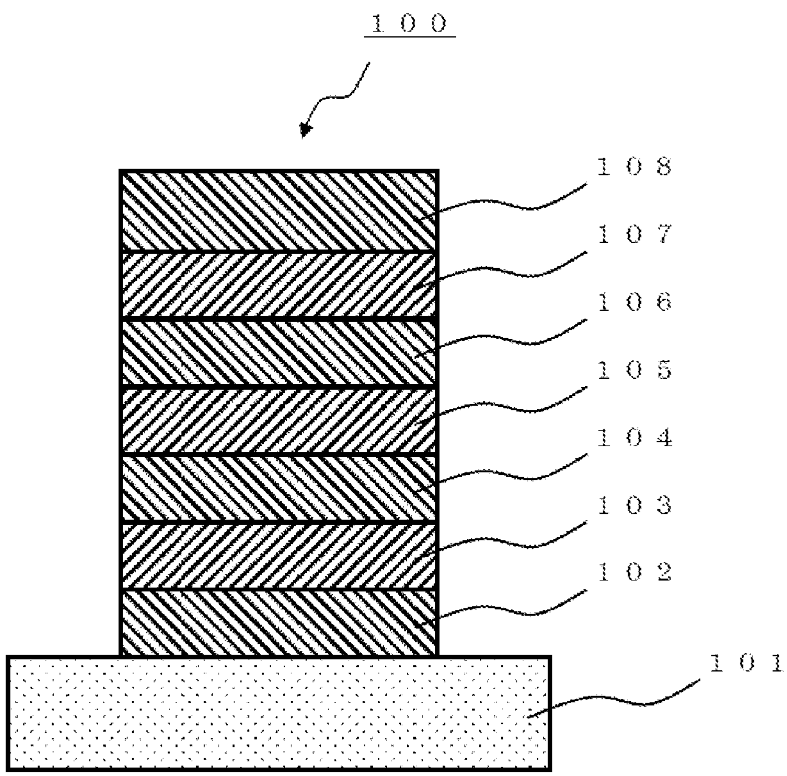
FIG. 1 is a schematic cross-sectional view illustrating an organic EL element according to the present embodiment.

A blue light emitting layer-forming composition of the present invention is a composition for coating and forming a light emitting layer of an organic EL element. The composition includes at least one selected from the group consisting of a polycyclic aromatic compound represented by general formula (A) and a polycyclic aromatic multimer compound having a plurality of structures represented by general formula (A) as a first component; at least one selected from the group consisting of compounds represented by general formulas (B-1) to (B-6) as a second component; and at least one organic solvent as a third component. The first component functions as a dopant component of a light emitting layer obtained from the composition, and the second component functions as a host component of the light emitting layer. The third component functions as a solvent for dissolving the first component and the second component in the composition. At the time of application, the third component provides a smooth and uniform surface shape due to a controlled evaporation rate of the third component itself.

1-1. First Component: Compound Represented by General Formula (A) or (A')

The first component is at least one selected from the group consisting of a polycyclic aromatic compound represented by general formula (A) and a polycyclic aromatic multimer compound having a plurality of structures represented by general formula (A), and functions as a dopant component of a light emitting layer obtained from the light emitting layer-forming composition. A compound represented by general formula (A) has a high fluorescence quantum yield and high color purity, and is therefore preferable as a dopant of a light emitting layer. These compounds are preferably polycyclic aromatic compounds represented by general formula (A'), or polycyclic aromatic multimer compounds each having a plurality of structures represented by the following general formula (A').

(A)

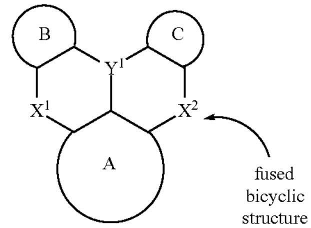

(A')

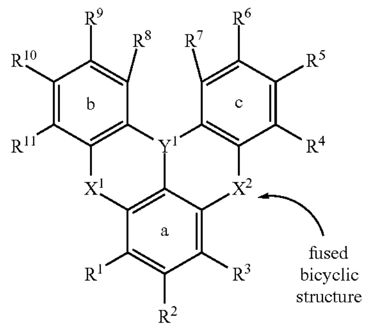

Ring A, ring B and ring C in formula (A) each independently represent an aryl ring or a heteroaryl ring, and at least one hydrogen atom in these rings may be substituted by a substituent. This substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (an amino group having an aryl and a heteroaryl), a substituted or unsubstituted alkyl, a substituted or unsubstituted alkoxy, or a substituted or unsubstituted aryloxy. In a case where these groups have substituents, examples of the substituents include an aryl, a heteroaryl, and an alkyl. Furthermore, the aryl ring or heteroaryl ring preferably has a 5-membered ring or 6-membered ring that shares a bond with a fused bicyclic structure (hereinafter, this structure is also referred to as "structure D") at the center of formula (A) constituted by $Y^1$, $X^1$ and $X^2$.

Here, the "fused bicyclic structure (structure D)" means a structure in which two saturated hydrocarbon rings that are configured to include $Y^1$, $X^1$ and $X^2$ and indicated at the center of formula (A), are fused. Furthermore, a "6-membered ring sharing a bond with the fused bicyclic structure" means, for example, ring a (benzene ring (6-membered ring)) fused to the structure D as represented by the above formula (A'). Furthermore, the phrase "aryl ring or heteroaryl ring (which is ring A) has this 6-membered ring" means that the ring A is formed from this 6-membered ring only, or the ring A is formed such that other rings are further fused to this 6-membered ring so as to include this 6-membered ring. In other words, the "aryl ring or heteroaryl ring (which is ring A) having a 6-membered ring" as used herein means that the 6-membered ring that constitutes the entirety or a portion of the ring A is fused to the structure D. Similar description applies to the "ring B (ring b)", "ring C (ring c)", and the "5-membered ring".

The ring A (or ring B or ring C) in formula (A) corresponds to ring a and its substituents $R^1$ to $R^3$ in formula (A') (or ring b and its substituents $R^4$ to $R^7$, or ring c and its substituents $R^8$ to $R^{11}$). That is, formula (A') corresponds to a structure in which "rings A to C each having a 6-membered ring" have been selected as the rings A to C of formula (A). For this meaning, rings of formula (A') are represented by small letters a to c.

In formula (A'), adjacent groups among the substituents $R^1$ to $R^{11}$ of the ring a, ring b, and ring c may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an aryl-heteroarylamino, an alkyl, an alkoxy, or an aryloxy, while at least one hydrogen atom in these may be substituted by an aryl, a heteroaryl or an alkyl. Therefore, a ring structure constituting the polycyclic aromatic compound represented by formula (A') changes according to a mutual bonding form of substituents in the ring a, ring b, and ring c as indicated by the following formulas (A'-1) and (A'-2). Ring A', ring B' and ring C' in each formula correspond to the ring A, ring B and ring C, respectively, in formula (A). Note that $R^1$ to $R^3$, $Y^1$, $X^1$, and $X^2$ in formula (A'-1) are defined in the same manner as those in formula (A'), and $R^4$ to $R^{11}$, $Y^1$, $X^1$, and $X^2$ in formula (A'-2) are defined in the same manner as those in formula (A').

(A'-1)

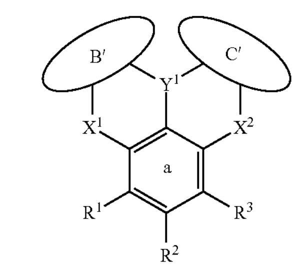

(A'-2)

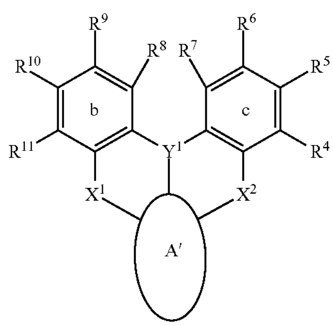

The ring A', ring B', and ring C' in the above formulas (A'-1) and (A'-2) each represent, to be described in connection with formula (A'), an aryl ring or a heteroaryl ring formed by bonding adjacent groups among the substituents $R^1$ to $R^{11}$ together with the ring a, ring b, and ring c, respectively (may also be referred to as a fused ring obtained by fusing another ring structure to the ring a, ring b, or ring c). Incidentally, although not indicated in the formula, there is also a compound in which all of the ring a, ring b, and ring c have been changed to the ring A', ring B' and ring C' Furthermore, as apparent from the above formulas (A'-1) and (A'-2), for example, $R^8$ of the ring b and $R^7$ of the ring c, $R^{11}$ of the ring b and $R^1$ of the ring a, $R^4$ of the ring c and $R^3$ of the ring a, and the like do not correspond to "adjacent groups", and these groups are not bonded to each other. That is, the term "adjacent groups" means adjacent groups on the same ring.

A compound represented by the above formula (A'-1) or (A'-2) corresponds to, for example, a compound represented by any one of formulas (1-402) to (1-409) listed as specific compounds described below. That is, for example, the compound represented by formula (A'-1) or formula (A'-2) is a compound having ring A' (or ring B' or ring C') that is formed by fusing a benzene ring, an indole ring, a pyrrole ring, a benzofuran ring or a benzothiophene ring to the benzene ring which is the ring a (or ring b or ring c), and the fused ring A' (or fused ring B' or fused ring C') that has been formed is a naphthalene ring, a carbazole ring, an indole ring, a dibenzofuran ring, or a dibenzothiophene ring.

The "aryl ring formed by bonding adjacent groups among $R^1$ to $R^{11}$ together with the ring a, ring b, or ring c" in formula (A') is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. However, the carbon number of the "aryl ring formed by bonding adjacent groups among $R^1$ to $R^{11}$ together with the ring a, ring b, or ring c" includes the carbon number 6 of the ring a, ring b, or ring c.

Specific examples of the aryl ring thus formed include a naphthalene ring which is a fused bicyclic ring system; an acenaphthylene ring, a fluorene ring, a phenalene ring, and a phenanthrene ring which are fused tricyclic systems; a triphenylene ring, a pyrene ring, and a naphthacene ring which are fused tetracyclic systems; and a perylene ring and a pentacene ring which are fused pentacyclic systems.

The "heteroaryl ring formed by bonding adjacent groups among $R^1$ to $R^{11}$ together with the ring a, ring b, or ring c" in formula (A') is, for example, a heteroaryl ring having 6 to 30 carbon atoms, and the heteroaryl ring is preferably a heteroaryl ring having 6 to 25 carbon atoms, more preferably a heteroaryl ring having 6 to 20 carbon atoms, still more preferably a heteroaryl ring having 6 to 15 carbon atoms, and particularly preferably a heteroaryl ring having 6 to 10 carbon atoms. In addition, examples of the "heteroaryl ring" include a heterocyclic ring containing 1 to 5 heteroatoms selected from an oxygen atom, a sulfur atom, and a nitrogen atom in addition to a carbon atom as a ring-constituting atom. However, the carbon number of the "aryl ring formed by bonding adjacent groups among $R^1$ to $R^{11}$ together with the ring a, ring b, or ring c" includes the carbon number 6 of the ring a, ring b, or ring c.

Specific examples of the heteroaryl ring thus formed include an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a carbazole ring, an acridine ring, a phenoxathiin ring, a phenoxazine ring, a phenothiazine ring, a phenazine ring, a benzofuran ring, an isobenzofuran ring, a dibenzofuran ring, a benzothiophene ring, a dibenzothiophene ring, and a thianthrene ring.

At least one hydrogen atom in the ring thus formed may be substituted by an aryl, a heteroaryl, a diarylamino, a diheteroarylamino, an arylheteroarylamino, or an aryloxy, while at least one hydrogen atom in these may be further substituted by an aryl, a heteroaryl, or a diarylamino. For this description, the description in $R^1$ to $R^{11}$ of formula (A') described below can be cited.

$Y^1$ in formulas (A) and (A') represents B.

$X^1$ and $X^2$ in formula (A) each independently represent O or N—R, while R of the N—R represents an optionally substituted aryl, or an optionally substituted heteroaryl or an alkyl, and R of the N—R may be bonded to the ring B and/or ring C by a linking group or a single bond. The linking group is preferably —O—, —S— or —C(—R)$_2$—. Incidentally, R of the "—C(—R)$_2$—" represents a hydrogen atom or an alkyl. This description also applies to $X^1$ and $X^2$ in formula (A').

Here, the provision that "R of the N—R is bonded to the ring A, ring B and/or ring C by a linking group or a single bond" in formula (A) corresponds to the provision that "R of the N—R is bonded to the ring a, ring b and/or ring c by —O—, —S—, —C(—R)$_2$— or a single bond" in formula (A').

This provision can be expressed by a compound having a ring structure in which $X^1$ or $X^2$ is incorporated into the fused ring B' or C', represented by the following formula (A'-3-1). That is, for example, the compound is a compound having ring B' (or ring C') that is formed by fusing another ring to a benzene ring which is ring b (or ring c) in formula (A') so as to incorporate $X^1$ (or $X^2$). This compound corresponds to, for example, a compound represented by any one of formulas (1-451) to (1-462) or a compound represented by any one of formulas (1-1401) to (1-1460), listed as specific examples that are described below, and the fused ring B' (or fused ring C') that has been formed is, for example, a phenoxazine ring, a phenothiazine ring, or an acridine ring.

The above provision can be expressed by a compound having a ring structure in which $X^1$ and/or $X^2$ are/is incorporated into the fused ring A', represented by the following formula (A'-3-2) or (A'-3-3). That is, for example, the compound is a compound having ring A' formed by fusing another ring to a benzene ring which is the ring a in formula (A') so as to incorporate $X^1$ (and/or $X^2$). This compound corresponds to, for example, a compound represented by any one of formulas (1-471) to (1-479) listed as specific examples that are described below, and the fused ring A' that has been formed is, for example, a phenoxazine ring, a phenothiazine ring, or an acridine ring. Note that $R^1$ to $R^3$, $Y^1$, $X^1$, and $X^2$ in formula (A'-3-1) are defined in the same manner as those in formula (A'), and $R^4$ to $R^{11}$, $Y^1$, $X^1$, and $X^2$ in formulas (A'-3-2) and (A'-3-3) are defined in the same manner as those in formula (A').

(A'-3-1)

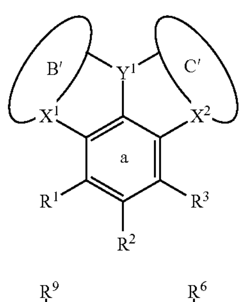

(A'-3-2)

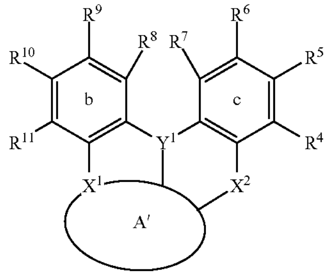

-continued (A'-3-3)

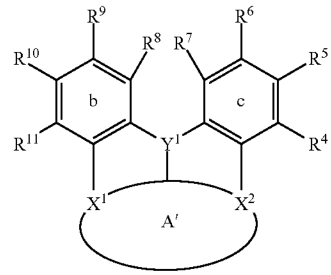

The "aryl ring" as the ring A, ring B, or ring C of formula (A) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^{11}$ together with the ring a, ring b, or ring c" defined by formula (A'). The ring a (or ring b or ring c) is already constituted by a benzene ring having 6 carbon atoms, and therefore the carbon number of 9 in total of a fused ring obtained by fusing a 5-membered ring to this benzene ring becomes a lower limit of the carbon number.

Specific examples of the "aryl ring" include a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring and a phenanthrene ring which are fused tricyclic systems; a triphenylene ring, a pyrene ring and a naphthacene ring which are fused tetracyclic systems; and a perylene ring and a pentacene ring which are fused pentacyclic systems. Furthermore, as described below, a group in which each of these aryls is substituted by a heteroaryl defined below is also defined as an aryl here.

The "heteroaryl ring" as the ring A, ring B or ring C of formula (A) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl having 2 to 10 carbon atoms. In addition, examples of the "heteroaryl ring" include a heterocyclic ring containing 1 to 5 heteroatoms selected from an oxygen atom, a sulfur atom, and a nitrogen atom in addition to a carbon atom as a ring-constituting atom. Incidentally, this "heteroaryl ring" corresponds to the "heteroaryl ring formed by bonding adjacent groups among $R^1$ to $R^{11}$ together with the ring a, ring b, or ring c" defined by formula (A'). The ring a (or ring b or ring c) is already constituted by a benzene ring having 6 carbon atoms, and therefore the carbon number of 6 in total of a fused ring obtained by fusing a 5-membered ring to this benzene ring becomes a lower limit of the carbon number.

Specific examples of the "heteroaryl ring" include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, a thianthrene ring, and the N-aryl substituted heteroaryl. Furthermore, as described below, a group in which each of these heteroaryls is substituted by the aryl defined above is also defined as a heteroaryl here.

At least one hydrogen atom in the above "aryl ring" or "heteroaryl ring" may be substituted by a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "alkyl", a substituted or unsubstituted "alkoxy", or a substituted or unsubstituted "aryloxy", which is a primary substituent. Examples of the aryl of the "aryl", "heteroaryl" and "diarylamino", the heteroaryl of the "diheteroarylamino", the aryl and heteroaryl of the "arylheteroarylamino" and the aryl of the "aryloxy" as these primary substituents include a monovalent group of the "aryl ring" or "heteroaryl ring" described above.

Furthermore, the "alkyl" as the primary substituent may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 to 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Furthermore, the "alkoxy" as a primary substituent may be, for example, a linear alkoxy having 1 to 24 carbon atoms or a branched alkoxy having 3 to 24 carbon atoms. An alkoxy having 1 to 18 carbon atoms (branched alkoxy having 3 to 18 carbon atoms) is preferable, an alkoxy having 1 to 12 carbon atoms (branched alkoxy having 3 to 12 carbon atoms) is more preferable, an alkoxy having 1 to 6 carbon atoms (branched alkoxy having 3 to 6 carbon atoms) is still more preferable, and an alkoxy having 1 to 4 carbon atoms (branched alkoxy having 3 to 4 carbon atoms) is particularly preferable.

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

In the substituted or unsubstituted "aryl", substituted or unsubstituted "heteroaryl", substituted or unsubstituted "diarylamino", substituted or unsubstituted "diheteroarylamino", substituted or unsubstituted "arylheteroarylamino", substituted or unsubstituted "alkyl", substituted or unsubstituted "alkoxy", or substituted or unsubstituted "aryloxy", which is the primary substituent, at least one hydrogen atom may be substituted by a secondary substituent, as described to be substituted or unsubstituted. Examples of this secondary substituent include an aryl, a heteroaryl, and an alkyl, and for the details thereof, and reference can be made to the above description on the monovalent group of the "aryl ring" or "heteroaryl ring" and the "alkyl" as the primary substituent. Furthermore, regarding the aryl or heteroaryl as the secondary substituent, an aryl or heteroaryl in which at least one hydrogen atom is substituted by an aryl such as phenyl (specific examples are described above), or an alkyl such as methyl (specific examples are described above) is also included in the aryl or heteroaryl as the secondary substituent. For instance, when the secondary substituent is a carbazolyl group, a carbazolyl group in which at least one hydrogen atom at the 9-position is substituted by an aryl such as phenyl or an alkyl such as methyl is also included in the heteroaryl as the secondary substituent.

Examples of the aryl, the heteroaryl, the aryl of the diarylamino, the heteroaryl of the diheteroarylamino, the aryl and the heteroaryl of the arylheteroarylamino, or the aryl of the aryloxy for $R^1$ to $R^{11}$ of formula (A') include the monovalent groups of the "aryl ring" or "heteroaryl ring" described in formula (A). Furthermore, regarding the alkyl or alkoxy for $R^1$ to $R^{11}$, reference can be made to the description on the "alkyl" or "alkoxy" as the primary substituent in the above description of formula (A). In addition, similar description applies to the aryl, heteroaryl or alkyl as the substituent for these groups. Furthermore, similar description applies to the heteroaryl, diarylamino, diheteroarylamino, arylheteroarylamino, alkyl, alkoxy, or aryloxy in a case of forming an aryl ring or a heteroaryl ring by bonding adjacent groups among $R^1$ to $R^{11}$ together with the ring a, ring b or ring c, as a substituent on these rings, and the aryl, heteroaryl, or alkyl as a further substituent. In addition, as described above, similarly, an aryl substituted by a heteroaryl is also defined as an aryl here, and a heteroaryl substituted by an aryl is also defined as a heteroaryl here.

Specific examples of $R^1$ to $R^{11}$ in formula (A') include groups represented by the following formulas (RG-1) to (RG-10). Note that the groups represented by the following formulas (RG-1) to (RG-10) are bonded to the above formula (A') at *.

(RG-1)

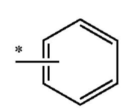

(RG-2)

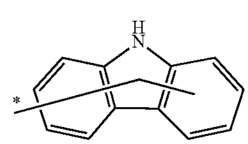

(RG-3)

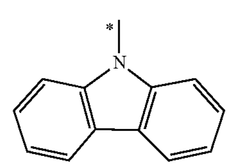

-continued (RG-4)

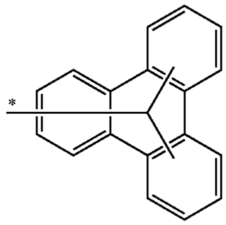

(RG-5)

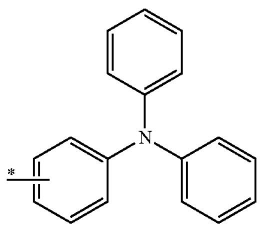

(RG-6)

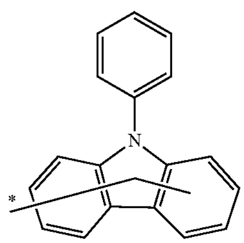

(RG-7)

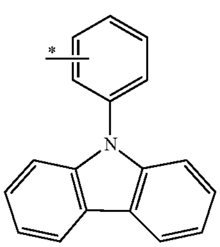

(RG-8)

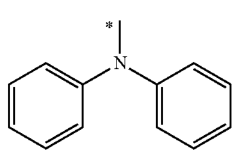

-continued (RG-9)

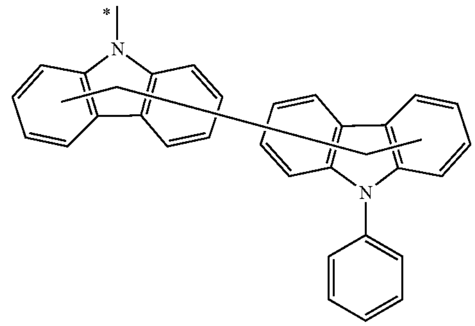

(RG-10)

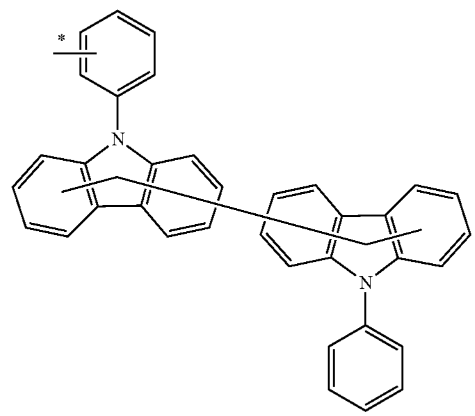

The "aryl" and "heteroaryl" defined here will be described with reference to the specific groups described above. Formulas (RG-1), (RG-4), and (RG-7) represent aryls. Formulas (RG-2), (RG-3), and (RG-6) represent heteroaryls. Formula (RG-9) represents a heteroaryl substituted by a heteroaryl. Formula (RG-10) represents an aryl substituted by a heteroaryl. Note that formula (RG-5) represents an aryl (phenyl group) substituted by a diarylamino (diphenylamino group), and formula (RG-8) represents a diarylamino (diphenylamino group).

(RG-9)

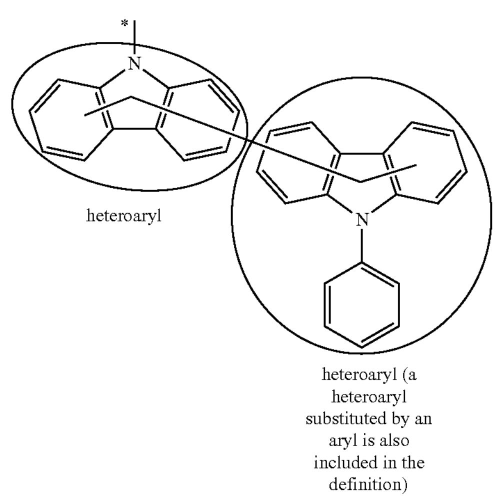

-continued (RG-10)

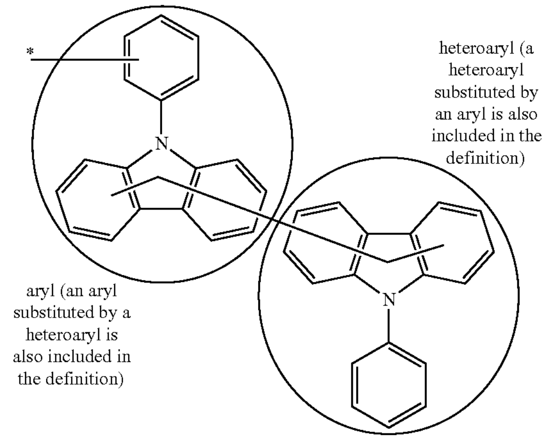

R of the N—R for $X^1$ and $X^2$ of formula (A) represents an aryl, a heteroaryl, or an alkyl which may be substituted by the secondary substituent described above, and at least one hydrogen atom in the aryl or heteroaryl may be substituted by, for example, an alkyl. Examples of this aryl, heteroaryl or alkyl include those described above. Particularly, an aryl having 6 to 10 carbon atoms (for example, phenyl or naphthyl), a heteroaryl having 2 to 15 carbon atoms (for example, carbazolyl), and an alkyl having 1 to 4 carbon atoms (for example, methyl or ethyl) are preferable. This description also applies to $X^1$ and $X^2$ in formula (A').

R of the "—C(—R)$_2$—" as a linking group in formula (A) represents a hydrogen atom or an alkyl, and examples of this alkyl include those described above. Particularly, an alkyl having 1 to 4 carbon atoms (for example, methyl or ethyl) is preferable. This description also applies to "—C(—R)$_2$—" as a linking group in formula (A')

1-1-1. Polycyclic Aromatic Multimer Compound

Furthermore, the invention of the present application relates to a polycyclic aromatic multimer compound having a plurality of unit structures each represented by formula (A), preferably to a polycyclic aromatic multimer compound having a plurality of unit structures each represented by formula (A'). The multimer compound is preferably a dimer to a hexamer, more preferably a dimer to a trimer, and particularly preferably a dimer. The multimer compound is only required to be in a form having the plurality of unit structures described above in one compound, and for example, the multimer compound may be in a form in which the plurality of unit structures are bonded with a linking group such as a single bond, an alkylene group having 1 to 3 carbon atoms, a phenylene group, or a naphthylene group. In addition, the multimer compound may be in a form in which the plurality of unit structures are bonded such that any ring contained in the unit structure (ring A, ring B or ring C, or ring a, ring b or ring c) is shared by the plurality of unit structures, or may be in a form in which the unit structures are bonded such that any rings contained in the unit structures (ring A, ring B or ring C, or ring a, ring b or ring c) are fused.

Examples of such a multimer compound include multimer compounds represented by the following formulas (A'-4), (A'-4-1), (A'-4-2), (A'-5-1) to (A'-5-4), and (A'-6). A multimer compound represented by the following formula (A'-4) corresponds to, for example, a compound represented by formula (1-423) described below. That is, to be described in connection with formula (A'), the multimer compound includes a plurality of unit structures each represented by formula (A') in one compound so as to share a benzene ring as ring a. Furthermore, a multimer compound represented by the following formula (A'-4-1) corresponds to, for example, a compound represented by the following formula (1-2665). That is, to be described in connection with formula (A'), the multimer compound includes two unit structures each represented by formula (A') in one compound so as to share a benzene ring as ring a. Furthermore, a multimer compound represented by the following formula (A'-4-2) corresponds to, for example, a compound represented by the following formula (1-2666). That is, to be described in connection with formula (A'), the multimer compound includes two unit structures each represented by formula (A') in one compound so as to share a benzene ring as ring a. Furthermore, multimer compounds represented by the following formulas (A'-5-1) to (A'-5-4) correspond to, for example, compounds represented by the following formulas (1-421), (1-422), (1-424), and (1-425). That is, to be described in connection with formula (A'), the multimer compound includes a plurality of unit structures each represented by general formula (A') in one compound so as to share a benzene ring as ring b (or ring c) Furthermore, a multimer compound represented by the following formula (A'-6) corresponds to, for example, a compound represented by any one of the following formulas (1-431) to (1-435). That is, to be described in connection with formula (A'), for example, the multimer compound includes a plurality of unit structures each represented by general formula (A') in one compound such that a benzene ring as ring b (or ring a or ring c) of a certain unit structure and a benzene ring as ring b (or ring a or ring c) of a certain unit structure are fused. Incidentally, $R^4$ to $R^{11}$, $Y^1$, $X^1$, and $X^2$ in formulas (A'-4), (A'-4-1), and (A'-4-2) are defined in the same manner as those in formula (A'), $R^1$ to $R^8$, $R^{11}$, $Y^1$, $X^1$, and $X^2$ in formulas (A'-5-1), (A'-5-3), and (A'-6) are defined in the same manner as those in formula (A'), $R^1$ to $R^7$, $R^{10}$, $R^{11}$, $Y^1$, $X^1$, and $X^2$ in formula (A'-5-2) are defined in the same manner as those in formula (A'), and $R^1$ to $R^7$, $Y^1$, $X^1$, and $X^2$ in formula (A'-5-4) are defined in the same manner as those in formula (A').

(A'-4)

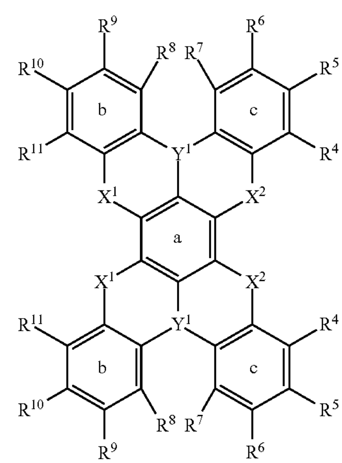

-continued
(A'-4-1)
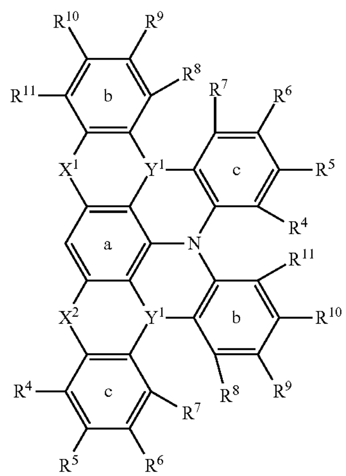
(A'-4-2)
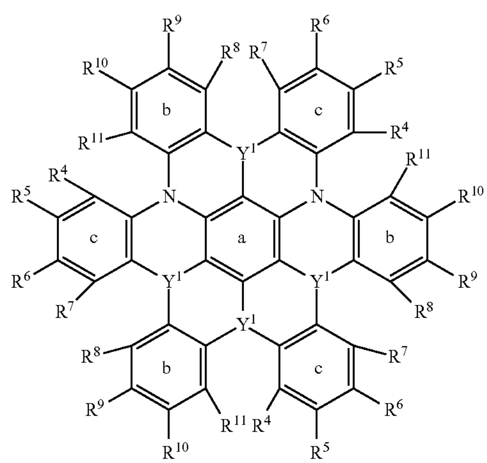
(A'-5-1)
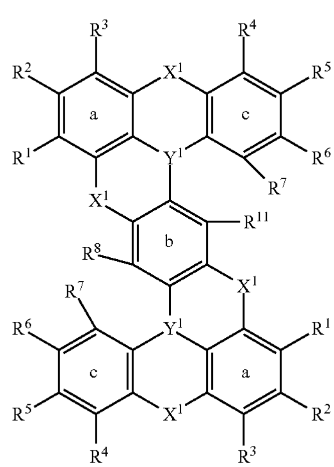
-continued
(A'-5-2)
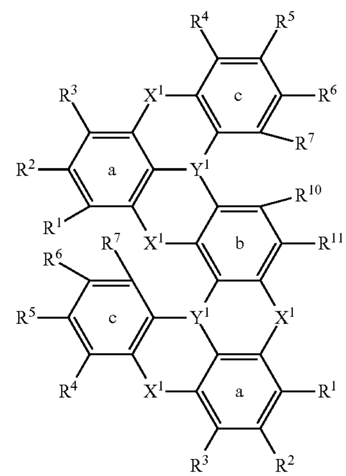
(A'-5-3)
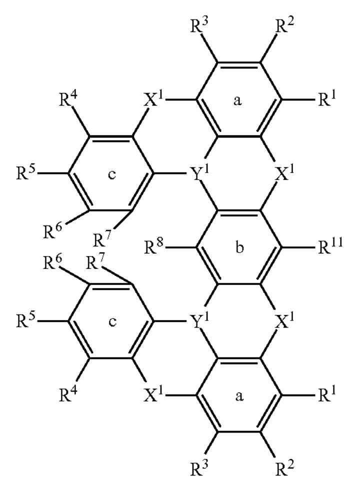
(A'-5-4)
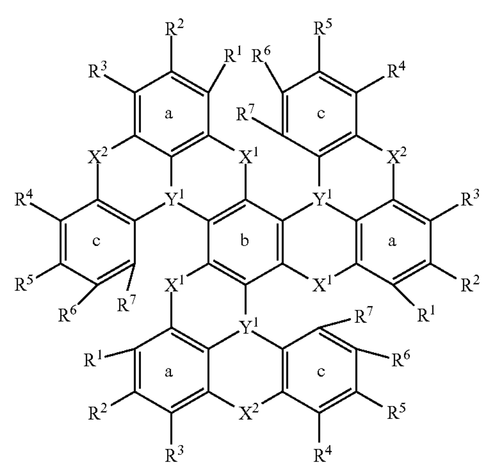

-continued (A'-6)

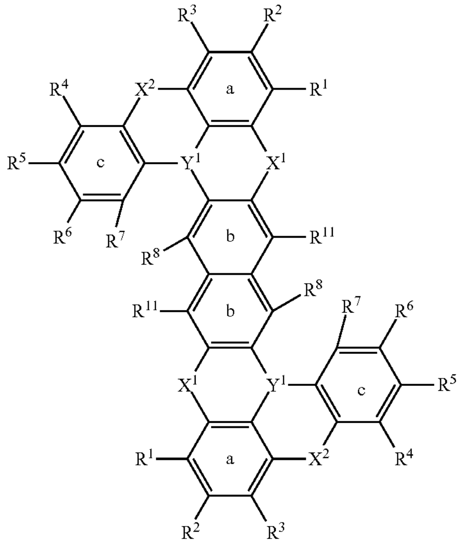

The multimer compound may be a multimer in which a multimer form represented by formula (A'-4), (A'-4-1) or (A'-4-2) and a multimer form represented by any one of formulas (A'-5-1) to (A'-5-4) or formula (A'-6) are combined, may be a multimer in which a multimer form represented by any one of formula (A'-5-1) to formula (A'-5-4) and a multimer form represented by formula (A'-6) are combined, or may be a multimer in which a multimer form represented by formula (A'-4), (A'-4-1) or (A'-4-2), a multimer form represented by any one of formulas (A'-5-1) to (A'-5-4), and a multimer form represented by formula (A'-6) are combined.

1-1-4. Substitution on Compound

At least one hydrogen atom in a compound represented by formula (A) or (A') (at least one hydrogen atom in an aryl ring or a heteroaryl ring in the compound) may be substituted by a group represented by formula (FG-1), a group represented by formula (FG-2), or an alkyl having 1 to 24 carbon atoms, further any —$CH_2$— in the alkyl may be substituted by —O— or —$Si(CH_3)_2$—, any —$CH_2$— excluding —$CH_2$— directly bonded to the compound in the alkyl may be substituted by an arylene having 6 to 24 carbon atoms, and any hydrogen atom in the alkyl may be substituted by a fluorine atom.

A group represented by formula (FG-1), a group represented by formula (FG-2), or an alkyl having 1 to 24 carbon atoms can further improve solubility in a solvent, film formability, wet coatability, thermal stability, and in-plane orientation of a compound because of being substituted by an appropriate length and structure at an appropriate position of a molecule.

One of molecular design guidelines for solubility control is to impart flexibility to molecules. Because of this, it is considered that solubility can be improved or controlled by reducing a cohesive force between solid molecules and promoting immediate solvent infiltration upon dissolution. In general, an alkyl chain is introduced into a molecule. However, in a case of use as an organic EL element, the alkyl chain may inhibit accumulation of molecules and may break a carrier path, and therefore a driving voltage of the organic EL element may be raised or mobility may be lowered.

In such a situation, it has been found that high solubility can be imparted without deteriorating a characteristic of the organic EL element by introducing a group represented by formula (FG-1) or (FG-2) having a structure in which phenylene is linked at an m-position. When a plurality of rotations between a phenyl and a phenyl in a group represented by formula (FG-1) or (FG-2) is combined, the group represented by formula (FG-1) or (FG-2) can draw a large rotating volume and is very flexible. Therefore, it is considered that a derivative to which a group represented by formula (FG-1) or (FG-2) is imparted can have high solubility. Particularly, as a group represented by formula (FG-1) is longer, flexibility is higher, and higher solubility can be imparted to a molecule. Therefore, a longer group is more preferable from a viewpoint of solubility. A structure that does not interfere with flexibility of a group represented by formula (FG-1) or (FG-2) throughout a molecule is preferable because flexibility of the group represented by formula (FG-1) or (FG-2) is utilized to the utmost and sufficient solubility is imparted thereto.

In addition, it is known that a biphenyl structure has a planar structure with an angle of 0° between phenyl rings in a crystal. Similarly, a group represented by formula (FG-1) or (FG-2) can have a planar structure in a solid. A group represented by formula (FG-1) or (FG-2) has flexibility in a solution. However, it is considered that flexibility of the group represented by formula (FG-1) or (FG-2) is suppressed after film formation, and molecules are sufficiently densely packed in a film. This generates a carrier transporting path in the film, and therefore leads to an improvement in carrier mobility and a reduction in drive voltage. Particularly, as a group represented by formula (FG-1) is shorter, the density of a structure of portions other than the group represented by formula (FG-1) responsible for the path can be higher. Therefore, a shorter group is more preferable from a viewpoint of the carrier transporting path.

Here, the term "wet coatability" means a measure of smoothness and uniformity of a film formed with wet coatability. During wet film formation, when solubility is low, a film cannot be formed but a crystal may be deposited. On the other hand, when solubility is high, a film defect such as a pinhole or cissing may be generated. Strictly speaking, when there is an extremely large difference from other components in solubility, component separation may occur. Furthermore, compatibility with a solvent, a composition, and a film formation/drying/baking step may have an influence on a film quality, and precise adjustment of each element may be required in order to obtain a high-quality film. Therefore, it is considered that control of solubility without changing HOMO and LUMO of a molecule leads to control of wet coatability.

A group represented by formula (FG-1) or (FG-2) can control solubility without having a large influence on a structure of portions other than the group represented by formula (FG-1) or (FG-2) responsible for HOMO or LUMO. In addition, the group represented by formula (FG-1) or (FG-2) can give a certain range to solubility, and can adjust a light emitting layer-forming composition flexibly.

Stability during driving of an organic EL element is estimated by thermal stability (glass transition point). It is considered that a cohesive force of a molecule may be increased in order to raise the glass transition point. That is, as solubility is improved more, the molecule may be more flexible, the glass transition point may be lower, and thermal stability may be lower.

By imparting a group represented by formula (FG-1), flexibility can be imparted to a molecule, while dense packing can be expected in a film. As a result, molecular motion can be restricted, and therefore stability to internal and external heat may be improved. As a group represented by formula (FG-1) is longer, a molecule can be larger, and Tg can be raised from a viewpoint of thermal stability. A group represented by formula (FG-2) has higher planarity than a group represented by formula (FG-1), and therefore has a larger effect of raising Tg.

In order to improve characteristics of a compound used for an organic EL element, studies have been made to impart in-plane orientation by giving a rigid structure to a molecule. In general, a compound having in-plane orientation has a rigid and highly linear structure like a p-terphenyl, and therefore has poor solubility.

However, contrary to conventional common general technical knowledge, the present inventors have found that high in-plane orientation can be imparted even to a molecule which is not rigid by performing a substitution such that a group represented by formula (FG-1) is long and the molecule has a rod-like shape. In this case, the molecule does not have a rigid and highly linear structure, and therefore solubility is never lowered. Preferably, a group represented by formula (FG-1) is long and the molecule has a rod-like shape from a viewpoint of in-plane orientation. When a group represented by formula (FG-1) is sufficiently long, high in-plane orientation can be exhibited even when a molecule is bent.

Even in a molecule into which an alkyl chain is introduced, deterioration of characteristics of an organic EL element can be prevented by controlling a chain length and a structure such that the alkyl chain does not inhibit accumulation of the molecules.

In a compound represented by formula (A) or (A'), at least one hydrogen atom in a molecule is preferably substituted by a group represented by formula (FG-1), a group represented by formula (FG-2), or an alkyl having 7 to 24 carbon atoms from a viewpoint of improving coating film formability and in-plane orientation. More preferably, at least one hydrogen atom in a molecule is substituted by a group represented by formula (FG-1) or (FG-2). Particularly preferably, at least one hydrogen atom in a molecule is substituted by a group represented by formula (FG-1).

1-1-4-1. Group Represented by General Formula (FG-1)

(FG-1)

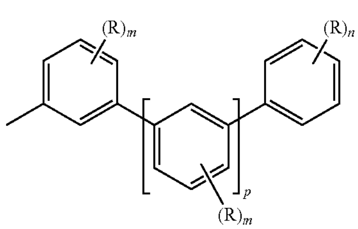

In formula (FG-1), R's each independently represent a fluorine atom, a trimethylsilyl, a trifluoromethyl, an alkyl having 1 to 24 carbon atoms, or a cycloalkyl having 3 to 24 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4, n represents an integer of 0 to 5, and p represents an integer of 1 to 5. Note that the term "two adjacent R's" means groups adjacent to each other on the same ring.

The linking number p of a phenylene is preferably from 1 to 5, more preferably from 1 to 3, and still more preferably 1 or 2 from a viewpoint of solubility, film formability, wet coatability, thermal stability, and in-plane orientation of a compound.

Regarding the substitution numbers m and n of the substituent R, m is preferably from 0 to 4, more preferably from 0 to 2, still more preferably from 0 to 1, and particularly preferably 0, and n is preferably from 0 to 5, more preferably from 0 to 3, still more preferably from 0 to 1, and particularly preferably 0.

Regarding the "substituent R on a group represented by formula (FG-1)", the substituent R is preferably present at a position other than the o-position with respect to a phenyl-phenyl bond (based on a bonding position of adjacent phenyl groups), and is more preferably present at a position further apart with respect to the phenyl-phenyl bond from a viewpoint of flexibility of a functional group and a filling property during film formation.

Specific examples of the "substituent R on a group represented by formula (FG-1)" include a fluorine atom, a trimethylsilyl, a trifluoromethyl, an alkyl having 1 to 24 carbons, a cycloalkyl having 3 to 24 carbons, an alkyl which has 1 to 24 carbon atoms and in which any —$CH_2$— is substituted by —O—, an alkyl which has 1 to 24 carbon atoms and in which any —$CH_2$— excluding —$CH_2$— directly bonded to a phenyl or a phenylene is substituted by an arylene having 6 to 24 carbon atoms, a cycloalkyl which has 3 to 24 carbon atoms and in which at least one hydrogen atom is substituted by an alkyl having 1 to 24 carbon atoms, and a cycloalkyl which has 3 to 24 carbon atoms and in which at least one hydrogen atom is substituted by an aryl having 6 to 12 carbon atoms.

The "alkyl having 1 to 24 carbon atoms" may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 to 4 carbon atoms) is particularly preferable.

Specific examples of the "alkyl having 1 to 24 carbon atoms" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl, but are not limited thereto.

Specific examples of the "alkyl which has 1 to 24 carbon atoms and in which any —$CH_2$— is substituted by —O—" include methoxy, ethoxy, propoxy, isopropoxy, n-butoxy, isobutoxy, s-butoxy, t-butoxy, pentyloxy, hexyloxy, heptyloxy, octyloxy, 2-methoxyethoxy, 2-ethoxyethoxy, 2-propoxyethoxy, 2-butoxyethoxy, 2-ethoxy-(2-ethoxyethoxy), and 2-ethoxy-(2-ethoxy-(2-ethoxyethoxy)), but are not limited thereto.

Specific examples of the "alkyl which has 1 to 24 carbon atoms and in which any —$CH_2$— excluding —$CH_2$— directly bonded to a phenyl or a phenylene is substituted by an arylene having 6 to 24 carbon atoms" include methylbenzyl, ethylbenzyl, and propylbenzyl, but are not limited thereto.

The "cycloalkyl having 3 to 24 carbon atoms" is preferably a cycloalkyl having 3 to 12 carbon atoms, more preferably a cycloalkyl having 3 to 10 carbon atoms, still more preferably a cycloalkyl having 3 to 8 carbon atom, and particularly preferably a cycloalkyl having 3 to 6 carbon atom.

Specific examples of the cycloalkyl having 3 to 24 carbon atoms include cyclopropyl, cyclobutyl, cyclopentyl, cyclohexyl, cycloheptyl, and cyclooctyl, but are not limited thereto.

Specific examples of the "cycloalkyl which has 3 to 24 carbon atoms and in which at least one hydrogen atom is substituted by an alkyl having 1 to 24 carbon atoms" or the "cycloalkyl which has 3 to 24 carbon atoms and in which at least one hydrogen atom is substituted by an aryl having 6 to 12 carbon atoms" include methylcyclopentyl, methylcyclohexyl, dimethylcyclohexyl, phenylcyclohexyl, and naphthylcyclohexyl, but are not limited thereto.

1-1-4-2. Group Represented by General Formula (FG-2)

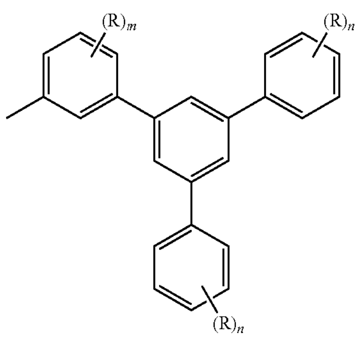

(FG-2)

In formula (FG-2), R's each independently represent a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —$CH_2$— in the alkyl may be substituted by —O—, any —$CH_2$— excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m represents an integer of 0 to 4, and n's each independently represent an integer of 0 to 5. Note that the term "two adjacent R's" means groups adjacent to each other on the same ring.

Regarding the substitution numbers m and n of the substituent R, m is preferably from 0 to 4, more preferably from 0 to 2, still more preferably from 0 to 1, and particularly preferably 0, and n is preferably from 0 to 5, more preferably from 0 to 3, still more preferably from 0 to 1, and particularly preferably 0.

Note that for the substituent R in formula (FG-2), description of the substituent R in formula (FG-1) can be cited. For the "aryl having 6 to 12 carbon atoms", description in the section of a compound represented by formula (A) or (A') can be cited.

1-1-4-3. Alkyl Having 1 to 24 Carbon Atoms

In general, when a molecule into which an alkyl chain is introduced is used as an organic EL element, the alkyl chain may inhibit accumulation of the molecules and may break a carrier path. Meanwhile, even in a molecule into which an alkyl chain is introduced, deterioration of characteristics of an organic EL element can be prevented by controlling a chain length and a structure such that the alkyl chain does not inhibit accumulation of the molecules.

By substitution of at least one hydrogen atom at the ortho-position of a phenyl group or a p-phenylene group at a terminal in a compound by a methyl group or the like, adjacent aromatic rings are likely to intersect each other perpendicularly, and conjugation is weakened. As a result, triplet excitation energy ($E_T$) can be increased.

At least one hydrogen atom in a compound represented by formula (A) or (A') (at least one hydrogen atom in an aryl ring or a heteroaryl ring in the compound) may be substituted by an alkyl having 1 to 24 carbon atoms, further any —$CH_2$— in the alkyl may be substituted by —O— or —$Si(CH_3)_2$—, any —$CH_2$— excluding —$CH_2$— directly bonded to the compound in the alkyl may be substituted by an arylene having 6 to 24 carbon atoms, and any hydrogen atom in the alkyl may be substituted by a fluorine atom. However, the term "the alkyl" used herein means all the alkyls by which at least one hydrogen atom of an aryl ring or a heteroaryl ring "may be substituted".

The "alkyl having 1 to 24 carbon atoms" may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 to 4 carbon atoms) is particularly preferable.

As another example, a linear or branched alkyl having 7 to 24 carbon atoms can be used. In this case, a linear or branched alkyl having 7 to 18 carbon atoms is preferable, and a linear or branched alkyl having 7 to 12 carbon atoms is more preferable.

Specific examples of the alkyl having 1 to 24 carbon atoms include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Any —$CH_2$— in the alkyl may be substituted by —O— or —$Si(CH_3)_2$—. Examples thereof include an alkoxy, an alkylether, and an alkylsilyl. Specific examples thereof include methoxy, ethoxy, propoxy, isopropoxy, butoxy, isobutoxy, s-butoxy, t-butoxy, pentyloxy, hexyloxy, heptyloxy, octyloxy, methoxymethyl, 2-methoxyethoxy, 2-(2-methoxyethoxy) ethoxy, and trimethylsilyl.

Any —$CH_2$— excluding —$CH_2$— directly bonded to the compound in the alkyl may be substituted by an arylene having 6 to 24 carbon atoms. Examples thereof include 2-methylbenzyl, 3-methylbenzyl, and 4-methylbenzyl.

1-1-4-4. Substitution Position on Compound

In a case where a compound represented by formula (A') is substituted by a group represented by formula (FG-1), a group represented by formula (FG-2), or an alkyl having 1 to 24 carbon atoms (or an alkyl having 7 to 24 carbon atoms), at least one of z's in the following formula (A'-NN-Z1) or (A'-NO-Z1) is preferably substituted.

(A'-NN-Z1)

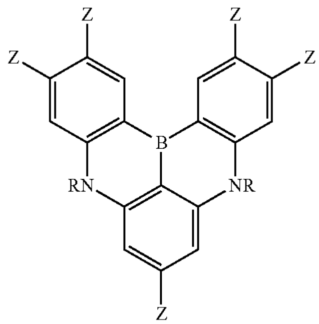

(A'-NO-Z1)

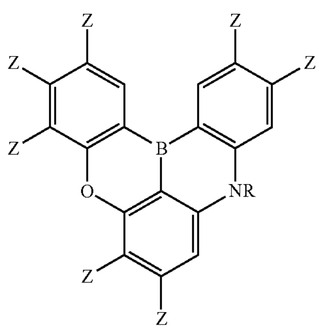

More specifically, at least one of z's in the following formula (1-401-z), (1-411-z), (1-422-z), (1-447-z), (1-1152-z), (1-1159-z), (1-1201-z), (1-1210-z), (1-2623-z), or (1-2679-z) is preferably substituted.

(1-104-z)

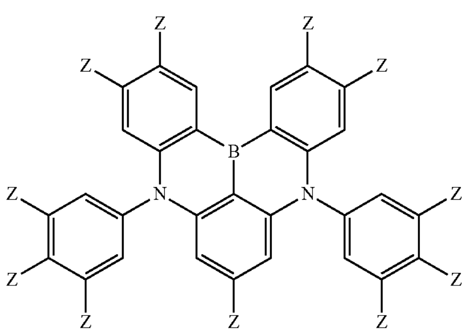

-continued (1-411-z)

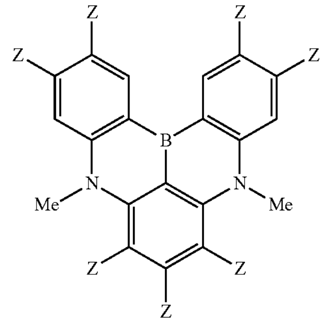

(1-422-z)

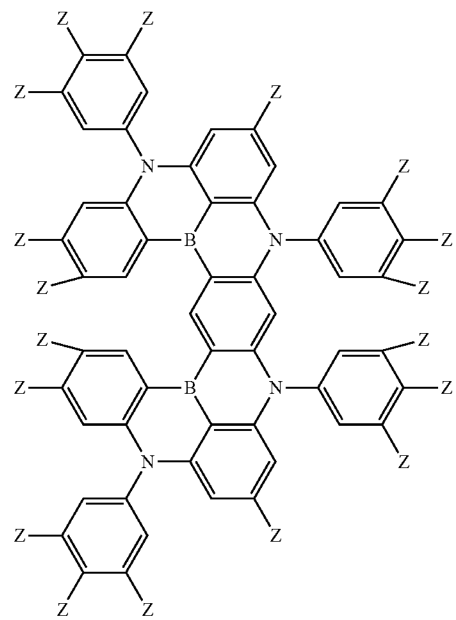

(1-447-z)

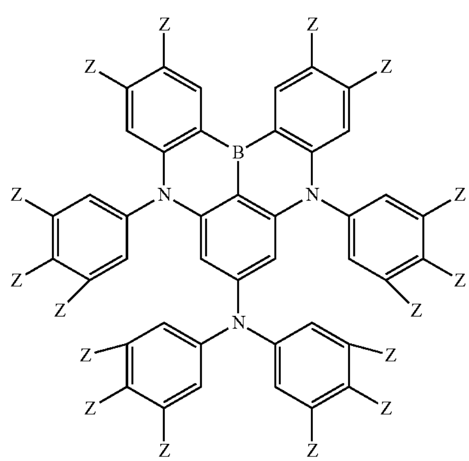

-continued (1-1152-z)

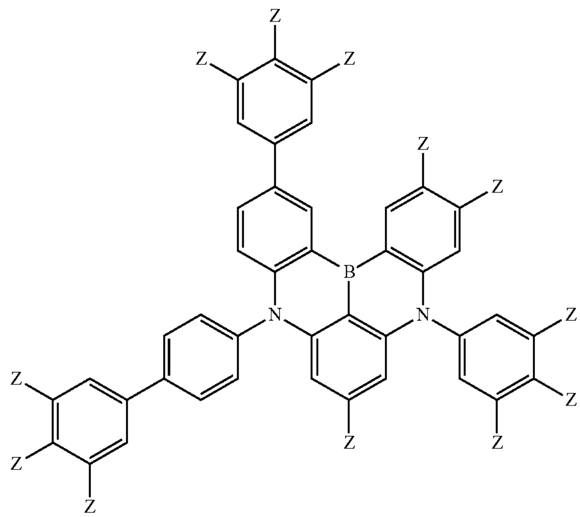

(1-1159-z)

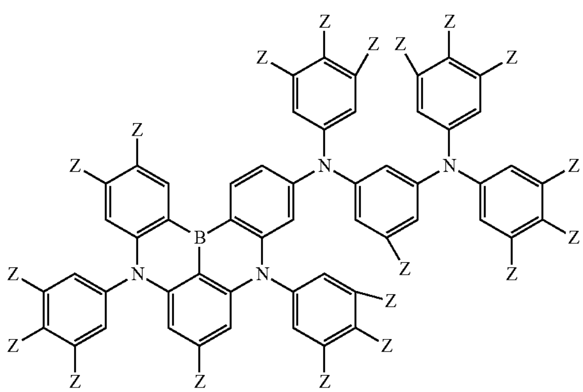

(1-1201-z)

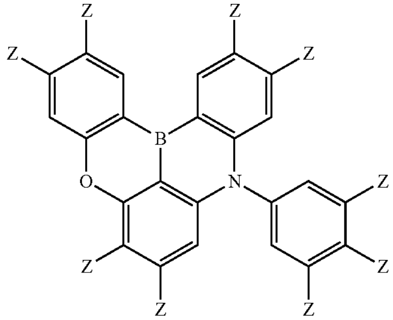

-continued (1-1210-z)

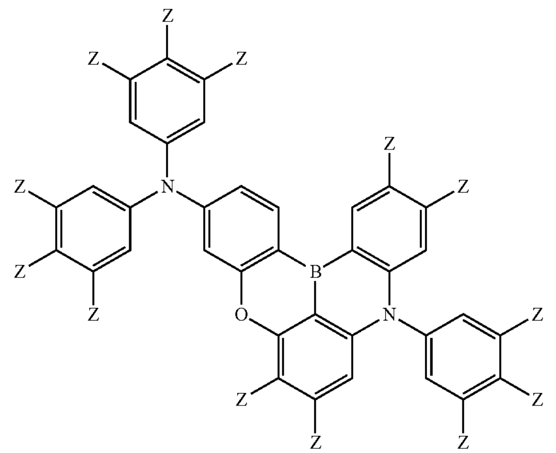

(1-2623-z)

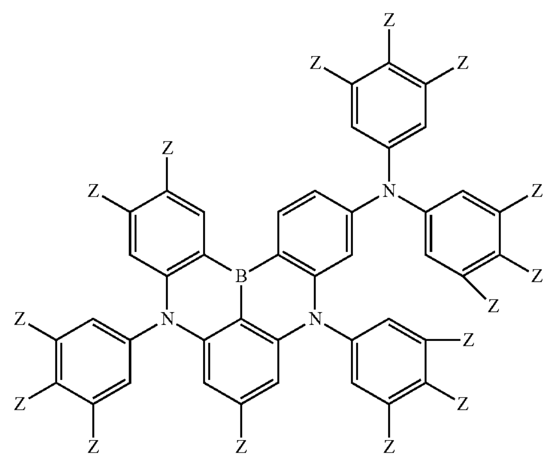

(1-2679-z)

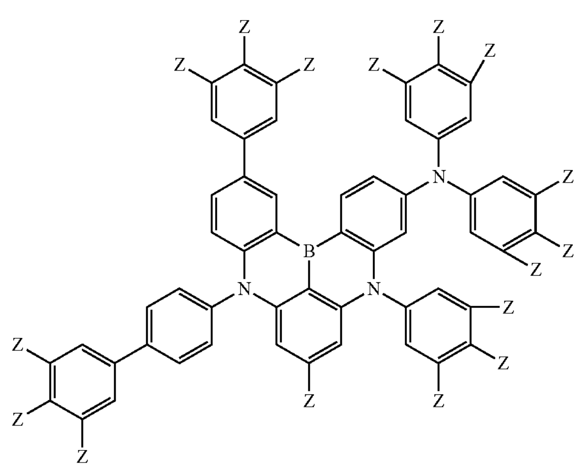

1-1-5. Substitution on Compound by Deuterium Atom or Halogen Atom

All or a portion of hydrogen atoms in a compound represented by formula (A) or (A') may be deuterium atoms. Furthermore, all or a portion of hydrogen atoms in a compound represented by formula (A) or (A') may be halogen atoms. For example, in formula (A) or (A'), a hydrogen atom on ring A, ring B, ring C, ring a, ring b, ring c, or a substituent on these rings may be substituted by a deuterium atom or a halogen atom. However, among these, particularly, a form in which all or a portion of hydrogen atoms at an aryl portion or a heteroaryl portion is substituted by a deuterium atom or a halogen atom is exemplified. The halogen is fluorine, chlorine, bromine, or iodine, preferably fluorine, chlorine, or bromine, and more preferably chlorine.

1-1-6. Specific Examples of Polycyclic Aromatic Compound or Polycyclic Aromatic Multimer Compound More specific structures of a compound represented by formula (A) or (A') and a multimer compound thereof are indicated below. Any one of compounds represented by the following formulas (1-401) to (1-462), (1-1401) to (1-1460), (1-471) to (1-479), (1-1151) to (1-1160), (1-1201) to (1-1281), (1-2623) to (1-2699), (1-3831) to (1-3991), and (1-4011) to (1-4033) has a structure not substituted by a group represented by formula (FG-1), a group represented by formula (FG-2), or an alkyl having 1 to 24 carbon atoms.

A specific structure of such a compound represented by formula (A) or (A') and a multimer compound thereof may be substituted by a group represented by formula (FG-1), a group represented by formula (FG-2), or an alkyl having 1 to 24 carbon atoms. Specific structures of these substituents are indicated in the following formulas (FG-1-1) to (FG-1-5), (FG-1-1001) to (FG-1-1103), (FG-1-2001) to (FG-1-2089), (FG-2-1), (FG-2-1001) to (FG-2-1006), (FG-2-1041) to (FG-2-1103), and (R-1) to (R-37).

Note that at least one hydrogen atom in a compound represented by formula (A) or (A') is substituted by groups represented by the following formulas (FG-1-1) to (FG-1-5), (FG-1-1001) to (FG-1-1103), (FG-1-2001) to (FG-1-2089), (FG-2-1), (FG-2-1001) to (FG-2-1006), (FG-2-1041) to (FG-2-1103), and (R-1) to (R-37) at * in each of the formulas.

A compound represented by formula (A) or (A') is bonded to a group represented by formula (FG-1), a group represented by formula (FG-2), or an alkyl having 1 to 24 carbon atoms at any position.

That is, it should be understood that compounds represented by the following formulas (1-401) to (1-462), (1-1401) to (1-1460), (1-471) to (1-479), (1-1151) to (1-1160), (1-1201) to (1-1281), (1-2623) to (1-2699), (1-3831) to (1-3991), and (1-4011) to (1-4033) disclose both a compound not substituted by a group represented by formula (FG-1), a group represented by formula (FG-2), or an alkyl having 1 to 24 carbon atoms, and a compound substituted by these groups at any position.

(1-401)

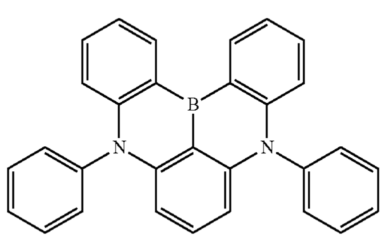

(1-402)

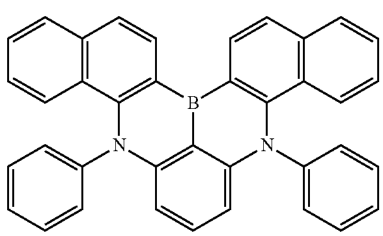

-continued (1-403)

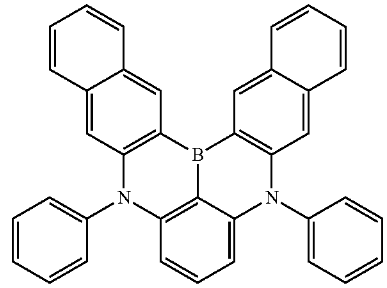

(1-404)

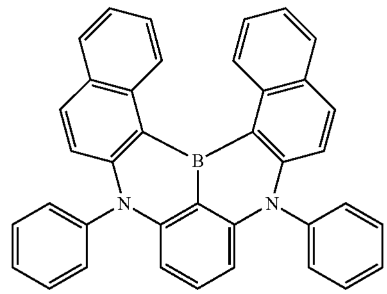

(1-405)

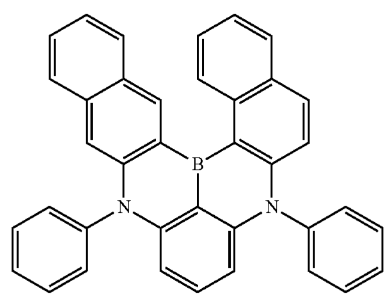

(1-406)

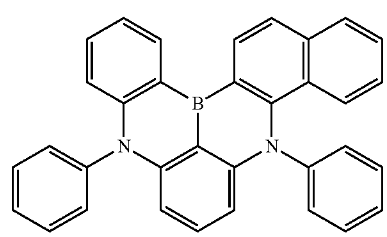

(1-407)

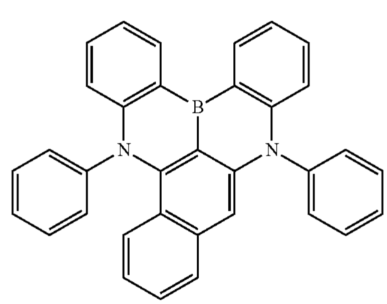

-continued
(1-408)
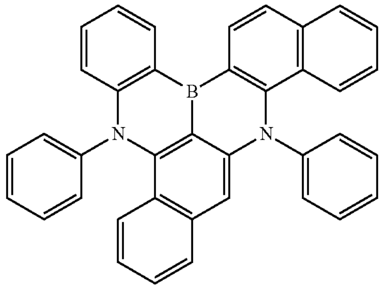
(1-409)
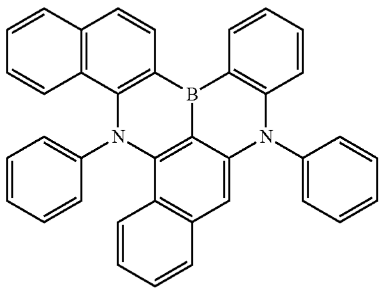
(1-411)
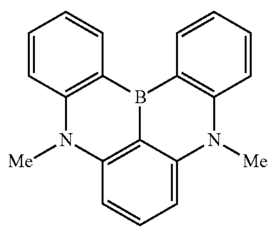
(1-412)
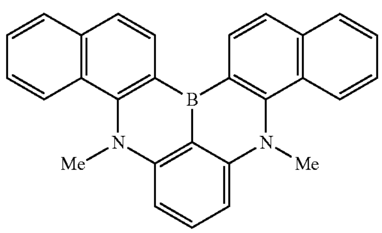
(1-413)
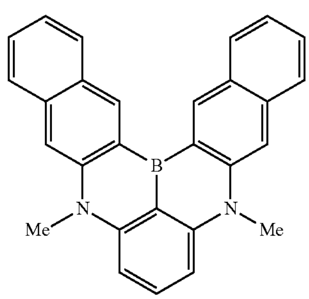
(1-414)
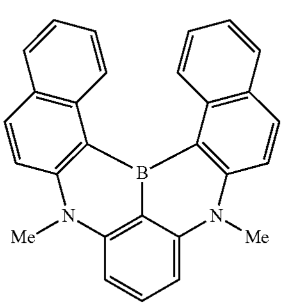
-continued
(1-415)
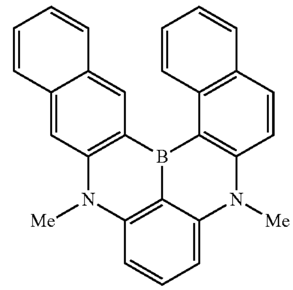
(1-416)
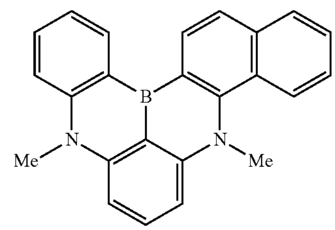
(1-417)
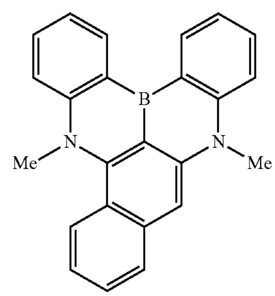
(1-418)
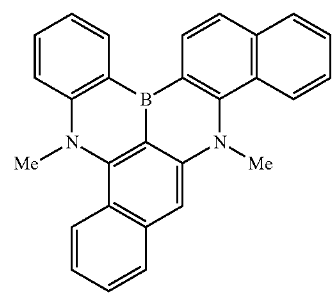
(1-419)
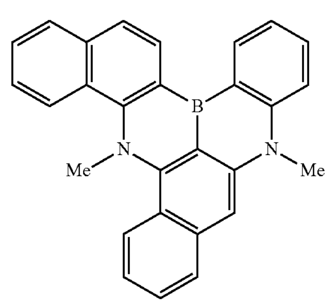

(1-421)
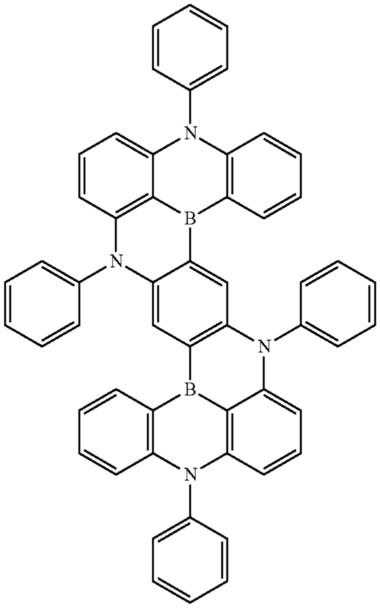
(1-422)
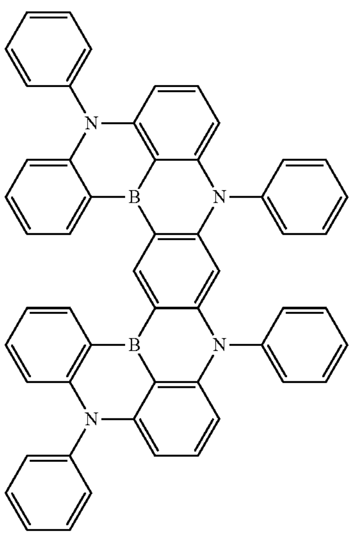
(1-423)
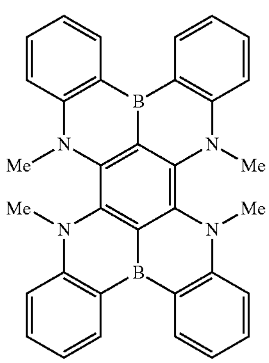
(1-424)
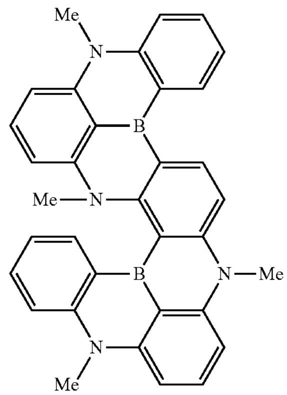
(1-425)
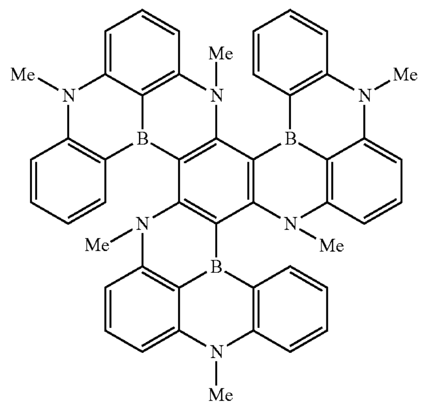
(1-431)
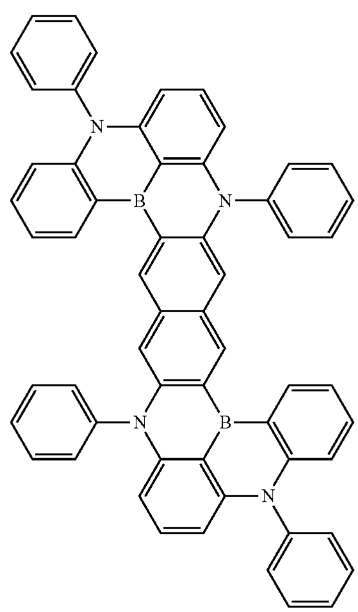

-continued
(1-432)
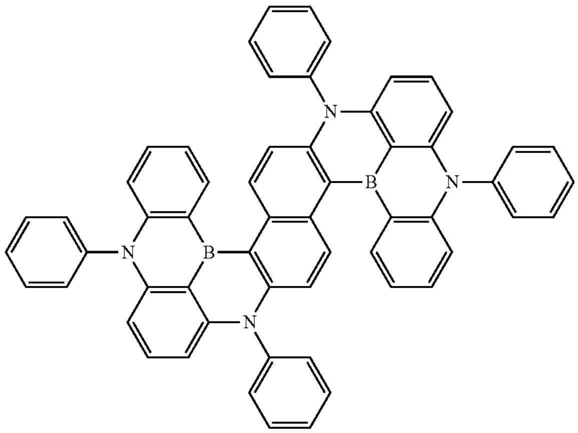
(1-433)
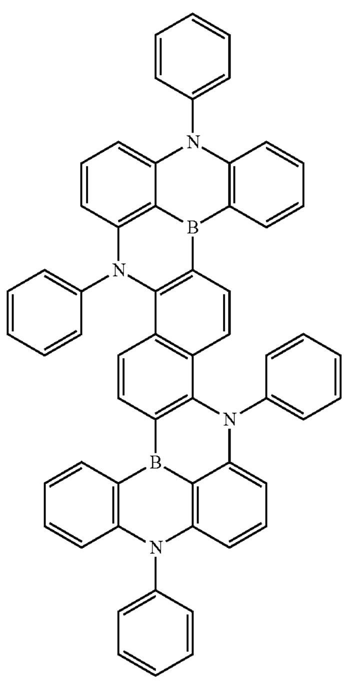
-continued
(1-434)
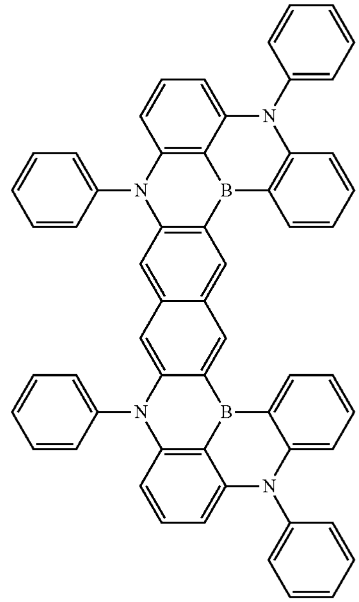
(1-435)
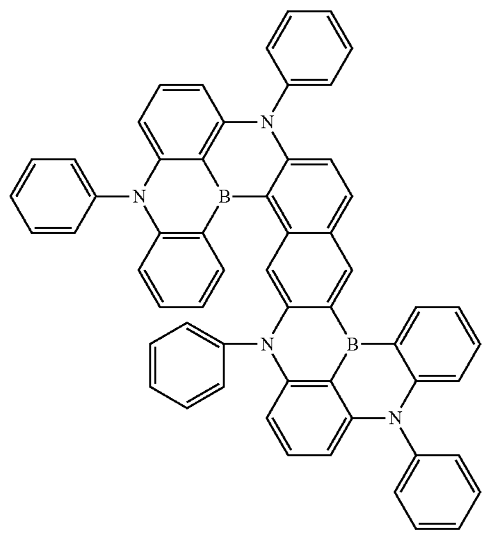
(1-441)
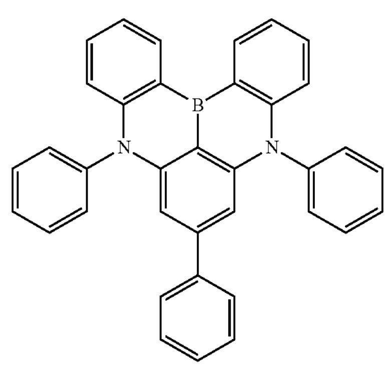

-continued
(1-442)
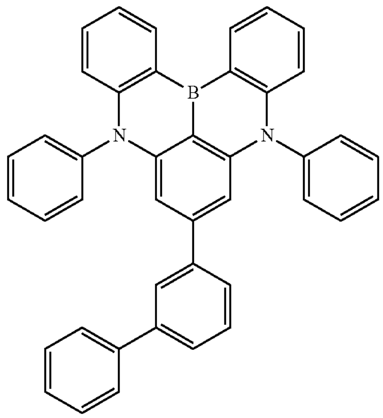
(1-443)
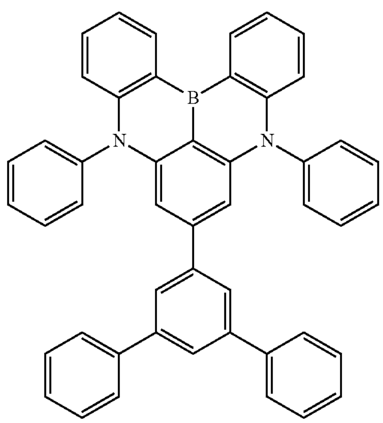
(1-444)
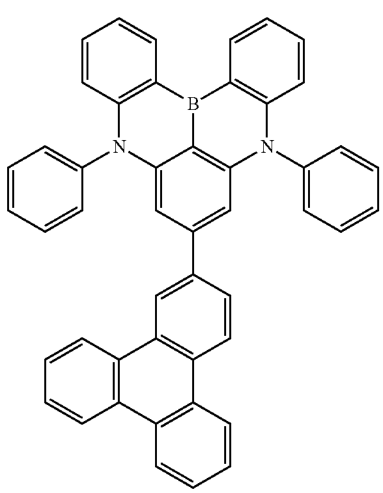
-continued
(1-445)
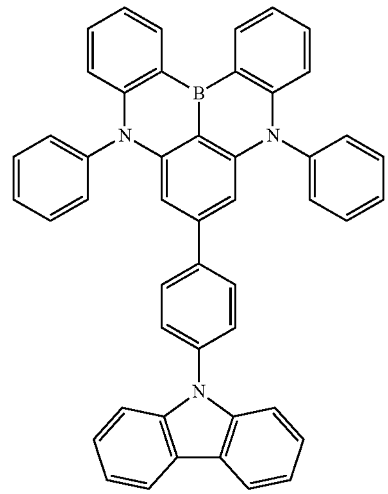
(1-446)
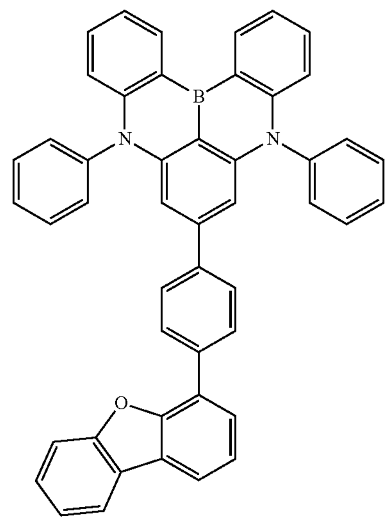
(1-447)
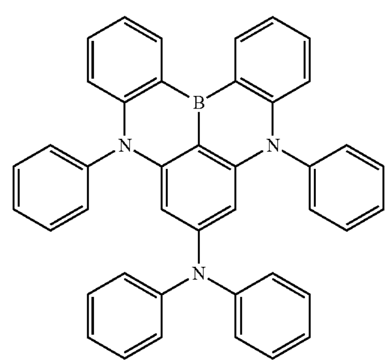
(1-451)
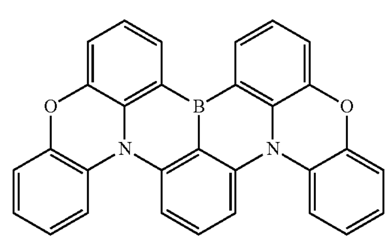

-continued
(1-452)
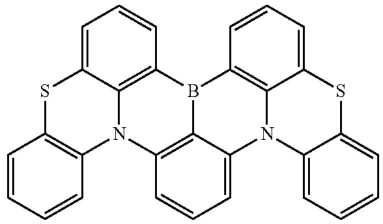
(1-453)
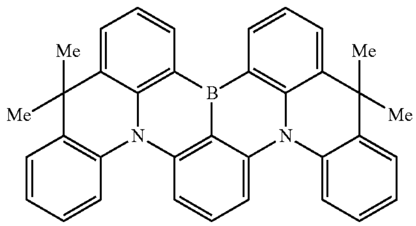
(1-454)
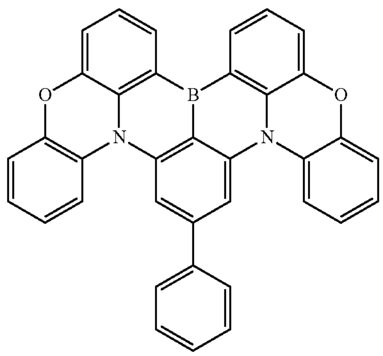
(1-455)
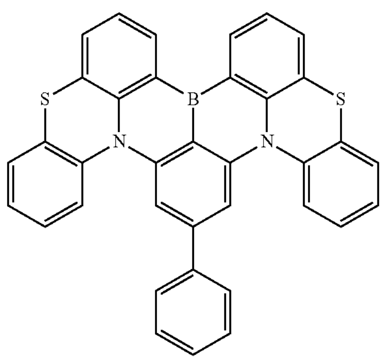
(1-456)
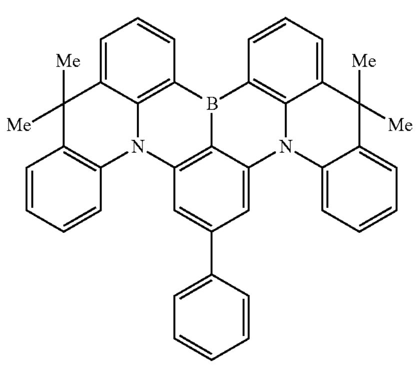
-continued
(1-457)
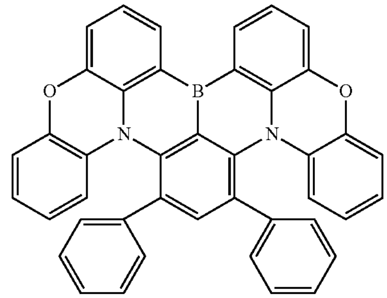
(1-458)
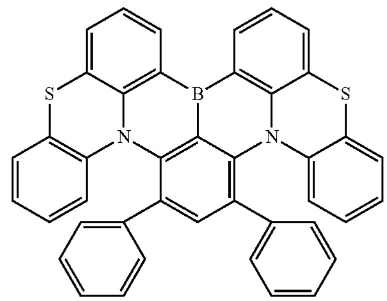
(1-459)
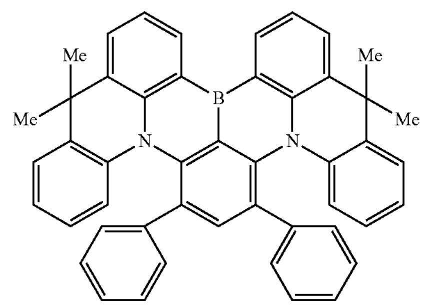
(1-460)
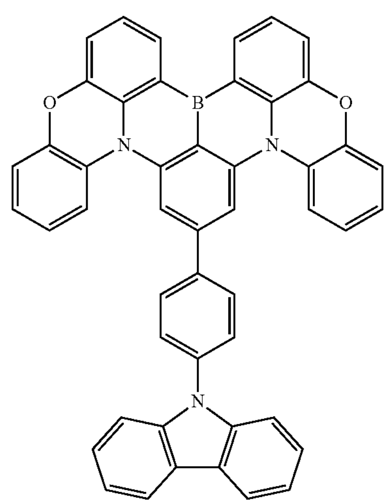

-continued
(1-461)
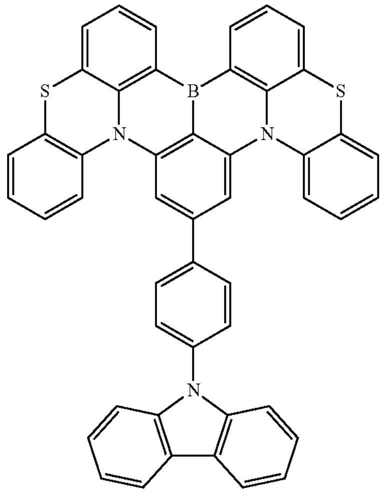
(1-462)
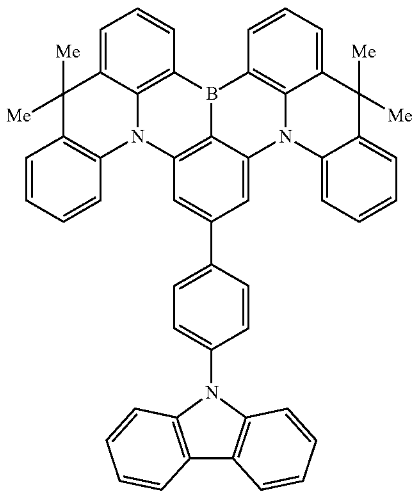
(1-1401)
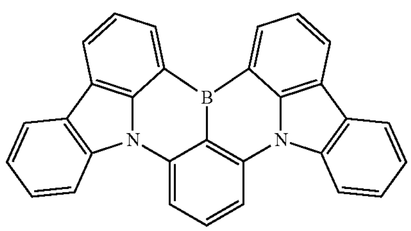
(1-1402)
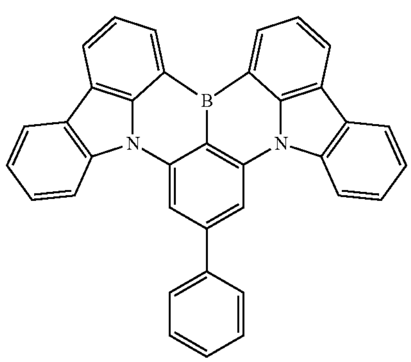
-continued
(1-1404)
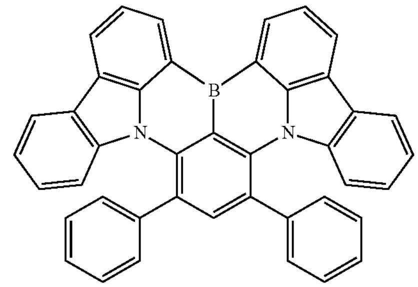
(1-1405)
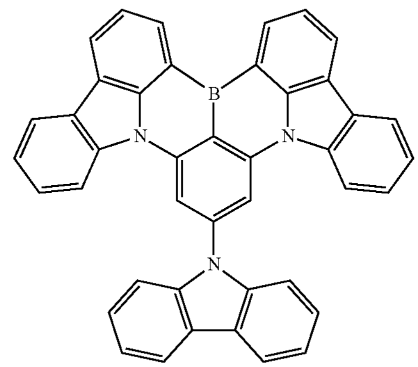
(1-1406)
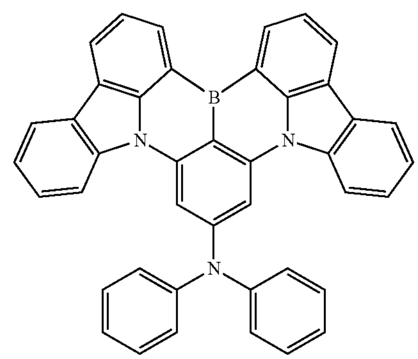
(1-1407)
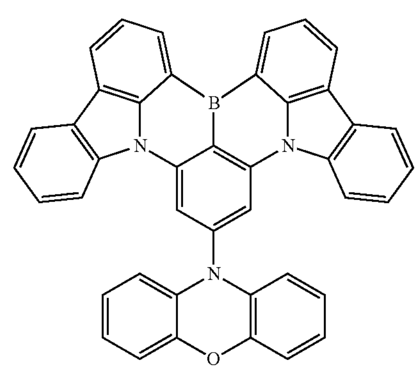

-continued
(1-1408)
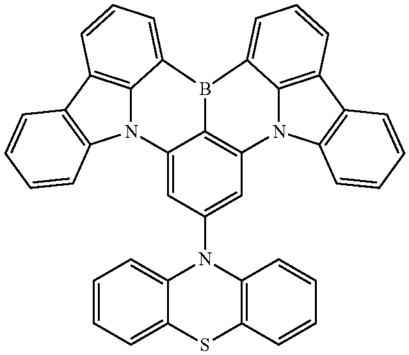
(1-1409)
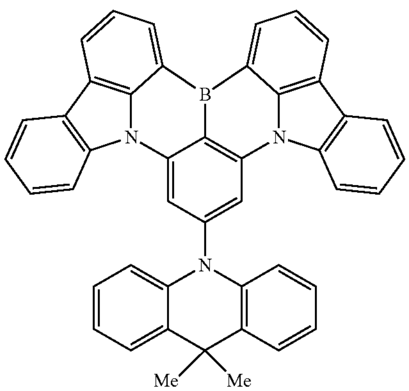
(1-1410)
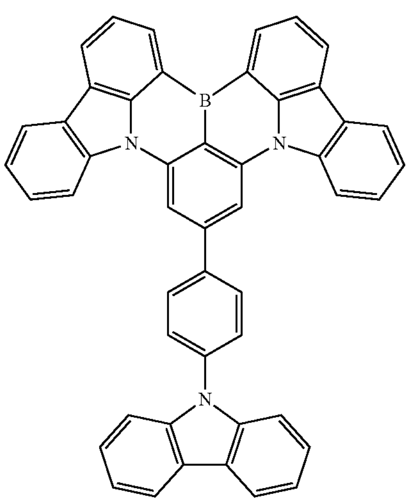
-continued
(1-1411)
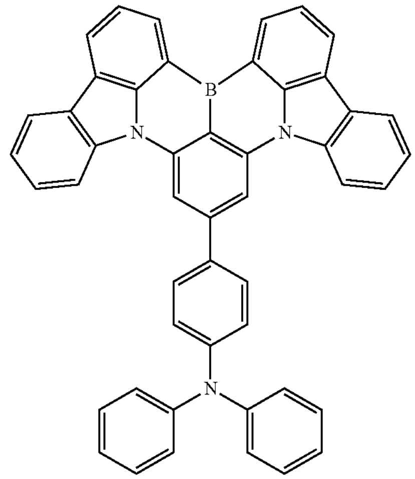
(1-1412)
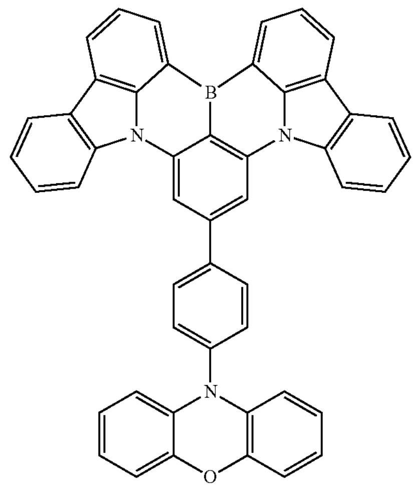
(1-1413)
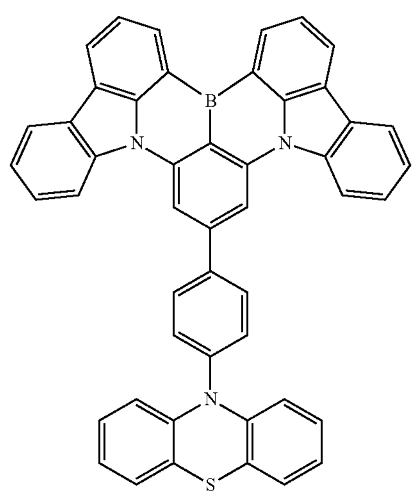

-continued
(1-1414)
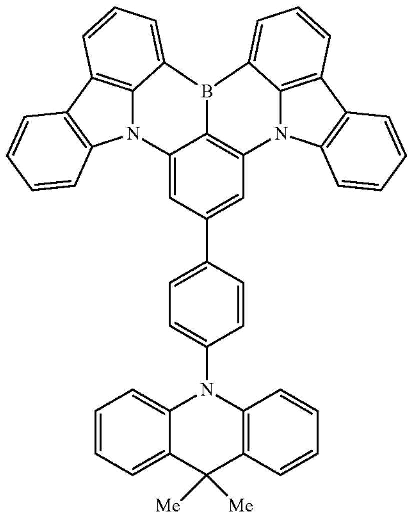
(1-1424)
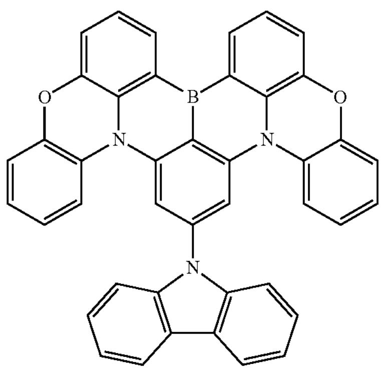
(1-1425)
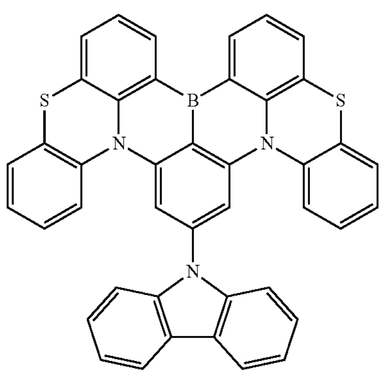
(1-1426)
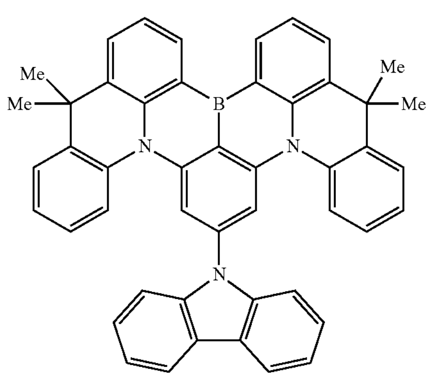
-continued
(1-1427)
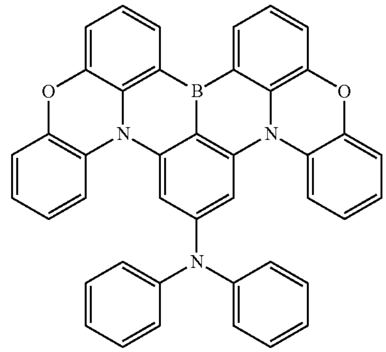
(1-1428)
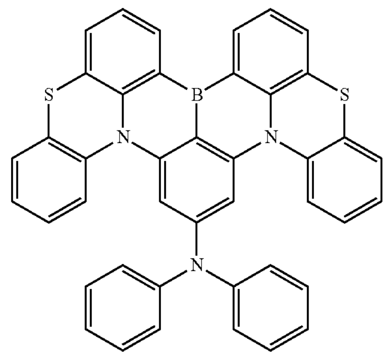
(1-1429)
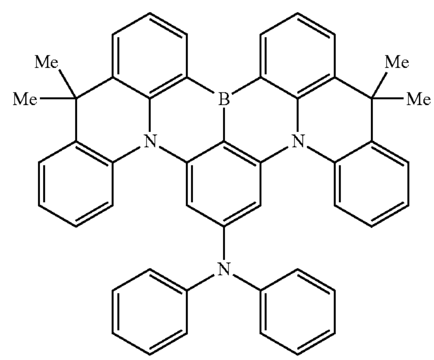
(1-1430)
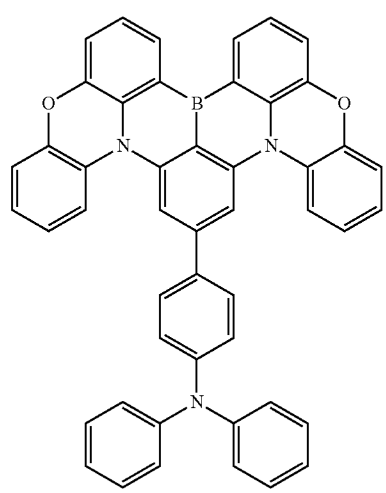

(1-1431)
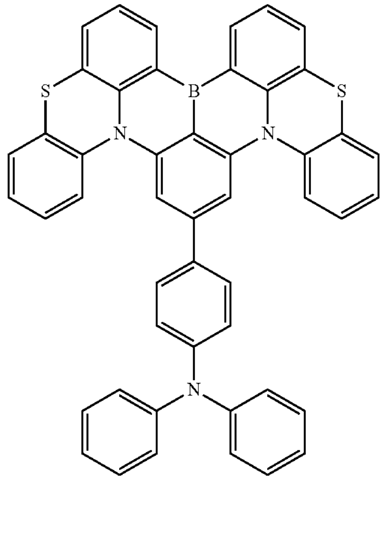
(1-1432)
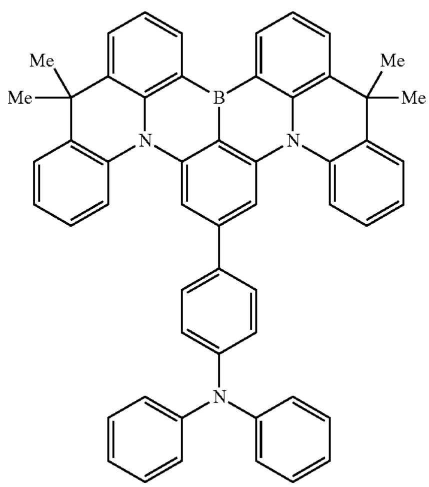
(1-1433)
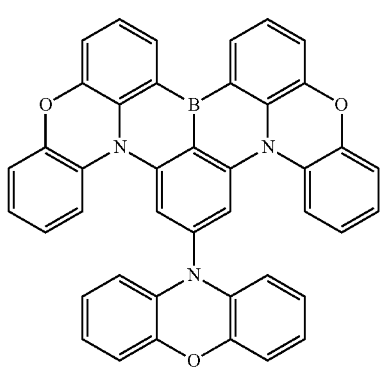
(1-1434)
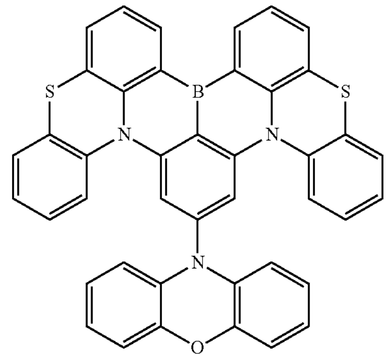
(1-1435)
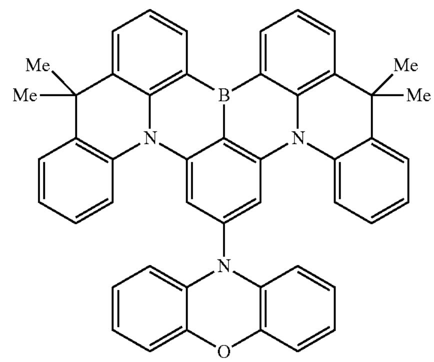
(1-1436)
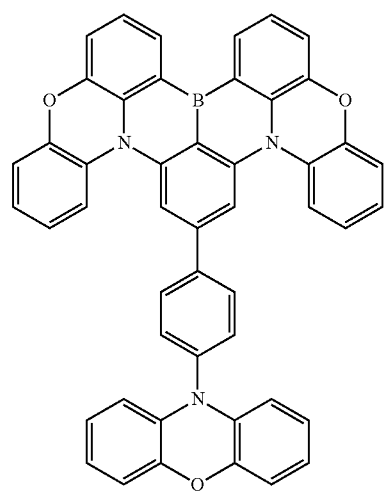

-continued
(1-1437)
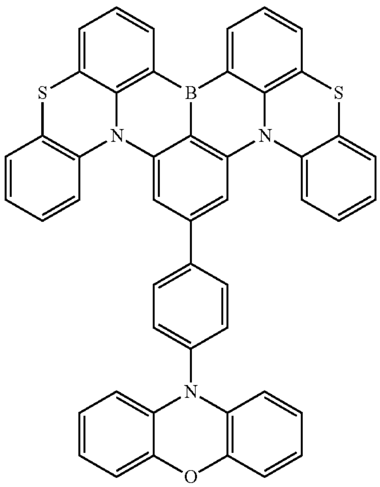
(1-1438)
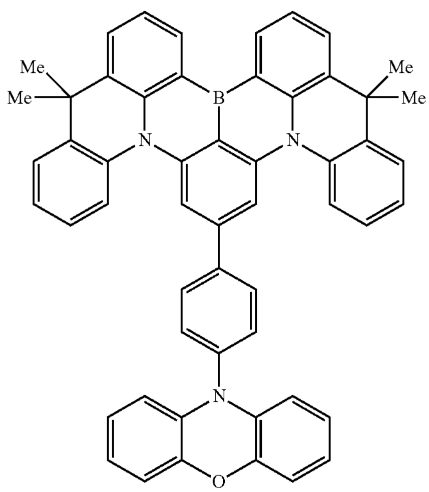
(1-1439)
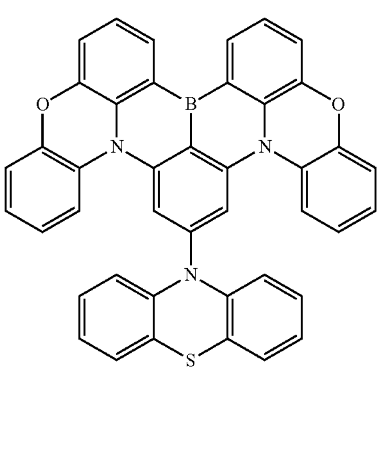
-continued
(1-1450)
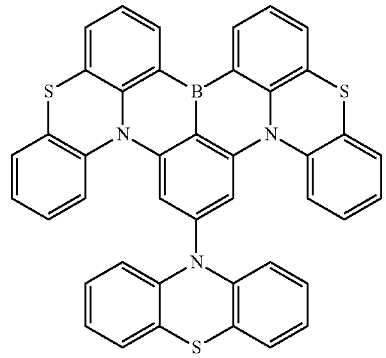
(1-1451)
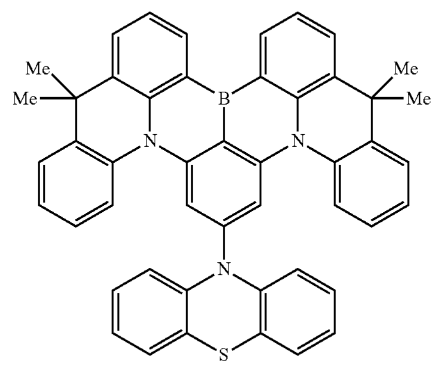
(1-1452)
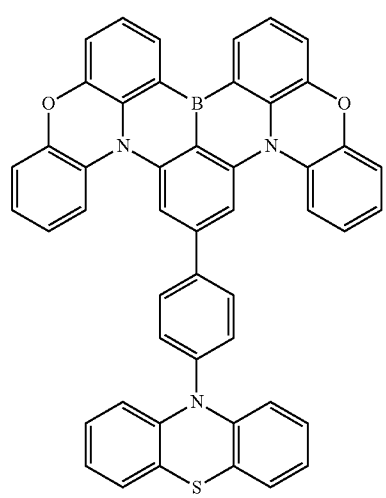

-continued
(1-1453)
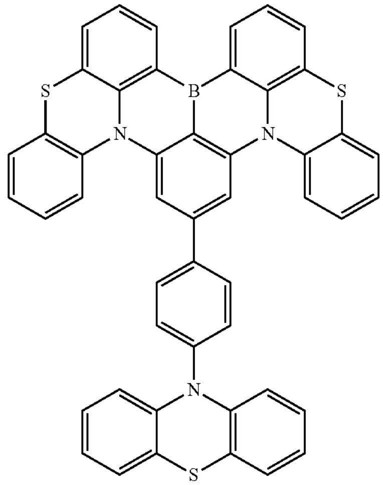
(1-1454)
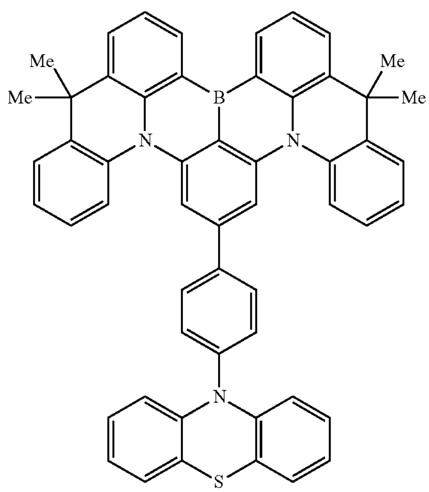
(1-1455)
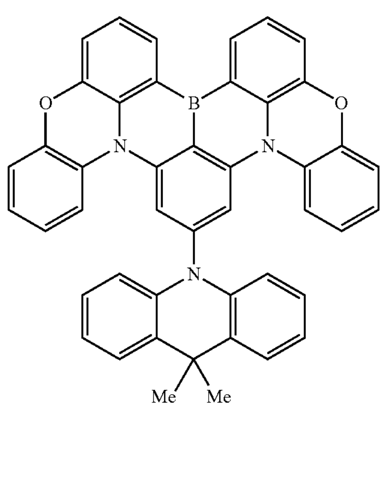
-continued
(1-1456)
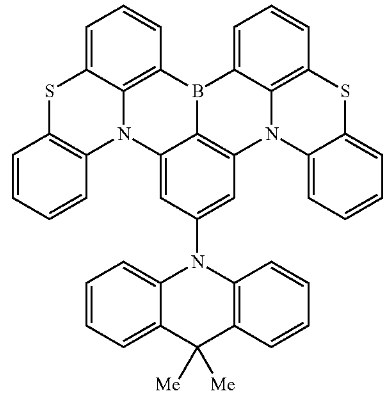
(1-1457)
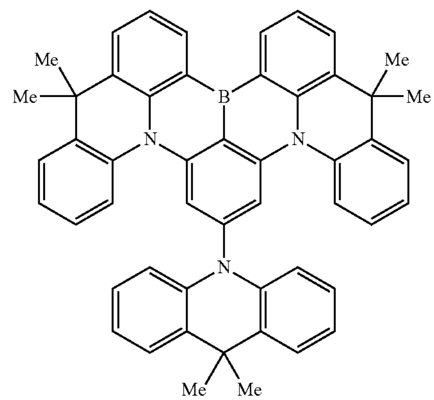
(1-1458)
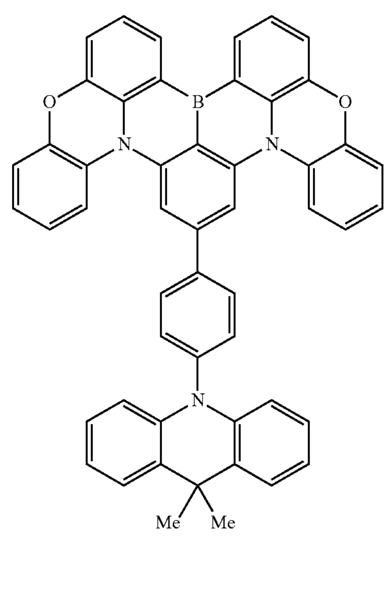

-continued
(1-1459)
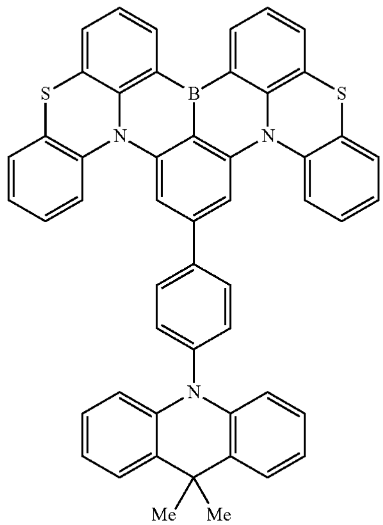
(1-1460)
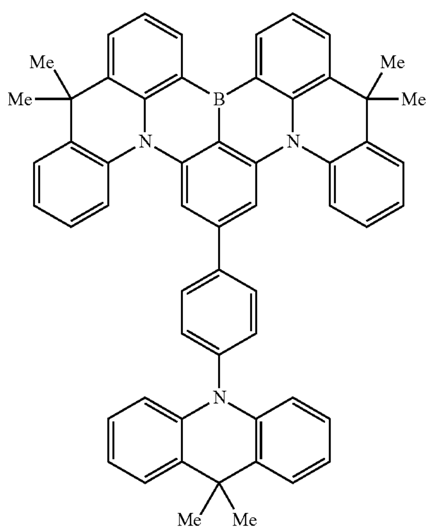
(1-471)
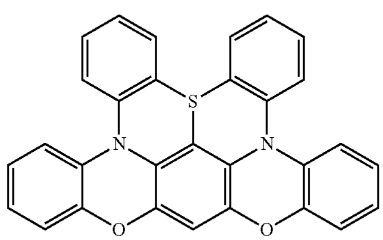
(1-472)
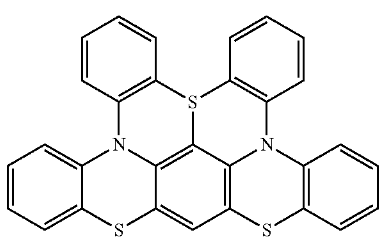
-continued
(1-473)
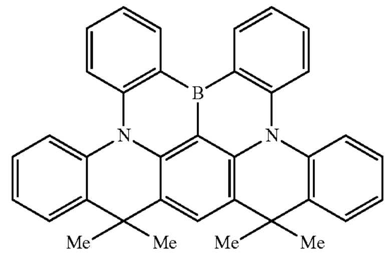
(1-477)
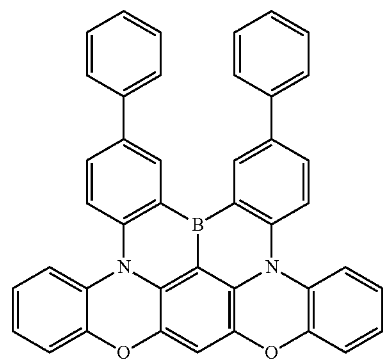
(1-478)
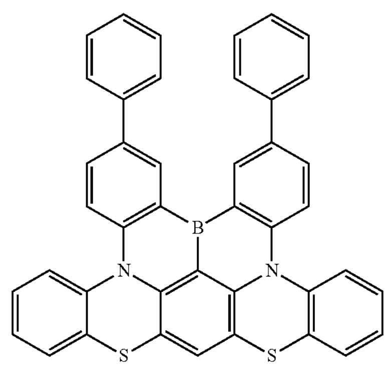
(1-479)
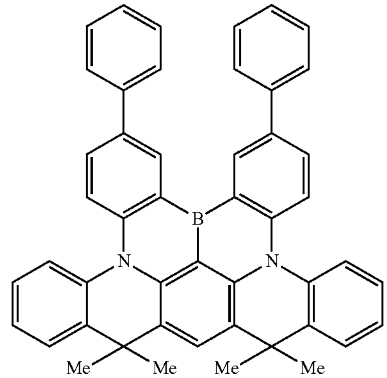

-continued
(1-1151)
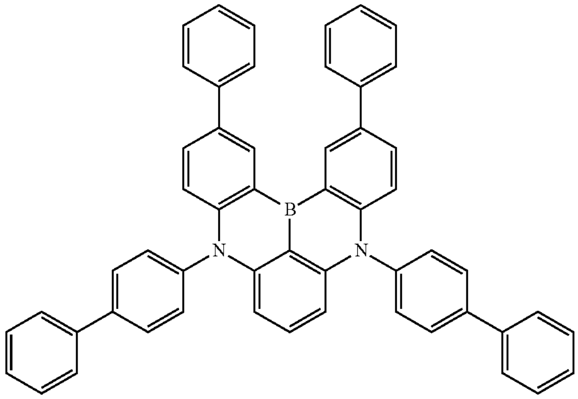
(1-1152)
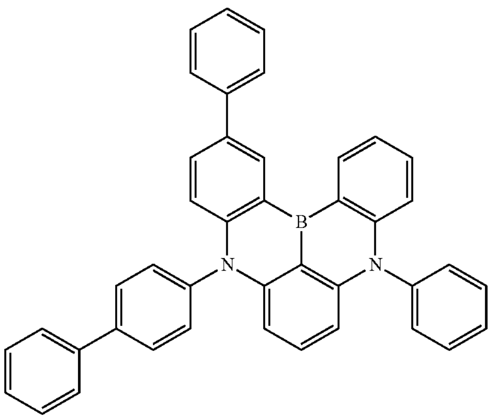
(1-1159)
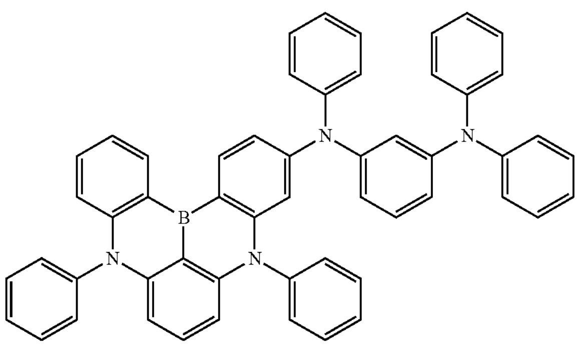
(1-1160)
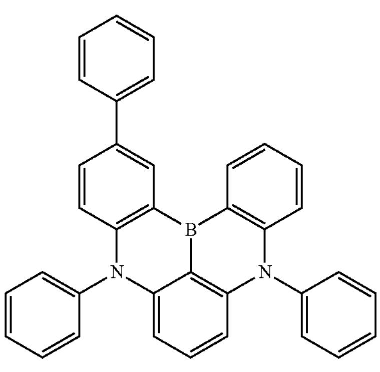
-continued
(1-1201)
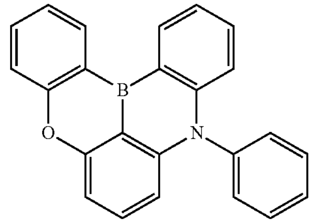
(1-1203)
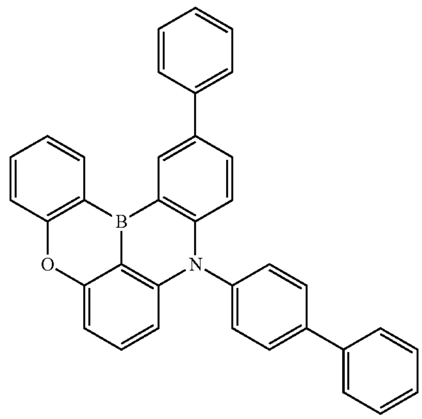
(1-1204)
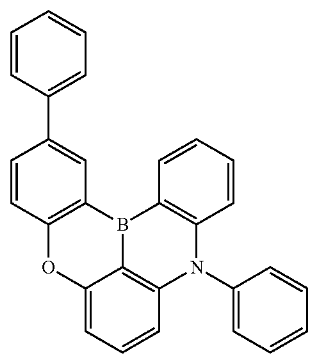
(1-1205)
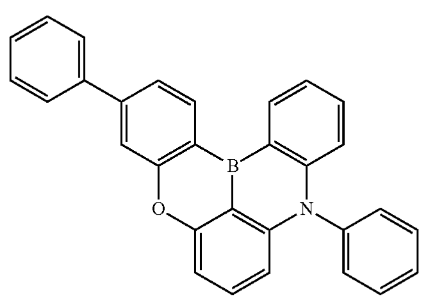

-continued
(1-1206)
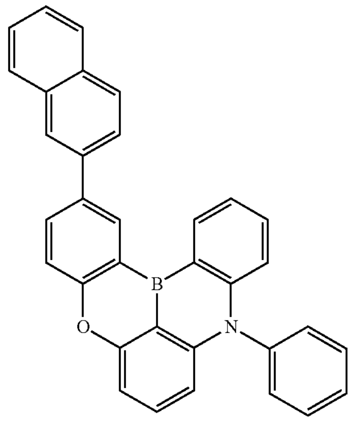
(1-1210)
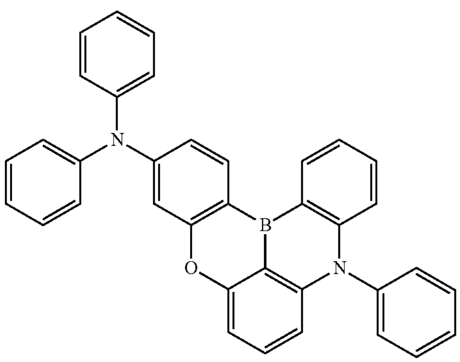
(1-1273)
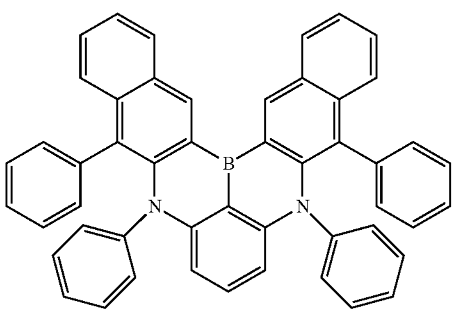
(1-1274)
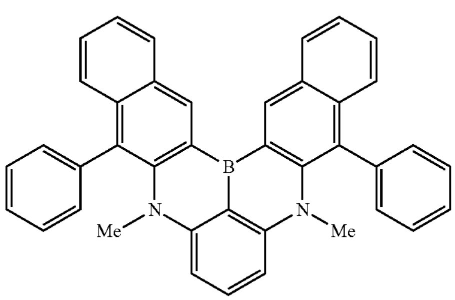
-continued
(1-1280)
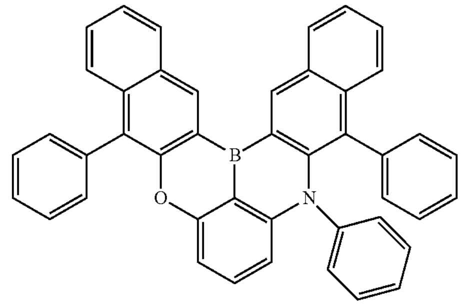
(1-1281)
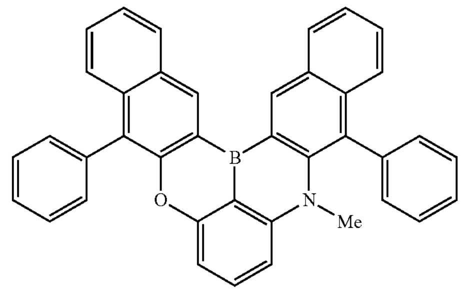
(1-2622)
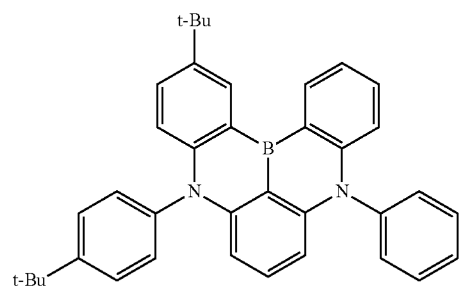
(1-2623)
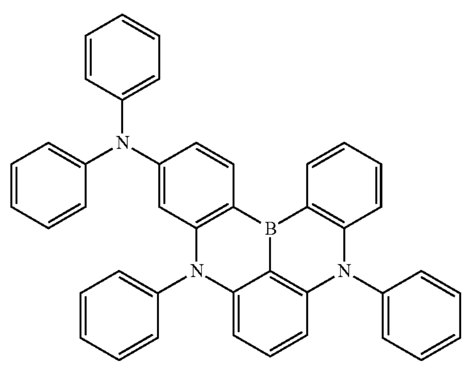
(1-2624)
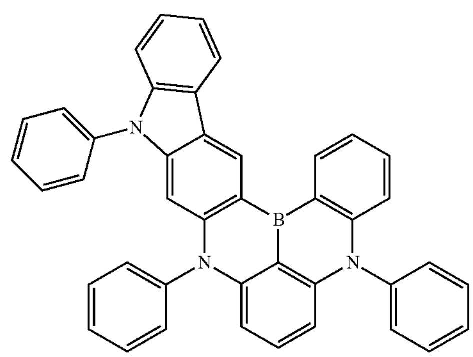

(1-2625)
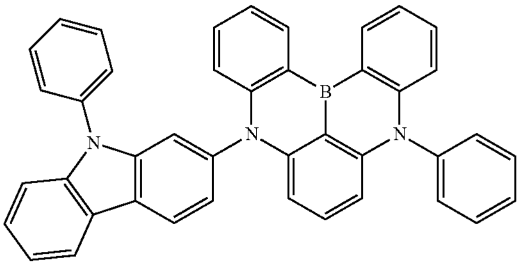
(1-2626)
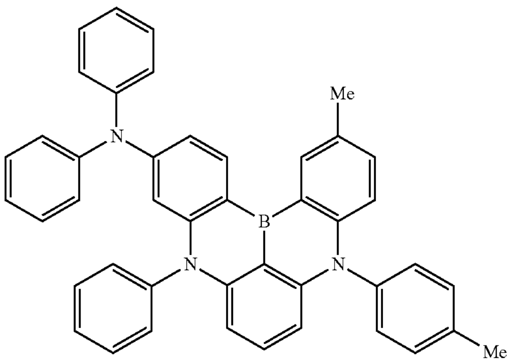
(1-2629)
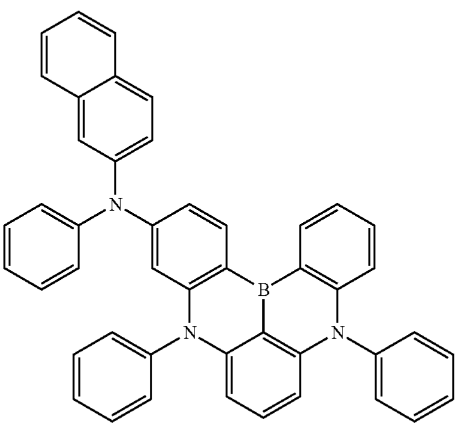
(1-2630)
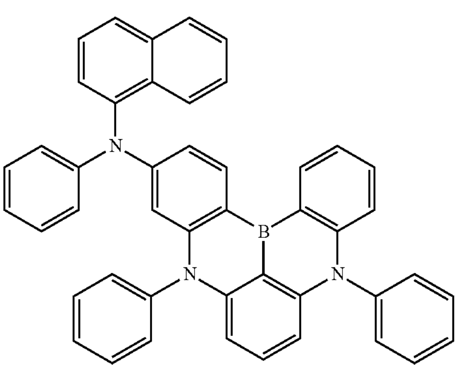
(1-2635)
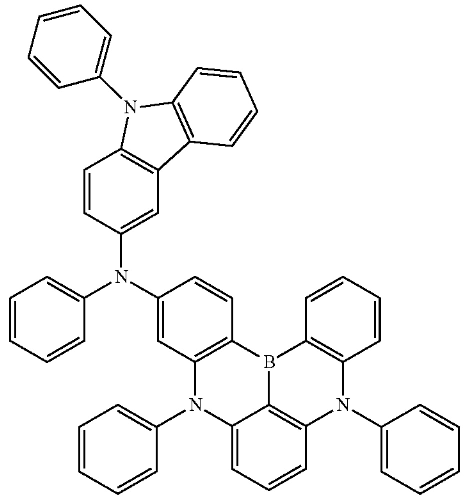
(1-2636)
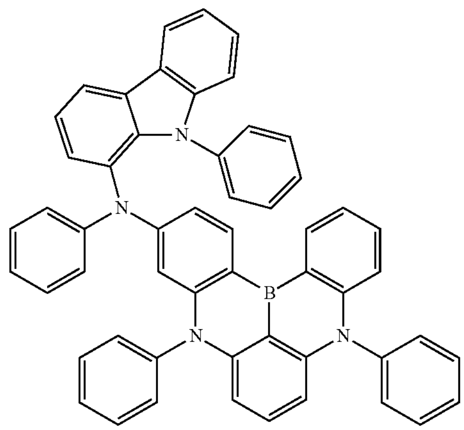
(1-2641)
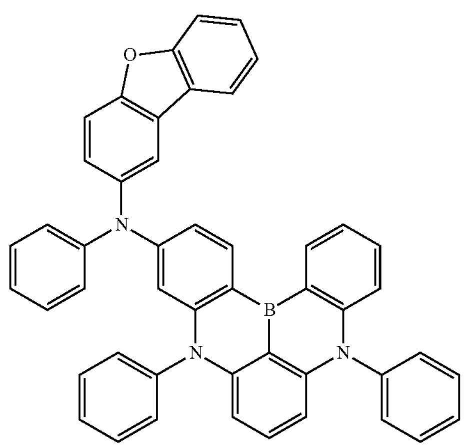

-continued
(1-2642)
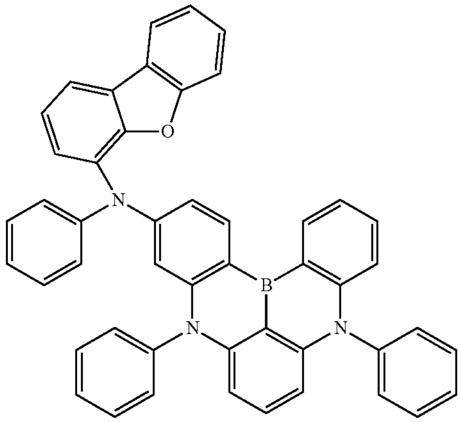
(1-2647)
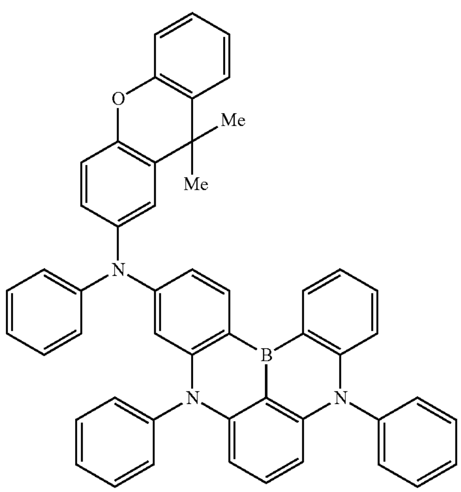
(1-2648)
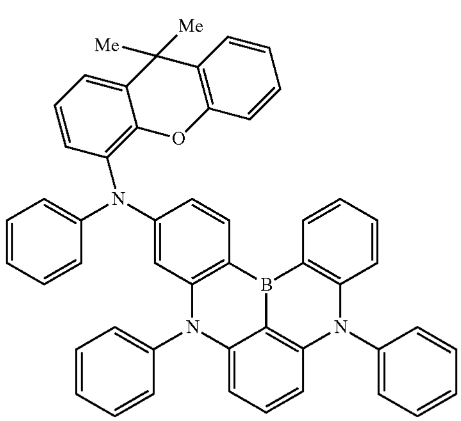
-continued
(1-2653)
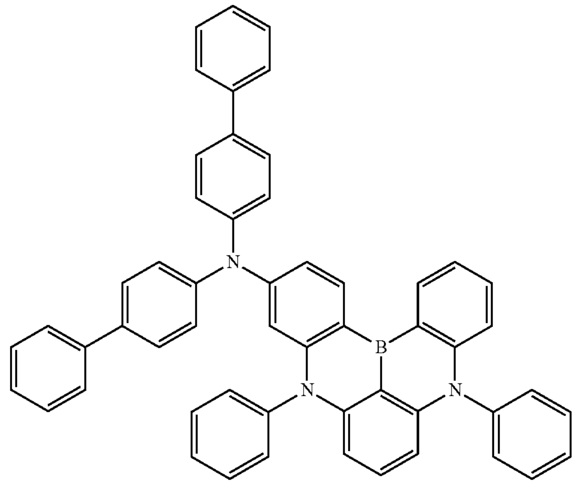
(1-2657)
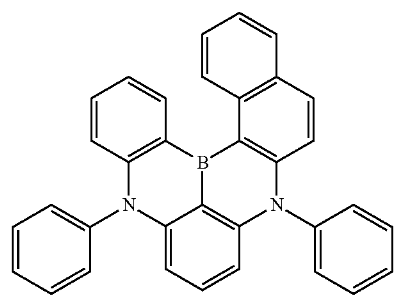
(1-2660)
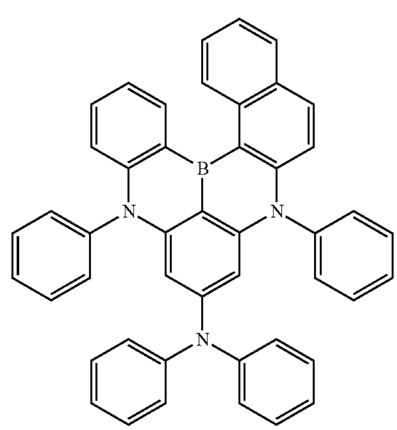

-continued
(1-2661)
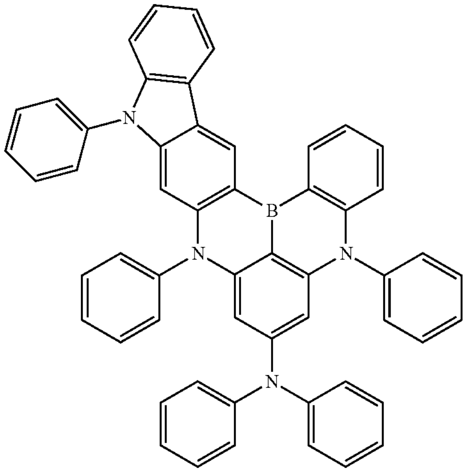
(1-2663)
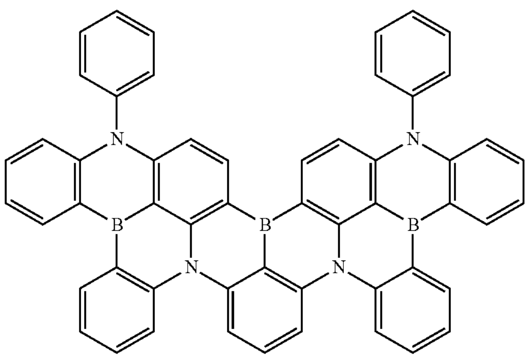
(1-2664)
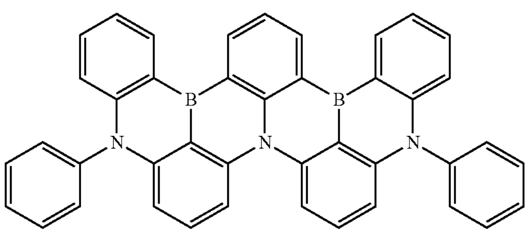
(1-2665)
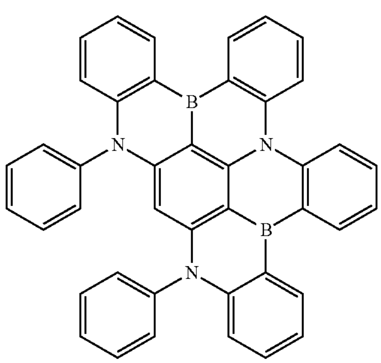
-continued
(1-2666)
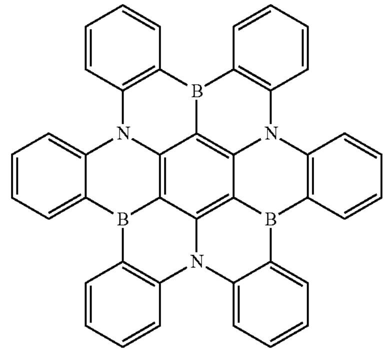
(1-2667)
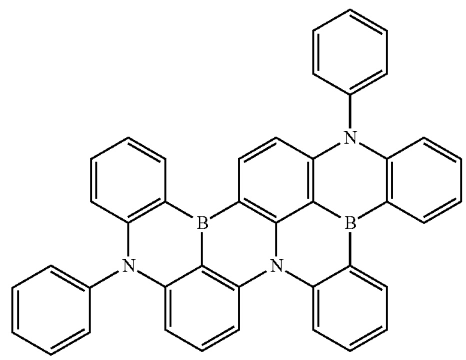
(1-2668)
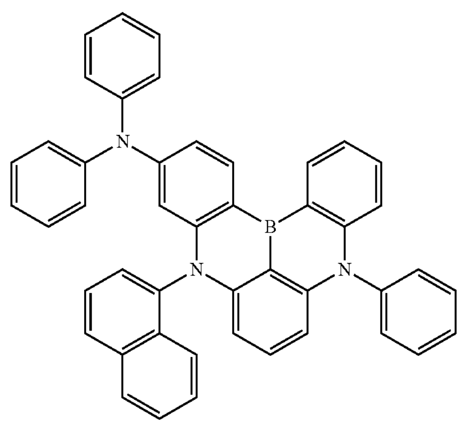
(1-2669)
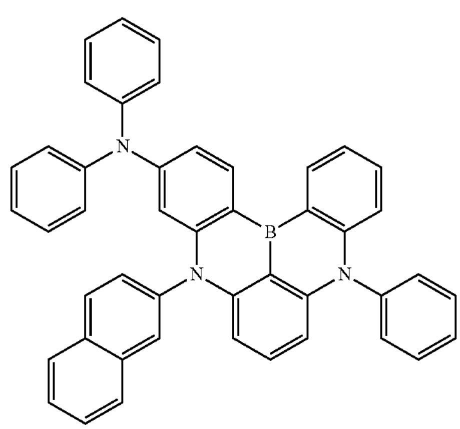

-continued
(1-2670)
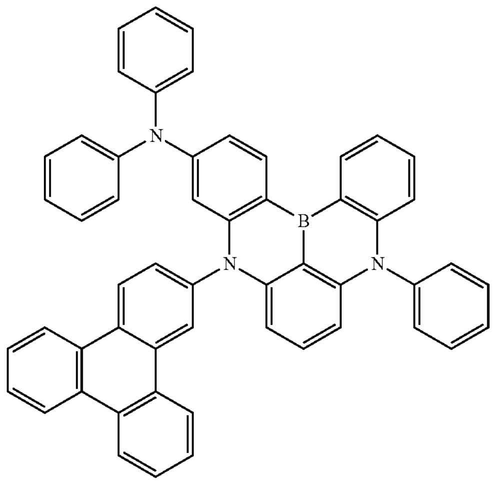
(1-2671)
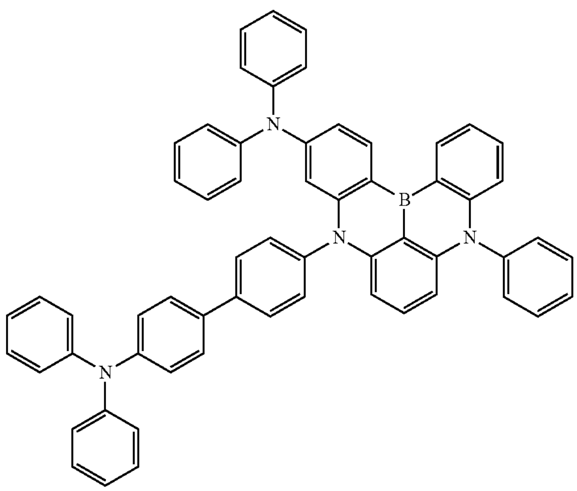
(1-2676)
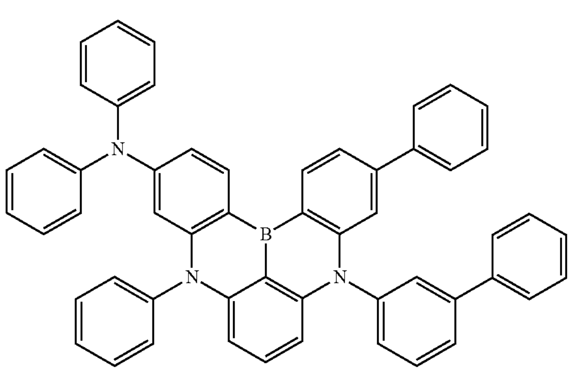
-continued
(1-2677)
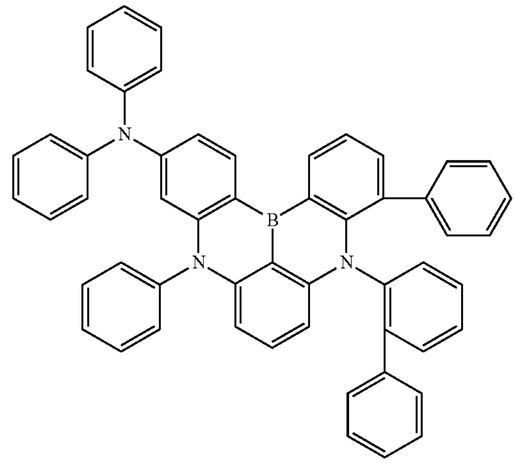
(1-2679)
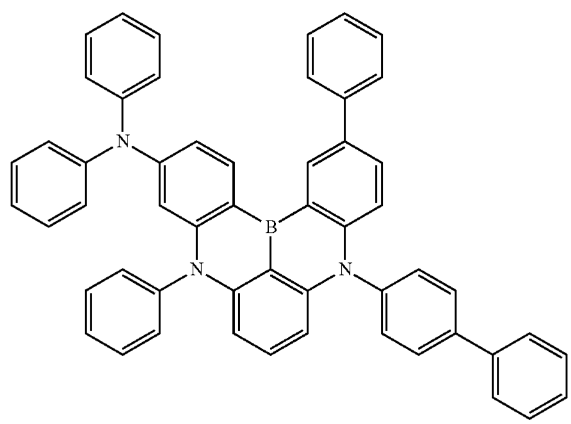
(1-2680)
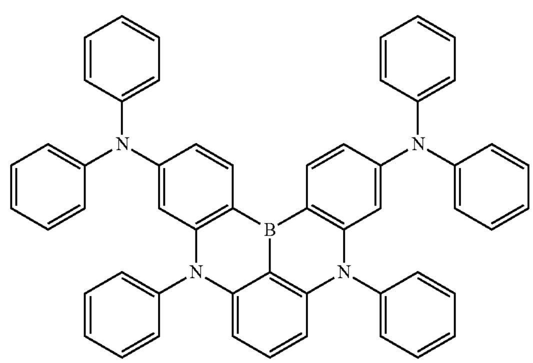

-continued
(1-2681)
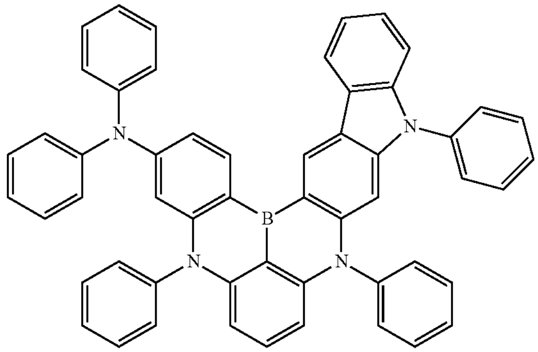
(1-2682)
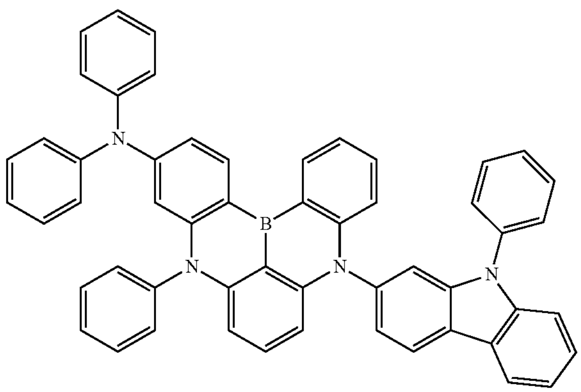
(1-2683)
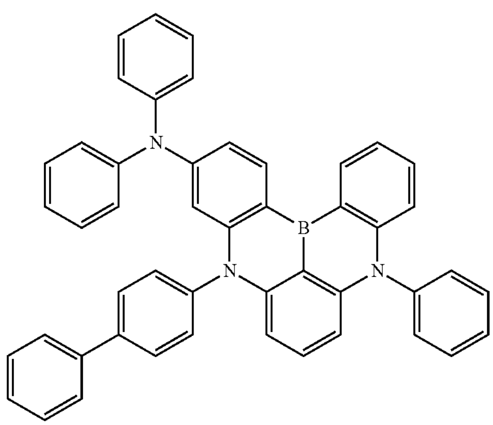
(1-2684)
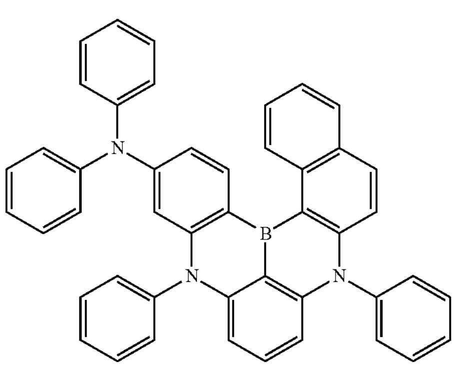
-continued
(1-2686)
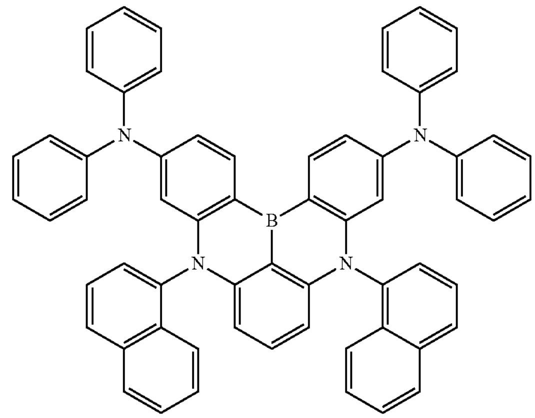
(1-2690)
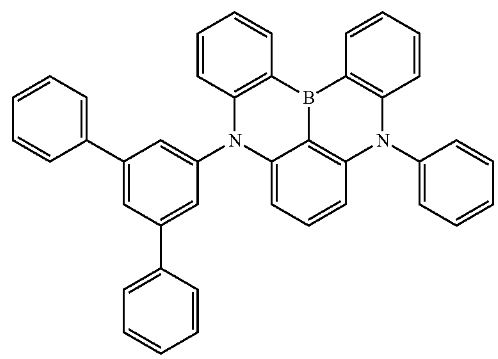
(1-2691)
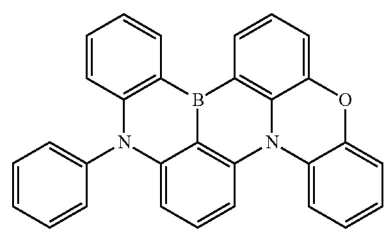
(1-2692)
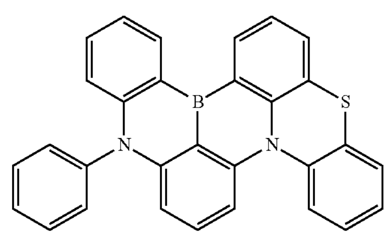
(1-2693)
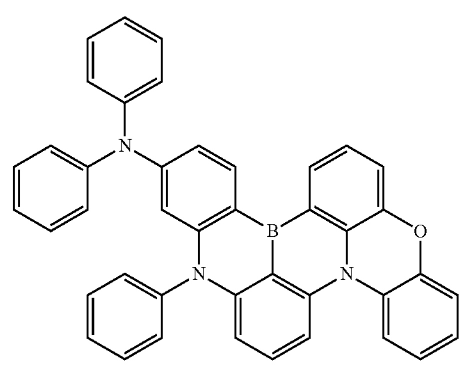

-continued
(1-2694)
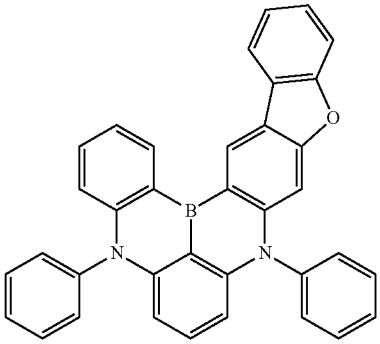
(1-2695)
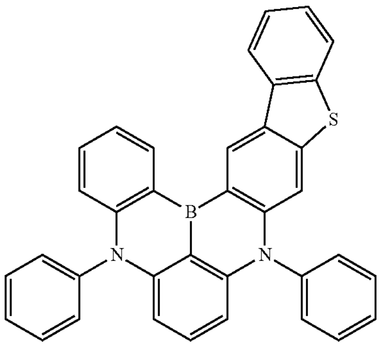
(1-2696)
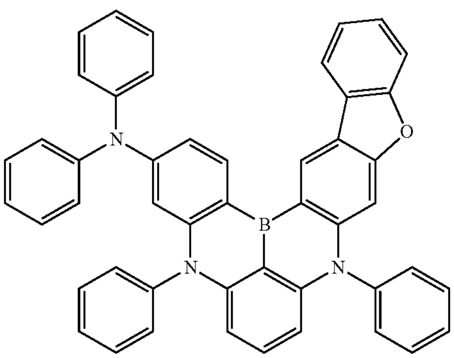
(1-2697)
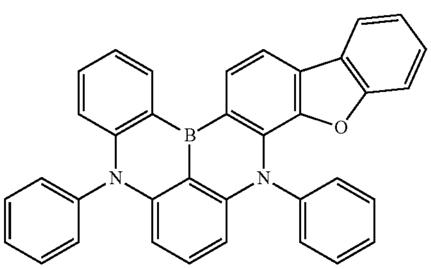
(1-2698)
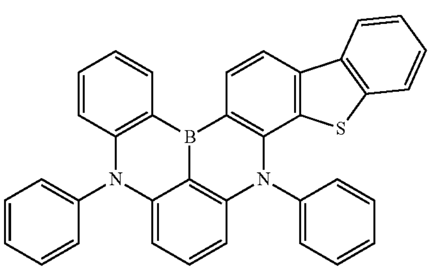
-continued
(1-2699)
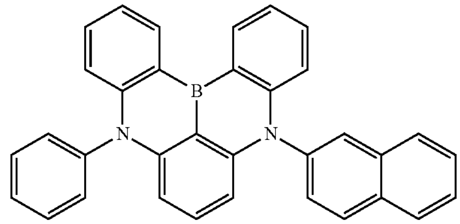
(1-3831)
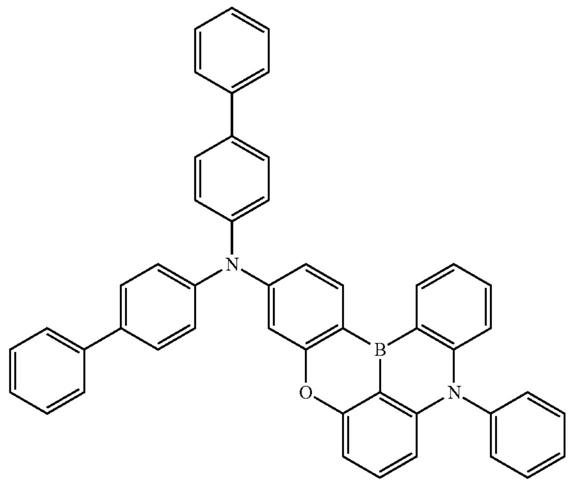
(1-3841)
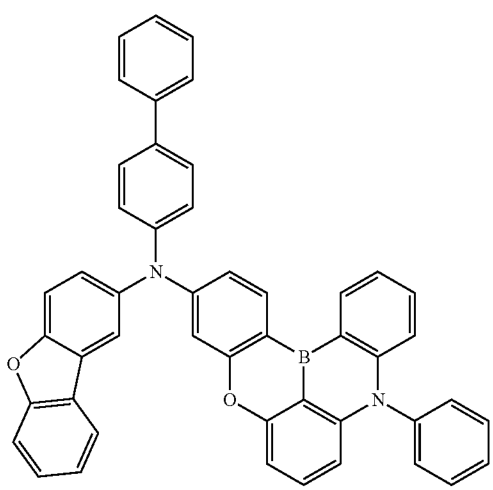

-continued
(1-3842)
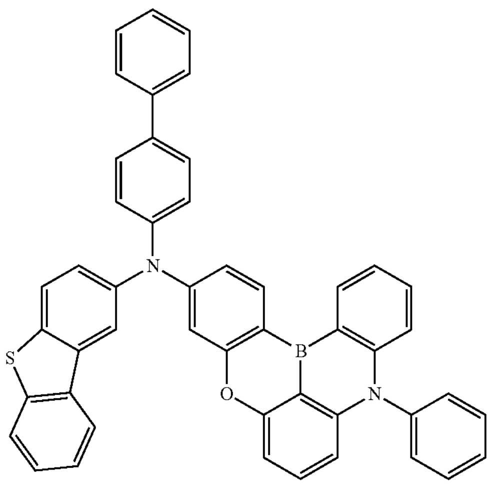
(1-3843)
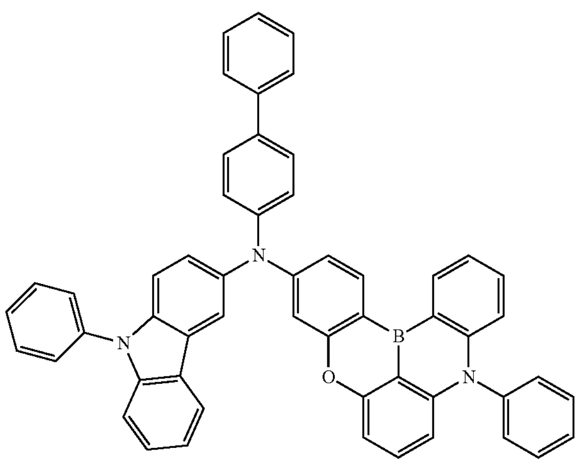
(1-3844)
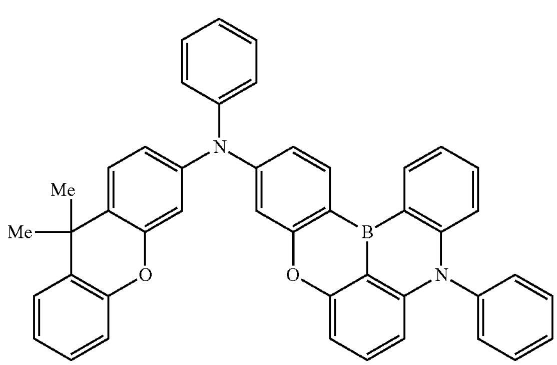
-continued
(1-3847)
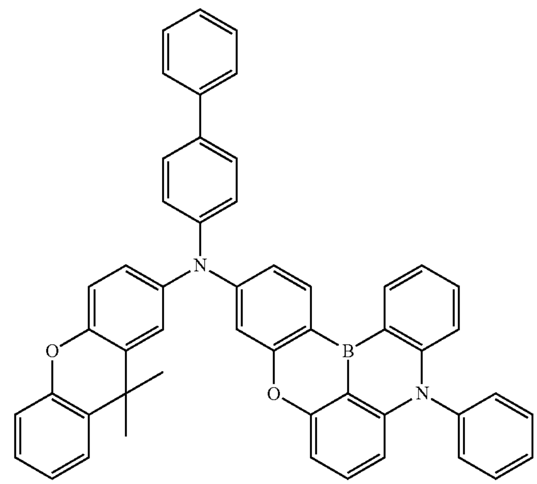
(1-3848)
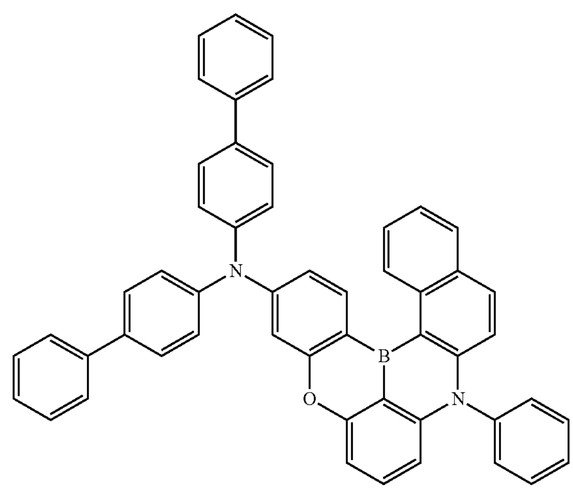
(1-3858)
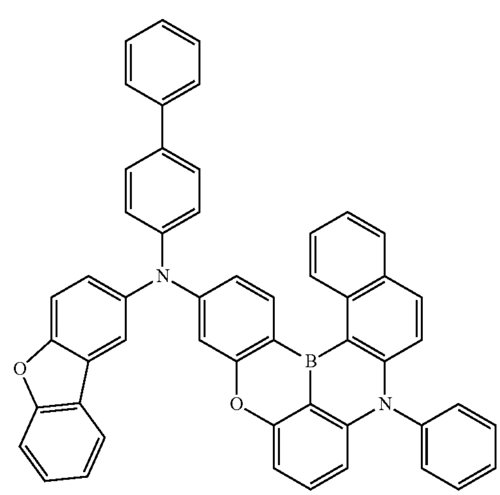

-continued
(1-3859)
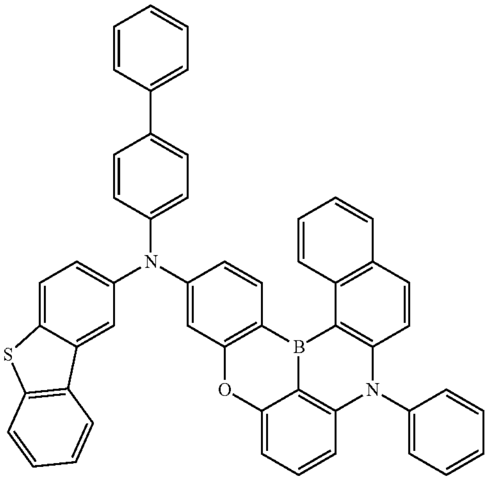
(1-3860)
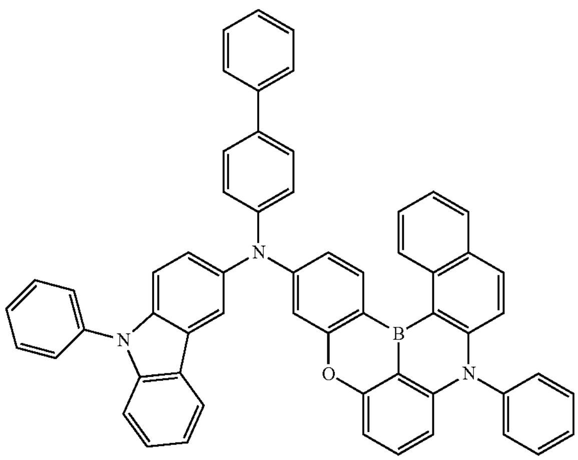
-continued
(1-3861)
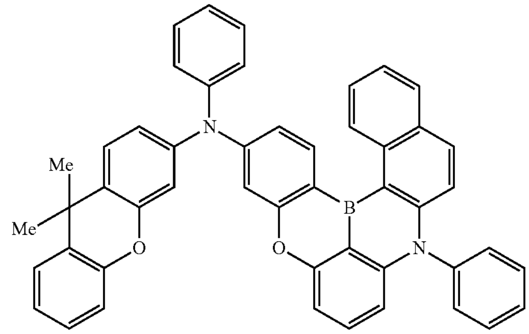
(1-3864)
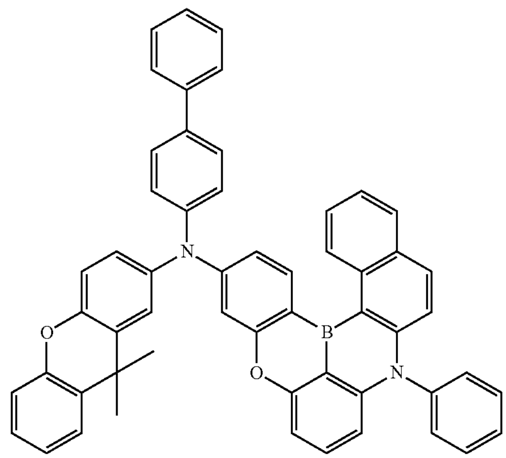
(1-3900)
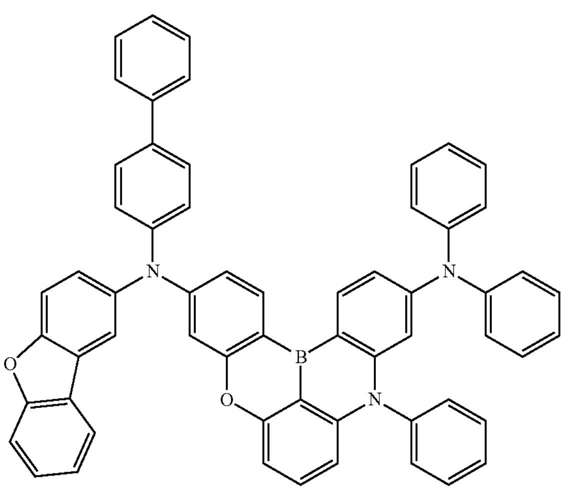
(1-3901)
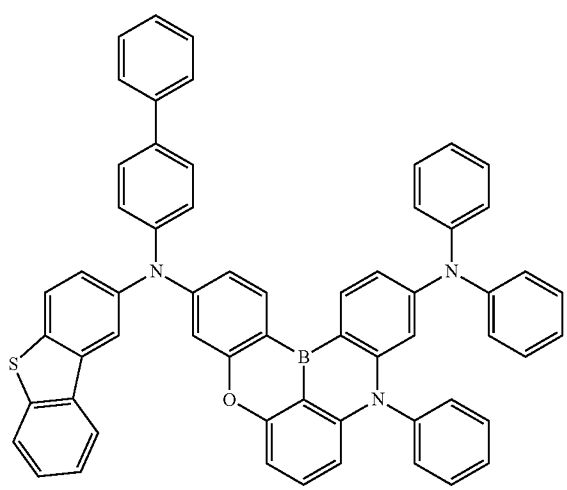

-continued
(1-3902)
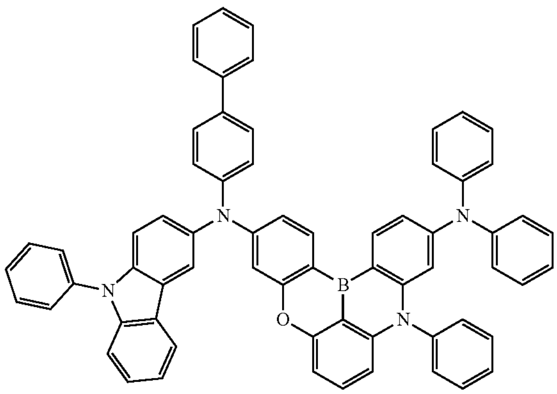
(1-3903)
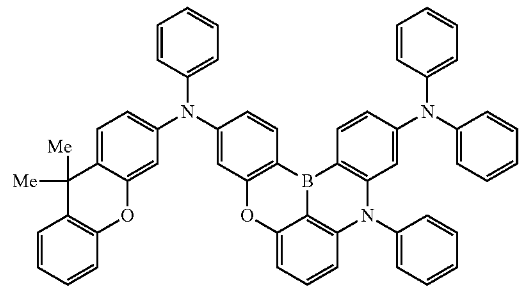
(1-3906)
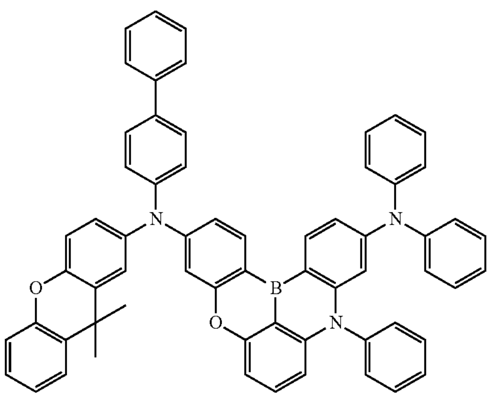
(1-3907)
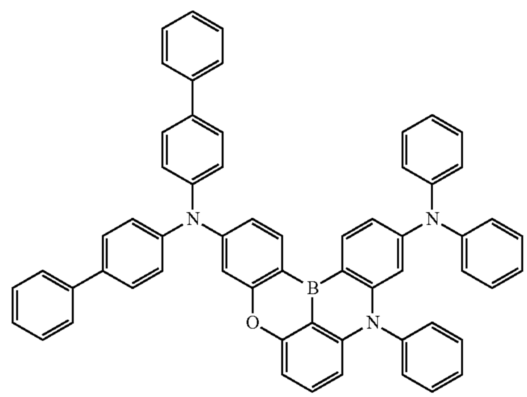
(1-3921)
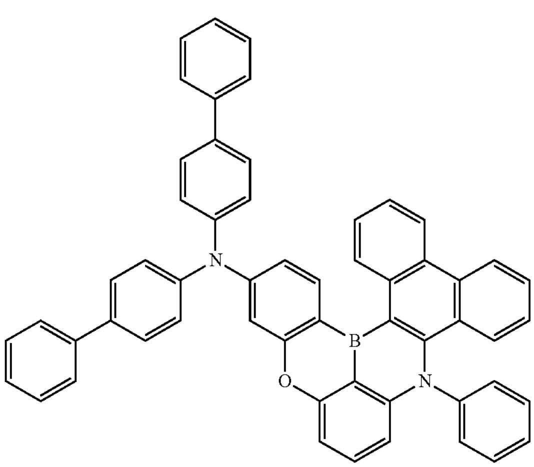
(1-3931)
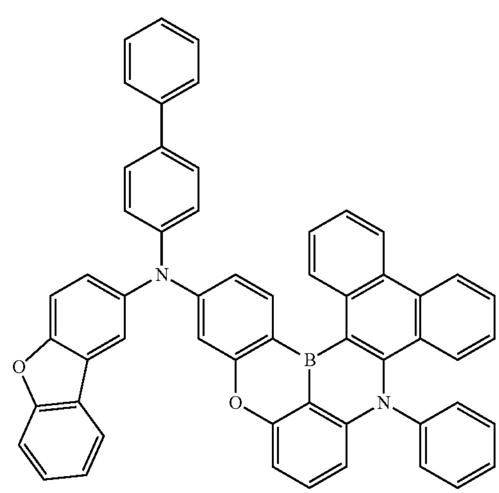

-continued
(1-3932)
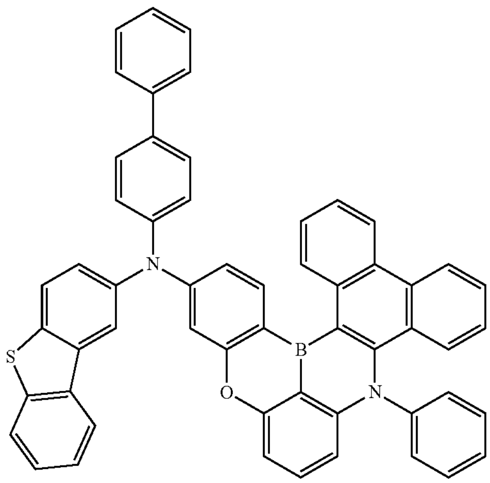
(1-3933)
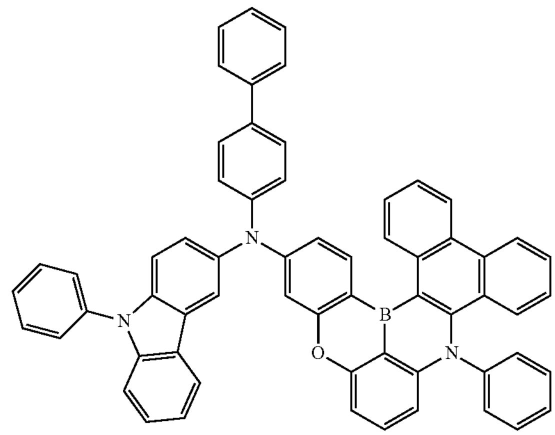
(1-3934)
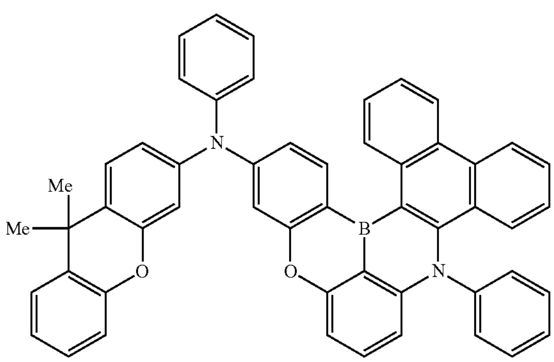
(1-3937)
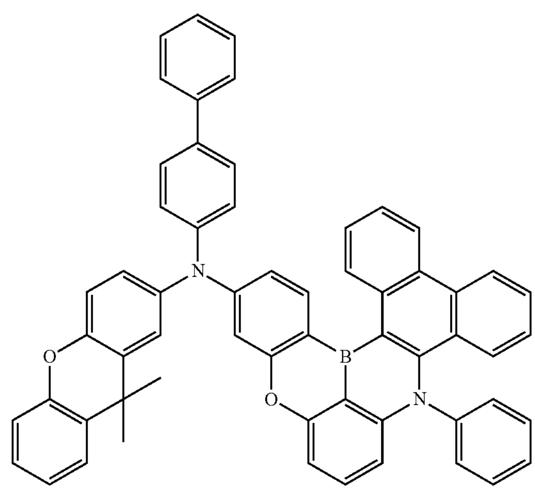
(1-3941)
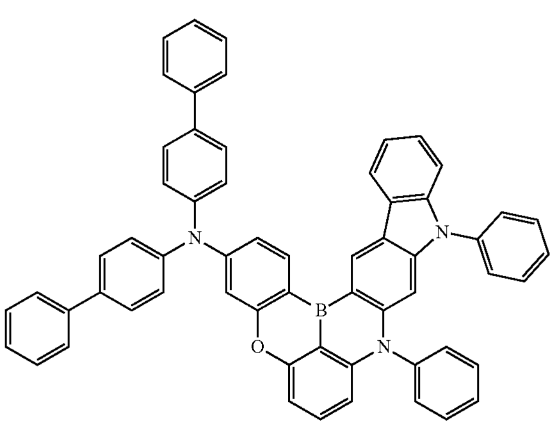
(1-3950)
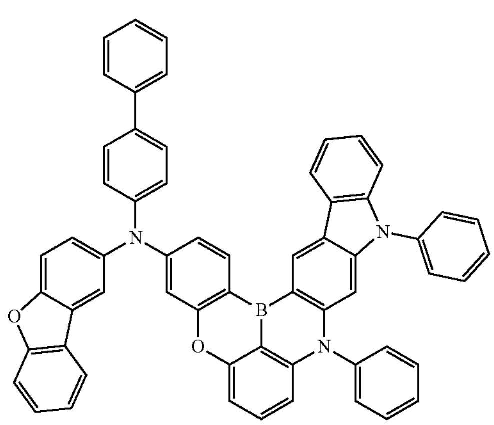

-continued
(1-3951)
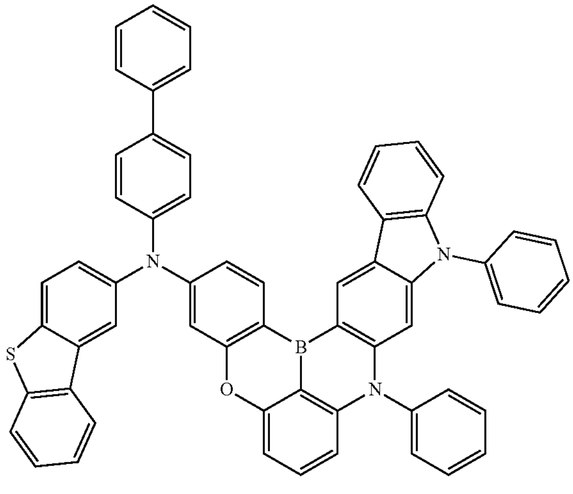
(1-3952)
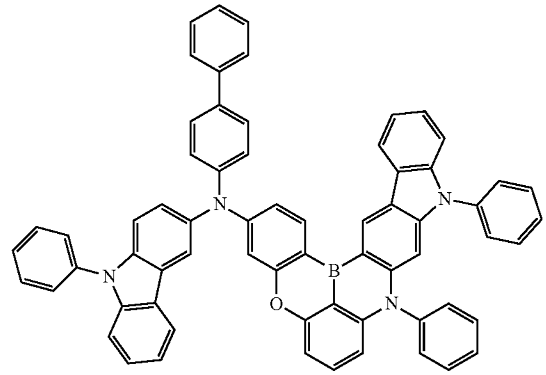
(1-3953)
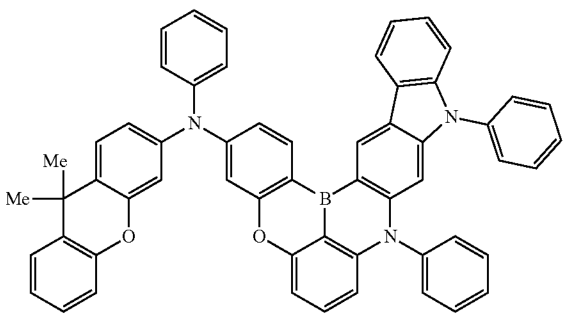
(1-3956)
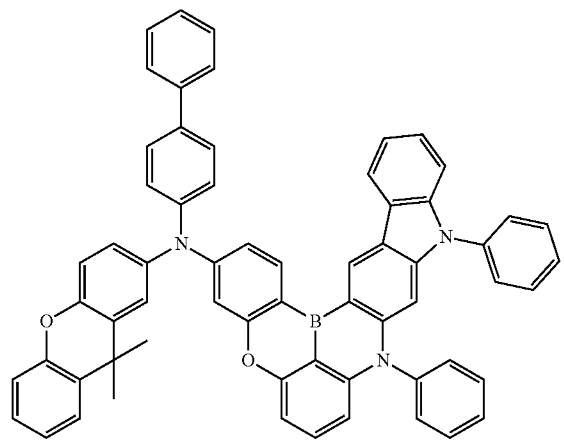
(1-3971)
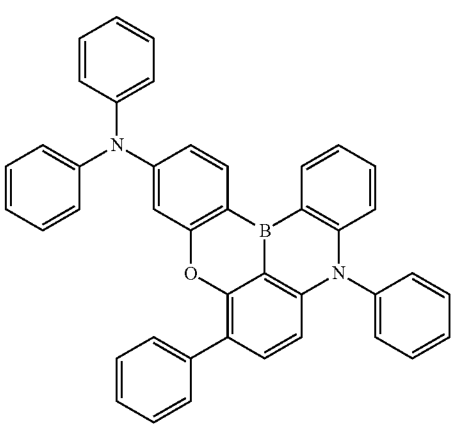
(1-3991)
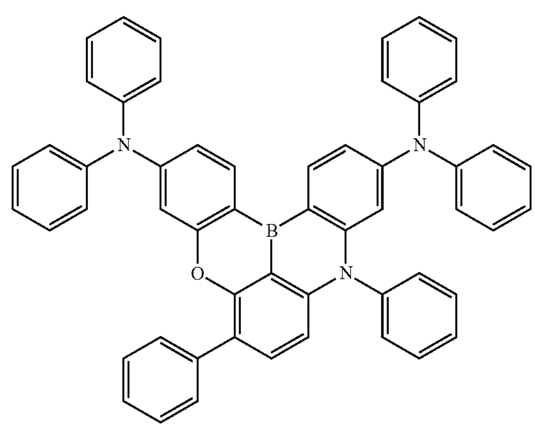

-continued
(1-4011)
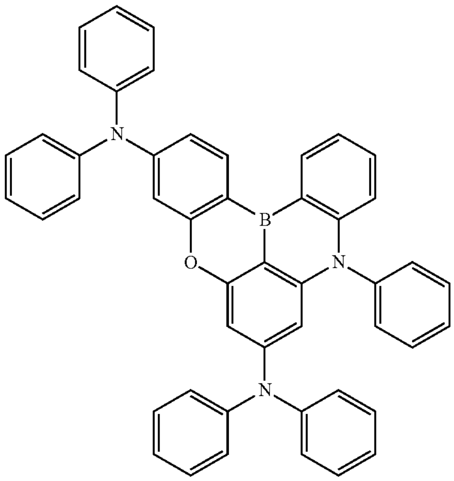
(1-4017)
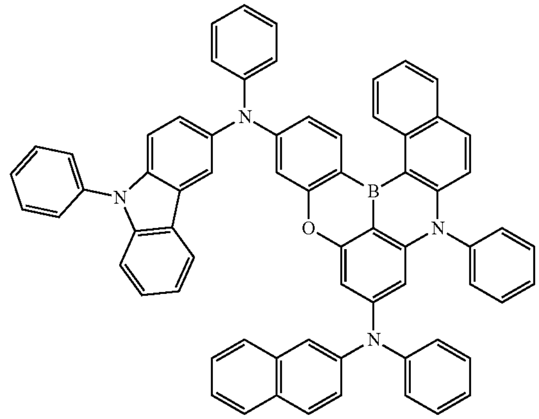
(1-4021)
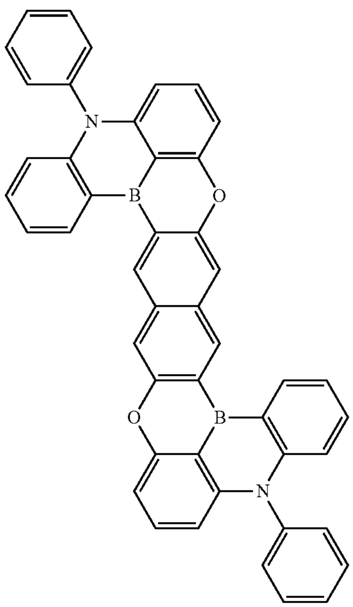
(1-4022)
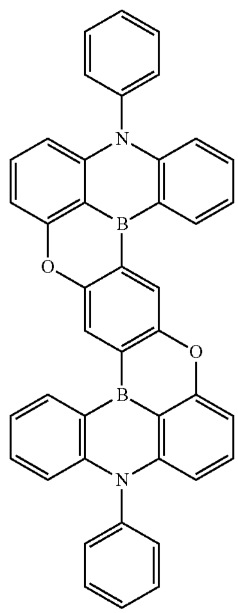
(1-4023)
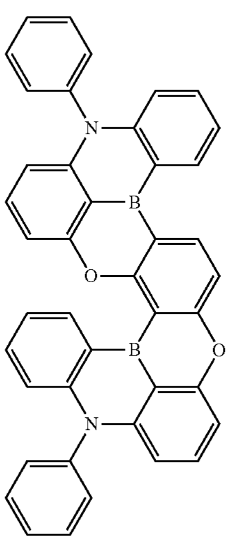
(1-4024)
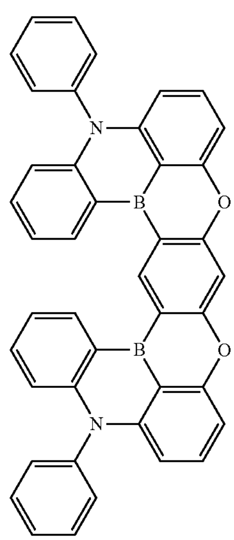

-continued
(1-4025)
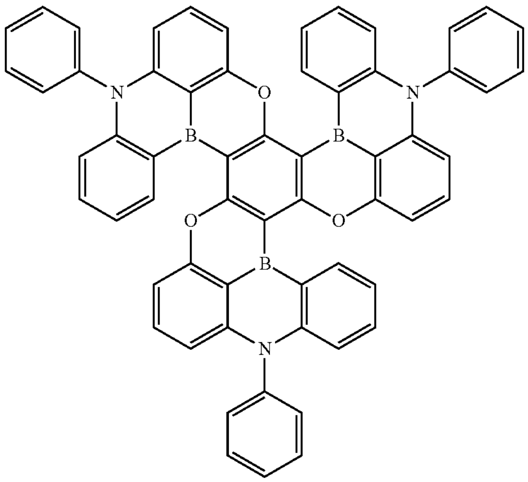
(1-4026)
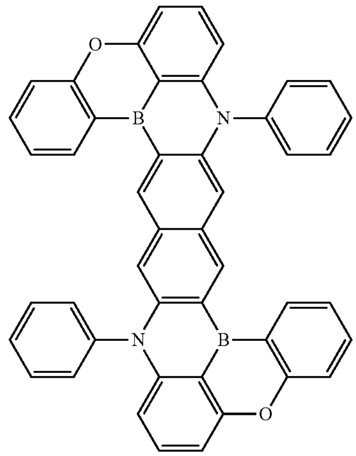
(1-4027)
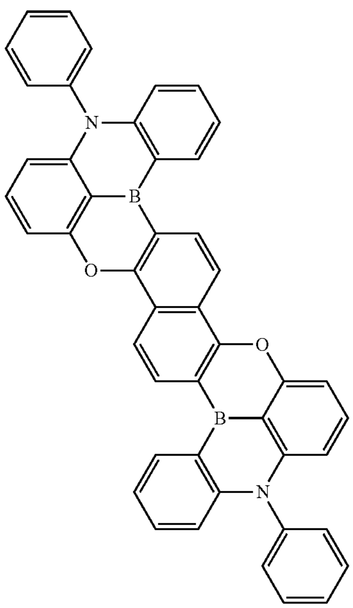
(1-4028)
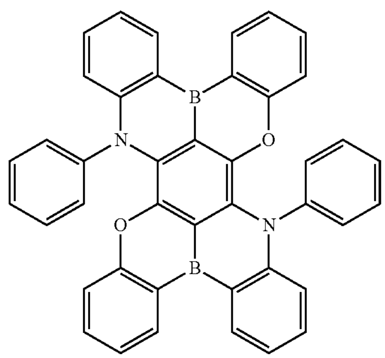
(1-4029)
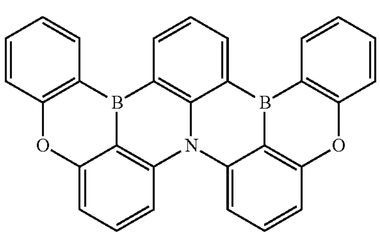
(1-4030)
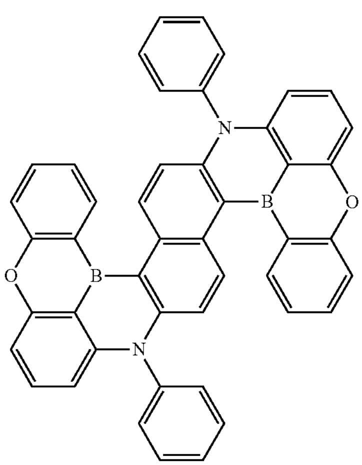

-continued
(1-4031)
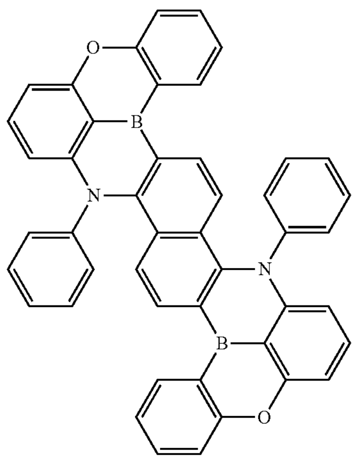
(1-4032)
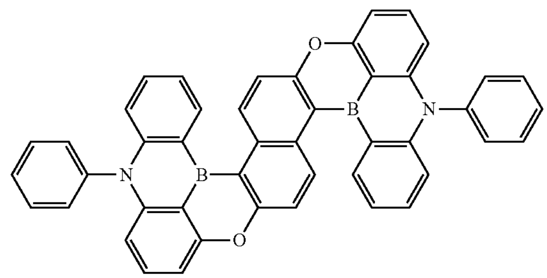
(1-4033)
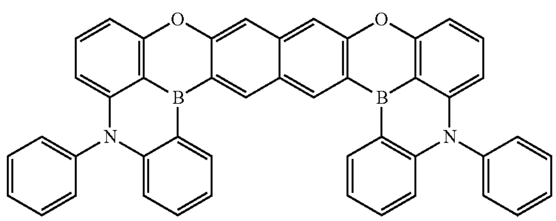
(FG-1-1)
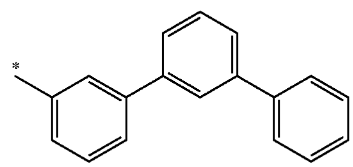
(FG-1-2)
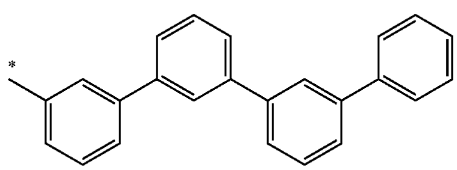
(FG-1-3)
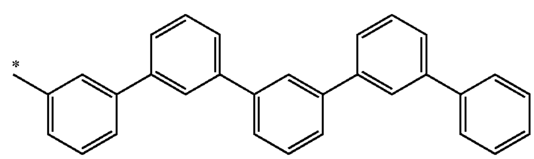
(FG-1-4)
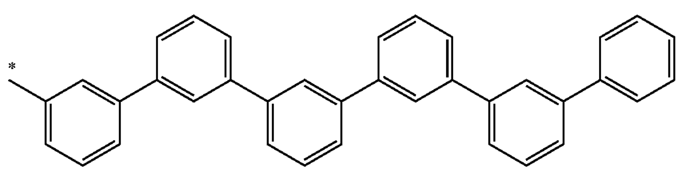
(FG-1-5)
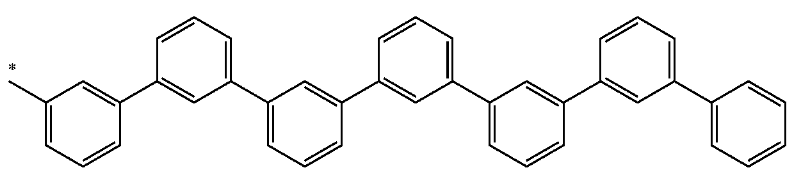
(FG-1-1001)
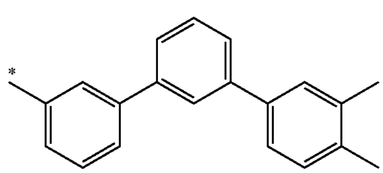
(FG-1-1002)
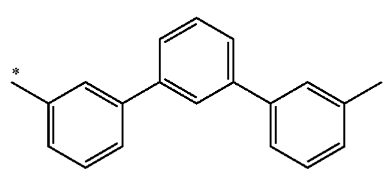
(FG-1-1003)
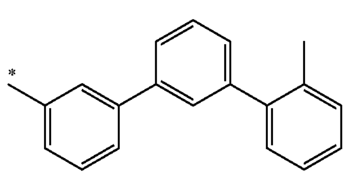
(FG-1-1004)
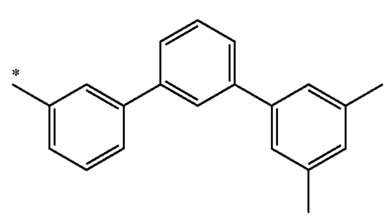

-continued
(FG-1-1005)
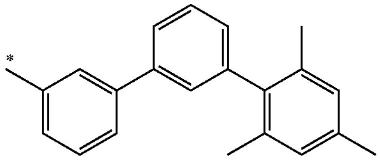
(FG-1-1006)
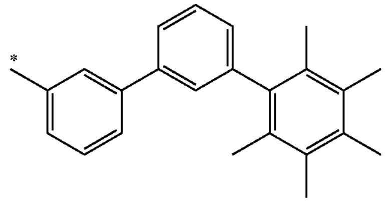
(FG-1-1021)
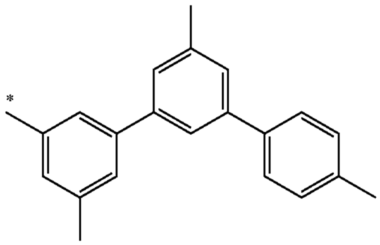
(FG-1-1022)
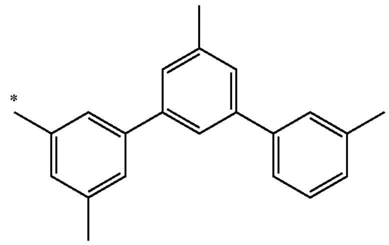
(FG-1-1023)
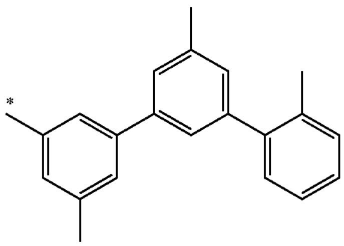
(FG-1-1024)
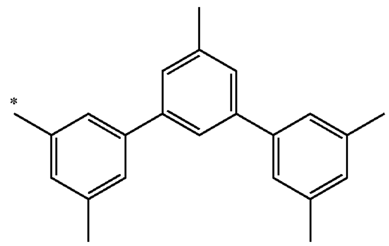
(FG-1-1025)
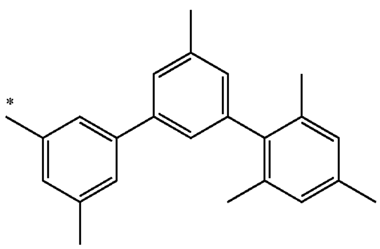
(FG-1-1026)
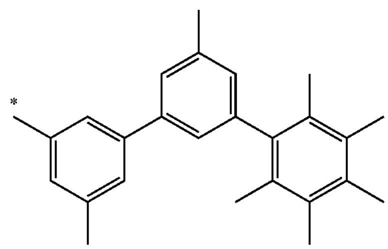
(FG-1-1041)
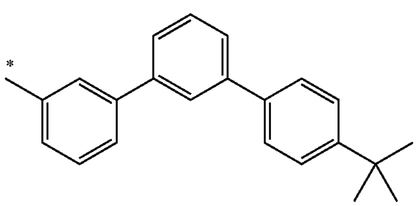
(FG-1-1042)
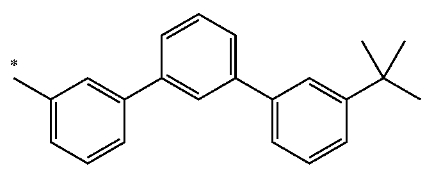
(FG-1-1043)
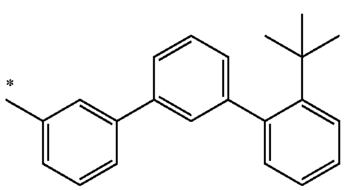
(FG-1-1051)
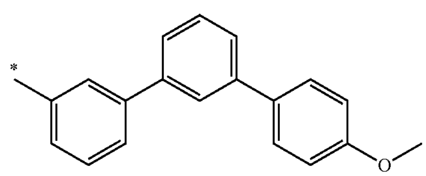
(FG-1-1052)
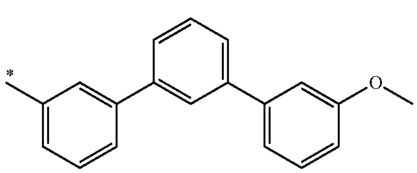
(FG-1-1053)
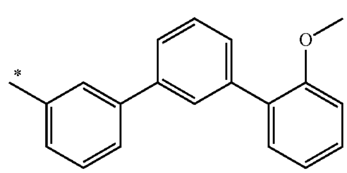

-continued
(FG-1-1061)
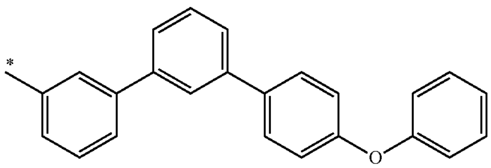
(FG-1-1062)
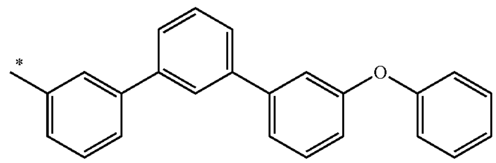
(FG-1-1063)
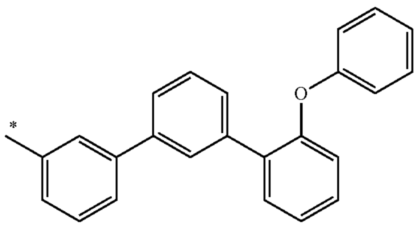
(FG-1-1071)
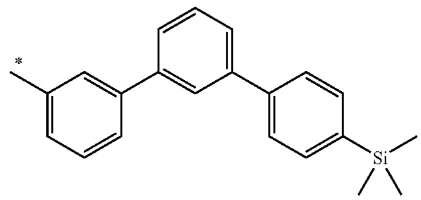
(FG-1-1072)
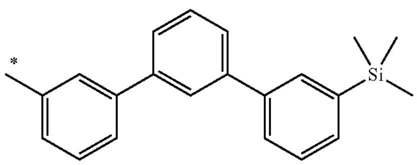
(FG-1-1073)
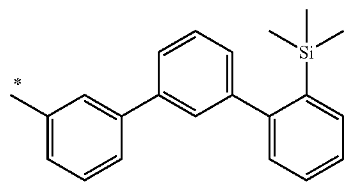
(FG-1-1081)
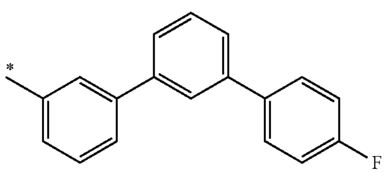
(FG-1-1082)
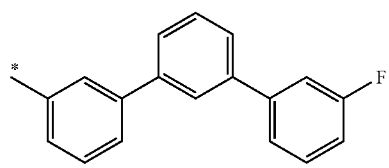
(FG-1-1083)
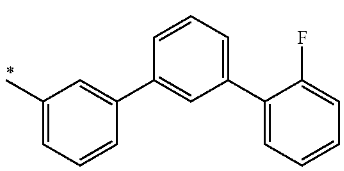
(FG-1-1084)
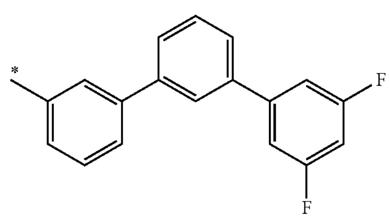
(FG-1-1085)
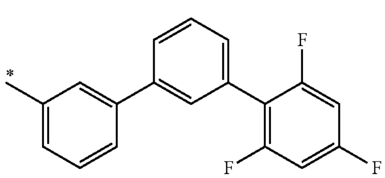
(FG-1-1086)
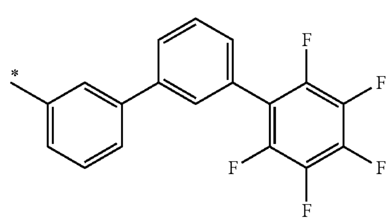
(FG-1-1101)
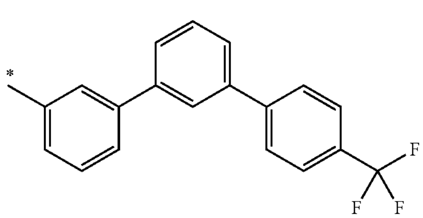
(FG-1-1102)
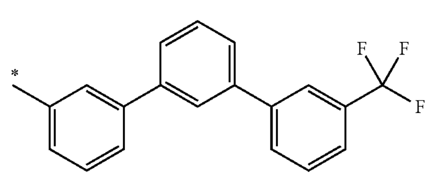

-continued
(FG-1-1103)
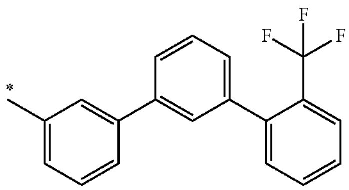
(FG-1-2001)
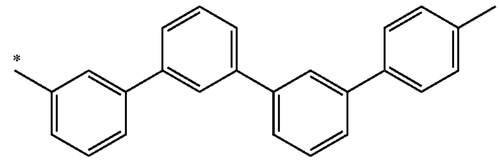
(FG-1-2002)
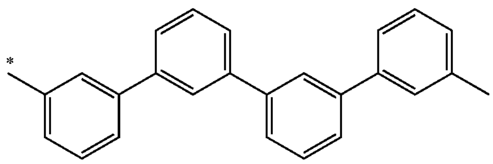
(FG-1-2003)
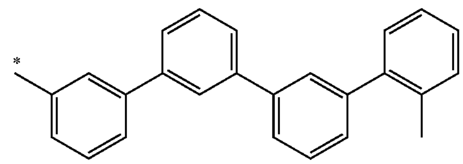
(FG-1-2004)
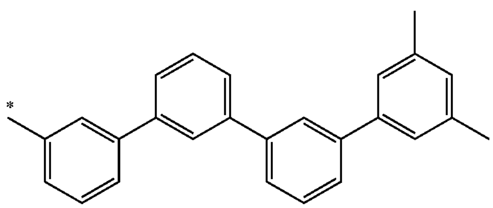
(FG-1-2005)
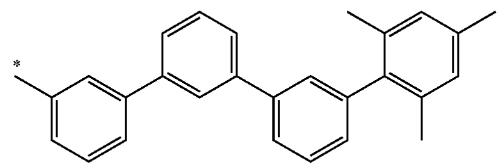
(FG-1-2006)
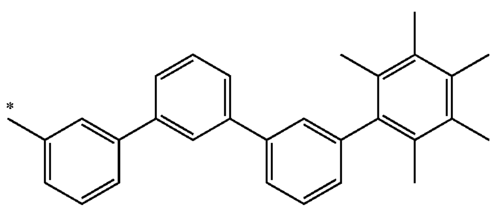
(FG-1-2021)
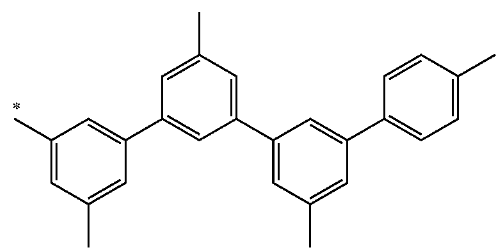
(FG-1-2022)
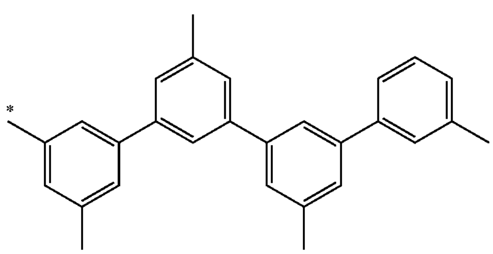
(FG-1-2023)
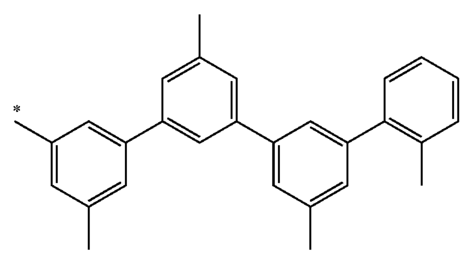
(FG-1-2024)
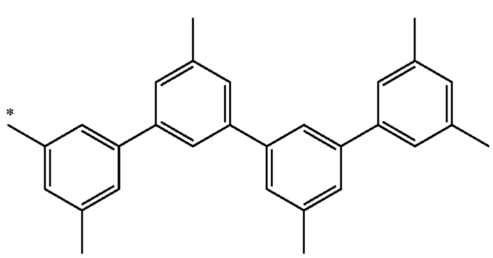
(FG-1-2025)
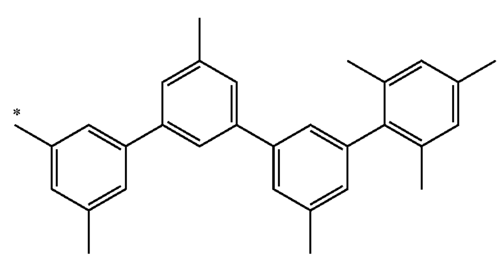

-continued
(FG-1-2026)
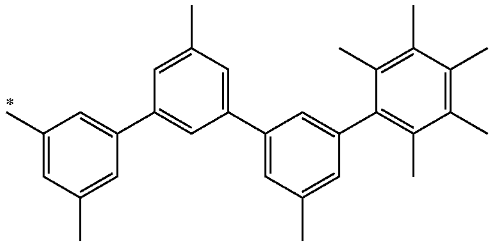
(FG-1-2041)
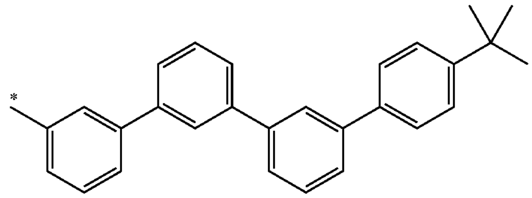
(FG-1-2042)
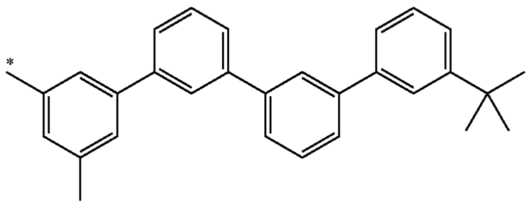
(FG-1-2043)
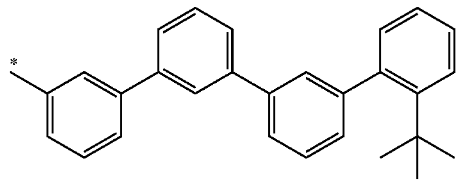
(FG-1-2051)
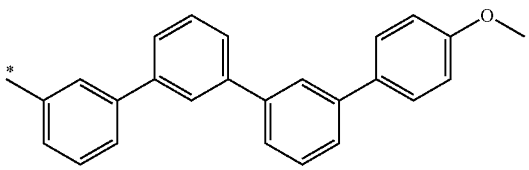
(FG-1-2052)
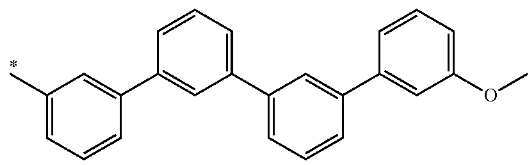
(FG-1-2053)
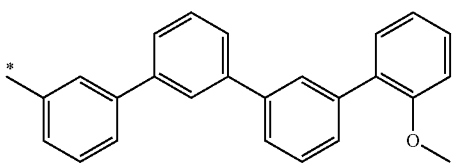
(FG-1-2061)
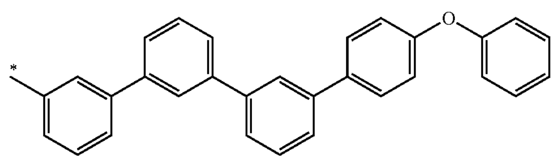
(FG-1-2062)
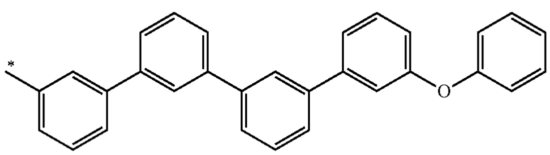
(FG-1-2063)
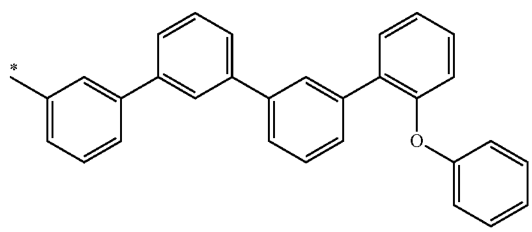
(FG-1-2071)
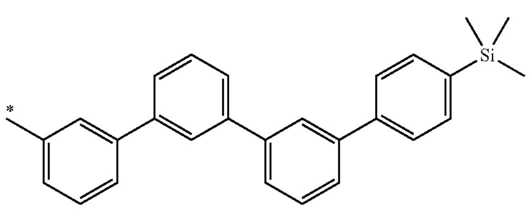
(FG-1-2072)
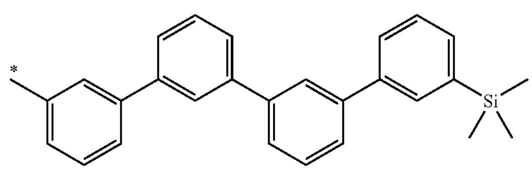
(FG-1-2073)
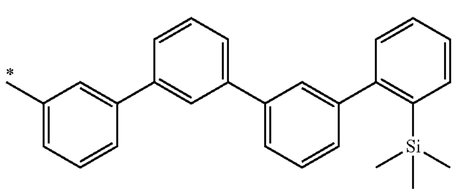
(FG-1-2081)
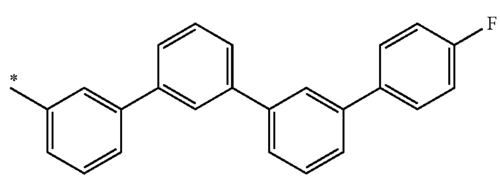

-continued
(FG-1-2082)
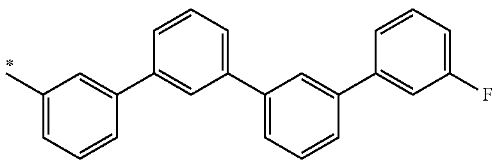
(FG-1-2083)
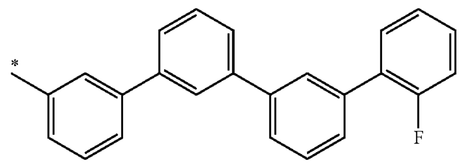
(FG-1-2084)
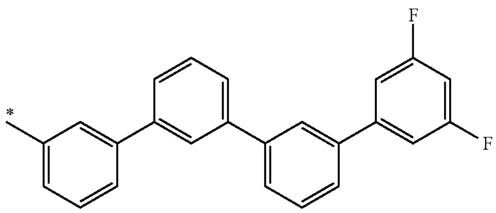
(FG-1-2085)
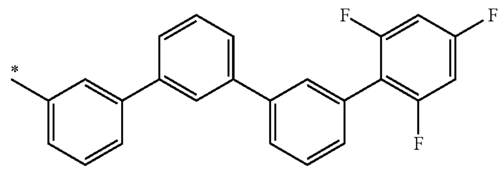
(FG-1-2086)
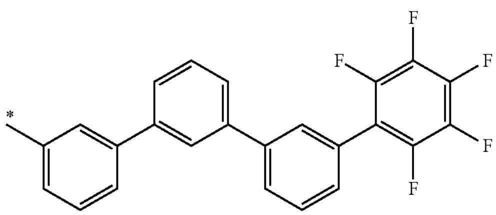
(FG-1-2087)
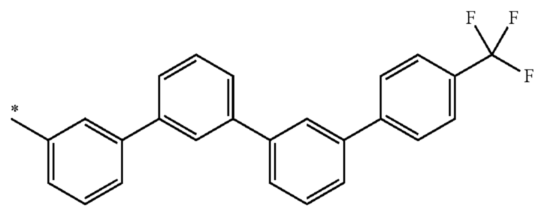
(FG-1-2088)
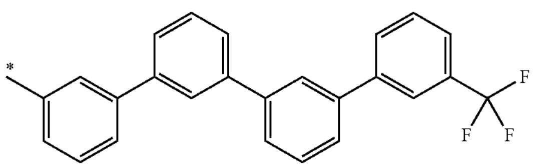
(FG-1-2089)
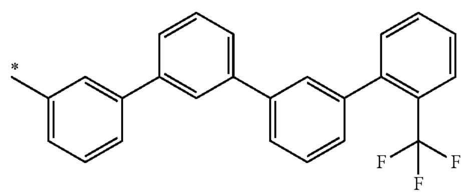
(FG-2-1)
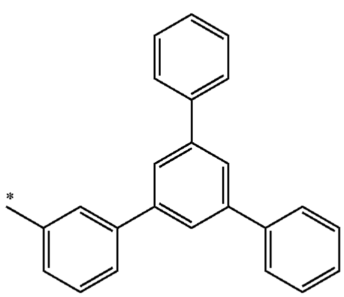
(FG-2-1001)
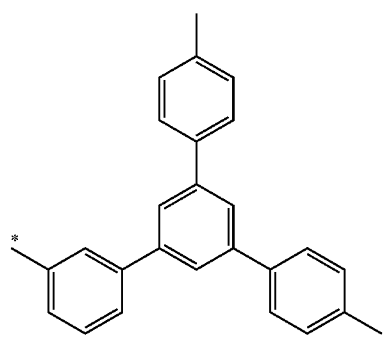
(FG-2-1002)
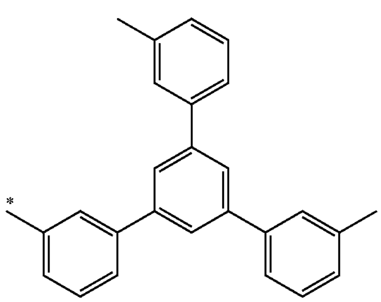
(FG-2-1003)
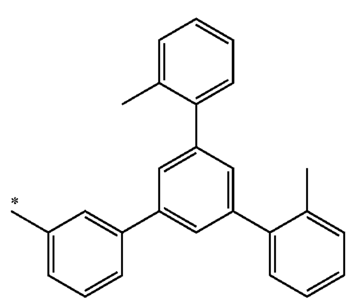

-continued
(FG-2-1004)
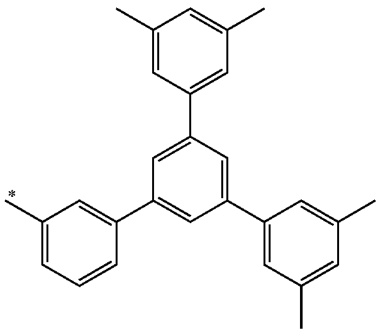
(FG-2-1005)
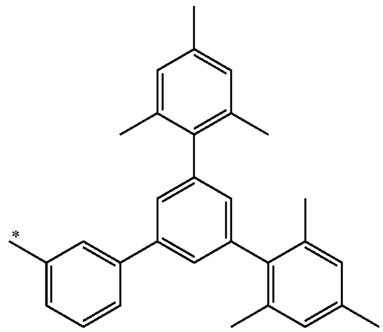
(FG-2-1006)
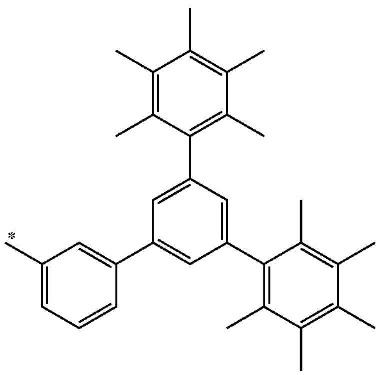
(FG-2-1041)
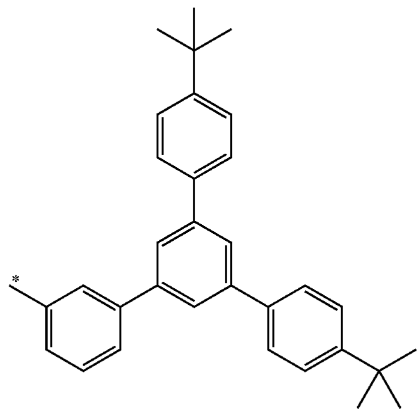
(FG-2-1042)
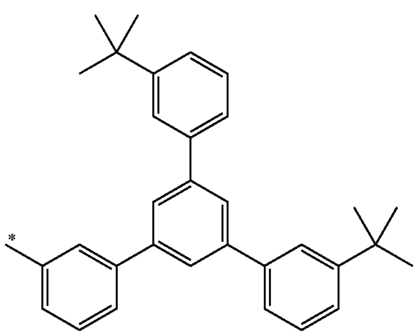
(FG-2-1043)
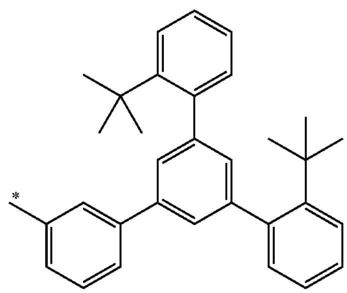
(FG-2-1051)
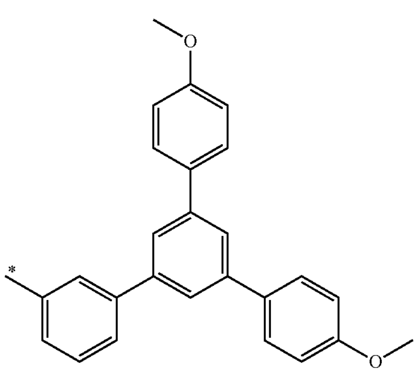
(FG-2-1052)
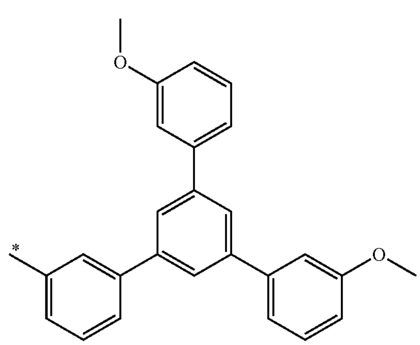

-continued
(FG-2-1053)
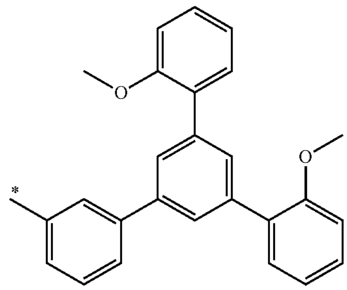
(FG-2-1061)
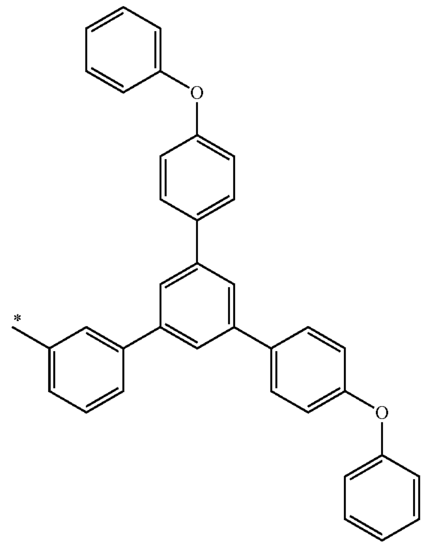
(FG-2-1062)
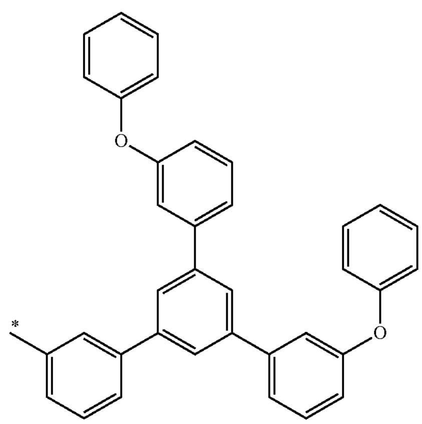
(FG-2-1063)
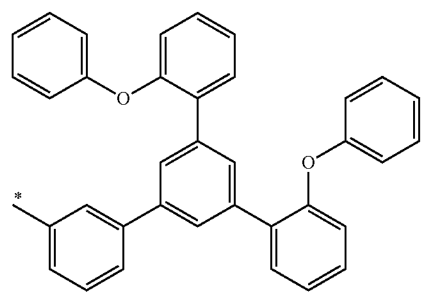
(FG-2-1071)
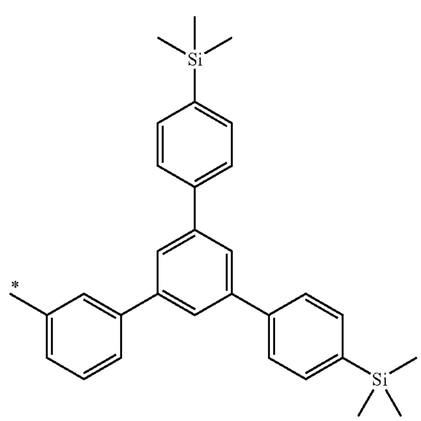
(FG-2-1072)
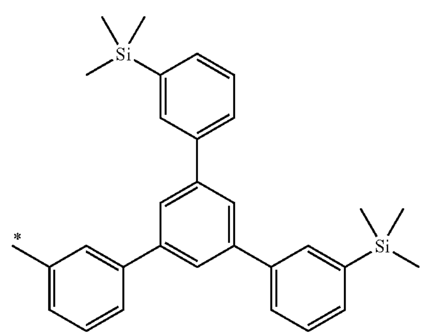

-continued
(FG-2-1073)
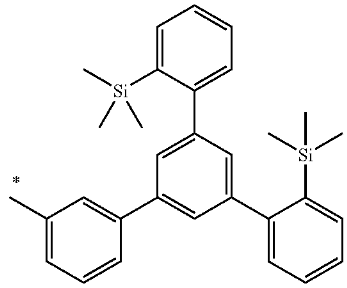
(FG-2-1081)
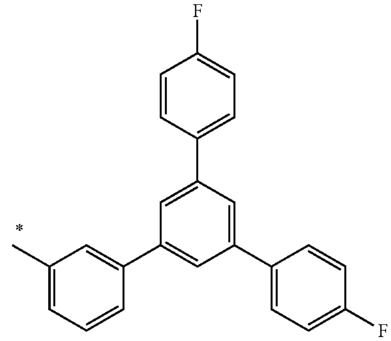
(FG-2-1082)
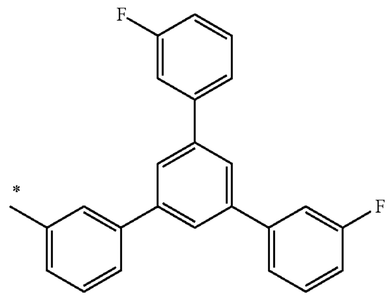
(FG-2-1083)
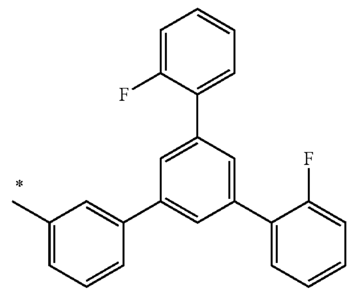
(FG-2-1084)
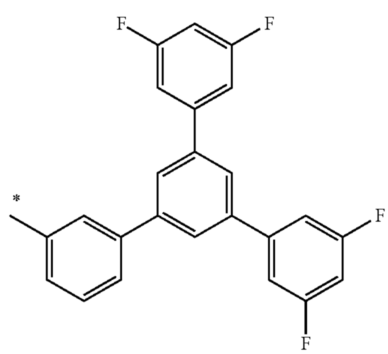
(FG-2-1085)
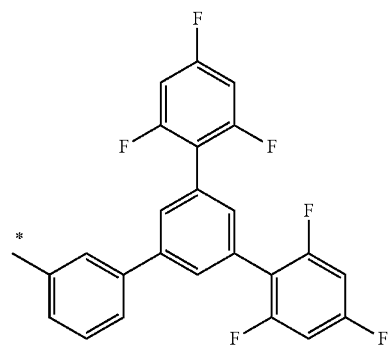
(FG-2-1086)
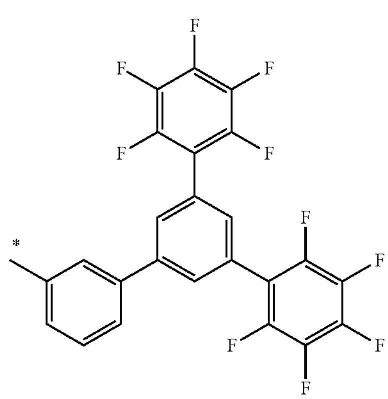
(FG-2-1101)
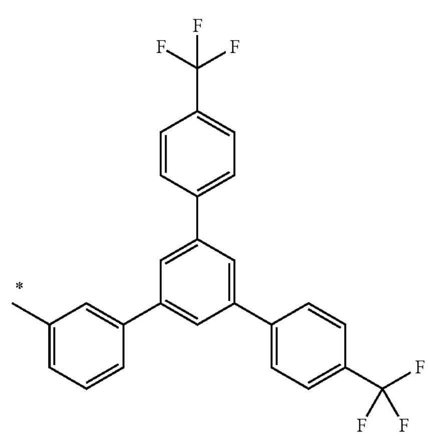

-continued
(FG-2-1102)
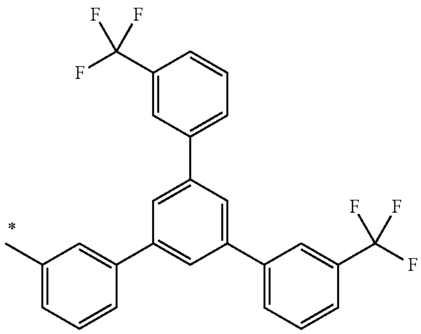
(FG-2-1103)
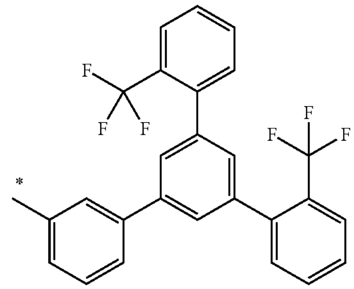
(R-1)
(R-2)
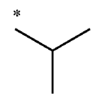
(R-3)
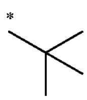
(R-4)
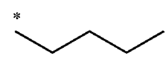
(R-5)
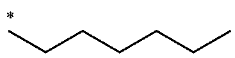
(R-6)
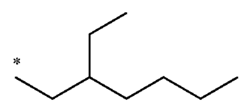
(R-7)
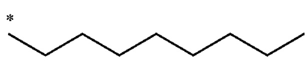
(R-8)
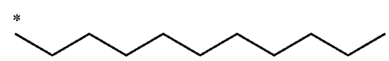
(R-9)
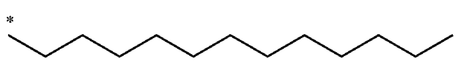
(R-10)
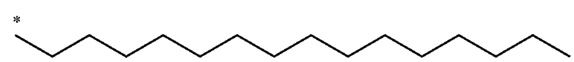
(R-11)
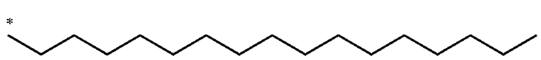
(R-4-1)
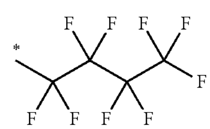
(R-5-1)
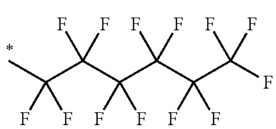
(R-7-1)
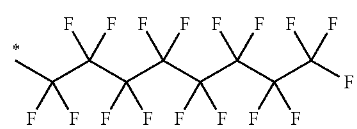
(R-8-1)
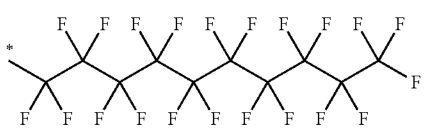
(R-9-1)
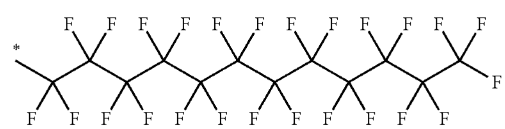
(R-21)
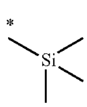
(R-31)
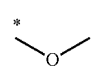
(R-32)
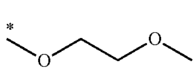
(R-33)
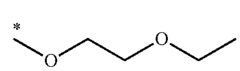
(R-34)
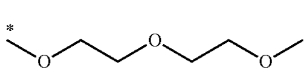
(R-35)
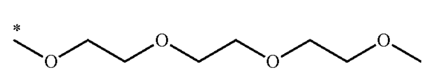
(R-36)
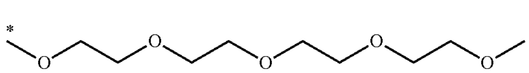
(R-37)
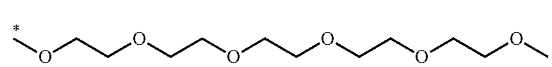

1-2. Second Component

In the light emitting layer-forming composition of the present invention, the second component functions as a host component of the light emitting layer. The second component is at least one selected from the group consisting of compounds represented by general formulas (B-1) to (B-6), is uniformly dissolved in the third component, forms a uniformly mixed coating film without being separated from the first component, and transfers energy to the first component efficiently and promptly when an element is driven. Compounds represented by general formulas (B-1) to (B-5) are preferable from a viewpoint of high efficiency and long lifetime. A compound represented by general formula (B-1) or (B-5) is more preferable, and a compound represented by general formula (B-1) is particularly preferable.

1-2-1. Low Molecular Weight Host Material: Compounds Represented by General Formulas (B-1) to (B-4)

(B-1)

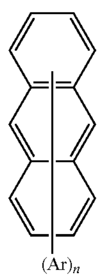

(B-2)

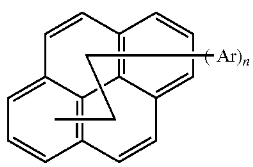

(B-3)

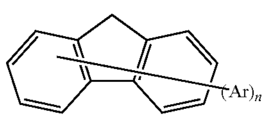

(B-4)

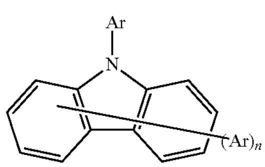

In formulas (B-1) to (B-4), Ar's each independently represent a hydrogen atom, an aryl, a heteroaryl, a diarylamino, a diheteroarylamino, an arylheteroarylamino, or an aryloxy, at least one hydrogen atom in these may be further substituted by an aryl, a heteroaryl, or a diarylamino, adjacent groups among Ar's may be bonded to each other to form an aryl ring or a heteroaryl ring together with a mother skeleton of an anthracene ring, a pyrene ring, a fluorene ring, or a carbazole ring, at least one hydrogen atom in the ring thus formed may be substituted by an aryl, a heteroaryl, a diarylamino, a diheteroarylamino, an arylheteroarylamino, or an aryloxy, and n represents an integer of 1 to a maximum substitutable number.

At least one hydrogen atom in compounds represented by general formulas (B-1) to (B-4) may be substituted by a group represented by the following general formula (FG-1), a group represented by the following general formula (FG-2), an alkyl having 1 to 24 carbon atoms, a halogen atom, or a deuterium atom, further any $—CH_2—$ in the alkyl may be substituted by —O— or $—Si(CH_3)_2—$, any $—CH_2—$ excluding $—CH_2—$ directly bonded to compounds represented by the above formulas (B-1) to (B-4) in the alkyl may be substituted by an arylene having 6 to 24 carbon atoms, and any hydrogen atom in the alkyl may be substituted by a fluorine atom.

As specific examples of "Ar" in the formulas (B-1) to (B-4), it is possible to cite the above description of a compound represented by formula (A) or (A'), and examples thereof include Ar's having the following structural formulas of one or more valences, and a combination thereof.

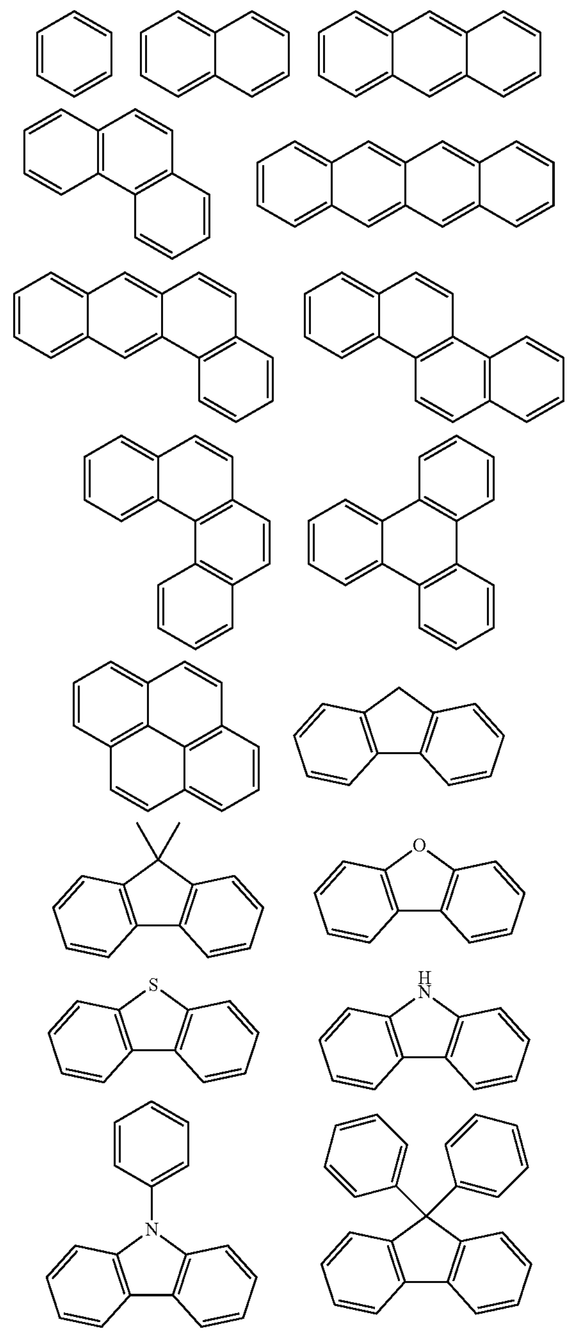

-continued

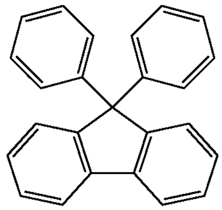
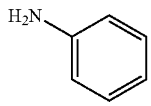
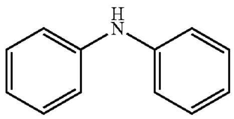
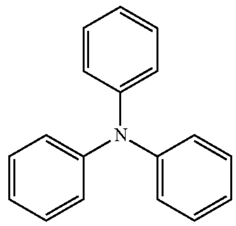
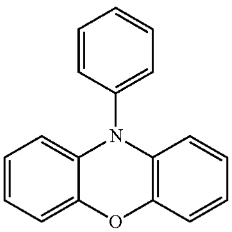
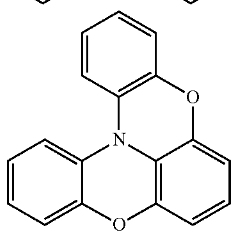
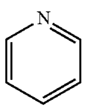
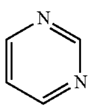
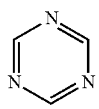
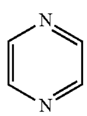
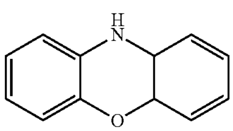
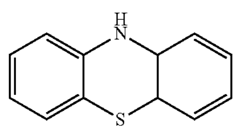
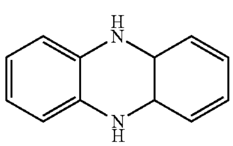
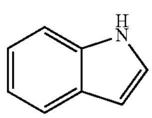
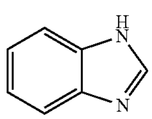

n is preferably an integer of 1 to 8, more preferably an integer of 1 to 6, still more preferably an integer of 1 to 4, particularly preferably 1 or 2, and most preferably 1.

1-2-1-1. Compound Represented by General Formula (B-11)

A compound represented by general formula (B-1) is preferably a compound represented by general formula (B-11). By using a compound represented by general formula (B-11) as a host material and using a compound represented by general formula (A) or (A') as a dopant, excellent element characteristics are obtained.

(B-11)

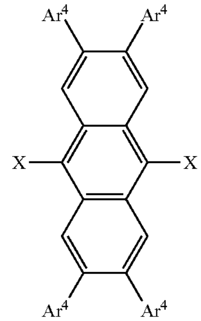

(B-11-X1)

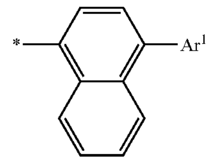

(B-11-X2)

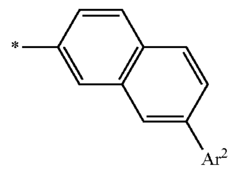

(B-11-X3)

$*—Ar^3$

In formula (B-11), X's each independently represent a group represented by the above formula (B-11-X1), (B-11-X2), or (B-11-X3). A group represented by formula (B-11-X1), (B-11-X2), or (B-11-X3) is bonded to formula (B-11) at * and two X's do not simultaneously represent a group represented by formula (B-11-X3).

A naphthylene moiety in formula (B-11-X1) or (B-11-X2) may be fused with one benzene ring. A structure fused in this way is as follows.

(B-11-X1-1)

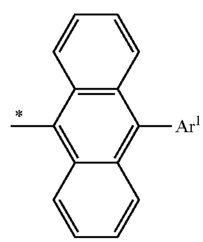

(B-11-X1-2)

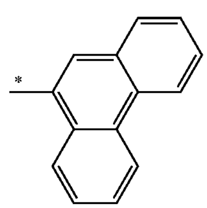

(B-11-X1-3)

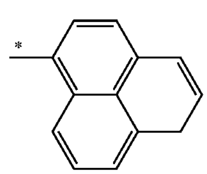

-continued (B-11-X1-4)

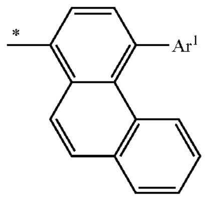

(B-11-X1-5)

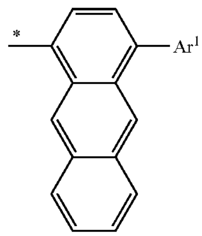

(B-11-X1-6)

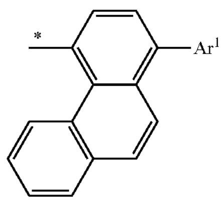

(B-11-X2-1)

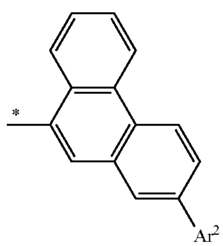

(B-11-X2-2)

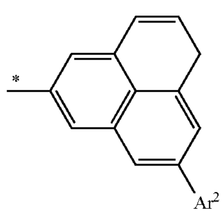

(B-11-X2-3)

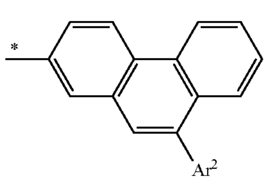

(B-11-X2-4)

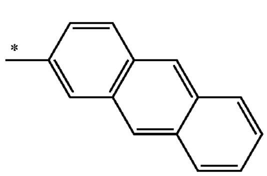

-continued (B-11-X2-5)

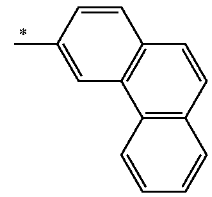

(B-11-X2-6)

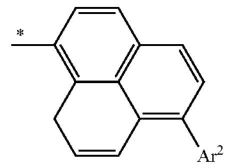

$Ar^1$ and $Ar^2$ each independently represent a hydrogen atom, phenyl, biphenylyl, terphenylyl, quaterphenylyl, naphthyl, phenanthryl, fluorenyl, benzofluorenyl, chrysenyl, triphenylenyl, pyrenylyl, carbazolyl, benzocarbazolyl, or phenyl-substituted carbazolyl.

$Ar^3$ is phenyl, biphenylyl, terphenylyl, quaterphenylyl, naphthyl, phenanthryl, fluorenyl, benzofluorenyl, chrysenyl, triphenylenyl, pyrenylyl, carbazolyl, benzocarbazolyl, or phenyl-substituted carbazolyl, and these may be further substituted by phenyl, biphenylyl, terphenylyl, naphthyl, phenanthryl, fluorenyl, chrysenyl, triphenylenyl, pyrenylyl, carbazolyl, or phenyl-substituted carbazolyl.

$Ar^4$'s each independently represent a hydrogen atom, phenyl, biphenylyl, terphenylyl, naphthyl, or silyl substituted by an alkyl having 1 to 4 carbon atoms.

Examples of the alkyl having 1 to 4 carbon atoms, by which a silyl is substituted include methyl, ethyl, propyl, i-propyl, butyl, sec-butyl, t-butyl, and cyclobutyl, and three hydrogen atoms in the silyl are each independently substituted by the alkyl.

Specific examples of the "silyl substituted by an alkyl having 1 to 4 carbon atoms" include trimethylsilyl, triethylsilyl, tripropylsilyl, tri-i-propylsilyl, tributylsilyl, tri sec-butylsilyl, tri-t-butylsilyl, ethyl dimethylsilyl, a propyldimethylsilyl, i-propyldimethylsilyl, butyldimethylsilyl, sec-butyldimethylsilyl, t-butyldimethylsilyl, methyldiethylsilyl, propyldiethylsilyl, i-propyldiethylsilyl, butyldiethylsilyl, sec-butyl diethylsilyl, t-butyldiethylsilyl, methyldipropylsilyl, ethyldipropylsilyl, butyldipropylsilyl, sec-butyldipropylsilyl, t-butyldipropylsilyl, methyl di-i-propylsilyl, ethyl di-i-propylsilyl, butyl di-i-propylsilyl, sec-butyl di-i-propylsilyl, and t-butyl di-i-propylsilyl.

Specific examples of a compound represented by formula (B-11) include compounds represented by the following formulas (B-11-1) to (B-1-108).

In addition, specific structures of these compounds may be substituted by a group represented by formula (FG-1), a group represented by formula (FG-2), or an alkyl having 1 to 24 carbon atoms.

A compound represented by formula (B-1) may be substituted by a group represented by formula (FG-1), a group represented by formula (FG-2), or an alkyl having 1 to 24 carbon atoms. In a case where the compound is substituted, these groups are bonded to the compound represented by formula (B-1) at any position.

That is, it should be understood that the following formulas (B-1-1) to (B-1-108) disclose both a compound not substituted by a group represented by formula (FG-1), a group represented by formula (FG-2), or an alkyl having 1 to 24 carbon atoms, and a compound substituted by these groups at any position.
(B-1-1)
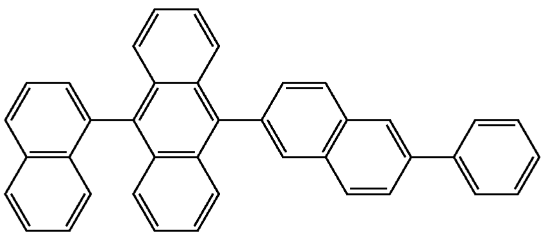
(B-1-2)
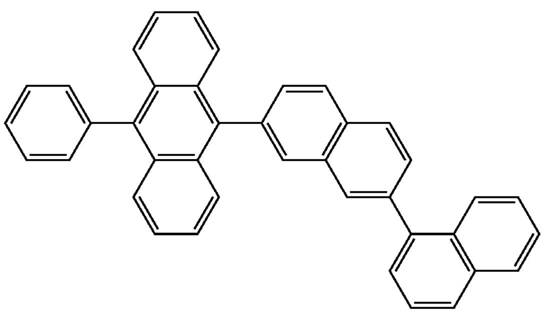
(B-1-3)
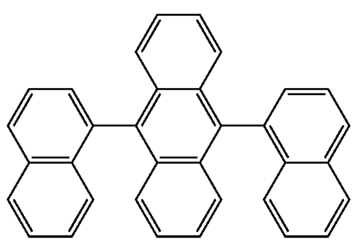
(B-1-4)
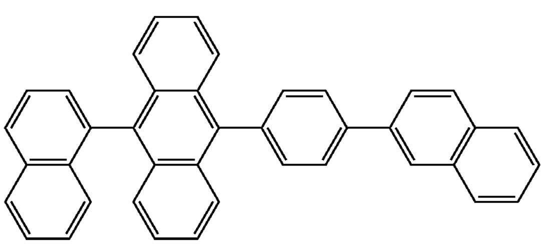
(B-1-5)
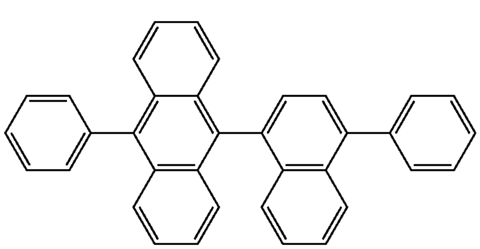
-continued
(B-1-6)
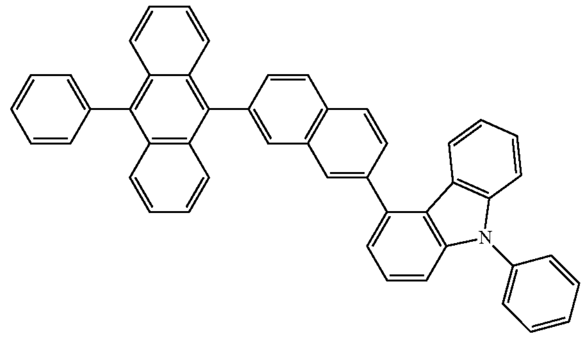
(B-1-7)
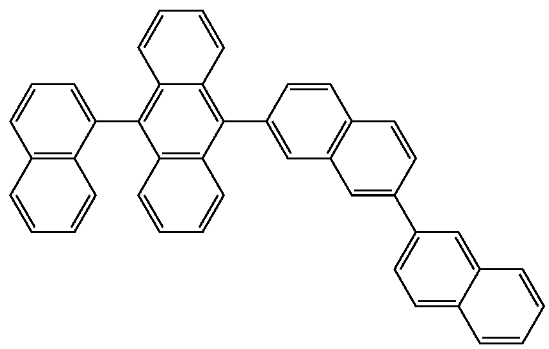
(B-1-8)
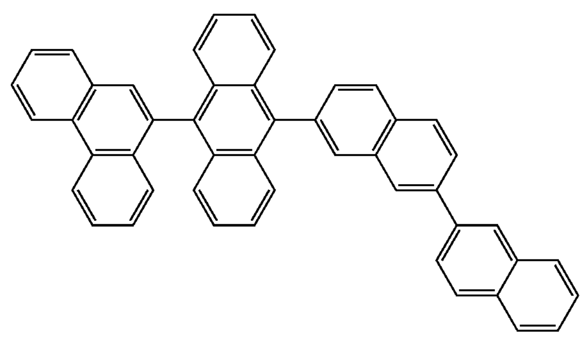
(B-1-11)
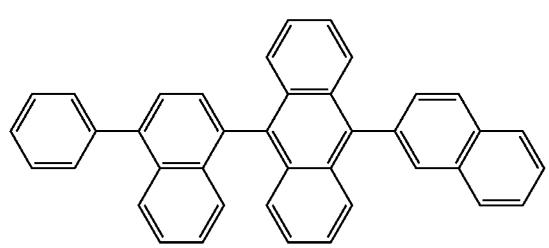

-continued
(B-1-12)
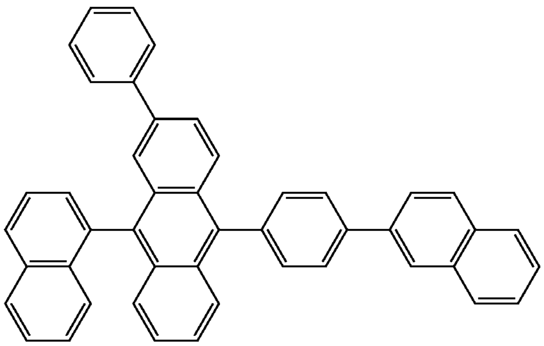
(B-1-13)
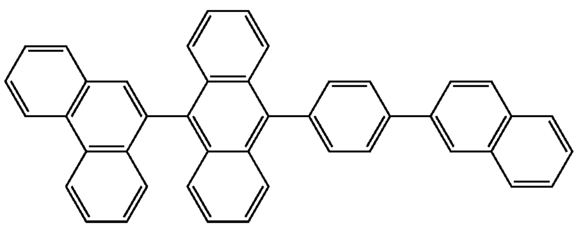
(B-1-14)
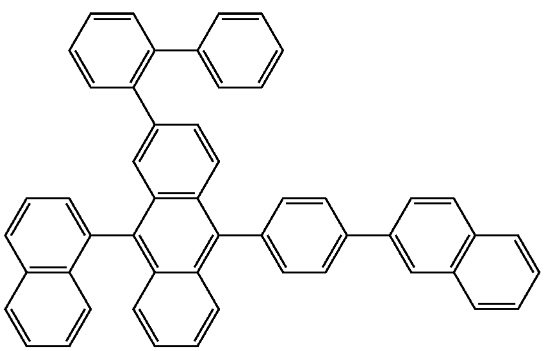
(B-1-15)
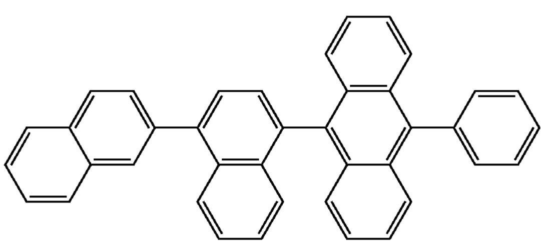
(B-1-16)
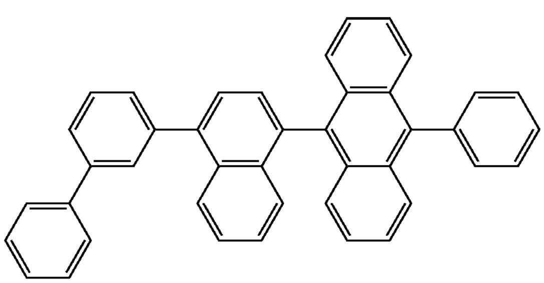
-continued
(B-1-17)
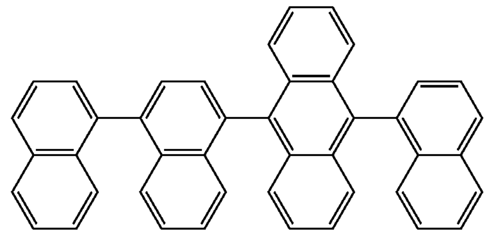
(B-1-18)
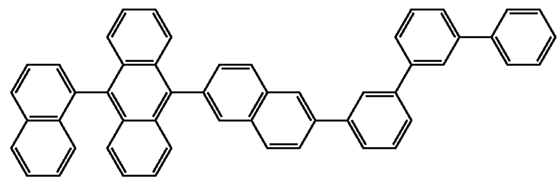
(B-1-19)
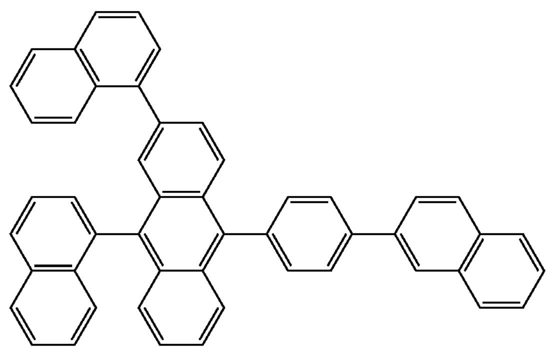
(B-1-21)
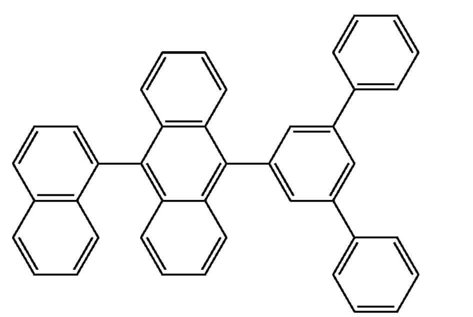
(B-1-22)
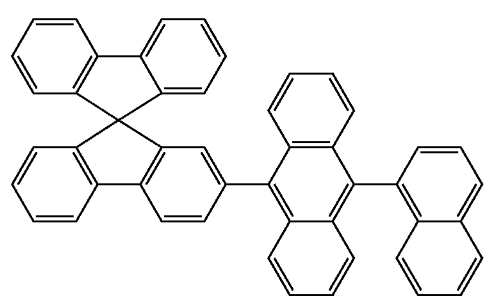

-continued
(B-1-23)
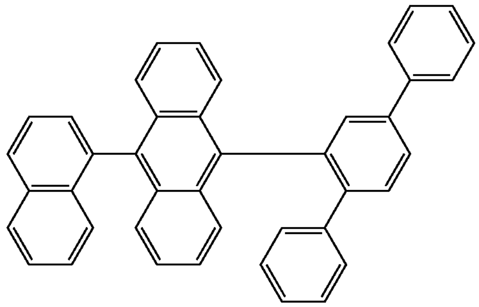
(B-1-24)
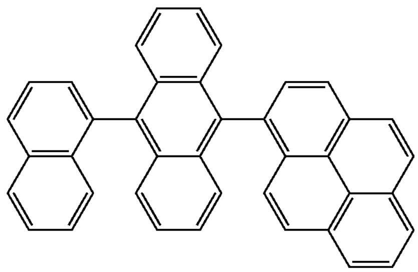
(B-1-25)
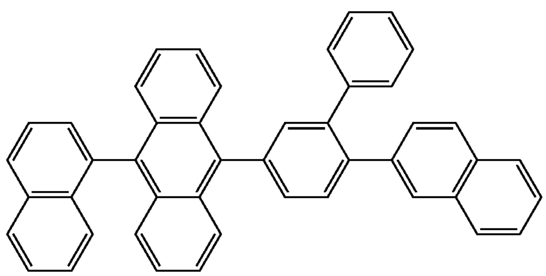
(B-1-26)
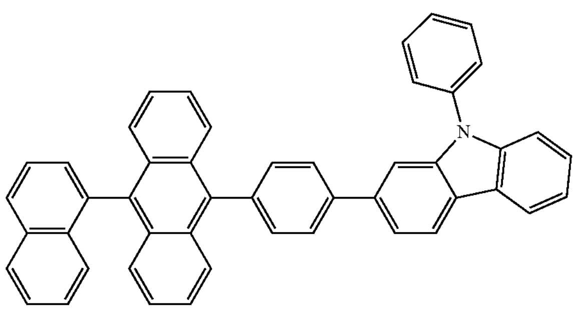
-continued
(B-1-101)
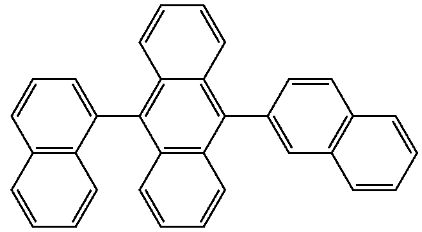
(B-1-102)
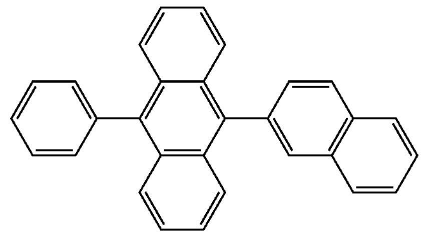
(B-1-105)
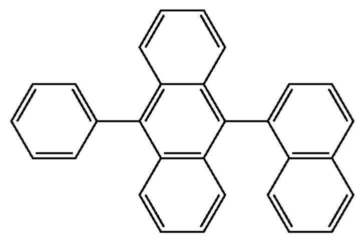
(B-1-108)
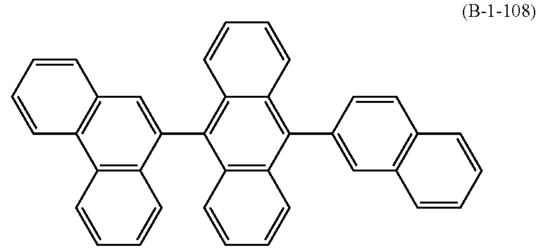
1-2-1-2. Compounds Represented by General Formulas (B-2) to (B-4)
Specific examples of compounds represented by general formulas (B-2) to (B-4) are indicated below.
(B-2-211)
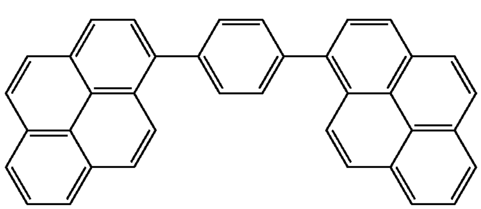
(B-2-212)
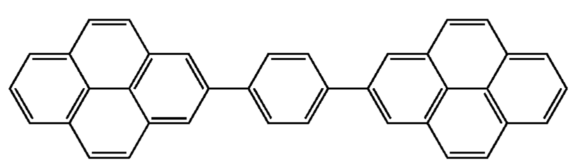

-continued
(B-2-213)
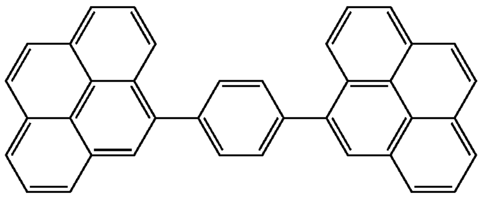
(B-2-221)
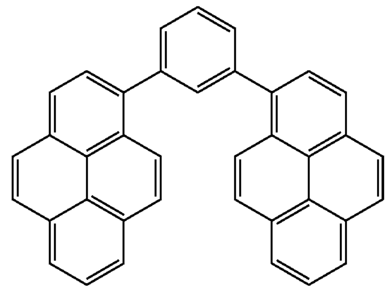
(B-2-222)
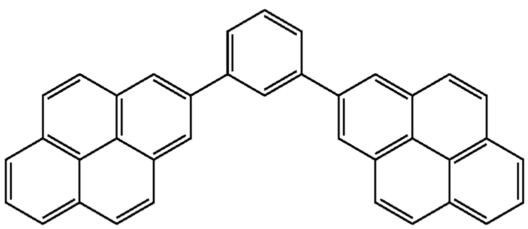
(B-2-223)
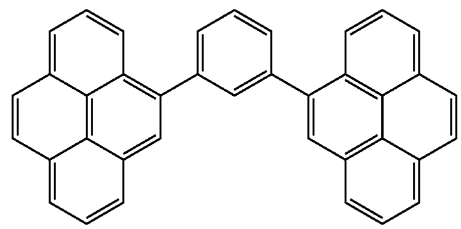
(B-2-231)
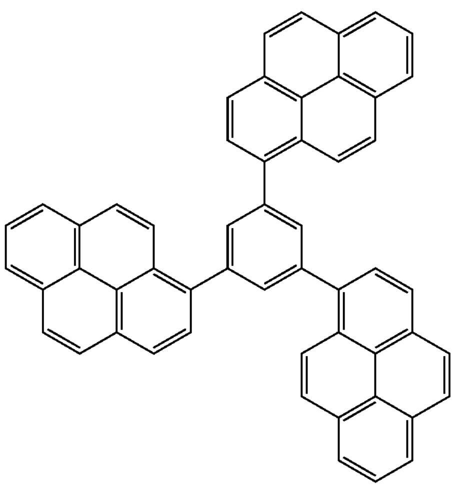
(B-2-232)
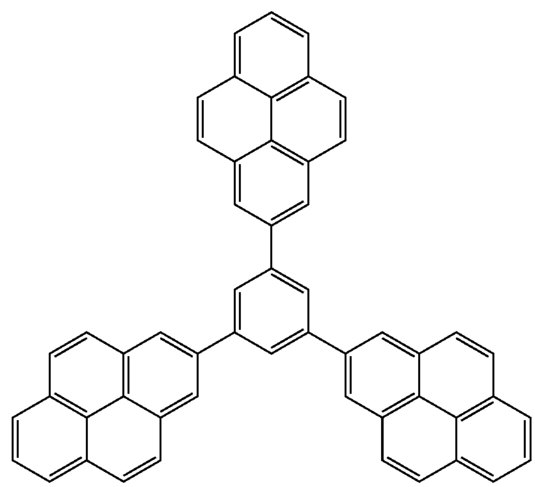
(B-2-233)
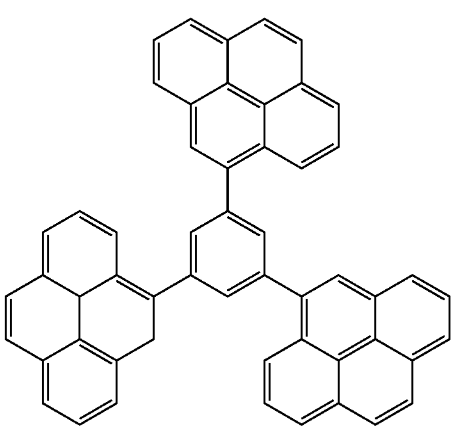
(B-3-001)
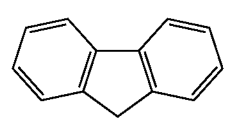

-continued
(B-3-011)
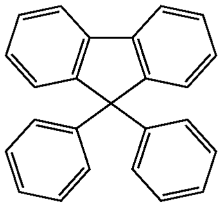
(B-3-021)
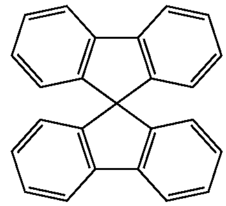
(B-3-201)
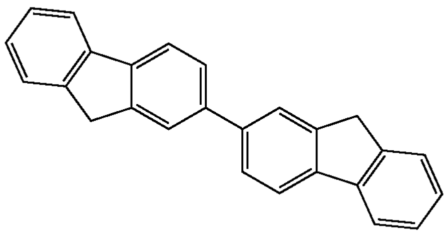
(B-3-211)
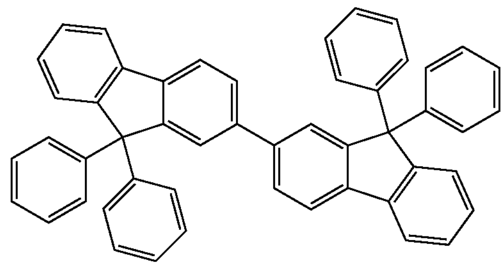
(B-3-221)
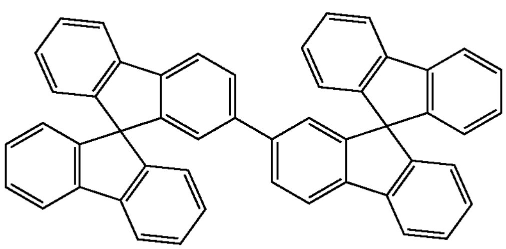
(B-3-301)
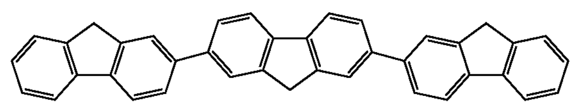
(B-3-311)
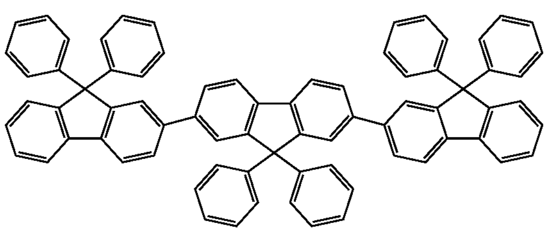
(B-3-321)
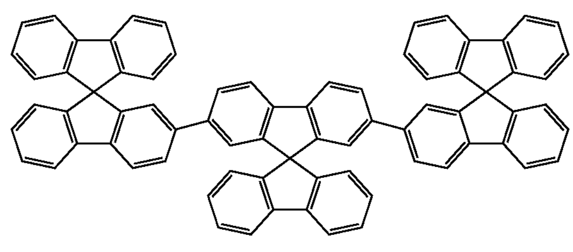
(B-4-001)
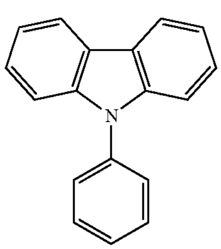
(B-4-201)
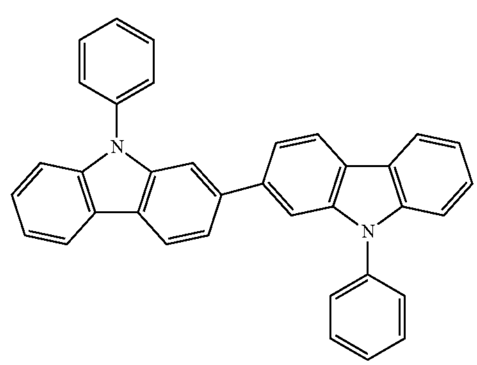

-continued (B-4-301)

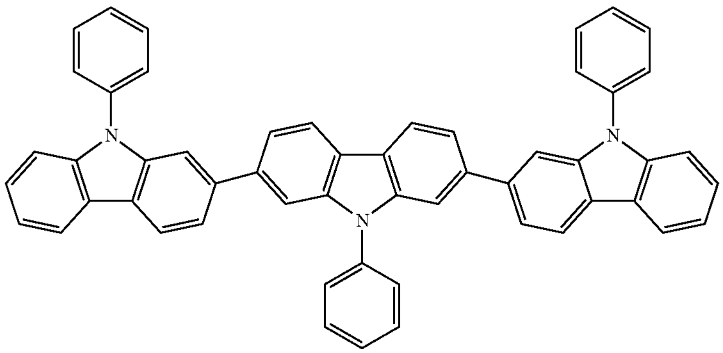

Similarly to the above specific examples of a compound represented by formula (B-1), it should be understood that the above specific examples of compounds represented by formulas (B-2) to (B-4) disclose both a compound not substituted by a group represented by formula (FG-1), a group represented by formula (FG-2), or an alkyl having 7 to 24 carbon atoms, and a compound substituted by these groups at any position. Compounds represented by formulas (B-2) to (B-4) are preferably substituted by these groups from a viewpoint of improving coating film formability and in-plane orientation. Compounds represented by formulas (B-2) to (B-4) are more preferably substituted by a group represented by formula (FG-1) or a group represented by formula (FG-2), and particularly preferably substituted by a group represented by formula (FG-1).

1-2-2. Host Material of Polycyclic Aromatic Compound: Compound Represented by General Formula (B-5)

(B-5)

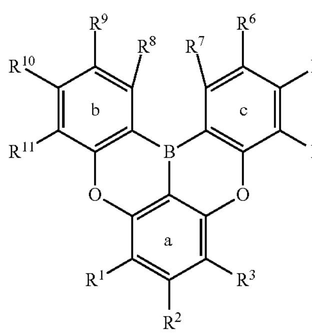

In formula (B-5), $R^1$ to $R^{11}$ each independently represent a hydrogen atom, an aryl, a heteroaryl, a diarylamino, a diheteroarylamino, an arylheteroarylamino, or an aryloxy, at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with the ring a, ring b, or ring c, at least one hydrogen atom in the ring thus formed may be substituted by an aryl, a heteroaryl, a diarylamino, a diheteroarylamino, an arylheteroarylamino, or an aryloxy, and at least one hydrogen atom in these may be further substituted by an aryl, a heteroaryl, or a diarylamino.

At least one hydrogen atom in a compound represented by formula (B-5) may be substituted by a group represented by formula (FG-1), a group represented by formula (FG-2), or an alkyl having 1 to 24 carbon atoms, further any —$CH_2$— in the alkyl may be substituted by —O— or —$Si(CH_3)_2$—, any —$CH_2$— excluding —$CH_2$— directly bonded to a compound represented by the above formula (B-5) in the alkyl may be substituted by an arylene having 6 to 24 carbon atoms, and any hydrogen atom in the alkyl may be substituted by a fluorine atom.

At least one hydrogen atom in a compound represented by formula (B-5) may be substituted by a halogen atom or a deuterium atom.

1-2-2-1. $R^1$ to $R^{11}$ in General Formula (B-5)

For description of $R^1$ to $R^{11}$ in formula (B-5), description of $R^1$ to $R^{11}$ in formula (A') can be cited.

1-2-2-2. "Ring Formed by Bonding Adjacent Groups of Ring a, Ring b, or Ring c in General Formula (B-5)"

In formula (B-5), adjacent groups among the substituents $R^1$ to $R^{11}$ of the ring a, ring b, and ring c may be bonded to each other to form an aryl ring or a heteroaryl ring together with the ring a, ring b, or ring c, at least one hydrogen atom in the ring thus formed may be substituted by an aryl, a heteroaryl, a diarylamino, a diheteroarylamino, an arylheteroarylamino, or an aryloxy, and at least one hydrogen atom in these may be further substituted by an aryl, a heteroaryl, or a diarylamino. However, the term "adjacent groups" used herein means groups adjacent to each other on the same ring. A compound in which "adjacent groups are bonded to each other to form an aryl ring or a heteroaryl ring together with the ring a, ring b, or ring c" corresponds to compounds represented by formulas (B-5-2) to (B-5-17) listed as specific compounds described below, for example. That is, for example, these compounds are formed by fusing a benzene ring, an indole ring, a pyrrole ring, a benzofuran ring, and a benzothiophene ring with the ring a (or ring b or ring c), and the fused rings thus formed are a naphthalene ring, a carbazole ring, an indole ring, a dibenzofuran ring, and a dibenzothiophene ring, respectively.

1-2-2-3. Substitution on Compound

For description of "substitution on compound" in formula (B-5), description of "substitution on compound" in formula (A) or (A') can be cited.

1-2-2-4. Substitution Position on Compound

In a case where a compound represented by formula (B-5) is substituted by a group represented by formula (FG-1), a group represented by formula (FG-2), or an alkyl having 1 to 24 carbon atoms (or an alkyl having 7 to 24 carbon atoms), at least one of z's in the following formula (B-5-Z1) or (B-5-Z2) is preferably substituted.

(B-5-Z1)
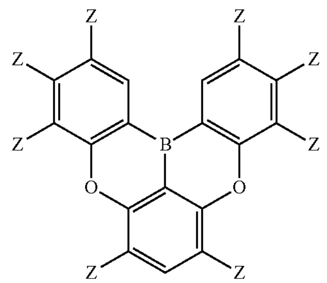
(B-5-Z2)
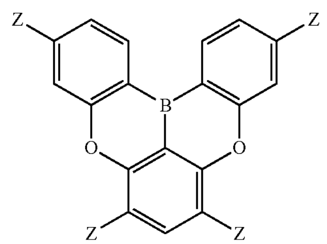
More specifically, at least one of z's in the following formula (B-5-1-z), (B-5-49-z), (B-5-91-z), (B-5-100-z), (B-5-152-z), (B-5-176-z), (B-5-1048-z), (B-5-1049-z), (B-5-1050-z), (B-5-1069-z), (B-5-1101-z), (B-5-1102-z), or (B-5-1103-z) is preferably substituted.
(B-5-1-z)
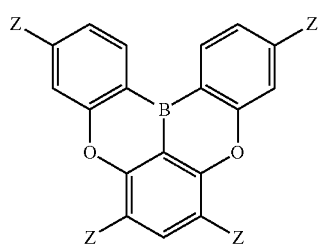
(B-5-49-z)
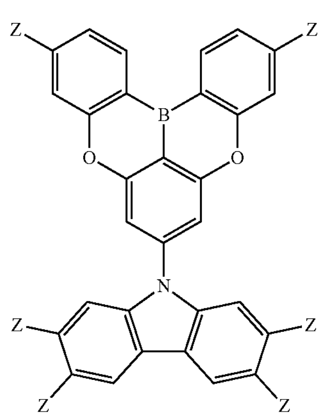
-continued
(B-5-91-z)
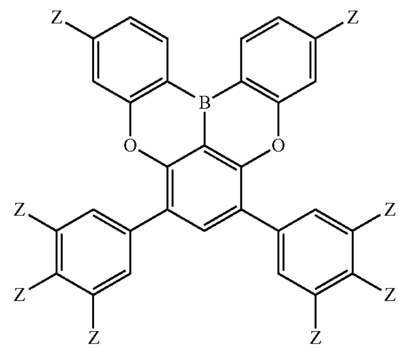
(B-5-100-z)
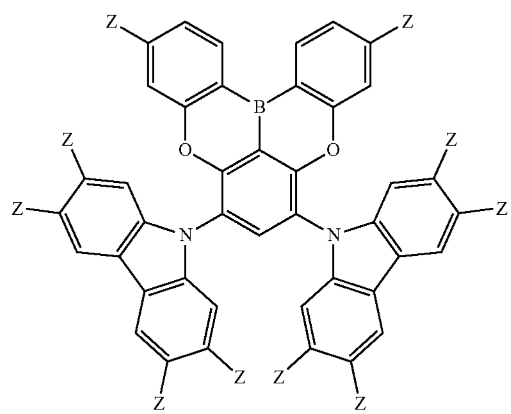
(B-5-152-z)
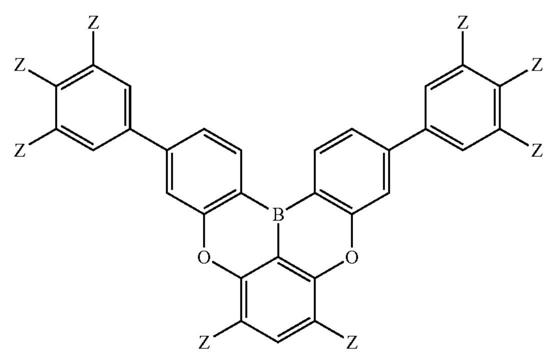
(B-5-176-z)
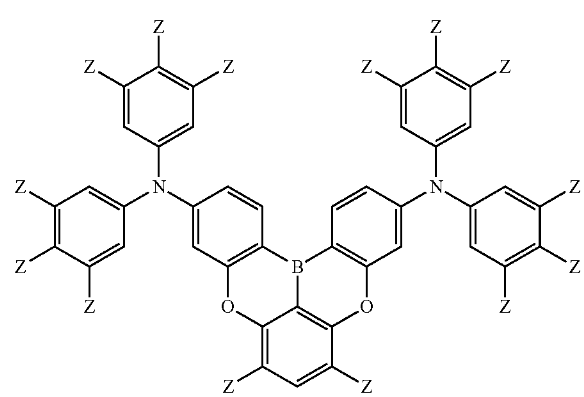

-continued
(B-5-1048-z)
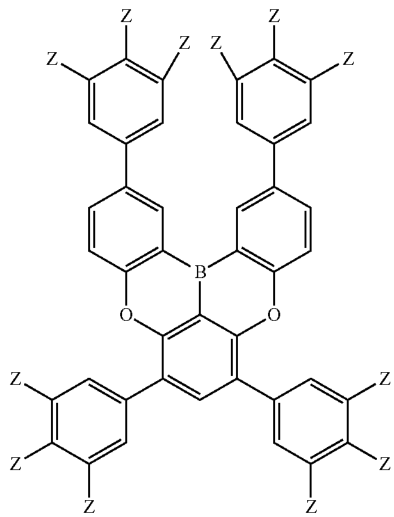
(B-5-1049-z)
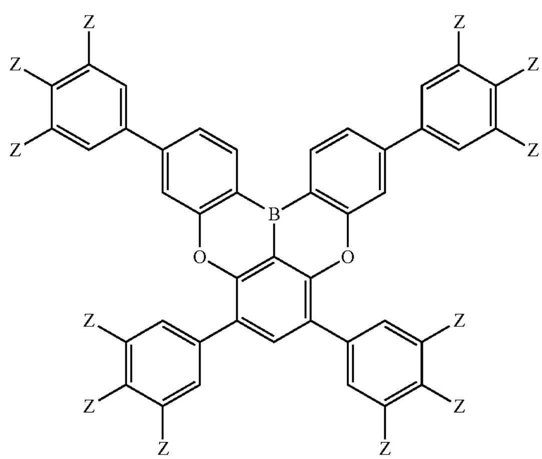
(B-5-1050-z)
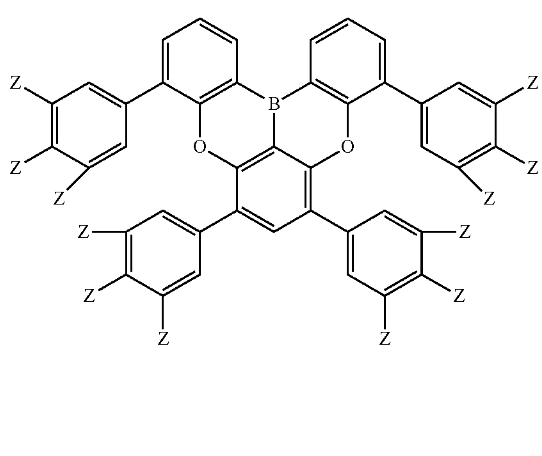
-continued
(B-5-1069-z)
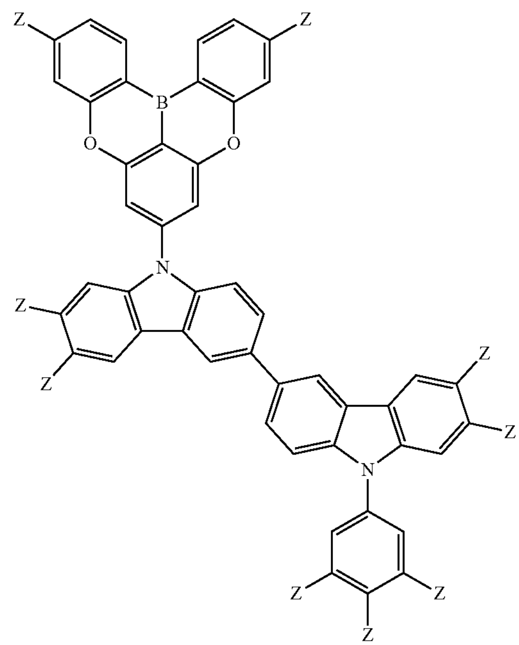
(B-5-1101-z)
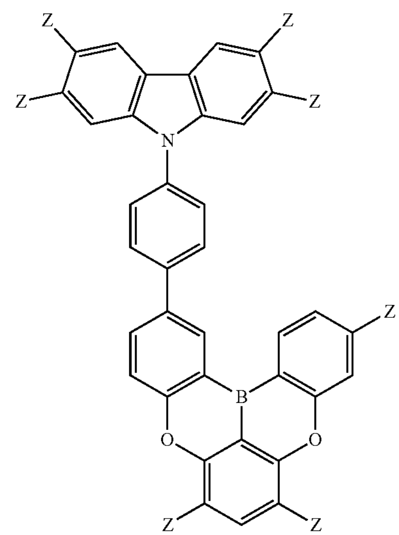
(B-5-1102-z)
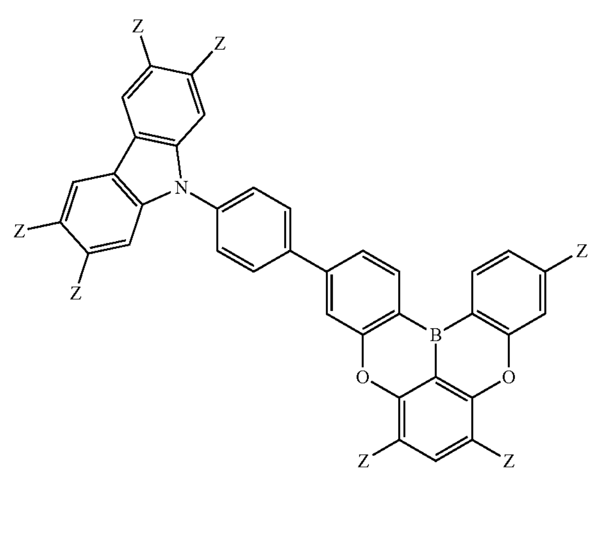

-continued (B-5-1103-z)

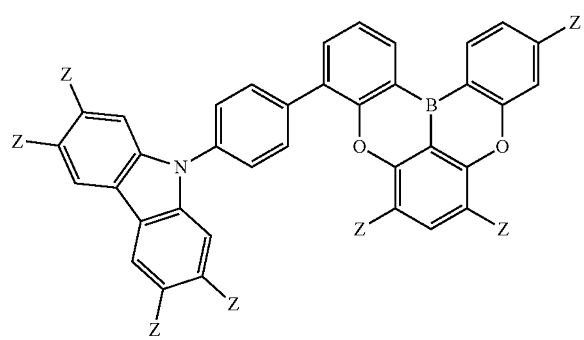

1-2-2-5. Substitution on Compound by Deuterium Atom or Halogen Atom

For description of "substitution on compound by deuterium atom or halogen atom" in formula (B-5), description of "substitution on compound by deuterium atom or halogen atom" in formula (A) or (A') can be cited.

1-2-2-6. Specific Examples of Compound

More specific structures of a compound represented by formula (B-5) are indicated below. Each of the following formulas (B-5-1) to (B-5-179), (B-5-1001) to (B-5-1148), and (B-5-1271) has a structure not substituted by a group represented by formula (FG-1), a group represented by formula (FG-2), or an alkyl having 1 to 24 carbon atoms.

A specific structure of such a compound represented by formula (B-5) may be substituted by a group represented by formula (FG-1), a group represented by formula (FG-2), or an alkyl having 1 to 24 carbon atoms. For specific structures of these substituents, the above formulas (FG-1-1) to (FG-1-5), (FG-1-1001) to (FG-1-1103), (FG-1-2001) to (FG-1-2089), (FG-2-1), (FG-2-1001) to (FG-2-1006), (FG-2-1041) to (FG-2-1103), and (R-1) to (R-37) in the above description for formula (A) or (A') can be cited.

Similarly to the above specific examples of a compound represented by formula (B-1), it should be understood that the specific examples of compounds represented by the following formulas (B-5-1) to (B-5-179), (B-5-1001) to (B-5-1148), and (B-5-1271) disclose both a compound not substituted by a group represented by formula (FG-1), a group represented by formula (FG-2), or an alkyl having 1 to 24 carbon atoms, and a compound substituted by these groups at any position.

(B-5-1)

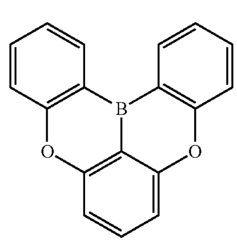

-continued (B-5-2)

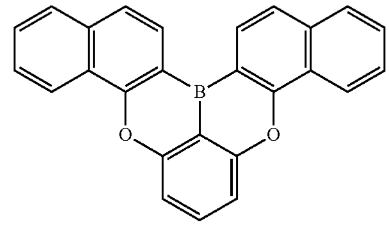

(B-5-3)

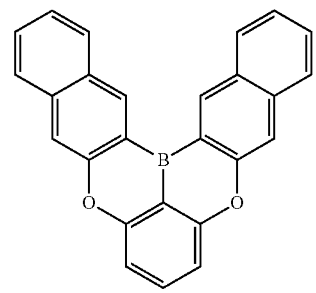

(B-5-4)

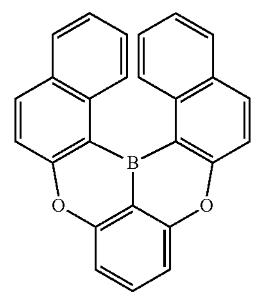

(B-5-5)

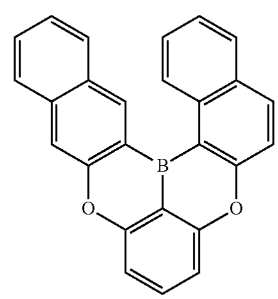

(B-5-6)

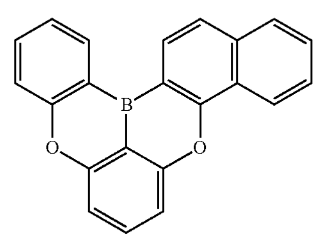

(B-5-7)

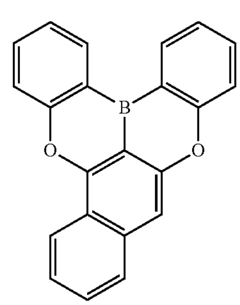

-continued
(B-5-8)
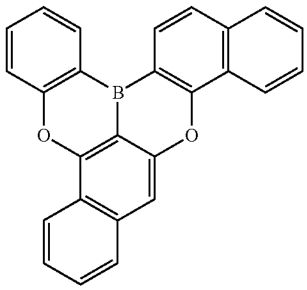
(B-5-9)
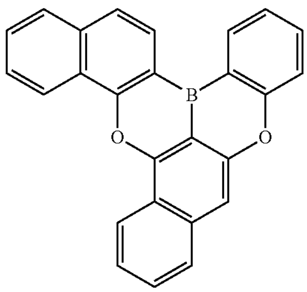
(B-5-10)
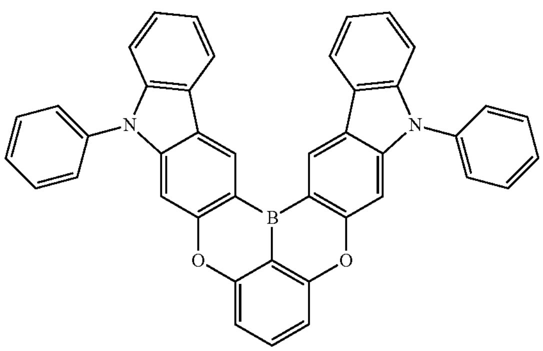
(B-5-11)
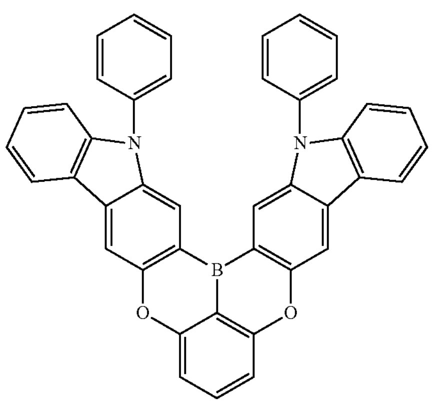
-continued
(B-5-12)
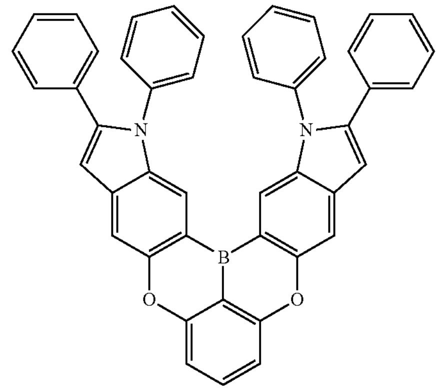
(B-5-13)
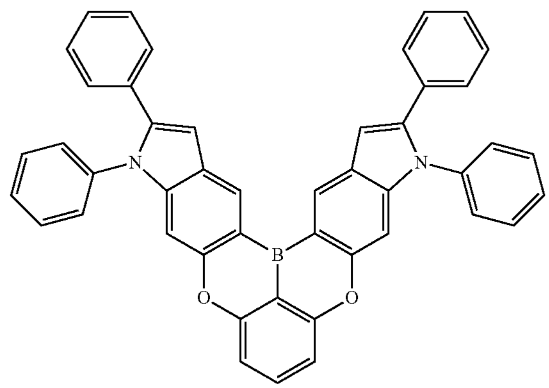
(B-5-14)
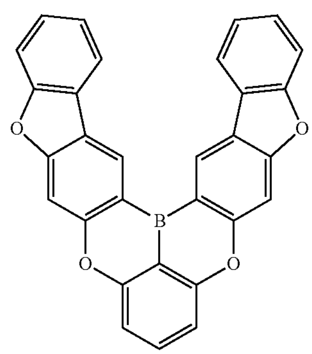
(B-5-15)
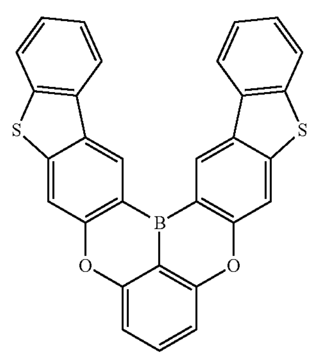

-continued
(B-5-16)
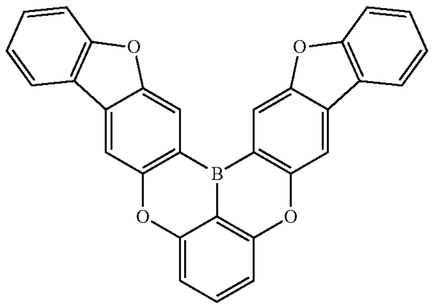
(B-5-17)
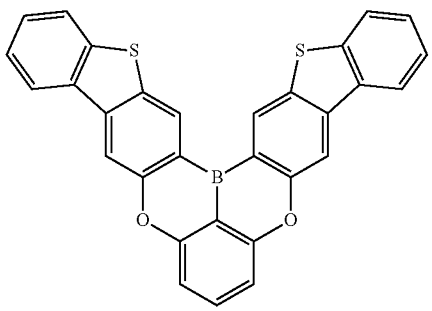
(B-5-41)
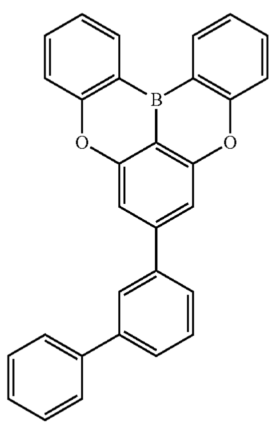
(B-5-42)
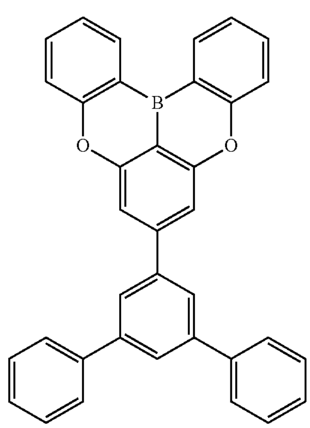
-continued
(B-5-43)
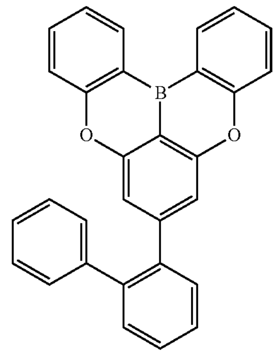
(B-5-44)
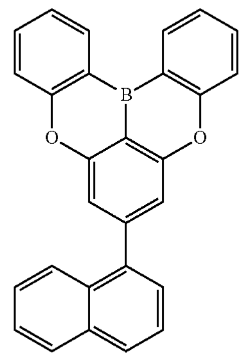
(B-5-45)
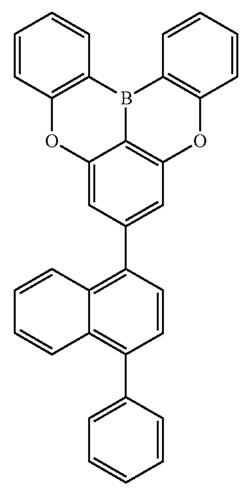
(B-5-46)
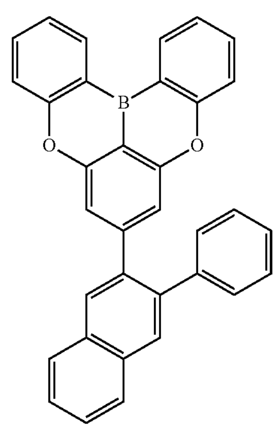

-continued
(B-5-47)
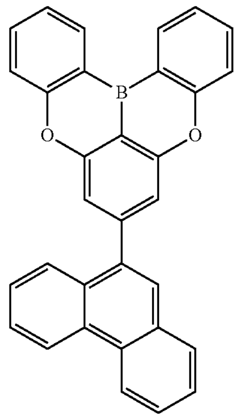
(B-5-48)
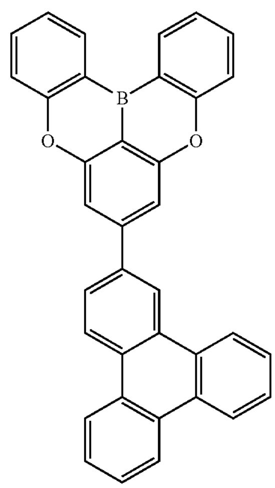
(B-5-49)
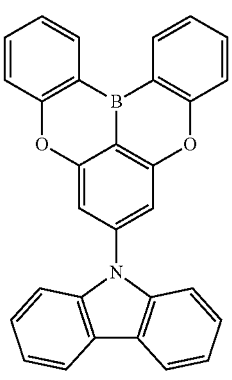
-continued
(B-5-50)
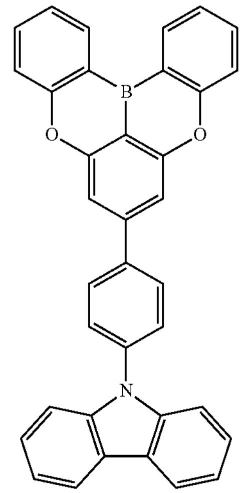
(B-5-51)
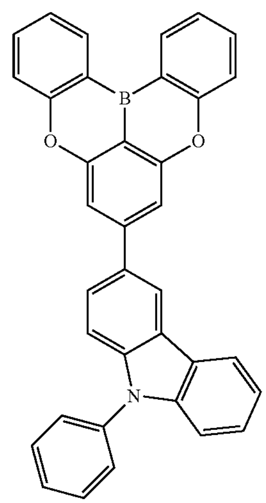
(B-5-52)
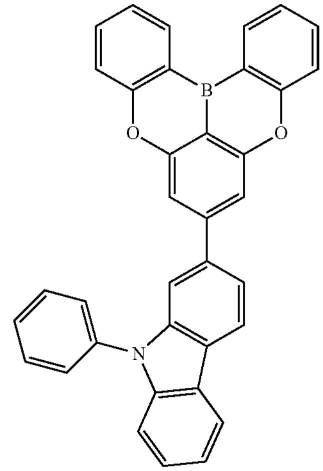

-continued
(B-5-61)
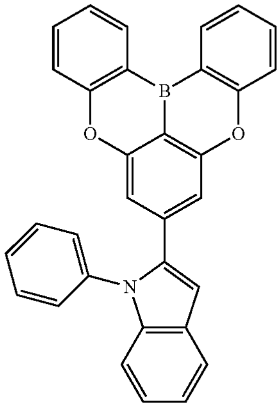
(B-5-62)
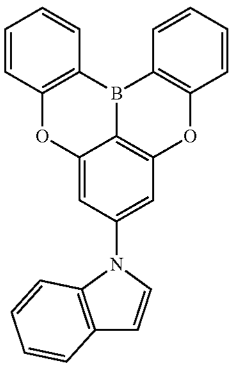
(B-5-63)
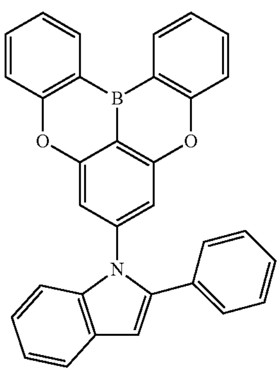
(B-5-64)
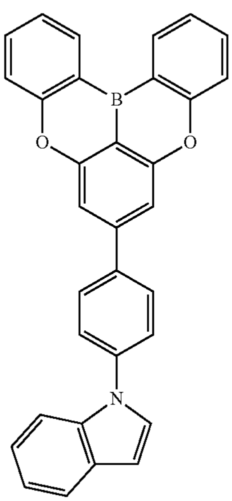
-continued
(B-5-65)
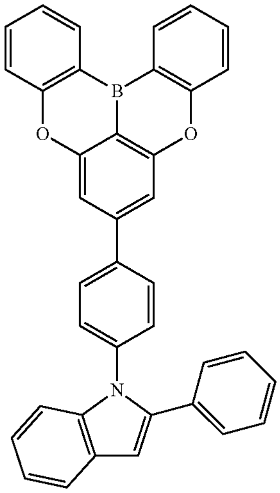
(B-5-66)
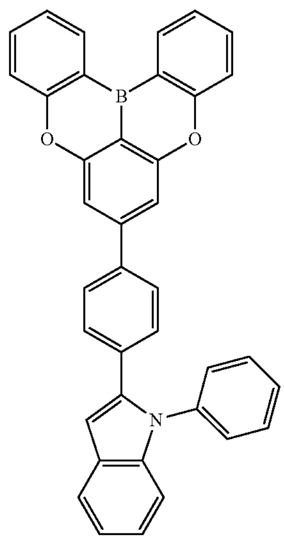
(B-5-67)
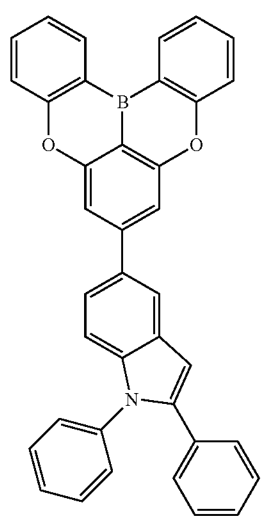

-continued
(B-5-68)
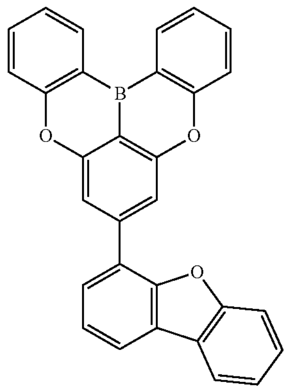
(B-5-69)
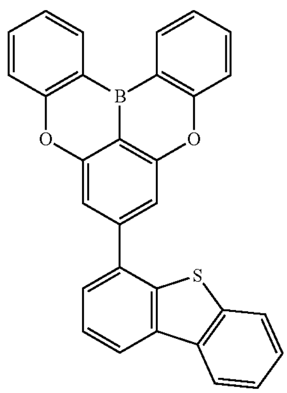
(B-5-70)
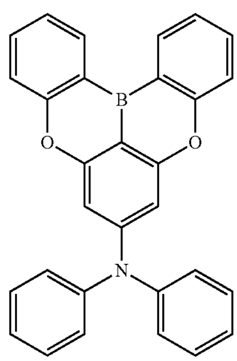
(B-5-71)
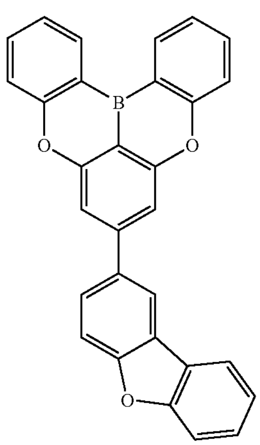
-continued
(B-5-72)
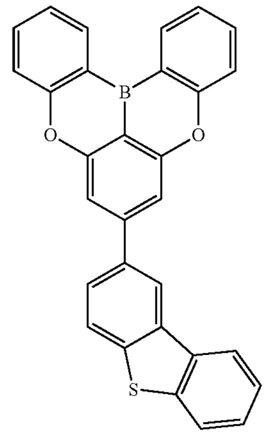
(B-5-73)
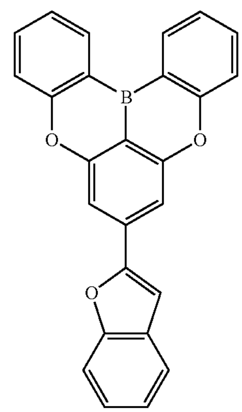
(B-5-74)
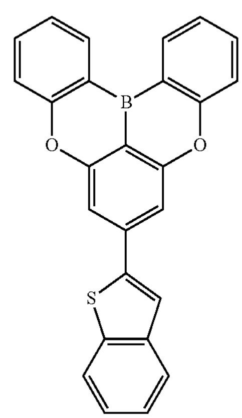

-continued
(B-5-75)
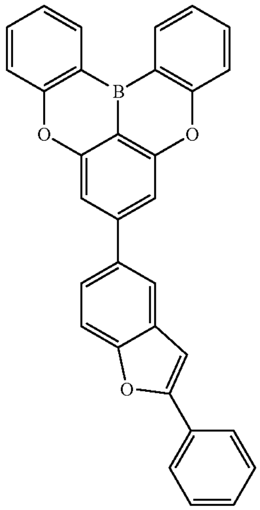
(B-5-76)
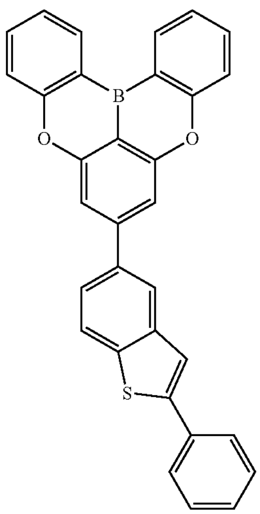
(B-5-77)
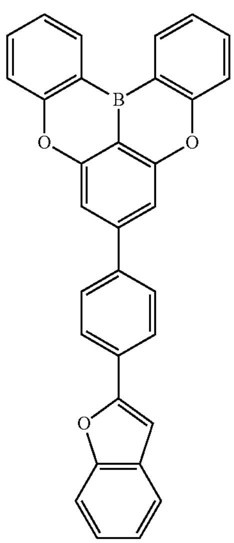
-continued
(B-5-78)
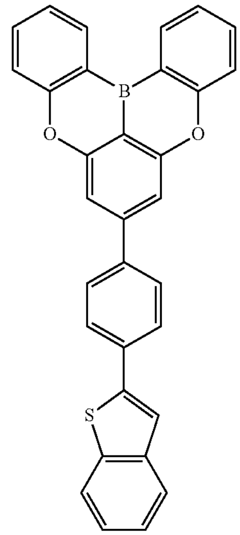
(B-5-79)
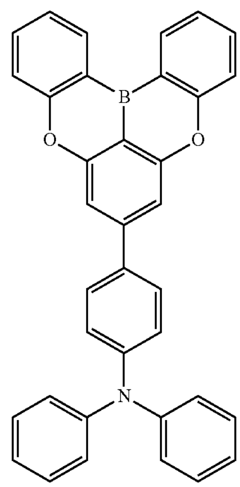
(B-5-80)
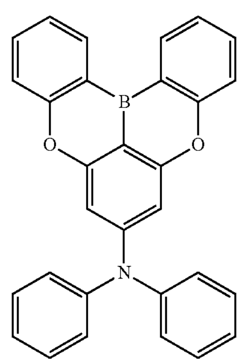

-continued
(B-5-81)
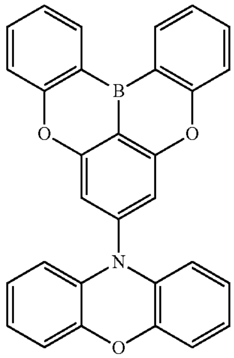
(B-5-82)
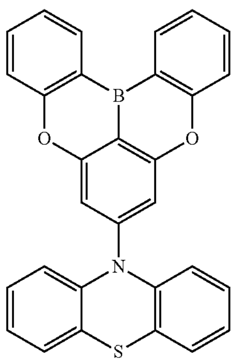
(B-5-83)
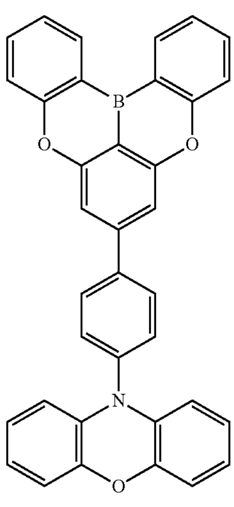
-continued
(B-5-84)
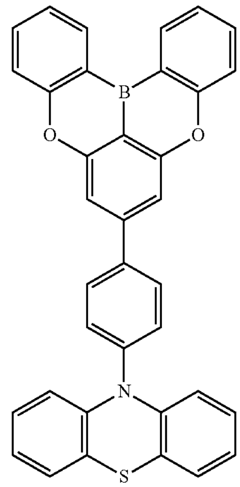
(B-5-91)
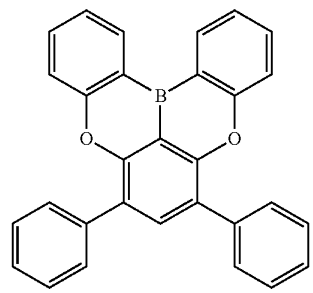
(B-5-92)
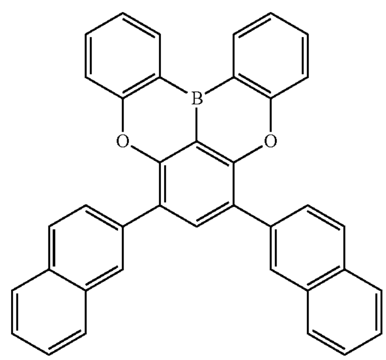
(B-5-93)
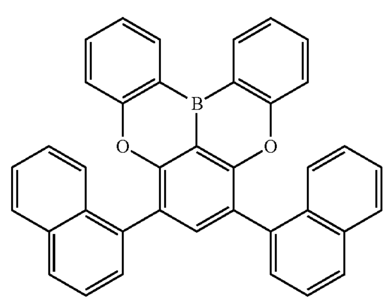

-continued
(B-5-94)
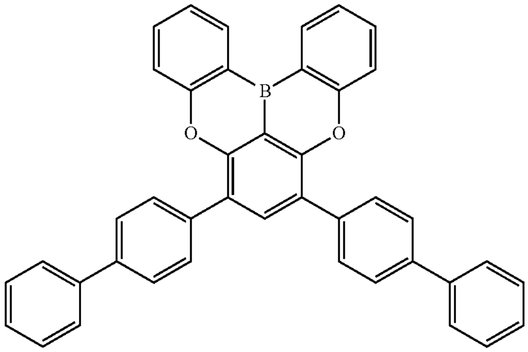
(B-5-95)
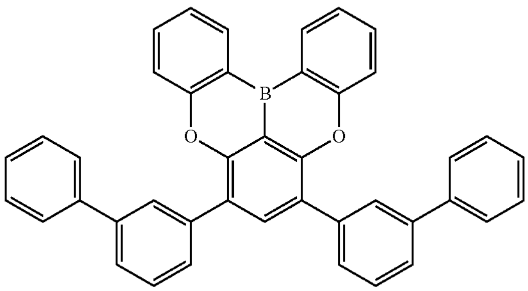
(B-5-96)
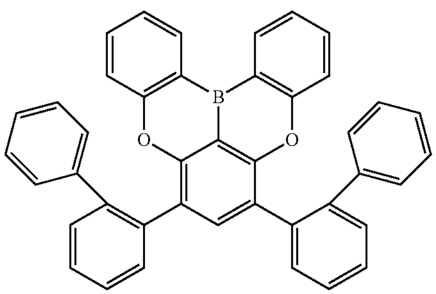
(B-5-97)
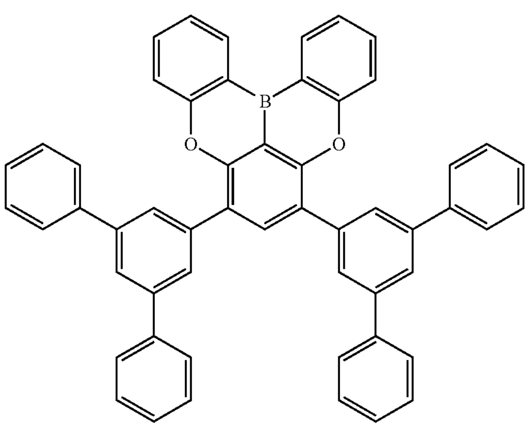
-continued
(B-5-98)
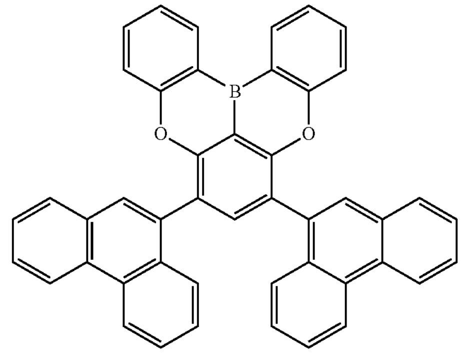
(B-5-99)
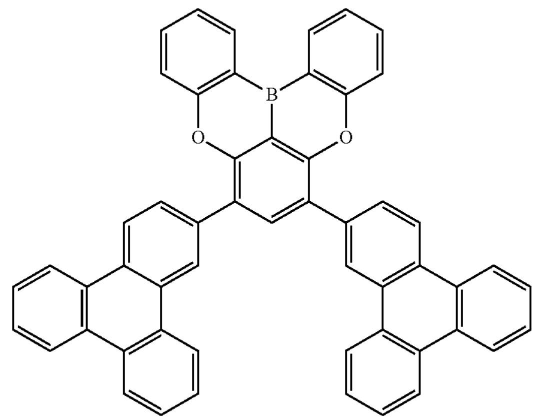
(B-5-100)
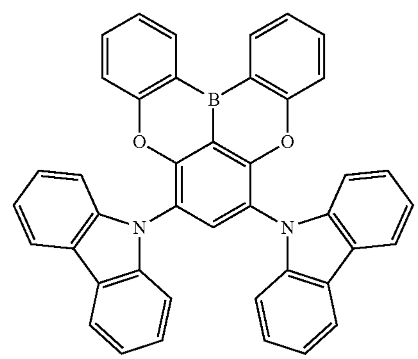
(B-5-101)
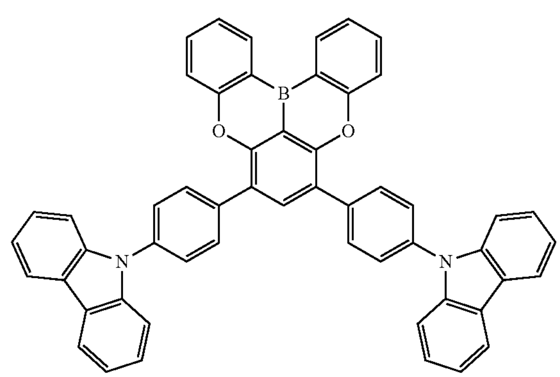

-continued
(B-5-111)
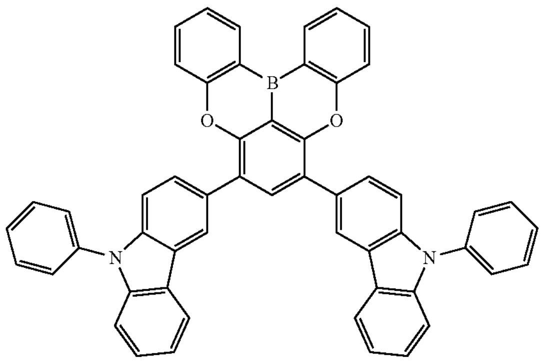
(B-5-112)
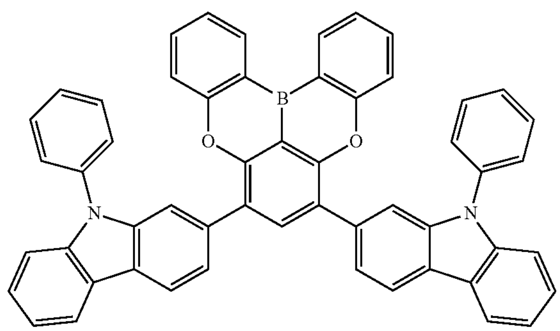
(B-5-113)
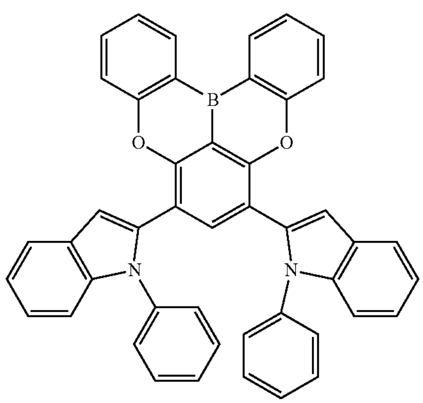
(B-5-114)
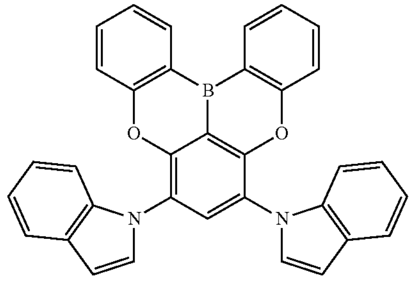
-continued
(B-5-115)
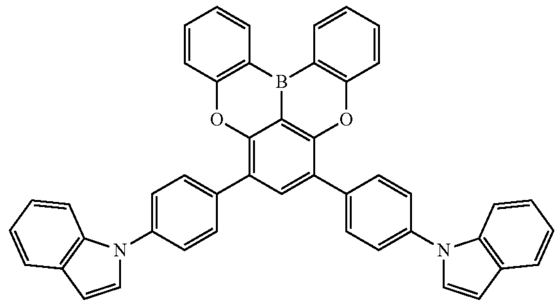
(B-5-116)
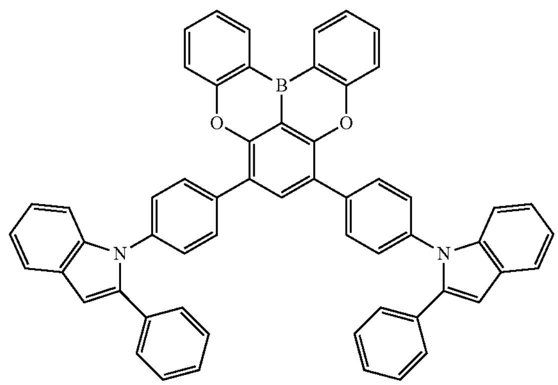
(B-5-117)
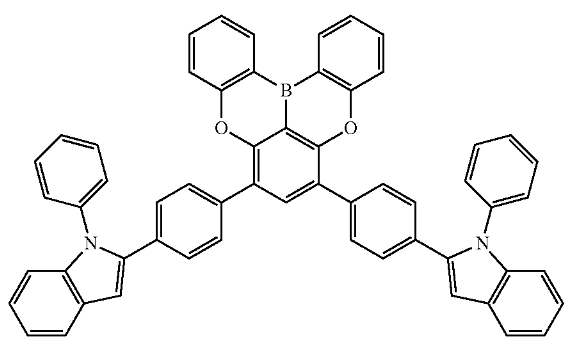
(B-5-118)
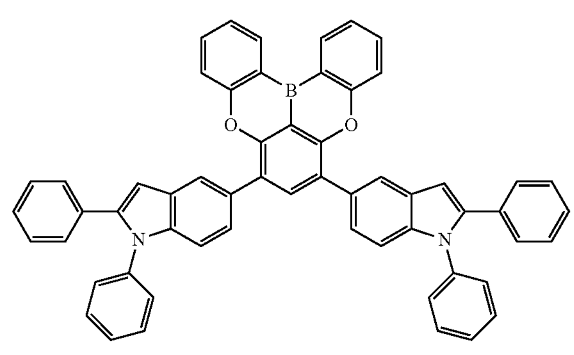

-continued
(B-5-121)
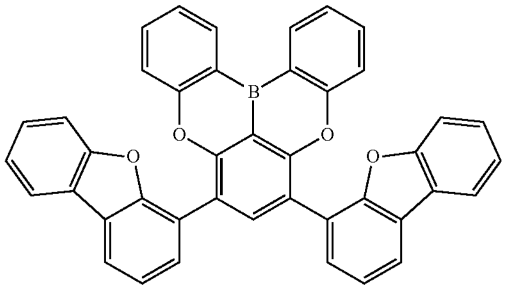
(B-5-122)
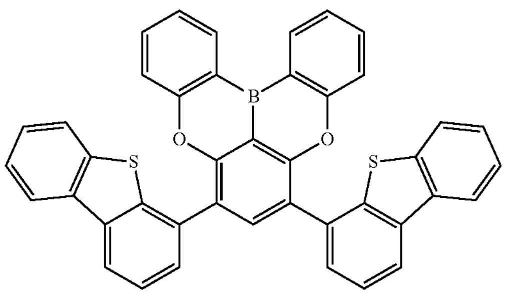
(B-5-123)
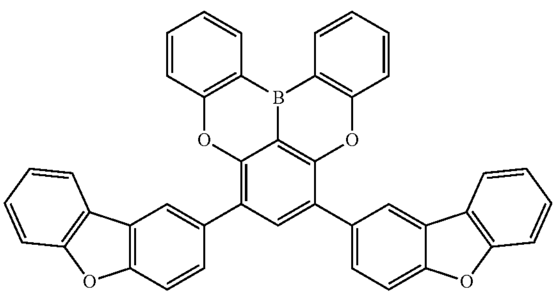
(B-5-124)
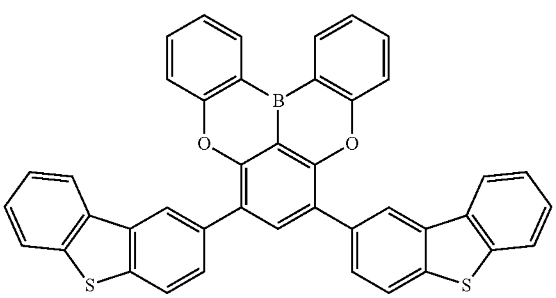
(B-5-125)
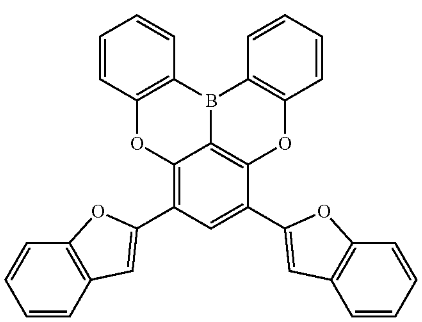
-continued
(B-5-126)
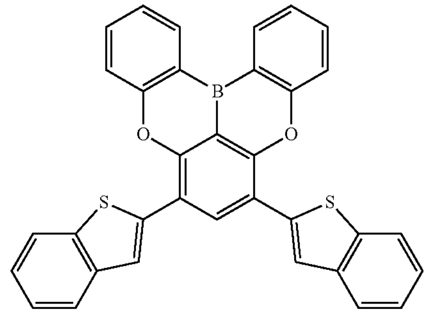
(B-5-127)
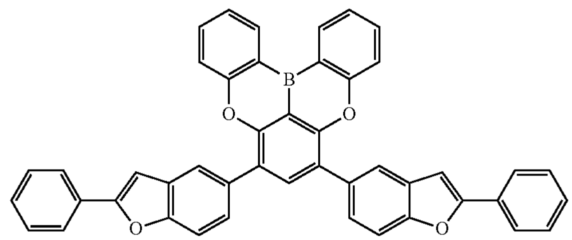
(B-5-128)
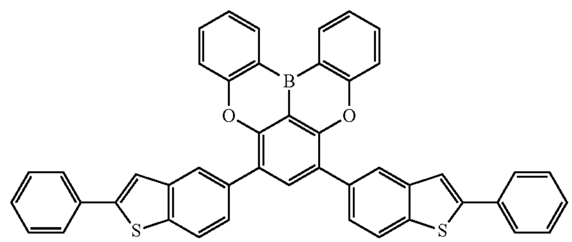
(B-5-129)
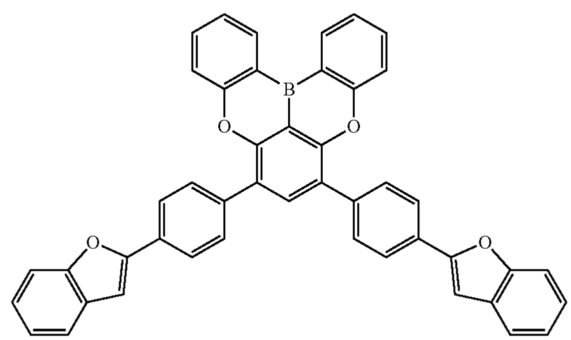
(B-5-130)
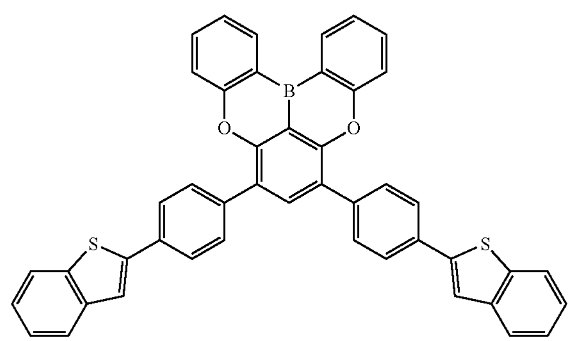

-continued
(B-5-141)
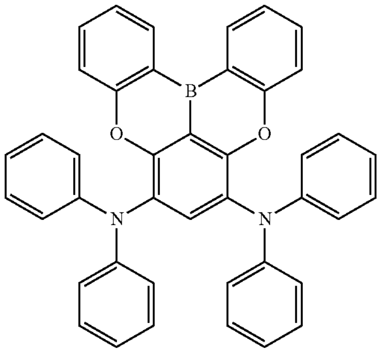
(B-5-142)
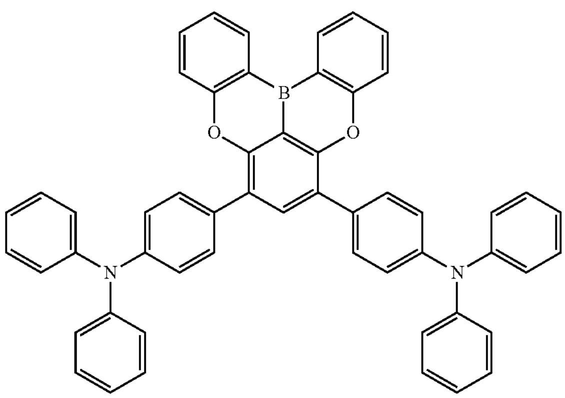
(B-5-143)
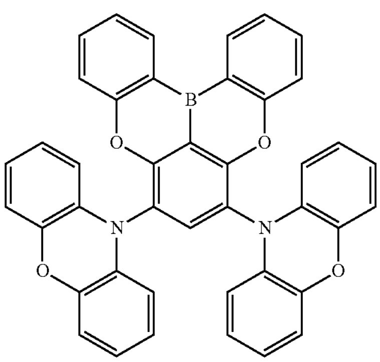
(B-5-144)
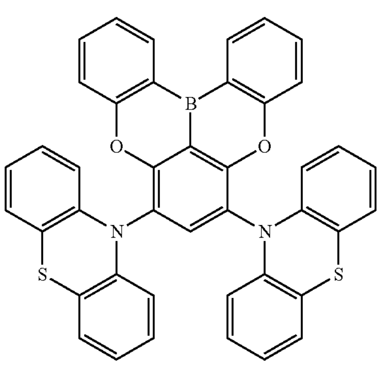
-continued
(B-5-145)
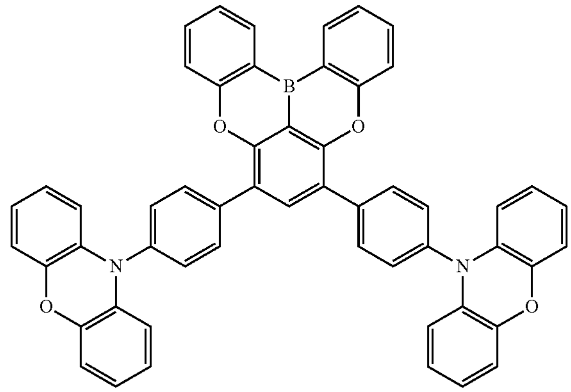
(B-5-146)
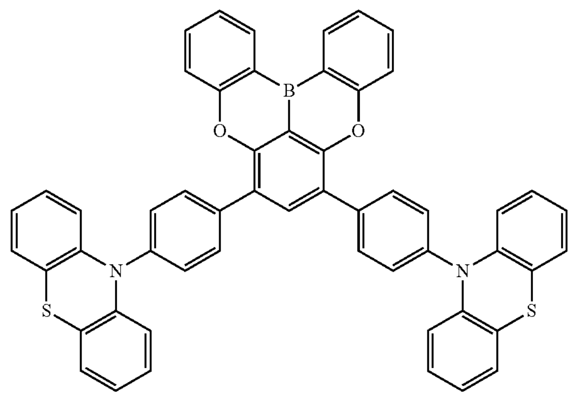
(B-5-151)
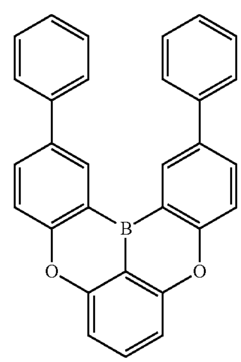
(B-5-152)
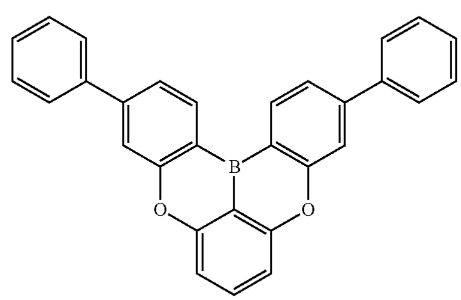

-continued
(B-5-153)
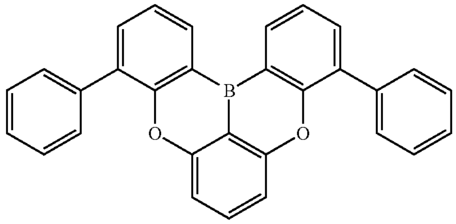
(B-5-154)
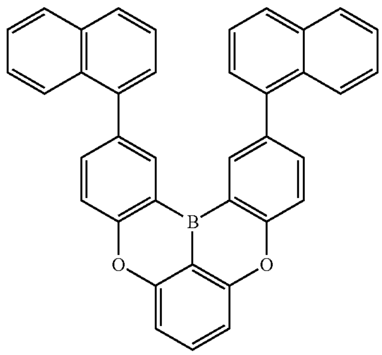
(B-5-155)
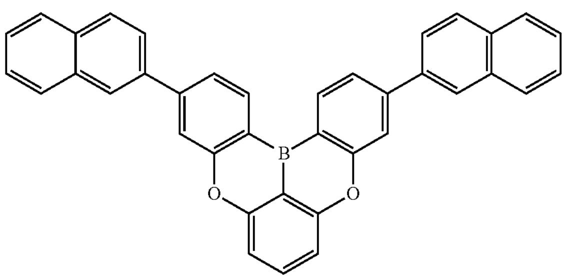
(B-5-156)
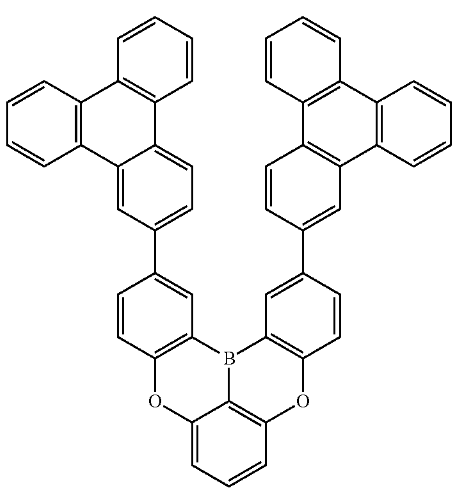
-continued
(B-5-157)
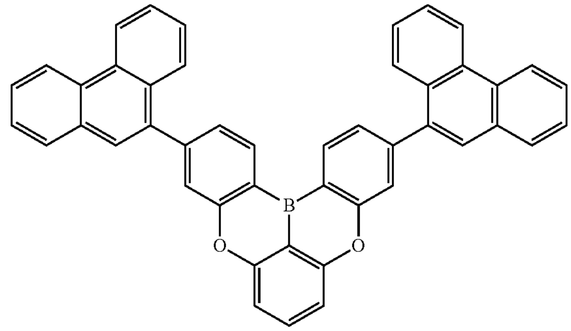
(B-5-158)
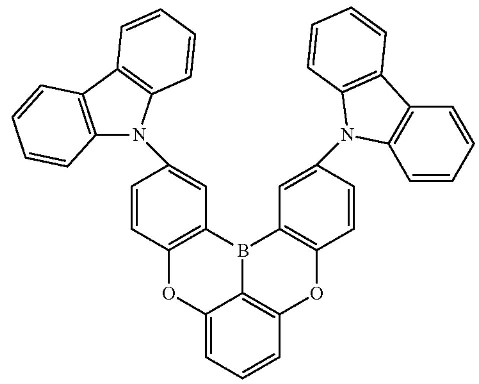
(B-5-159)
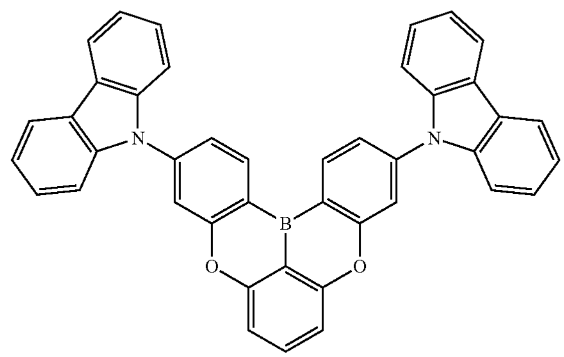
(B-5-160)
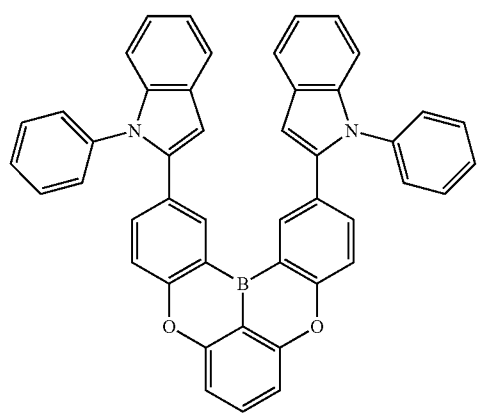

-continued
(B-5-161)
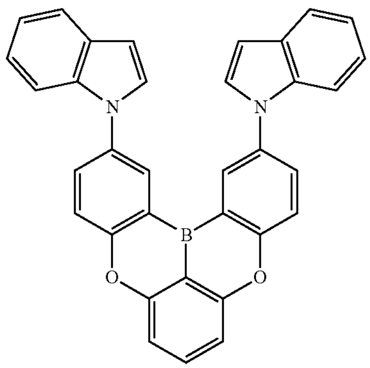
(B-5-171)
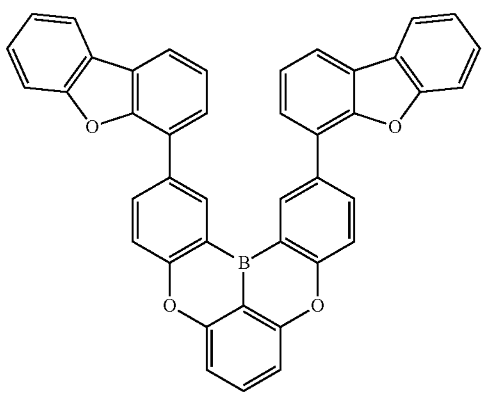
(B-5-172)
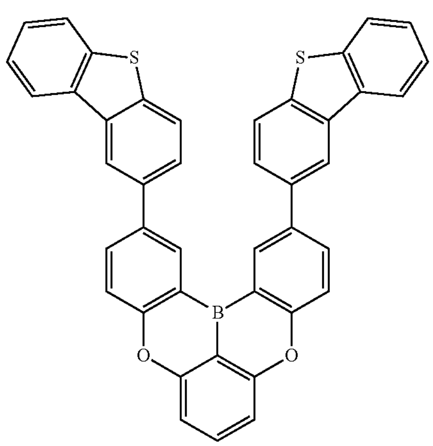
-continued
(B-5-173)
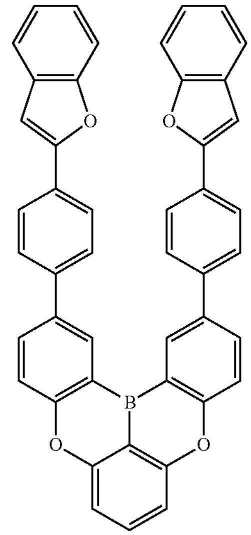
(B-5-174)
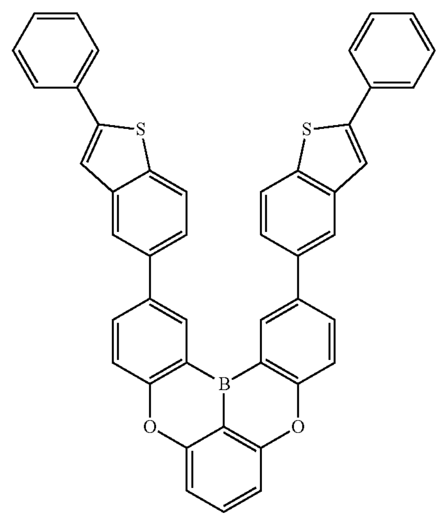
(B-5-175)
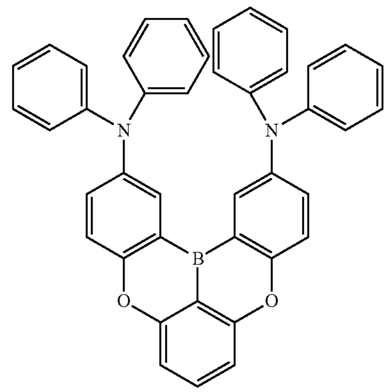

-continued
(B-5-176)
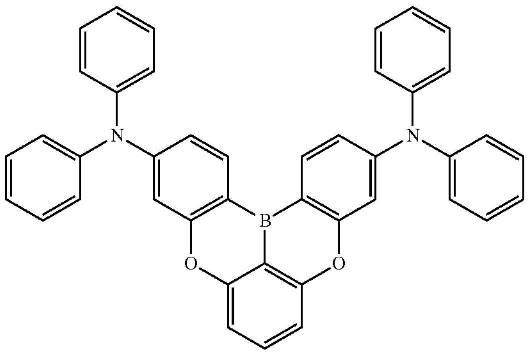
(B-5-177)
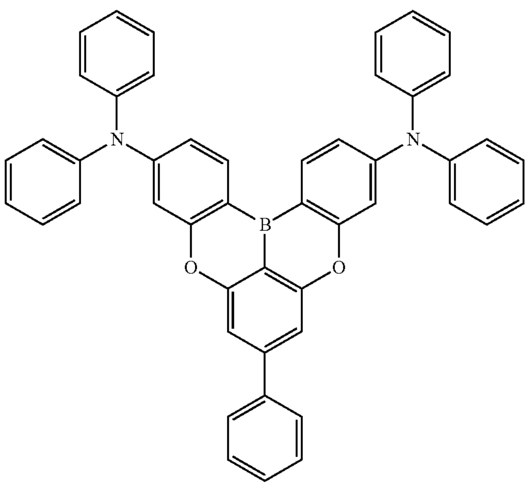
(B-5-178)
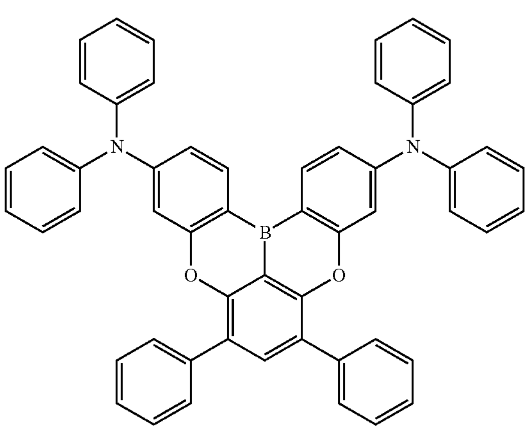
-continued
(B-5-179)
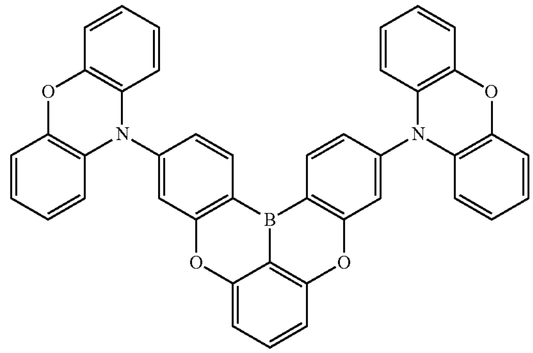
(B-5-1001)
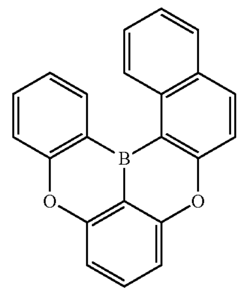
(B-5-1002)
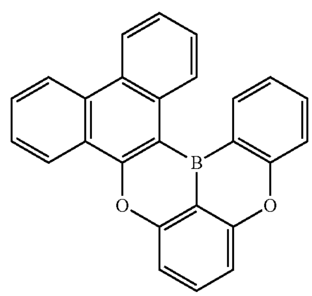
(B-5-1003)
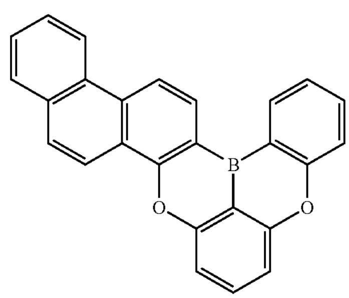
(B-5-1004)
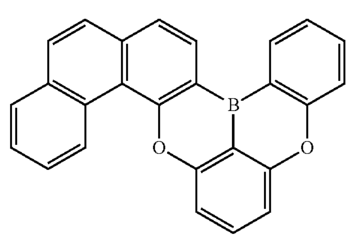

(B-5-1005)
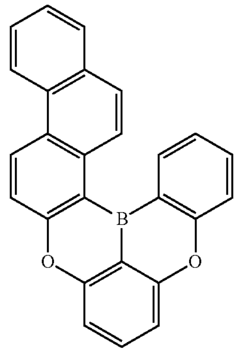
(B-5-1006)
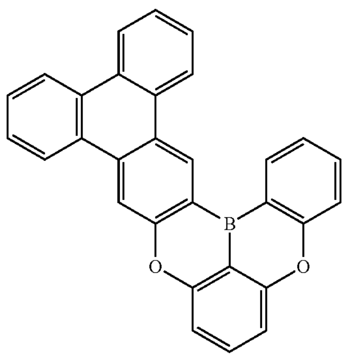
(B-5-1007)
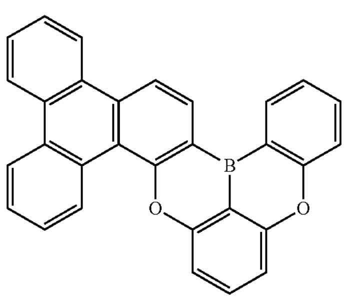
(B-5-1008)
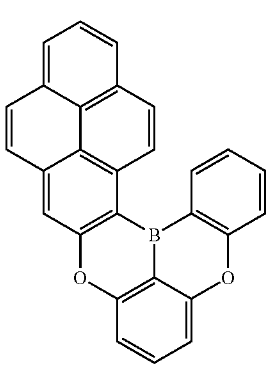
(B-5-1009)
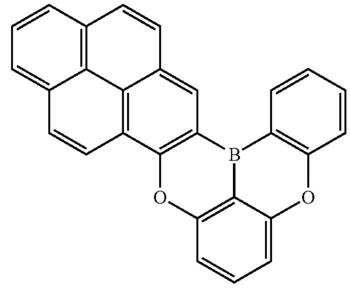
(B-5-1010)
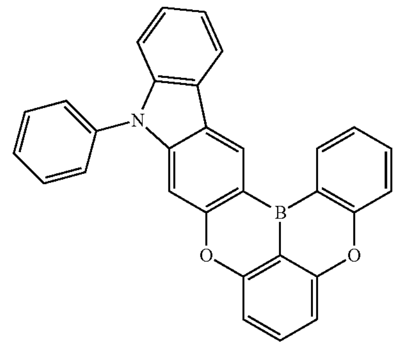
(B-5-1011)
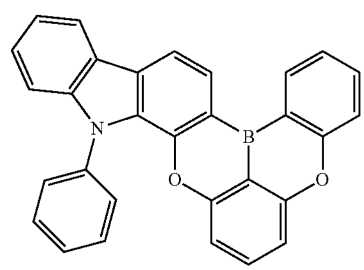
(B-5-1012)
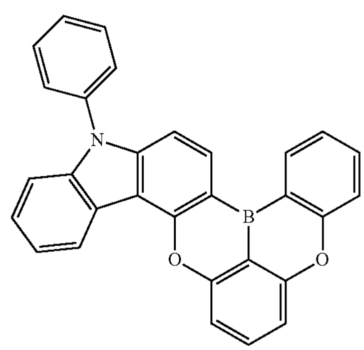
(B-5-1013)
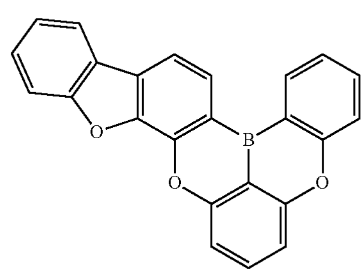

-continued
(B-5-1014)
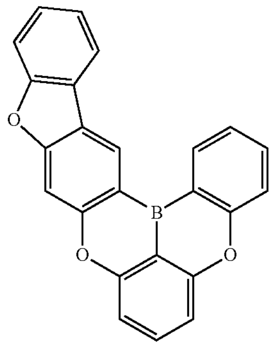
(B-5-1015)
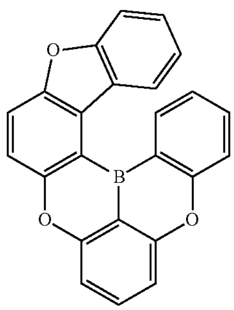
(B-5-1016)
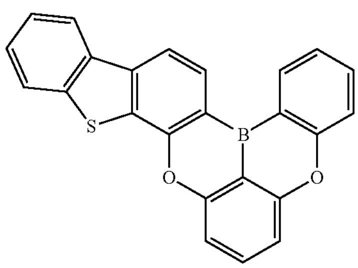
(B-5-1017)
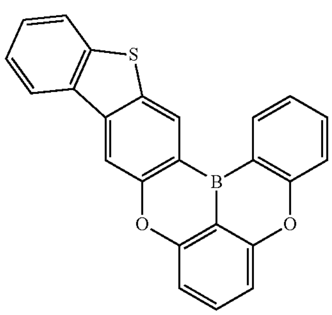
(B-5-1018)
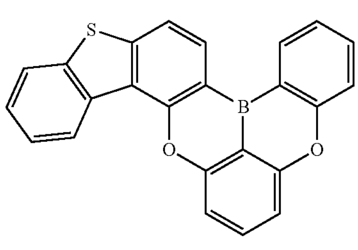
-continued
(B-5-1021)
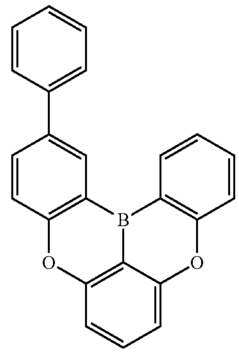
(B-5-1022)
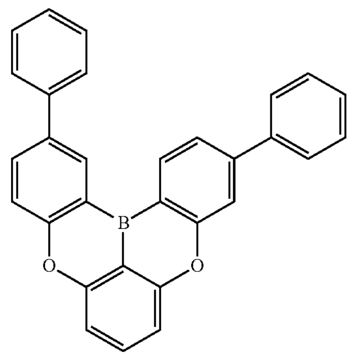
(B-5-1023)
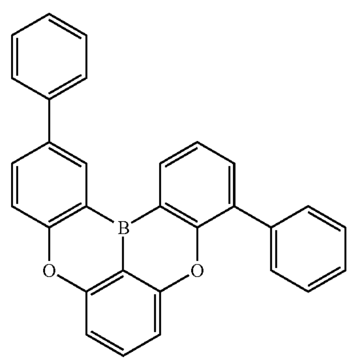
(B-5-1024)
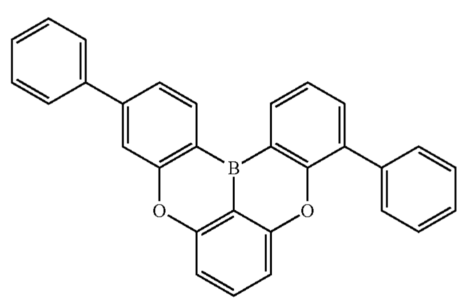

-continued
(B-5-1025)
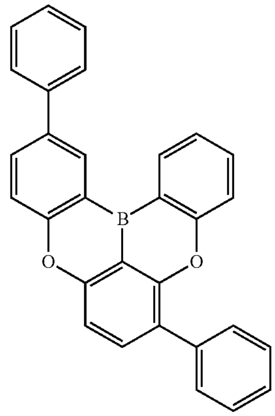
(B-5-1026)
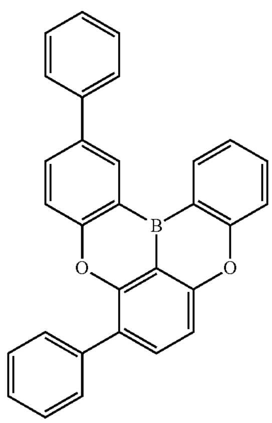
(B-5-1027)
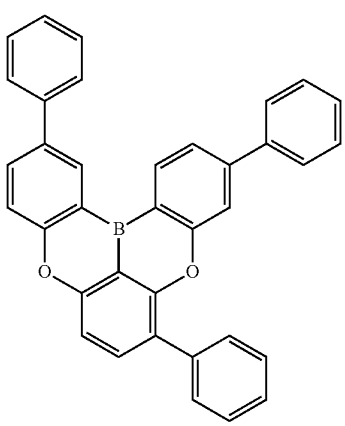
-continued
(B-5-1028)
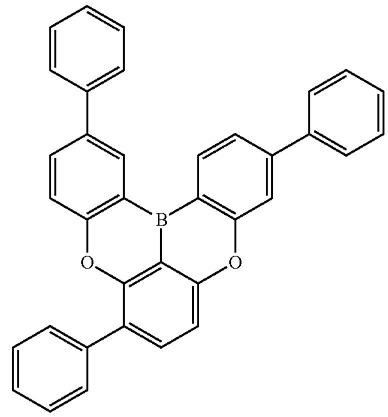
(B-5-1029)
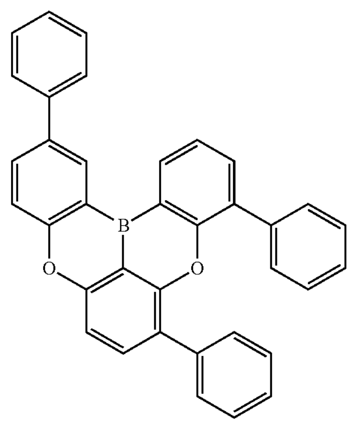
(B-5-1030)
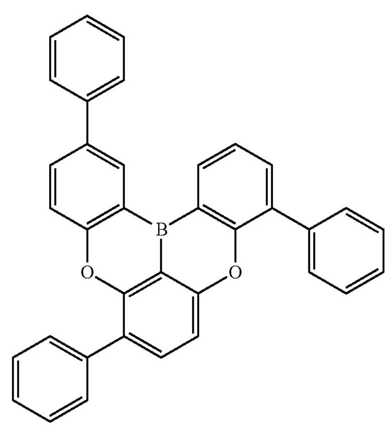

-continued
(B-5-1031)
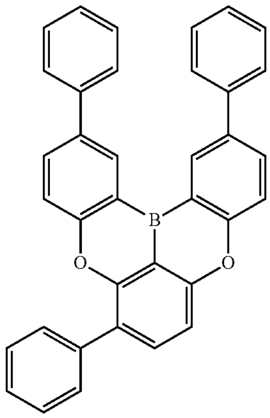
(B-5-1032)
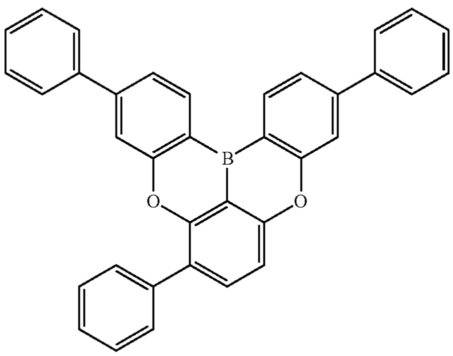
(B-5-1033)
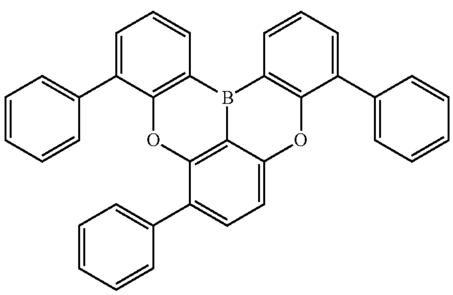
(B-5-1034)
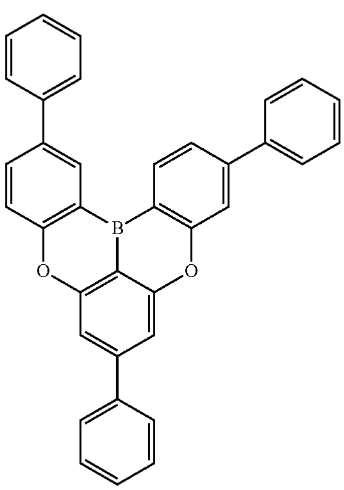
-continued
(B-5-1035)
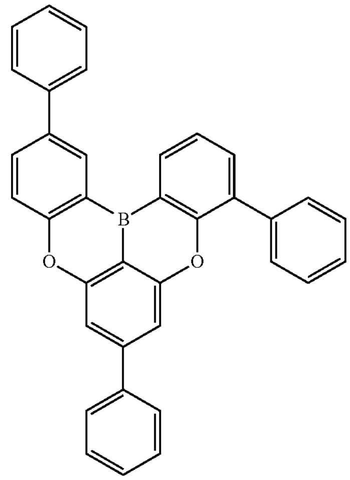
(B-5-1036)
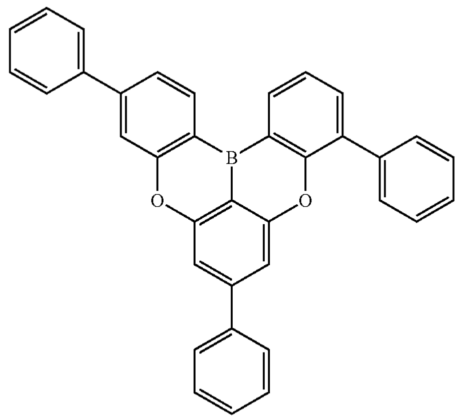
(B-5-1037)
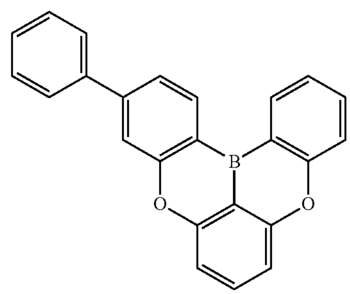
(B-5-1038)
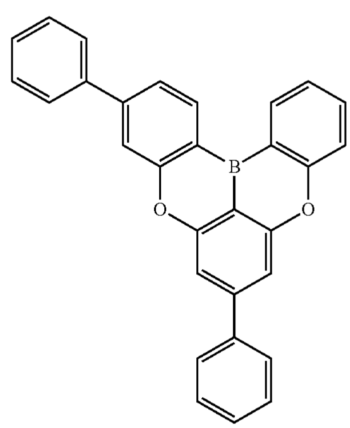

-continued
(B-5-1039)
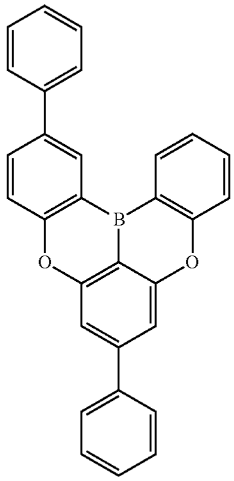
(B-5-1041)
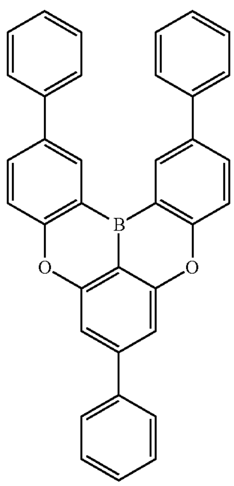
(B-5-1042)
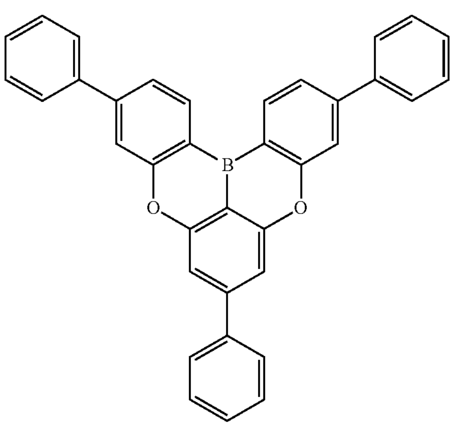
-continued
(B-5-1043)
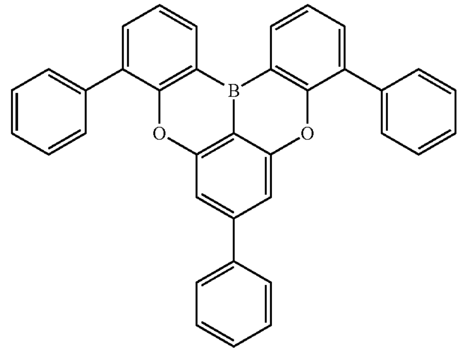
(B-5-1044)
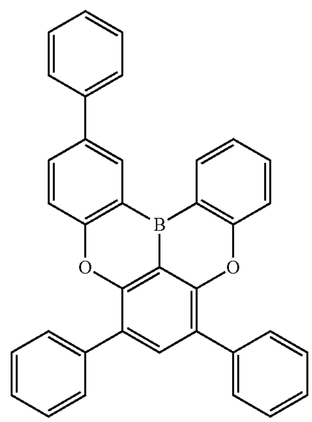
(B-5-1045)
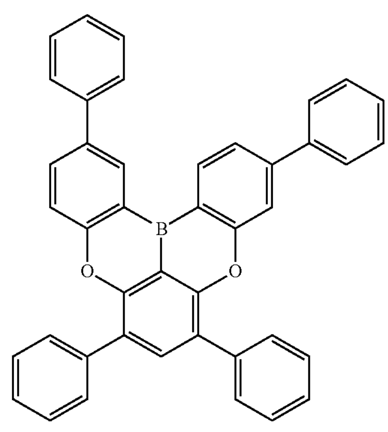

-continued
(B-5-1046)
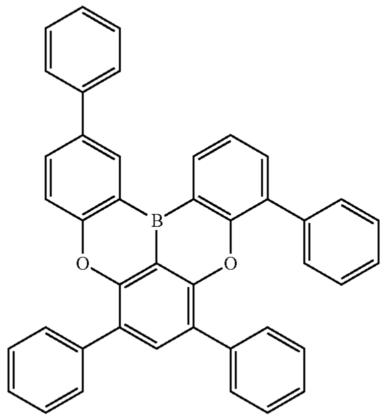
(B-5-1047)
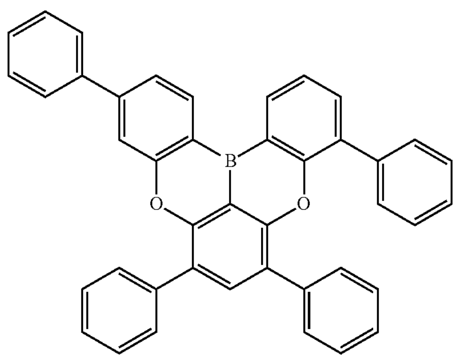
(B-5-1048)
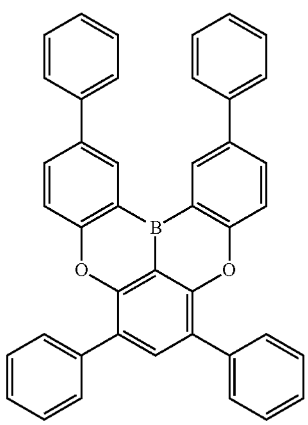
(B-5-1049)
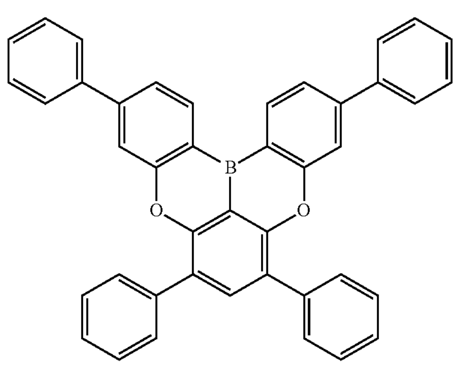
-continued
(B-5-1050)
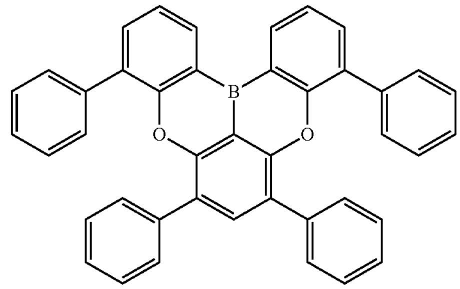
(B-5-1061)
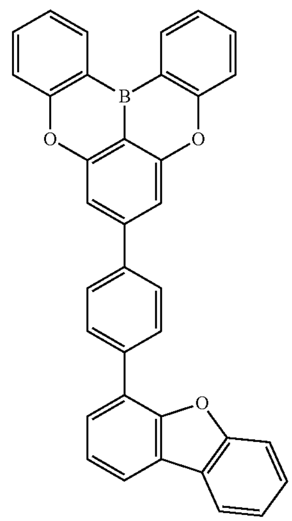
(B-5-1062)
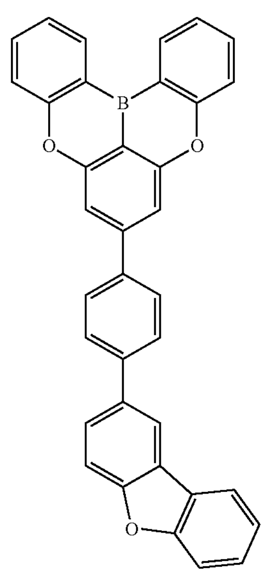

-continued
(B-5-1063)
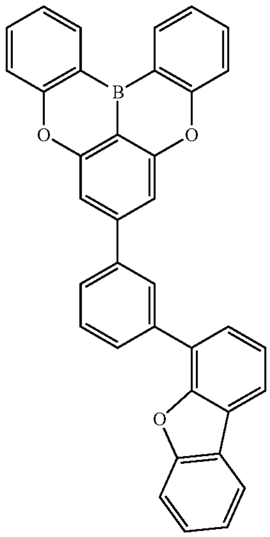
(B-5-1064)
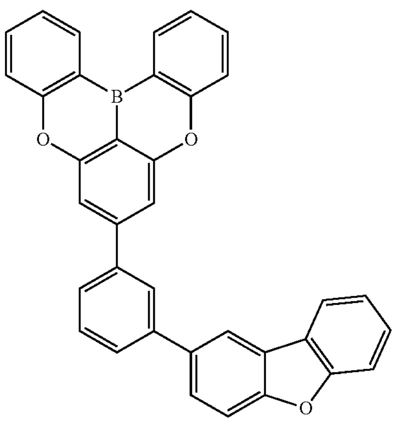
(B-5-1065)
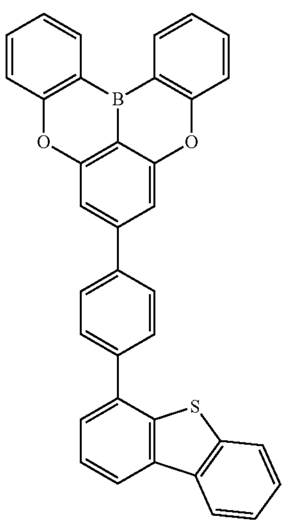
-continued
(B-5-1066)
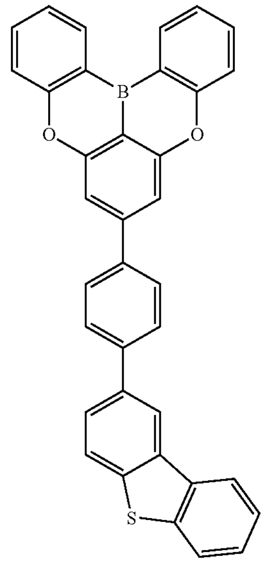
(B-5-1067)
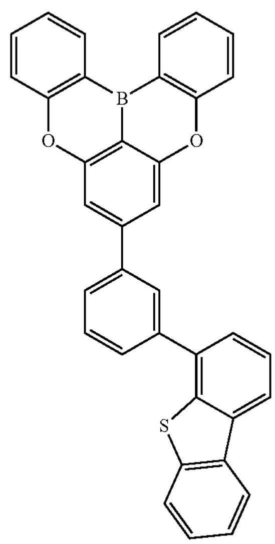
(B-5-1068)
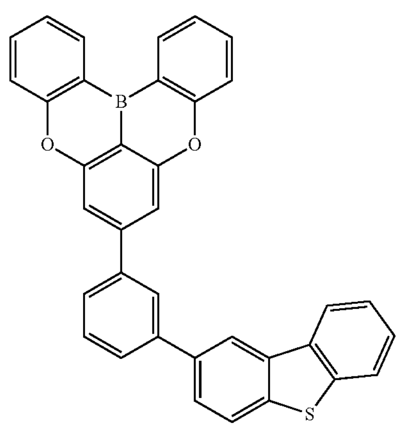

-continued
(B-5-1069)
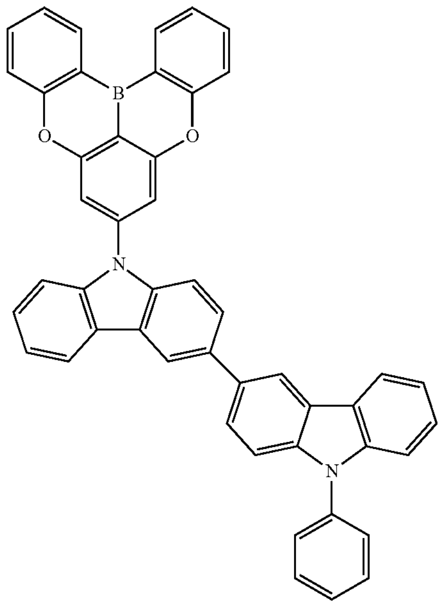
(B-5-1070)
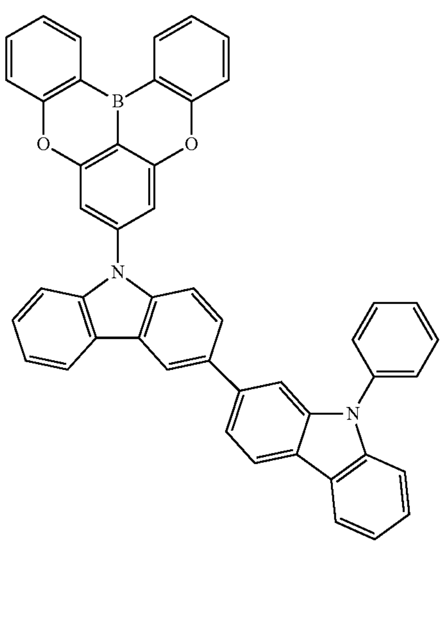
-continued
(B-5-1071)
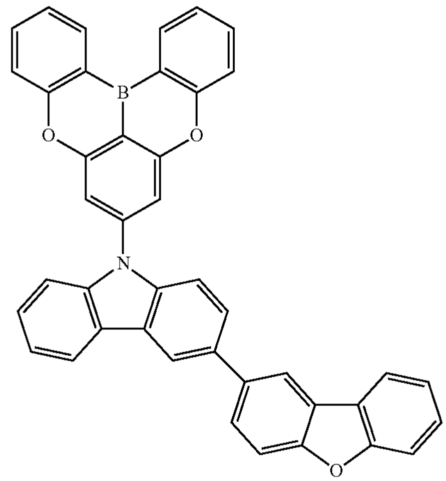
(B-5-1072)
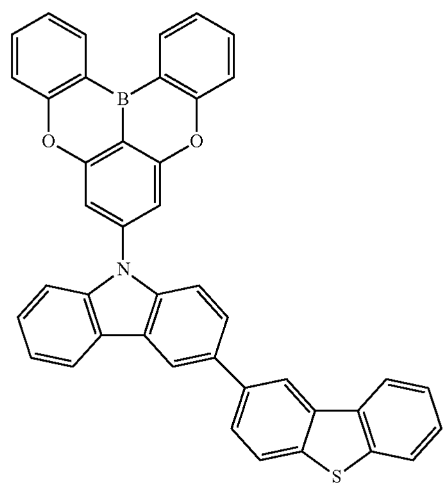
(B-5-1081)
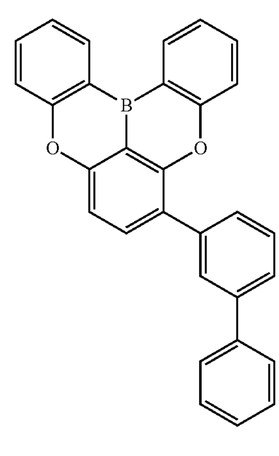

-continued
(B-5-1082)
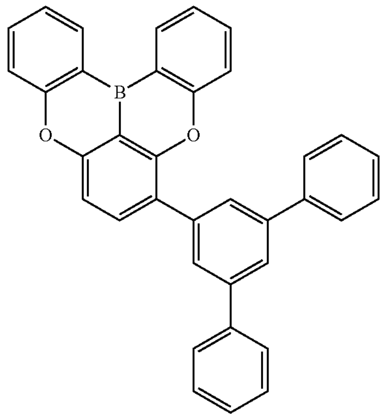
(B-5-1083)
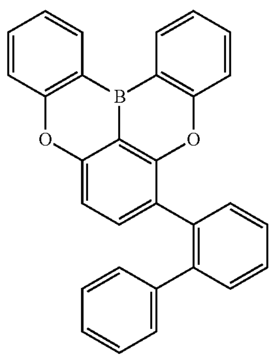
(B-5-1084)
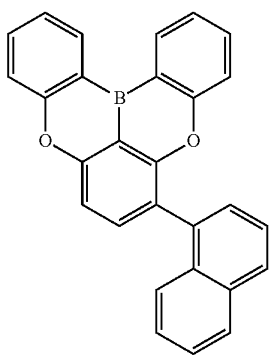
(B-5-1085)
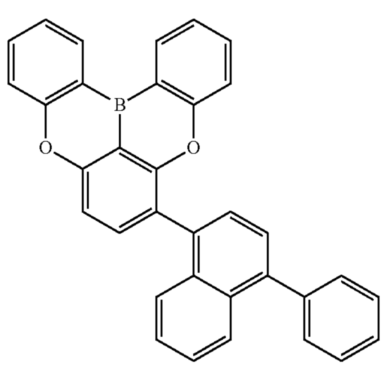
-continued
(B-5-1086)
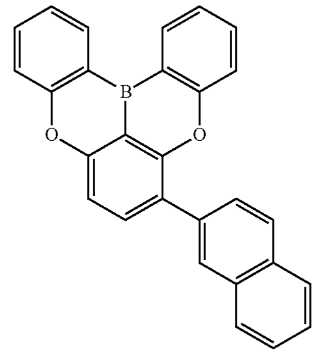
(B-5-1087)
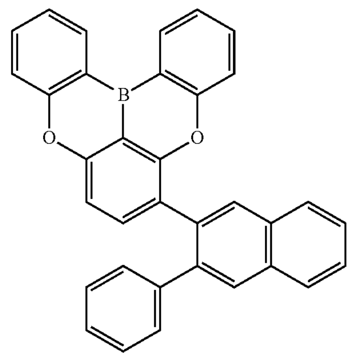
(B-5-1088)
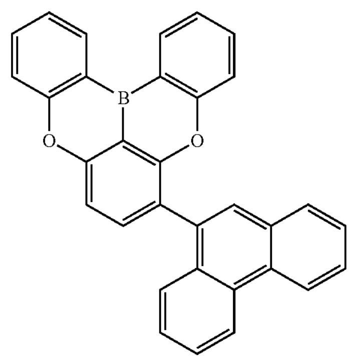
(B-5-1089)
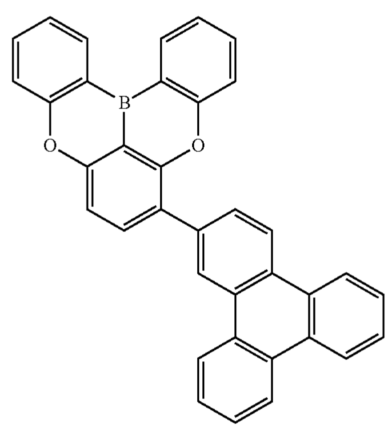

-continued
(B-5-1090)
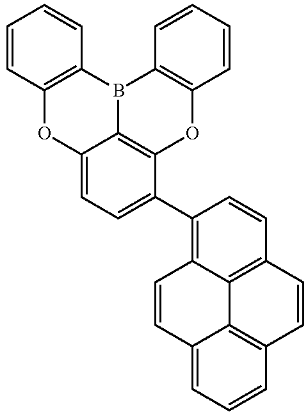
(B-5-1091)
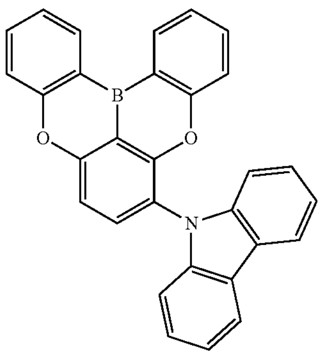
(B-5-1092)
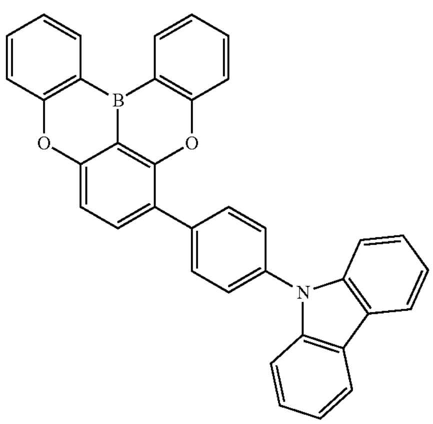
(B-5-1093)
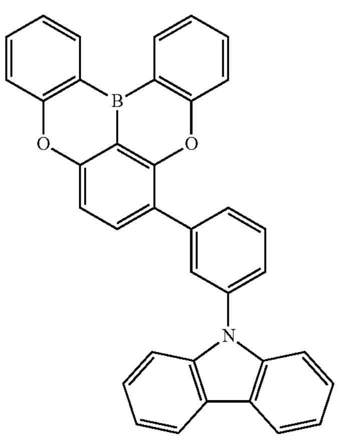
-continued
(B-5-1094)
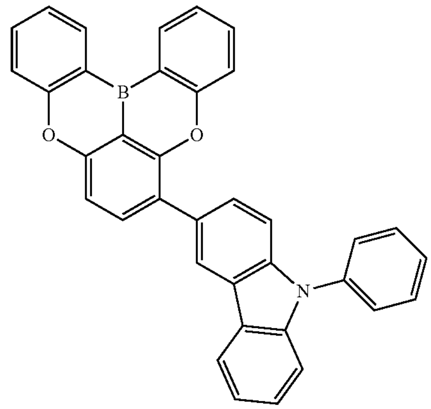
(B-5-1095)
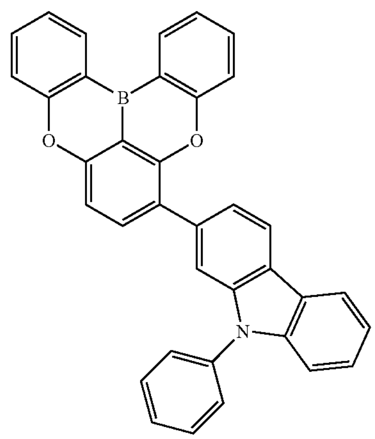
(B-5-1096)
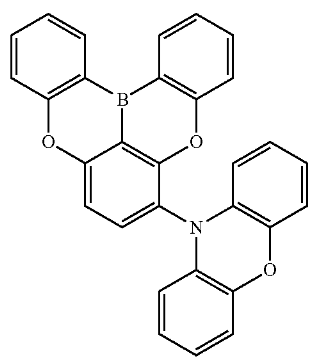

-continued
(B-5-1101)
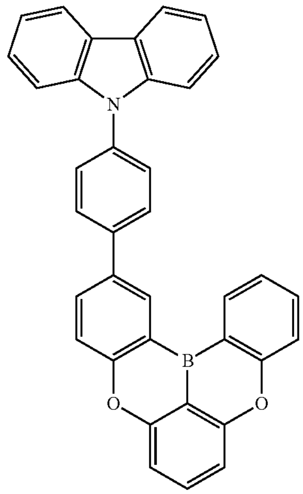
(B-5-1102)
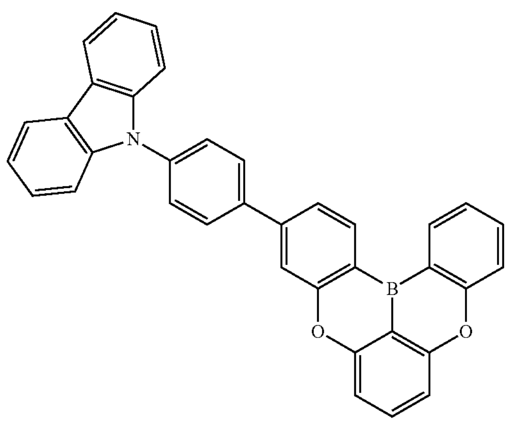
(B-5-1103)
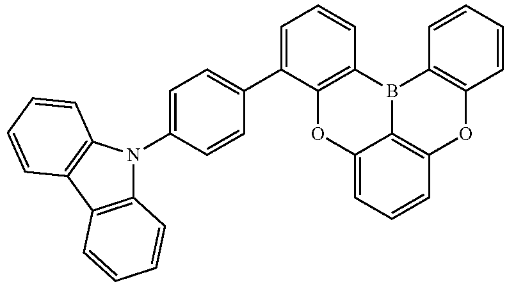
-continued
(B-5-1104)
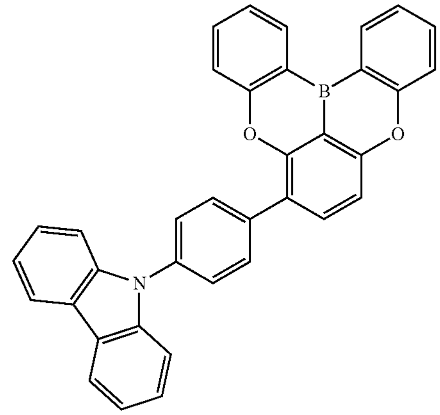
(B-5-1105)
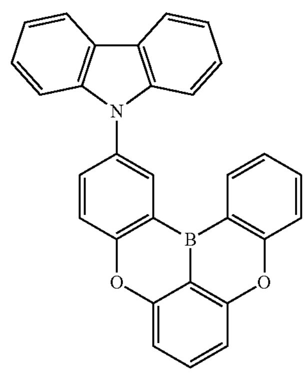
(B-5-1106)
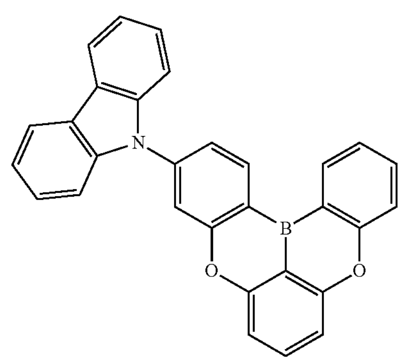

-continued
(B-5-1107)
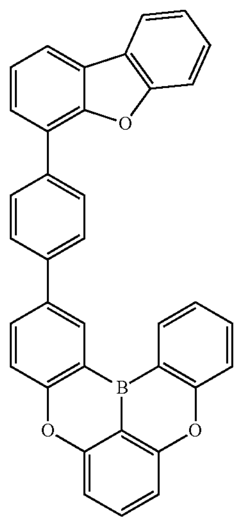
(B-5-1108)
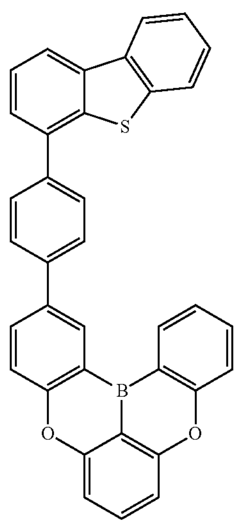
(B-5-1109)
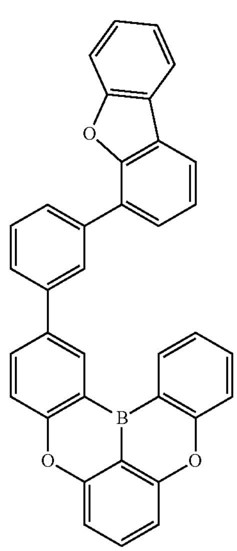
-continued
(B-5-1110)
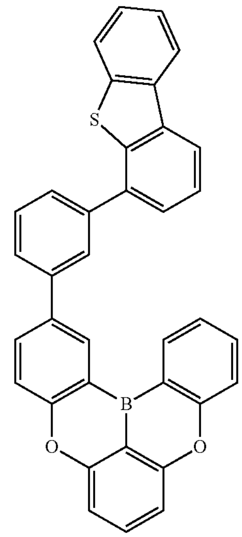
(B-5-1111)
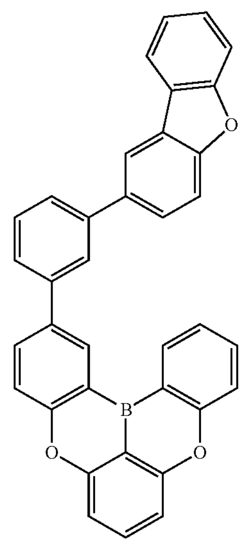
(B-5-1112)
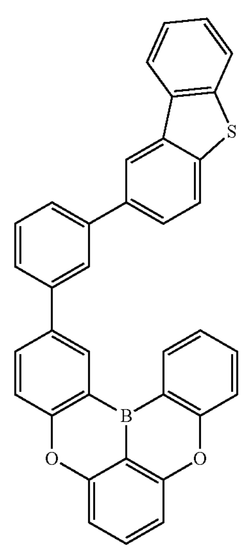

-continued
(B-5-1113)
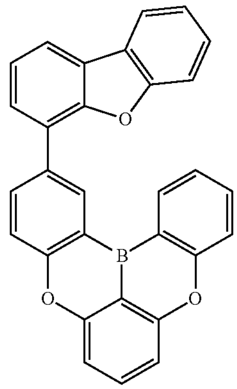
(B-5-1114)
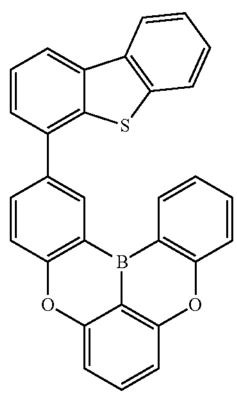
(B-5-1121)
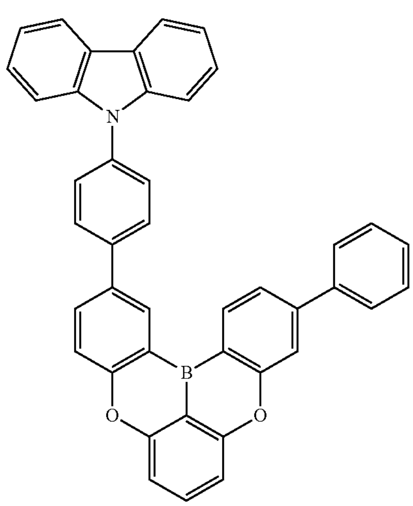
-continued
(B-5-1122)
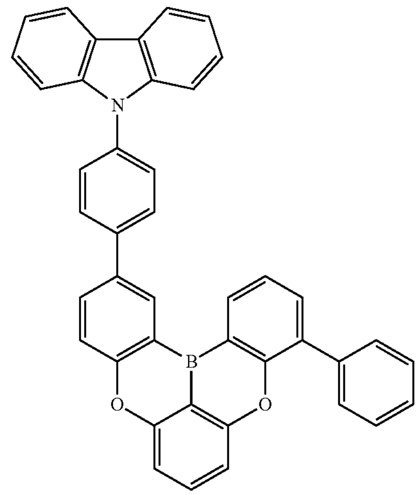
(B-5-1123)
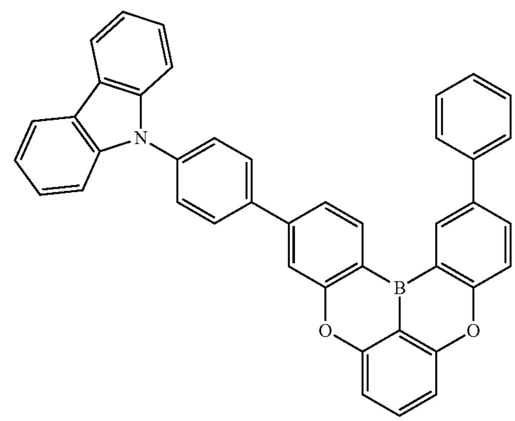
(B-5-1124)
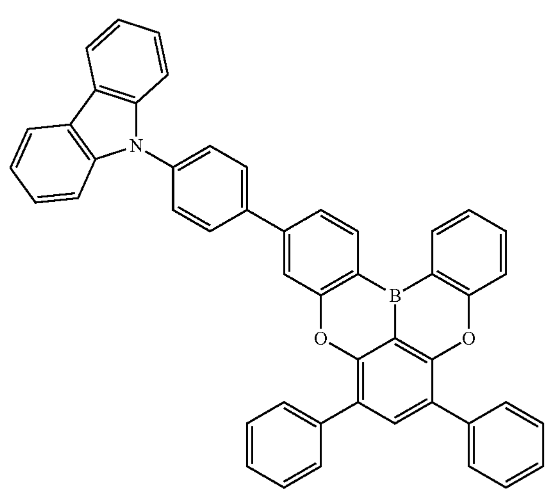

-continued
(B-5-1125)
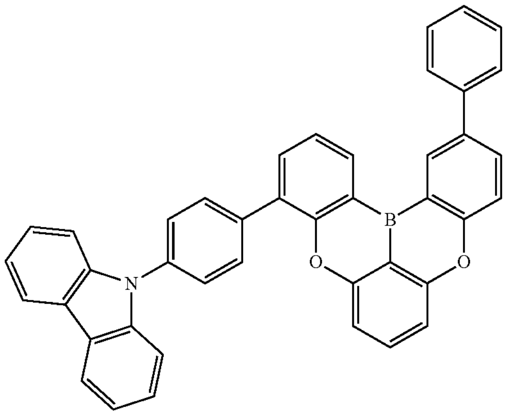
(B-5-1126)
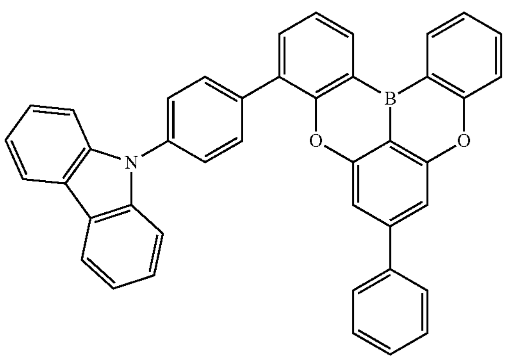
(B-5-1127)
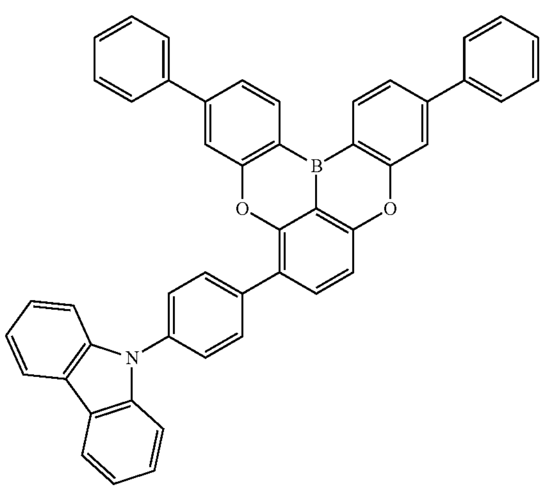
-continued
(B-5-1128)
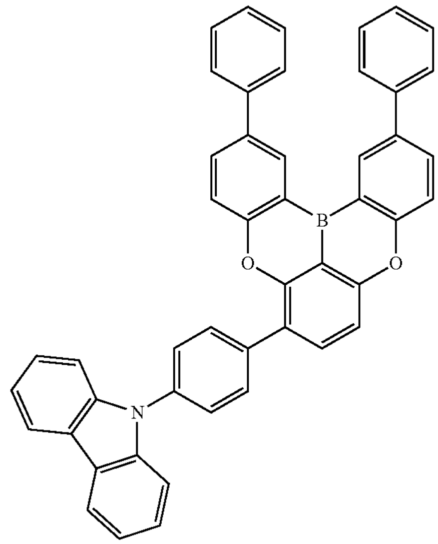
(B-5-1129)
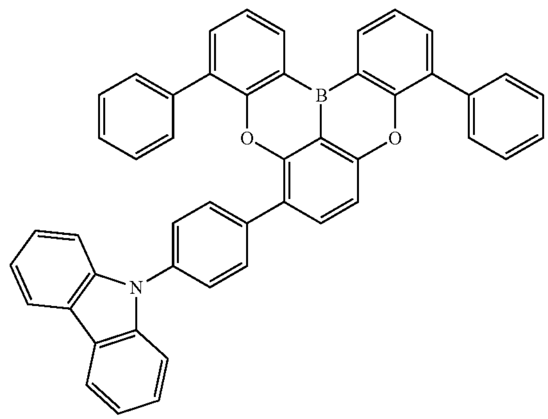
(B-5-1130)
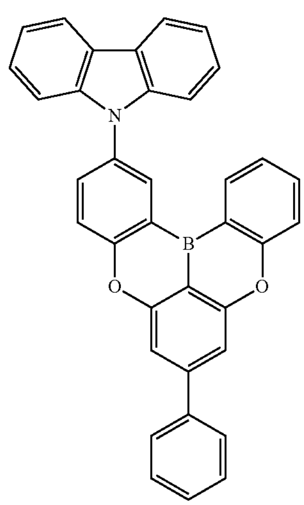

-continued
(B-5-1131)
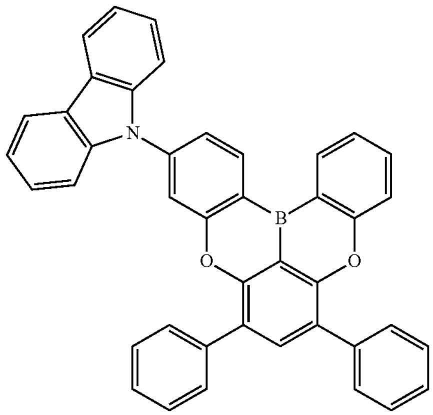
(B-5-1132)
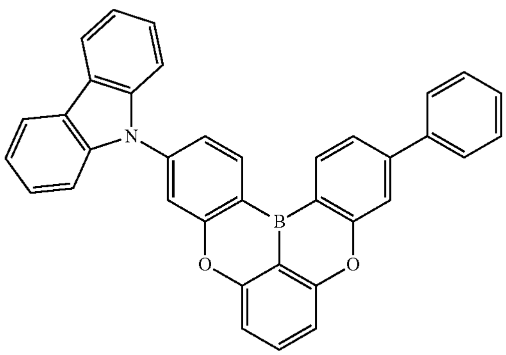
(B-5-1141)
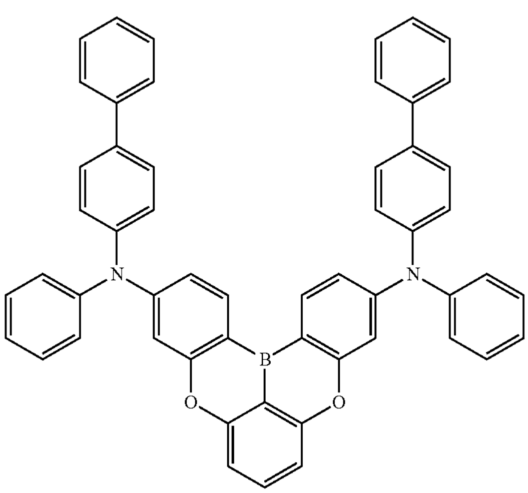
-continued
(B-5-1142)
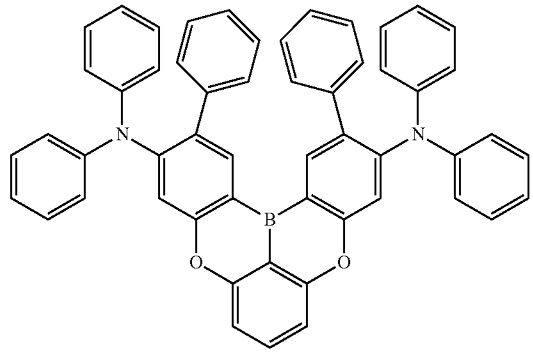
(B-5-1143)
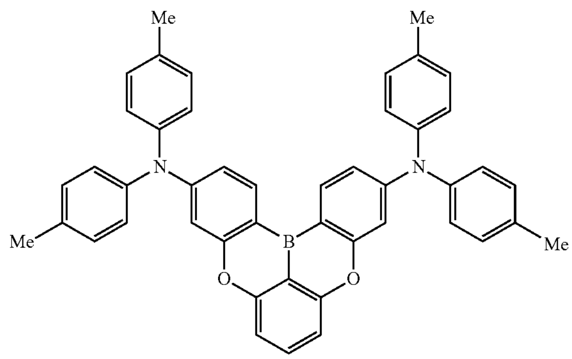
(B-5-1144)
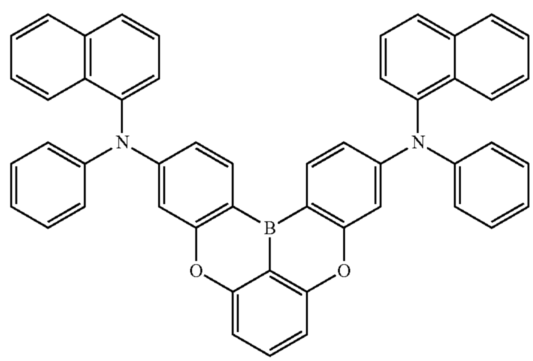
(B-5-1145)
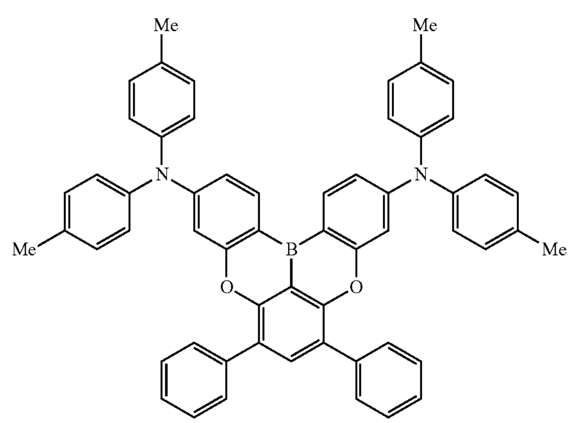

(B-51146)

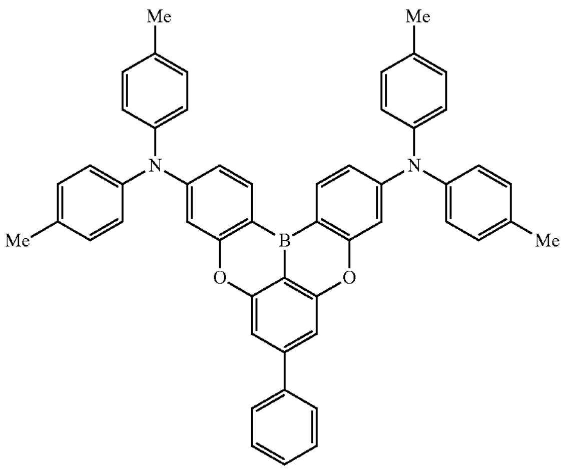

(B-5-1147)

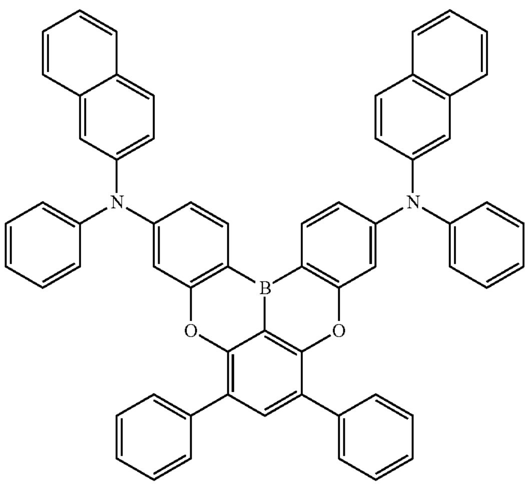

(B-5-1148)

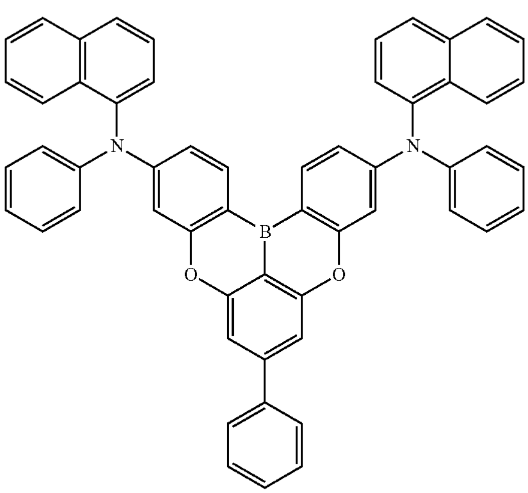

(B-5-1271)

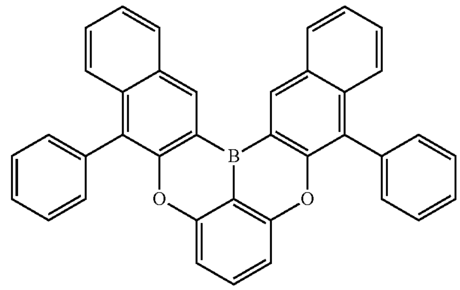

Among compounds represented by the above formulas (B-5-1) to (B-5-179), (B-5-1001) to (B-5-1148), and (B-5-1271), a compound represented by formula (B-5-1), (B-5-2), (B-5-4), (B-5-10), (B-5-49), (B-5-81), (B-5-91), (B-5-100), (B-5-141), (B-5-151), (B-5-176), (B-5-50), (B-5-152), (B-5-1048), (B-5-1049), (B-5-1050), (B-5-1069), (B-5-1084), (B-5-1090), (B-5-1092), (B-5-1101), (B-5-1102), (B-5-1103), (B-5-1145), (B-5-1271), (B-5-79), (B-5-142), (B-5-158), (B-5-159), (B-5-1006), or (B-5-1104) is more preferable, and a compound represented by formula (B-5-1), (B-5-2), (B-5-4), (B-5-10), (B-5-49), (B-5-81), (B-5-91), (B-5-100), (B-5-141), (B-5-151), or (B-5-176) is particularly preferable. Furthermore, a compound in which at least one hydrogen atom in these compounds is substituted by a group represented by formula (FG-1), a group represented by formula (FG-2), or an alkyl having 1 to 24 carbon atoms at * is preferable from a viewpoint of high solubility, good film formability, and high in-plane orientation.

1-2-3. Polymer Host Material: Compound Represented by General Formula (B-6)

(B-6)

$$EC \leftarrow\!\!\left(MU\right)_k\!\!\rightarrow EC$$

In formula (B-6), MU's each independently represent at least one selected from the group consisting of divalent groups of compounds represented by general formulas (B-1) to (B-5), two hydrogen atoms in MU are substituted by EC or MU, EC's each independently represent a hydrogen atom, an aryl, a heteroaryl, a diarylamino, a diheteroarylamino, an arylheteroarylamino, or an aryloxy, at least one hydrogen atom in these may be further substituted by an aryl, a heteroaryl, or a diarylamino, and k is an integer of 2 to 50000. K is preferably an integer of 100 to 40000, and more preferably an integer of 500 to 25000.

At least one hydrogen atom of EC in formula (B-6) may be substituted by a group represented by general formula (FG-1), a group represented by general formula (FG-2), an alkyl having 1 to 24 carbon atoms, a halogen atom, or a deuterium atom, further any —$CH_2$— in the alkyl may be substituted by —O— or —$Si(CH_3)_2$—, any —$CH_2$— excluding —$CH_2$— directly bonded to EC in formula (B-6) in the alkyl may be substituted by an arylene having 6 to 24 carbon atoms, and any hydrogen atom in the alkyl may be substituted by a fluorine atom.

Examples of MU include divalent groups represented by the following general formulas (MU-1-1) to (MU-1-12), (MU-2-1) to (MU-2-202) (MU-3-1) to (MU-3-201), (MU-4-1) to (MU-4-122), and (MU-5-1) to MU-5-12). Examples of EC include groups represented by the following general formulas (EC-1) to (EC-29) In these groups, MU is bonded to MU or EC at * and EC is bonded to MU at *.

Furthermore, a compound represented by formula (B-6) preferably has at least one divalent group represented by formula (B-6-X1) in a molecule from a viewpoint of charge transport, and more preferably has a divalent group represented by formula (B-6-X1) in an amount of 10% or more with respect to the molecular weight of the compound represented by formula (B-6).

(MU-1-1)

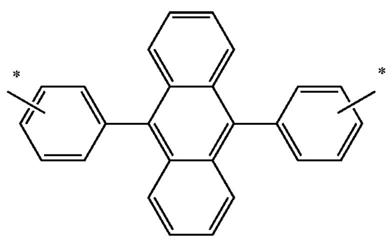

(MU-1-2)

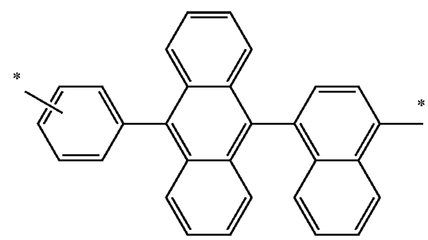

(MU-1-3)

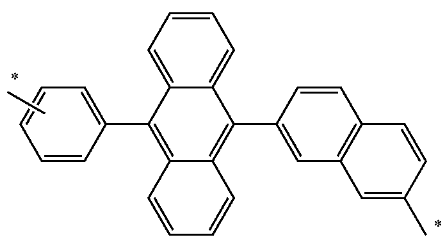

(MU-1-4)

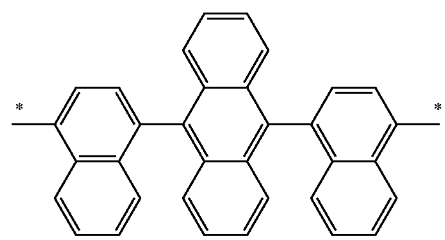

(MU-1-5)

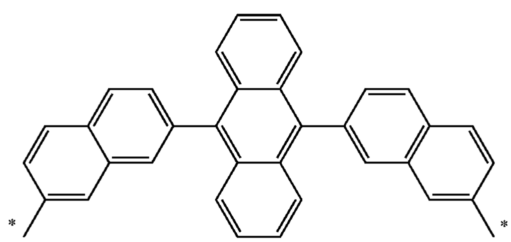

(MU-1-6)

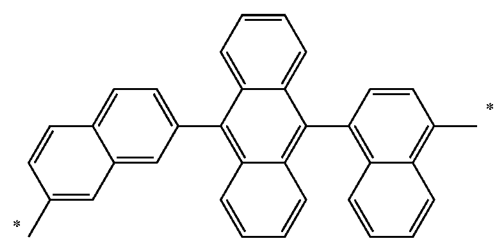

(MU-1-11)

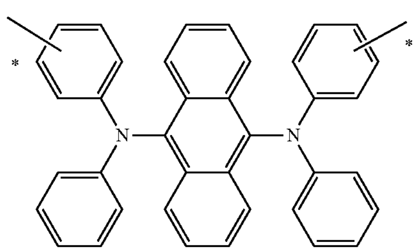

(MU-1-12)

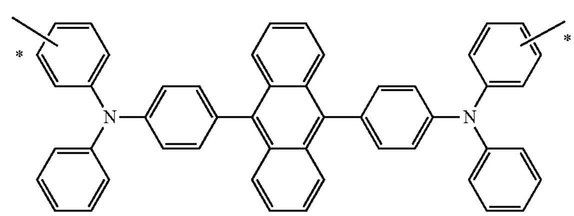

(MU-2-1)

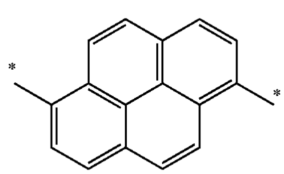

(MU-2-2)

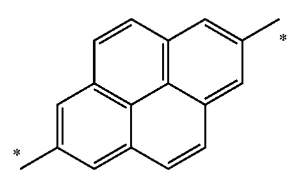

(MU-2-3)

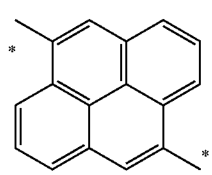

(MU-2-4)

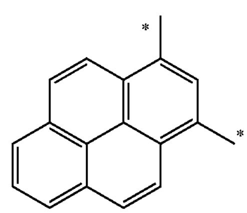

-continued
(MU-2-5)
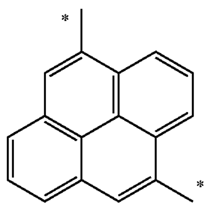
(MU-2-11)
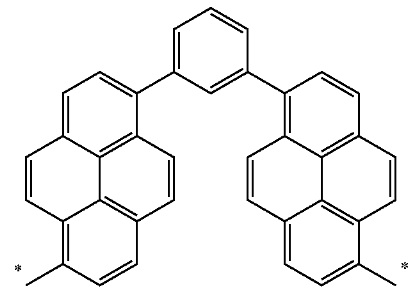
(MU-2-12)
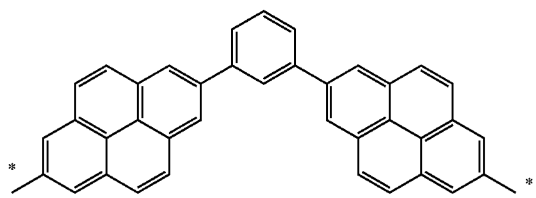
(MU-2-101)
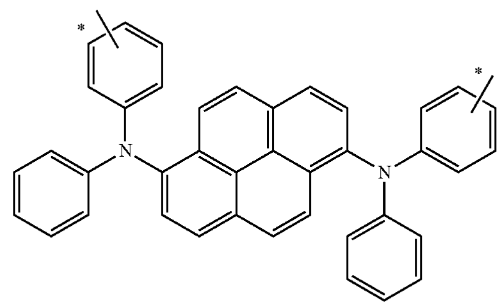
(MU-2-102)
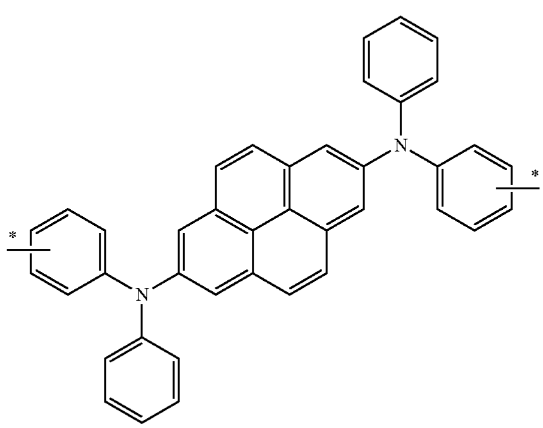
(MU-2-201)
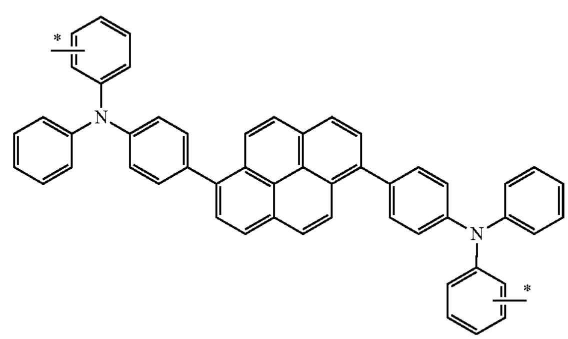
(MU-2-202)
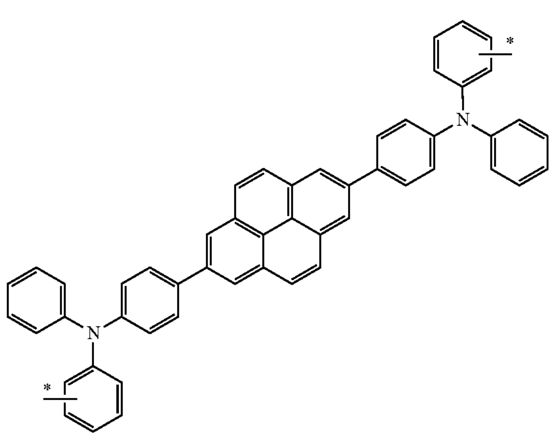
(MU-3-1)
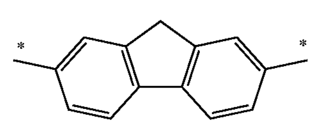

-continued
(MU-3-2)
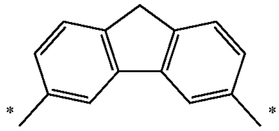
(MU-3-11)
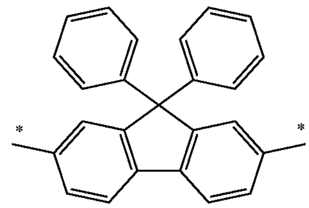
(MU-3-12)
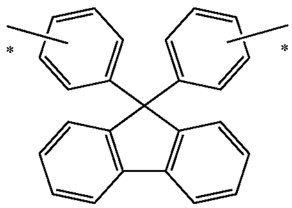
(MU-3-21)
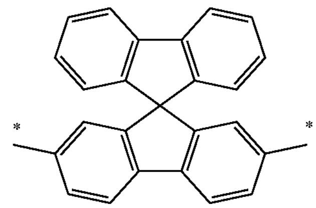
(MU-3-22)
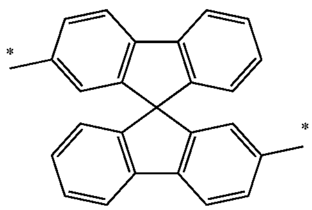
(MU-3-101)
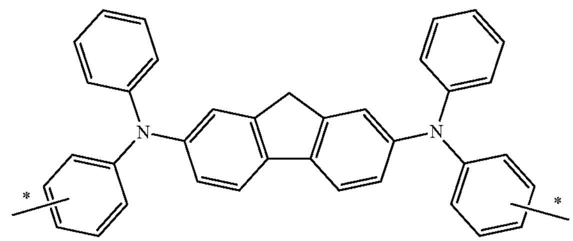
(MU-3-201)
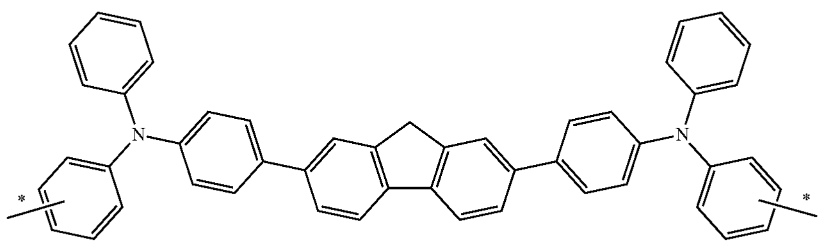
(MU-4-1)
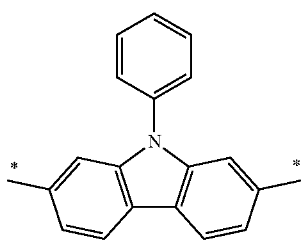
(MU-4-2)
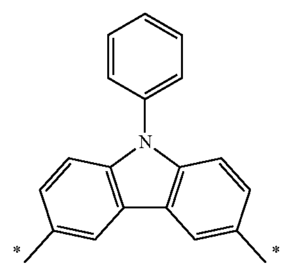
(MU-4-11)
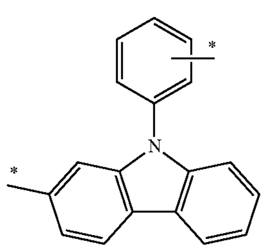
(MU-4-12)
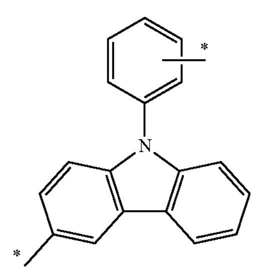

-continued
(MU-4-101)
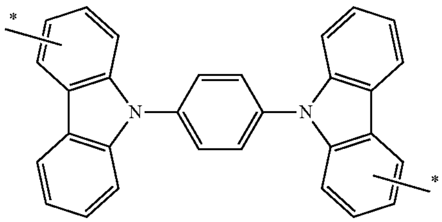
(MU-4-102)
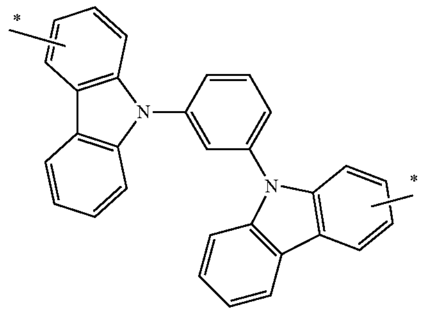
(MU-4-121)
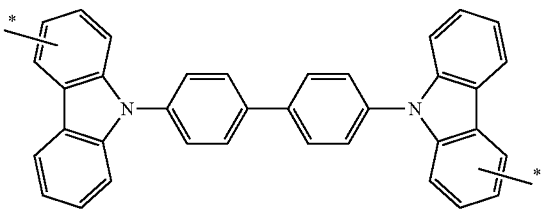
(MU-4-122)
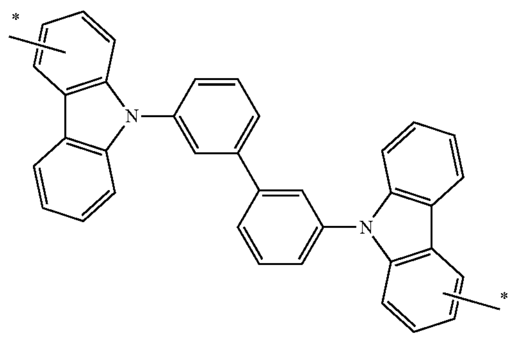
(MU-5-1)
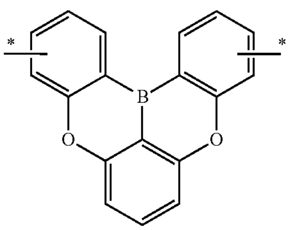
(MU-5-2)
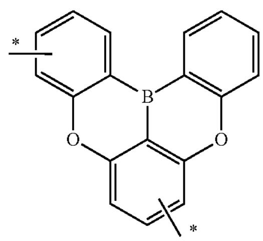
(MU-5-11)
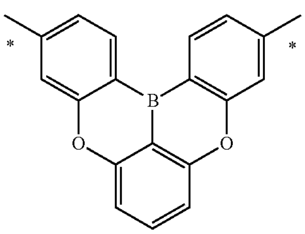
(MU-5-12)
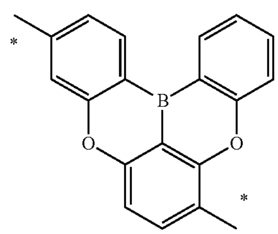
(EC-1)
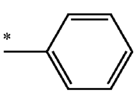
(EC-2)
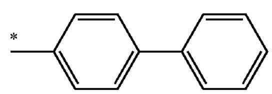
(EC-3)
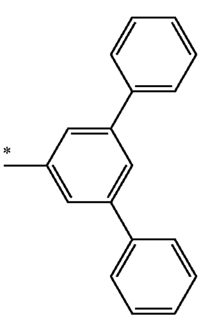
(EC-4)
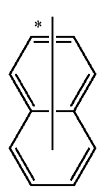

-continued
(EC-5)
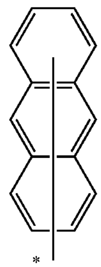
(EC-6)
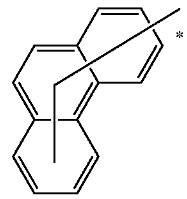
(EC-7)
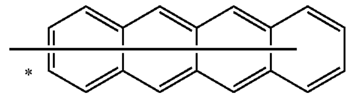
(EC-8)
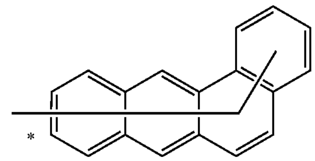
(EC-9)
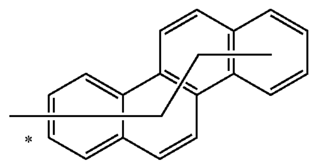
(EC-10)
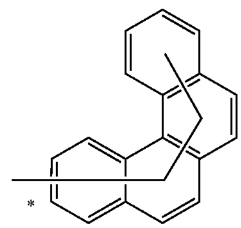
(EC-11)
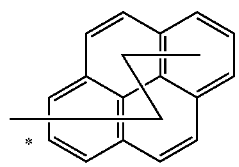
(EC-21)
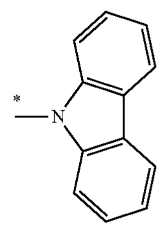
(EC-22)
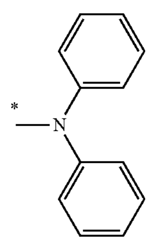
(EC-23)
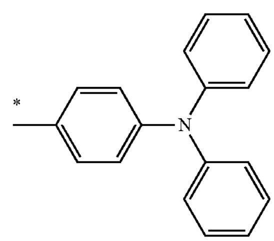
(EC-24)
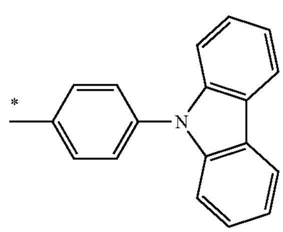
(EC-25)
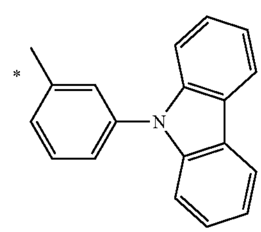
(EC-26)
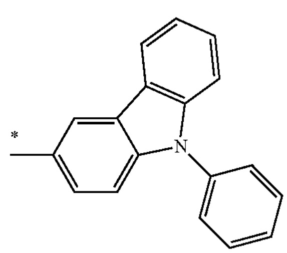
(EC-27)
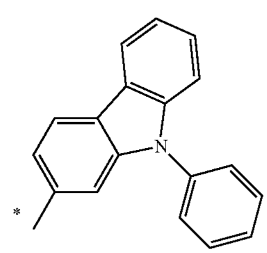

-continued (EC-28)

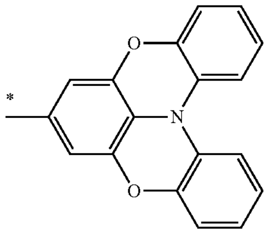

(EC-29)

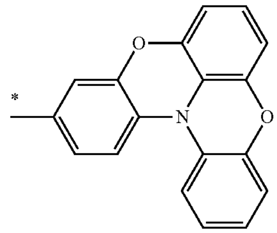

(B-6-X1)

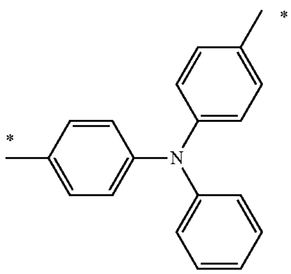

In a compound represented by formula (B-6), 10 to 100% of the total number of MU's (n) in a molecule preferably has an alkyl having 1 to 24 carbon atoms, 30 to 100% of the total number of MU's (n) in a molecule more preferably has an alkyl having 1 to 18 carbon atoms (branched alkyl having 3 to 18 carbon atoms), and 50 to 100% of the total number of MU's (n) in a molecule still more preferably has an alkyl having 1 to 12 carbons (branched alkyl having 3 to 12 carbons) from a viewpoint of solubility and coating film formability. Meanwhile, 10 to 100% of the total number of MU's (n) in a molecule preferably has an alkyl having 7 to 24 carbon atoms, and 30 to 100% of the total number of MU's (n) in a molecule more preferably has an alkyl having 7 to 24 carbon atoms (branched alkyl having 7 to 24 carbon atoms) from a viewpoint of in-plane orientation and charge transport 1-3. Organic Solvent The light emitting layer-forming composition of the present invention contains at least one organic solvent as a third component. By controlling an evaporation rate of an organic solvent at the time of film formation, it is possible to control and improve film formability, presence or absence of defects in a coating film, surface roughness, and smoothness. At the time of film formation using an ink jet method, by controlling meniscus stability at a pinhole of an ink jet head, ejection performance can be controlled and improved. In addition, by controlling a drying speed of a film and orientation of a derivative molecule, it is possible to improve electrical characteristics, luminescence characteristics, efficiency, and a lifetime of an organic EL element having a light emitting layer obtained from the light emitting layer-forming composition.

1-3-1. Physical Properties of Organic Solvent

In the third component, the boiling point of at least one organic solvent is from 130° C. to 300° C., more preferably from 140° C. to 270° C., and still more preferably from 150° C. to 250° C. A case where the boiling point is higher than 130° C. is preferable from a viewpoint of ink jet ejection performance. A case where the boiling point is lower than 300° C. is preferable from a viewpoint of defects in a coating film, surface roughness, a residual solvent, and smoothness. The third component more preferably contains two or more kinds of organic solvents from a viewpoint of good ink jet ejection performance, film formability, smoothness, and the small amount of a residual solvent. Meanwhile, in some cases, in consideration of transportability and the like, the third component may be a solid composition obtained by removing a solvent from the light emitting layer-forming composition.

Furthermore, a particularly preferable configuration is that the third component contains a good solvent (GS) and a poor solvent (PS) for at least one of compounds represented by formulas (B-1) to (B-6), and the boiling point ($BP_{GS}$) of the good solvent (GS) is lower than the boiling point ($BP_{PS}$) of the poor solvent (PS).

By adding a poor solvent having a high boiling point, a good solvent having a low boiling point is volatilized earlier at the time of film formation, and the concentration of contents in the composition and the concentration of the poor solvent are increased to promote prompt film formation. As a result, a coating film having few defects, less surface roughness, and high smoothness can be obtained.

A difference in solubility ($S_{GS}-S_{PS}$) is preferably 1% or more, more preferably 3% or more, and still more preferably 5% or more. A difference in boiling point ($BP_{PS}-BP_{GS}$) is preferably 10° C. or more, more preferably 30° C. or more, and still more preferably 50° C. or more.

After the film formation, an organic solvent is removed from a coating film through a drying step such as evacuation, reduction in pressure, or heating. In a case of heating, heating is preferably performed at a glass transition temperature (Tg) of the first component+30° C. or lower from a viewpoint of improving coating film formability. Heating is preferably performed at a glass transition point (Tg) of the first component−30° C. or higher from a viewpoint of reducing a residual solvent. Even when the heating temperature is lower than the boiling point of an organic solvent, the organic solvent is sufficiently removed because the film is thin. Drying may be performed a plurality of times at different temperatures, or a plurality of drying methods may be used in combination.

1-3-2. Specific Examples of Organic Solvent

Examples of an organic solvent used in the light emitting layer-forming composition include an alkylbenzene-based solvent, a phenyl ether-based solvent, an alkyl ether-based solvent, a cyclic ketone-based solvent, an aliphatic ketone-based solvent, a monocyclic ketone-based solvent, a solvent having a diester skeleton, and a fluorine-containing solvent. Specific examples thereof include pentanol, hexanol, heptanol, octanol, nonanol, decanol, undecanol, dodecanol, tetradecanol, hexan-2-ol, heptan-2-ol, octan-2-ol, decan-2-ol, dodecan-2-ol, cyclohexanol, α-terpineol, β-terpineol, γ-terpineol, δ-terpineol, terpineol (mixture), ethylene glycol monomethyl ether acetate, propylene glycol monomethyl ether acetate, diethylene glycol dimethyl ether, dipropylene glycol dimethyl ether, diethylene glycol ethyl methyl ether, diethylene glycol isopropyl methyl ether, dipropylene glycol monomethyl ether, diethylene glycol diethyl ether, diethylene glycol monomethyl ether, diethylene glycol butyl methyl ether, tripropylene glycol dimethyl ether, triethylene glycol dimethyl ether, diethylene glycol monobutyl ether, ethylene glycol monophenyl ether, triethylene glycol monomethyl ether, diethylene glycol dibutyl ether, triethylene glycol butyl methyl ether, polyethylene glycol dimethyl ether, tetraethylene glycol dimethyl ether, p-xylene, m-xylene, o-xylene, 2,6-lutidine, 2-fluoro-m-xylene, 3-fluoro-o-xylene, 2-chlorobenzo trifluoride, cumene, toluene, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, mesitylene, 1,2,4-trimethylbenzene, t-butylbenzene, 2-methylanisole, phenetole, benzodioxole, 4-methylanisole, s-butylbenzene, 3-methylanisole, 4-fluoro-3-methylanisole, cymene, 1,2,3-trimethylbenzene, 1,2-dichlorobenzene, 2-fluorobenzonitrile, 4-fluorobellaterol, 2,6-dimethylanisole, n-butylbenzene, 3-fluorobenzonitrile, decalin (decahydronaphthalene), neopentylbenzene, 2,5-dimethylanisole, 2,4-dimethylanisole, benzonitrile, 3,5-dimethylanisole, diphenyl ether, 1-fluoro-3,5-dimethoxybenzene, methyl benzoate, isopentylbenzene, 3,4-dimethylanisole, o-tolunitrile, n-amylbenzene, veratrole, 1,2,3,4-tetrahydronaphthalene, ethyl benzoate, n-hexylbenzene, propyl benzoate, cyclohexylbenzene, 1-methylnaphthalene, butyl benzoate, 2-methylbiphenyl, 3-phenoxytoluene, 2,2'-vitrile, dodecylbenzene, dipentylbenzene, tetramethylbenzene, trimethoxy benzene, trimethoxytoluene, 2,3-dihydrobenzofuran, 1-methyl-4-(propoxymethyl) benzene, 1-methyl-4-(butyloxymethyl) benzene, 1-methyl-4-(pentyloxymethyl) benzene, 1-methyl-4-(hexyloxymethyl) benzene, 1-methyl-4-(heptyloxymethyl) benzenebenzyl butyl ether, benzyl pentyl ether, benzyl hexyl ether, benzyl heptyl ether, and benzyl octyl ether, but are not limited thereto. Furthermore, these solvents may be used singly or in a mixture thereof.

1-4. Optional Components

The light emitting layer-forming composition may contain an optional component as long as properties thereof are not impaired. Examples of an optional component include a binder and a surfactant.

1-4-1. Binder

The light emitting layer-forming composition may contain a binder. The binder forms a film at the time of film formation, and bonds the obtained film to a substrate. The binder also plays a role of dissolving, dispersing, and binding other components in the light emitting layer-forming composition.

Examples of a binder used in the light emitting layer-forming composition include an acrylic resin, polyethylene terephthalate, an ethylene-vinyl acetate copolymer, an ethylene-vinyl alcohol copolymer, an acrylonitrile-ethylene-styrene copolymer (AES) resin, an ionomer, chlorinated polyether, a diallyl phthalate resin, an unsaturated polyester resin, polyethylene, polypropylene, polyvinyl chloride, polyvinylidene chloride, polystyrene, polyvinyl acetate, Teflon, an acrylonitrile-butadiene-styrene copolymer (ABS) resin, an acrylonitrile-styrene copolymer (AS) resin, a phenol resin, an epoxy resin, a melamine resin, a urea resin, an alkyd resin, polyurethane, and a copolymer of the above resins and polymers, but are not limited thereto.

The binder used in the light emitting layer-forming composition may be used singly or in a mixture of a plurality of kinds thereof.

1-4-2. Surfactant

The light emitting layer-forming composition may contain, for example, a surfactant for controlling film surface uniformity of the light emitting layer-forming composition, solvent affinity of a film surface, and liquid repellency. The surfactant is classified into an ionic surfactant and a nonionic surfactant based on the structure of a hydrophilic group, and is further classified into an alkyl-based surfactant, a silicon-based surfactant, and a fluorine-based surfactant based on the structure of a hydrophobic group. The surfactant is classified into a monomolecule-based surfactant having a relatively small molecular weight and a simple structure, and a polymer-based surfactant having a large molecular weight and a side chain or a branched chain based on the structure of a molecule. The surfactant is classified into a single surfactant and a mixed surfactant obtained by mixing two or more kinds of surfactants with a base material based on the composition. As a surfactant that can be used in the light emitting layer-forming composition, all kinds of surfactants can be used.

Examples of the surfactant include Polyflow No. 45, PolyflowKL-245, PolyflowNo. 75, PolyflowNo. 90, PolyflowNo. 95 (trade names, manufactured by Kyoeisha Chemical Co., Ltd.), Disperbyk 161, Disperbyk 162, Disperbyk 163, Disperbyk 164, Disperbyk 166, Disperbyk 170, Disperbyk 180, Disperbyk 181, Disperbyk 182, BYK 300, BYK 306, BYK 310, BYK 320, BYK 330, BYK 342, BYK 344, BYK 346 (trade names, manufactured by BYK Japan KK), KP-341, KP-358, KP-368, KF-96-50CS, KF-50-100CS (trade names, manufactured by Shin-Etsu Chemical Co., Ltd.), Surflon SC-101, Surflon KH-40 (trade names, manufactured by Seimi Chemical Co., Ltd.), Futargent 222F, Futargent 251, FTX-218 (trade names, manufactured by Neos Co., Ltd.), EFTOP EF-351, EFTOP EF-352, EFTOP EF-601, EFTOP EF-801, EFTOP EF-802 (trade names, manufactured by Mitsubishi Materials Corporation), Megafac F-470, Megafac F-471, Megafac F-475, Megafac R-08, Megafac F-477, Megafac F-479, Megafac F-553, Megafac F-554, (trade names, manufactured by DIC Corporation), fluoroalkyl benzene sulfonate, fluoroalkyl carboxylate, fluoroalkyl polyoxyethylene ether, fluoroalkyl ammonium iodide, fluoroalkyl betaine, fluoroalkyl sulfonate, diglycerin tetrakis(fluoroalkyl polyoxyethylene ether), a fluoroalkyl trimethyl ammonium salt, fluoroalkyl aminosulfonate, polyoxyethylene nonyl phenyl ether, polyoxyethylene octyl phenyl ether, polyoxyethylene alkyl ether, polyoxyethylene laurate, polyoxyethylene oleate, polyoxyethylene stearate, polyoxyethylene lauryl amine, sorbitan laurate, sorbitan palmitate, sorbitan stearate, sorbitan oleate, sorbitan fatty acid ester, polyoxyethylene sorbitan laurate, polyoxyethylene sorbitan palmitate, polyoxyethylene sorbitan stearate, polyoxyethylene sorbitan oleate, polyoxyethylene naphthyl ether, alkylbenzene sulfonate, and alkyl diphenyl ether disulfonate.

The surfactant may be used singly or in combination of two or more kinds thereof.

1-5. Composition and Physical Properties of Light Emitting Layer-Forming Composition In the light emitting layer-forming composition of the present invention, at least one compound in the first component or the second component may be substituted by a group represented by the above formula (FG-1), a group represented by the above formula (FG-2), or an alkyl having 1 to 24 carbon atoms (preferably an alkyl having 7 to 24 carbon atoms). A least one compound in the second component is preferably substituted, and at least one compound in the first component and at least one compound in the second component are more preferably substituted from a viewpoint of excellent solubility, film formability, wet coatability, and in-plane orientation. In a case where at least one compound in the first component and at least one compound in the second component are substituted, both of these compounds are preferably substituted by the same kind of groups, more preferably substituted by a group represented by the above formula (FG-1) or a group represented by the above formula (FG-2), and still more preferably substituted by a group represented by the above formula (FG-1) from a viewpoint of in-plane orientation.

As for the contents of the components in the light emitting layer-forming composition of the present invention, preferably, the content of the first component is from 0.0001% by weight to 2.0% by weight with respect to the total weight of the light emitting layer-forming composition, the content of the second component is from 0.0999% by weight to 8.0% by weight with respect to the total weight of the light emitting layer-forming composition, and the content of the third component is from 90.0% by weight to 99.9% by weight with respect to the total weight of the light emitting layer-forming composition from a viewpoint of good solubility of the components in the light emitting layer-forming composition, storage stability, film formability, high quality of a coating film obtained from the light emitting layer-forming composition, good ejection performance in a case of using an ink jet method, and good electrical characteristics, luminescent characteristics, efficiency, and a lifetime of an organic EL element having a light emitting layer manufactured using the composition.

More preferably, the content of the first component is from 0.03% by weight to 1.0% by weight with respect to the total weight of the light emitting layer-forming composition, the content of the second component is from 0.17% by weight to 4.0% by weight with respect to the total weight of the light emitting layer-forming composition, and the content of the third component is from 95.0% by weight to 99.8% by with respect to the total weight of the light emitting layer-forming composition. Still more preferably, the content of the first component is from 0.05% by weight to 0.5% by weight with respect to the total weight of the light emitting layer-forming composition, the content of the second component is from 0.25% by weight to 2.5% by weight with respect to the total weight of the light emitting layer-forming composition, and the content of the third component is from 97.0% by weight to 99.7% by with respect to the total weight of the light emitting layer-forming composition. In another preferable embodiment, the content of the first component is from 0.005% by weight to 1.0% by weight with respect to the total weight of the light emitting layer-forming composition, the content of the second component is from 0.095% by weight to 4.0% by weight with respect to the total weight of the light emitting layer-forming composition, and the content of the third component is from 95.0% by weight to 99.9% by with respect to the total weight of the light emitting layer-forming composition.

The light emitting layer-forming composition can be manufactured by appropriately selecting and performing stirring, mixing, heating, cooling, dissolving, dispersing, and the like of the above components by a known method. After preparation, filtration, removal of gas (also referred to as degassing), an ion exchange treatment, an inert gas replacement/encapsulation treatment, and the like may be appropriately selected and performed.

The light emitting layer-forming composition having a high viscosity brings about good film formability and good ejection performance in a case of using an ink jet method. Meanwhile, the lower viscosity makes it easier to make a thin film. Therefore, the viscosity of the light emitting layer-forming composition is preferably from 0.3 mPa·s to 3 mPa·s, and more preferably from 1 mPa·s to 3 mPa·s at 25° C. In the present invention, the viscosity is a value measured using a cone plate type rotational viscometer (cone plate type).

The light emitting layer-forming composition having a low surface tension brings about a coating film having good film formability and no defects. Meanwhile, the light emitting layer-forming composition having a high surface tension brings about good ink jet ejection performance. Therefore, the surface tension of the light emitting layer-forming composition is preferably from 20 mN/m to 40 mN/m, and more preferably from 20 mN/m to 30 mN/m at 25° C. In the present invention, the surface tension is a value measured using a hanging drop method.

2. Manufacturing Method

Hereinafter, a method for manufacturing a compound represented by general formula (A) or (A') and compounds represented by general formulas (B-1) to (B-6) will be described.

2-1. Method for Manufacturing Compound Represented by General Formula (A), (A'), or (B-5)

Compounds represented by general formulas (A), (A'), and (B-5) and multimer compounds thereof are contained in the first component and the second component in the light emitting layer-forming composition of the present invention, and are different constituent components from one another. However, manufacturing methods thereof are similar to one another, and therefore will be described collectively.

In regard to compounds represented by general formulas (A), (A'), and (B-5), and multimer compounds thereof, basically, an intermediate is first manufactured by bonding the ring A (ring a), ring B (ring b), and ring C (ring c) with a bonding group (a group containing $X^1$ or $X^2$) (first reaction), and then a final product can be manufactured by bonding the ring A (ring a), ring B (ring b), and ring C (ring c) with a bonding group (a group containing $Y^1$) (second reaction). In the first reaction, for example, in an etherification reaction, a general reaction such as a nucleophilic substitution reaction or an Ullmann reaction can be utilized, and in an amination reaction, a general reaction such as a Buchwald-Hartwig reaction can be utilized. In the second reaction, a Tandem Hetero-Friedel-Crafts reaction (continuous aromatic electrophilic substitution reaction, the same hereinafter) can be utilized.

The second reaction is a reaction for introducing $Y^1$ that bonds the ring A (ring a), ring B (ring b), and ring C (ring c) as illustrated in the following scheme (1) or (2), and as an example, a case in which $Y^1$ represents a boron atom, and $X^1$ and $X^2$ represent nitrogen atoms is indicated below. First, a hydrogen atom between $X^1$ and $X^2$ is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, a desired product can be obtained. In the second reaction, a Lewis acid such as aluminum trichloride may be added in order to accelerate the reaction. Note that $R^1$ to $R^{11}$ and R of N—R in structural formulas in schemes (1) and (2) are defined in the same manner as those in formula (A').

scheme (1)

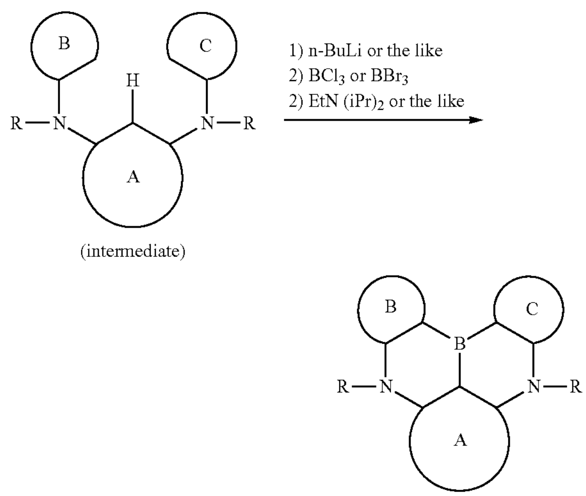

(intermediate)

general formula (A) type company scheme (2)

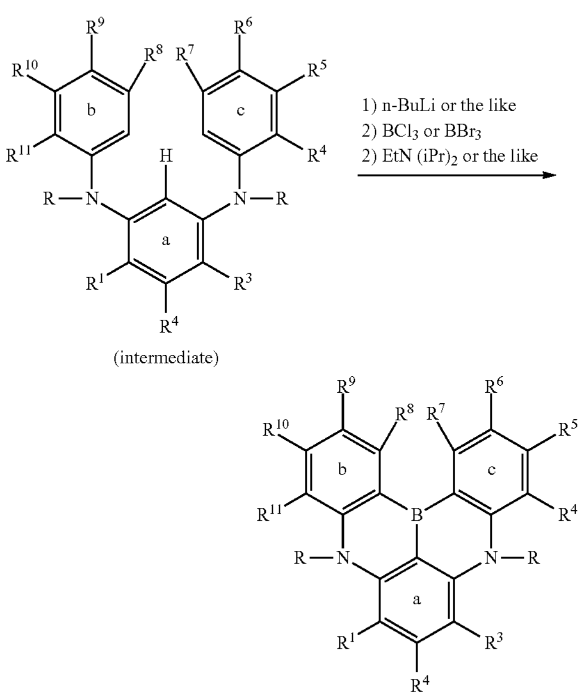

(intermediate)

general formula (A') type company

Incidentally, the scheme (1) or (2) mainly illustrates a method for manufacturing a polycyclic aromatic compound represented by general formula (A) or (A'). However, a multimer compound thereof can be manufactured using an intermediate having a plurality of ring A's (ring a's), ring B's (ring b's) and ring C's (ring c's). More specifically, the manufacturing method will be described with the following schemes (3) to (5). In this case, a desired product can be obtained by increasing the amount of a reagent used therein such as butyllithium to a double amount or a triple amount. Note that $R^1$ to $R^{11}$ and R of N—R in structural formulas in schemes (3) to (5) are defined in the same manner as those in formula (A').

scheme (3)

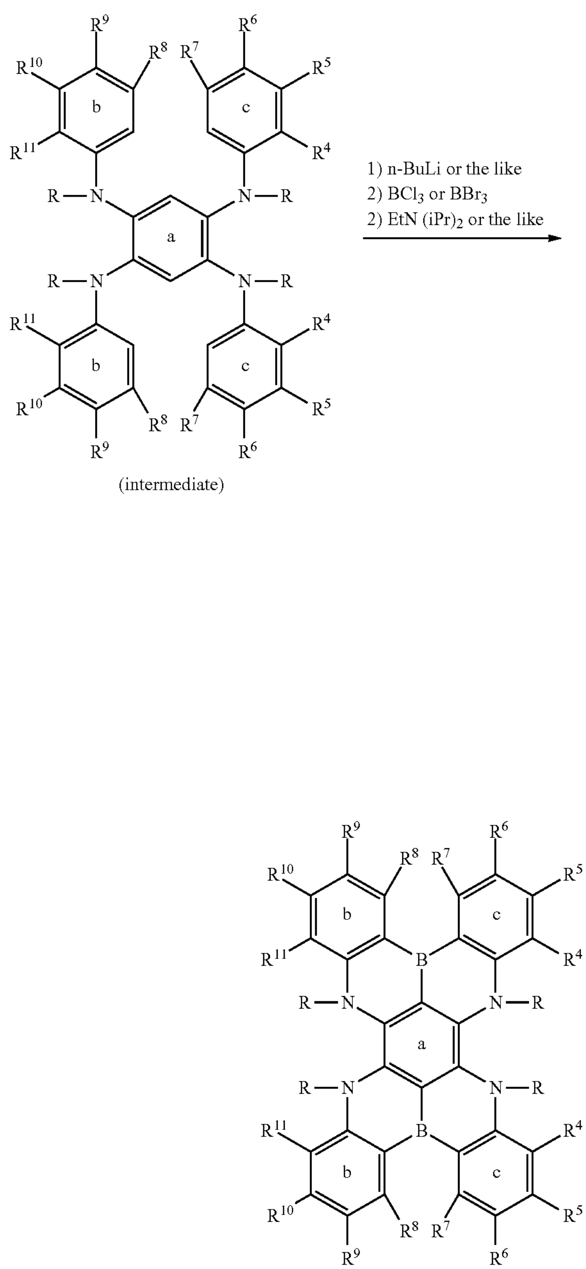

(intermediate)

scheme (4)

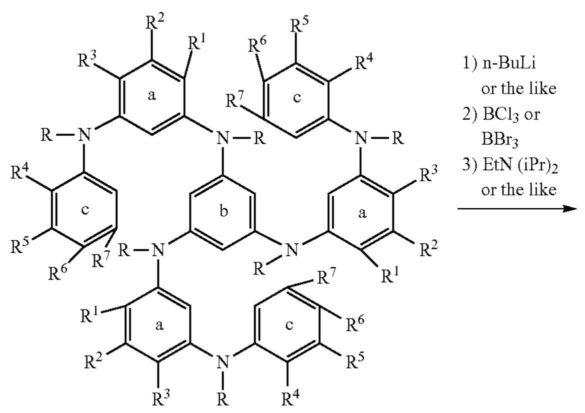

(intermediate)

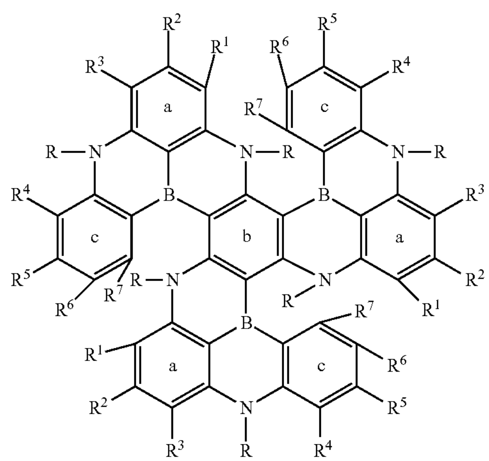

scheme (5)

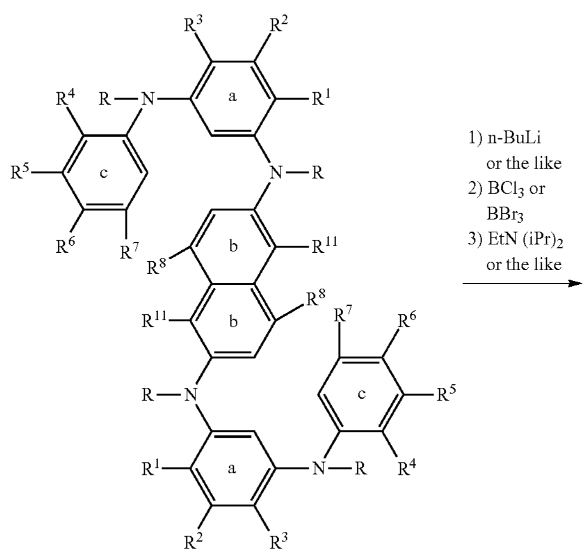

(intermediate)

-continued

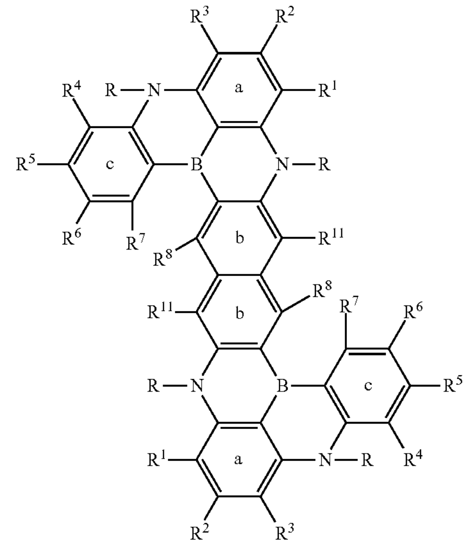

In the above schemes, a lithium atom is introduced to a desired position by ortho-metalation. However, a lithium atom can also be introduced to a desired position by halogen-metal exchange by introducing a bromine atom or the like to a position to which it is wished to introduce lithium, as in the following schemes (6) and (7). Note that $R^1$ to $R^{11}$ and R in N—R in structural formulas in schemes (6) and (7) are defined in the same manner as those in formula (A').

scheme (6)

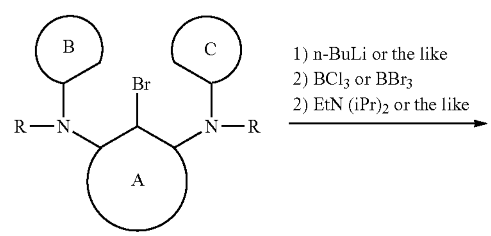

(intermediate)

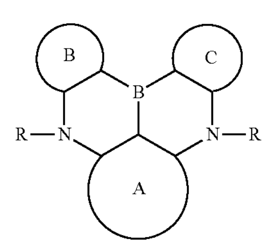

general formula (A) type company scheme (7)

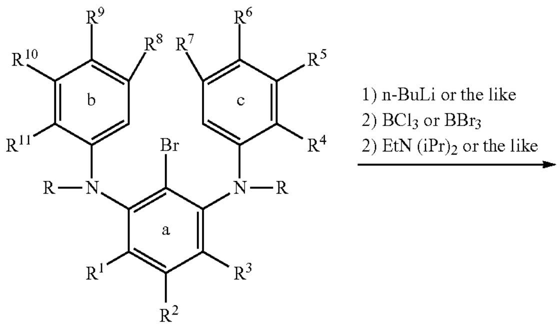

(intermediate)

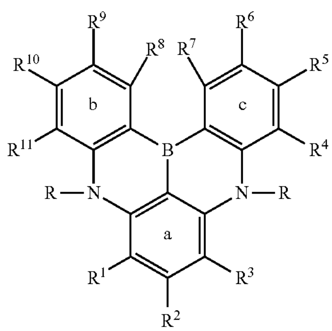

general formula (A′) type company

Furthermore, also in regard to the method for manufacturing a multimer described in scheme (3), a lithium atom can be introduced to a desired position also by halogen-metal exchange by introducing a halogen atom such as a bromine atom or a chlorine atom to a position to which it is wished to introduce a lithium atom, as in the above schemes (6) and (7) (the following schemes (8), (9), and (10)). Note that $R^1$ to $R^{11}$ and R of N—R in structural formulas in schemes (8) to (10) are defined in the same manner as those in formula (A').

scheme (8)

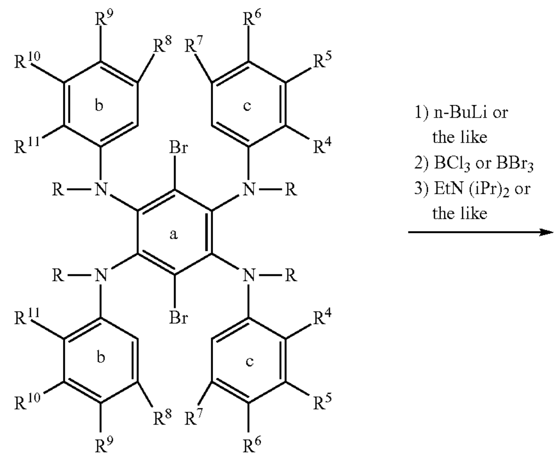

(intermediate)

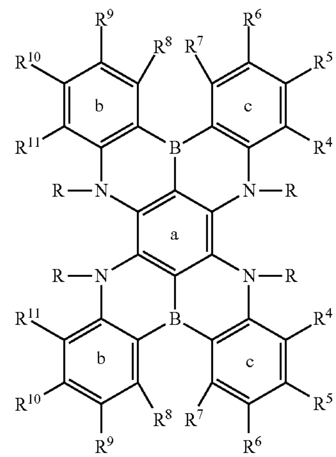

scheme (9)

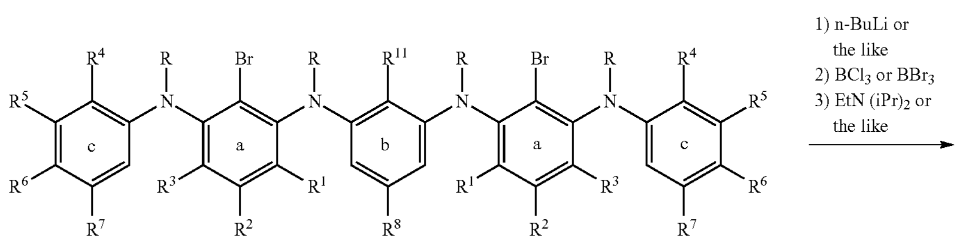

(intermediate)

-continued

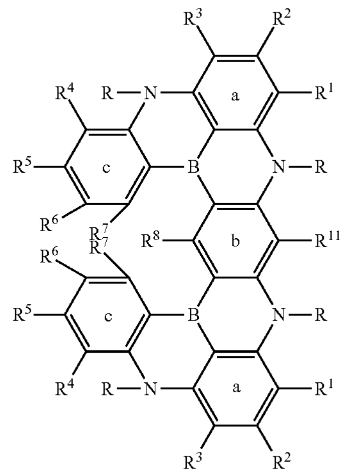

scheme (10)

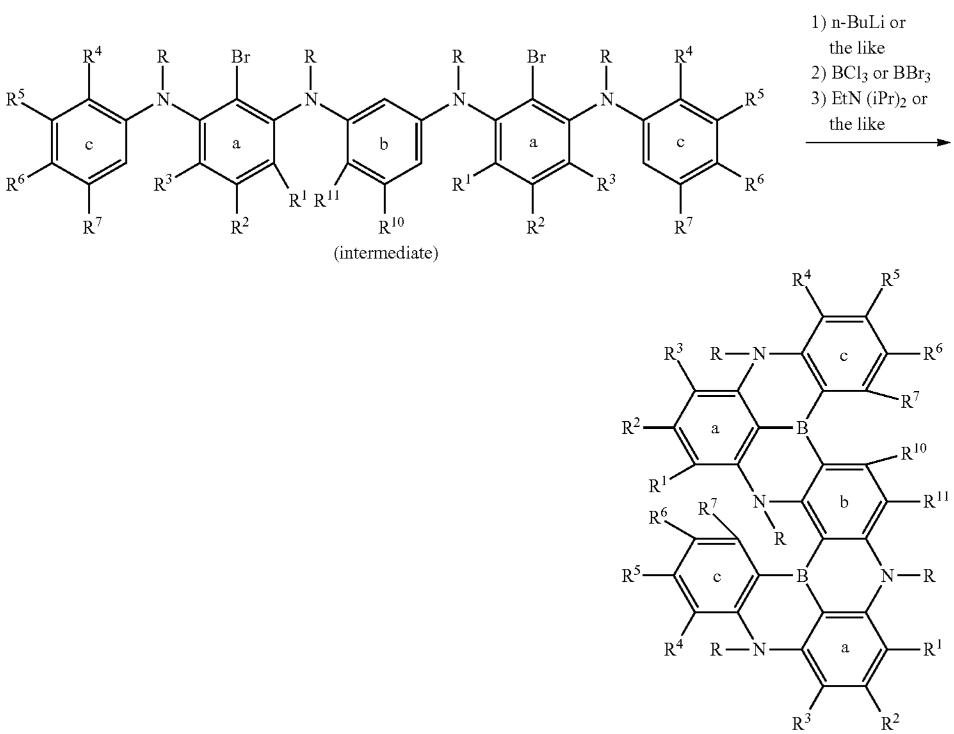

According to this method, a desired product can also be synthesized even in a case where ortho-metalation cannot be achieved due to an influence of substituents, and therefore, the method is useful.

By appropriately selecting the synthesis method described above and appropriately selecting raw materials to be used, a polycyclic aromatic compound having substituents at desired positions, with Y being a boron atom and $X^1$ and $X^2$ being nitrogen atoms, and a multimer compound thereof can be synthesized.

Next, as examples, a case where $Y^1$ represents a boron atom, $X^1$ represents an oxygen atom, and $X^2$ represents a nitrogen atom will be illustrated in the following schemes (11) and (12), and a case where $X^1$ and $X^2$ represent oxygen atoms will be illustrated in the following scheme (13). Similarly to the case where $X^1$ and $X^2$ are nitrogen atoms, first, a hydrogen atom between $X^1$ and $X^2$ is ortho-metalated with n-butyllithium or the like. Subsequently, boron tribromide or the like is added thereto to induce lithium-boron metal exchange, and then a Brønsted base such as N,N-diisopropylethylamine is added thereto to induce a Tandem Bora-Friedel-Crafts reaction. Thus, a desired product can be obtained. In this reaction, a Lewis acid such as aluminum trichloride may also be added in order to accelerate the reaction. Note that $R^1$ to $R^{11}$ and R of N—R in structural formulas in schemes (11) to (13) are defined in the same manner as those in formula (A').

scheme (11)

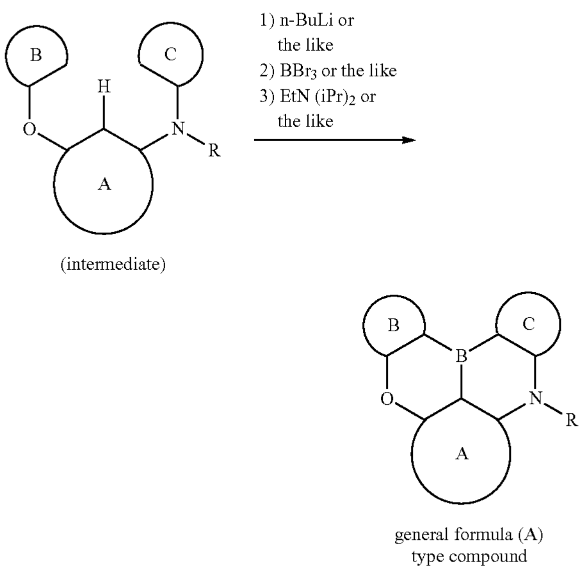

scheme (12)

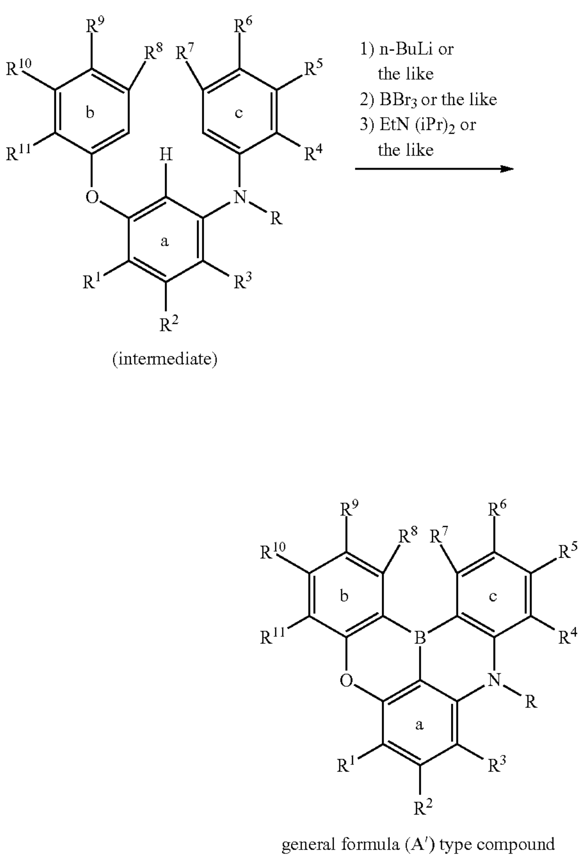

scheme (13)

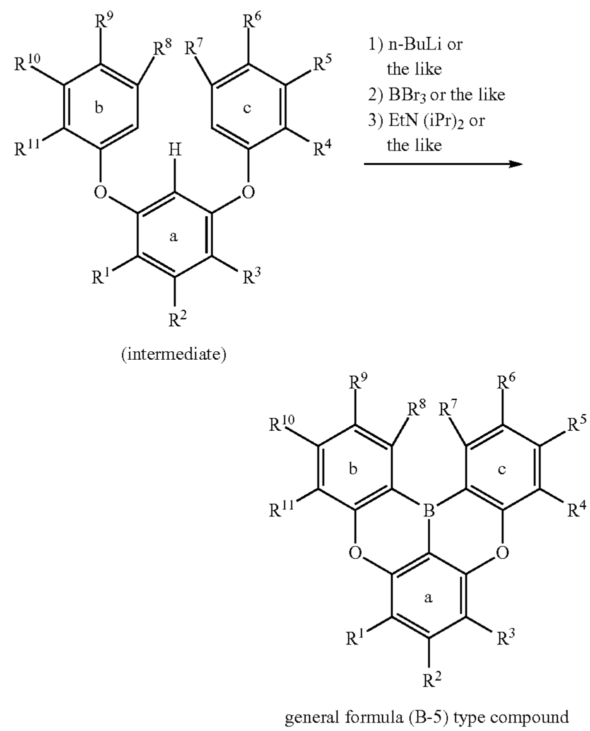

Specific examples of a solvent used in the above reactions include t-butylbenzene and xylene.

Furthermore, in general formula (A') or (B-5), adjacent groups among the substituents $R^1$ to $R^{11}$ of the ring a, ring b, and ring c may be bonded to each other to form an aryl ring or a heteroaryl ring together with the ring a, ring b, or ring c, and at least one hydrogen atom in the ring thus formed may be substituted by an aryl or a heteroaryl. Therefore, in a polycyclic aromatic compound represented by general formula (A') or (B-5), a ring structure constituting the compound changes as represented by formulas (A'-1) and (A'-2) of the following schemes (14) and (15) according to a mutual bonding form of substituents in the ring a, ring b, and ring c. These compounds can be synthesized by applying synthesis methods illustrated in the above schemes (1) to (13) to intermediates illustrated in the following schemes (14) and (15). Note that $R^1$ to $R^{11}$, $Y^1$, $X^1$, and $X^2$ in structural formulas in schemes (14) and (15) are defined in the same manner as those in formula (A')

scheme (14)

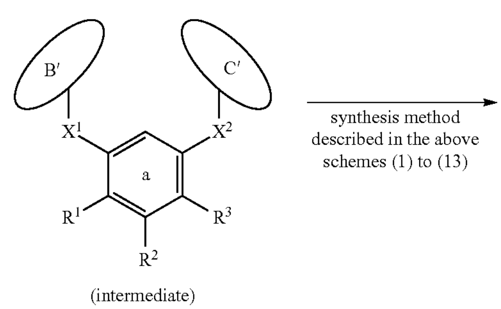

-continued

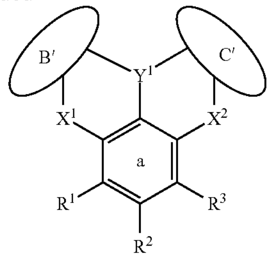

(A'-1)

scheme (15)

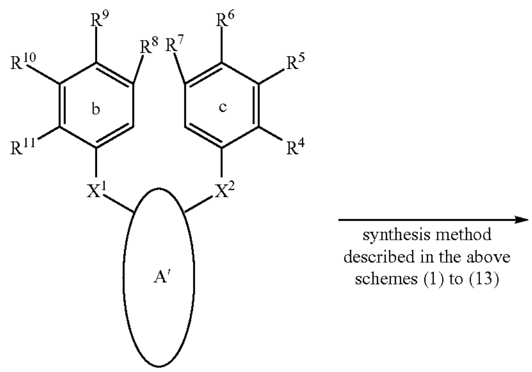

(intermediate)

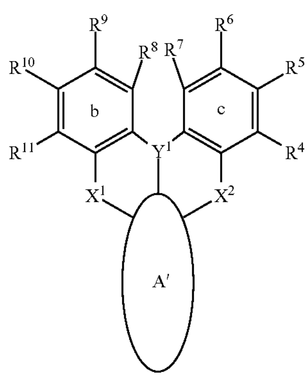

(A'-2)

The ring A', ring B' and ring C' in the above formulas (A'-1) and (A'-2) each represent an aryl ring or a heteroaryl ring formed by bonding adjacent groups among the substituents $R^1$ to $R^{11}$ together with the ring a, ring b, and ring c, respectively (may also be referred to as a fused ring obtained by fusing another ring structure to the ring a, ring b, or ring c). Incidentally, although not indicated in the formula, there is also a compound in which all of the ring a, ring b, and ring c have been changed to the ring A', ring B' and ring C'.

Furthermore, the provision that "R of the N—R is bonded to the ring a, ring b, and/or ring c with —O—, —S—, —C(—R)$_2$—, or a single bond" in general formulas (A') and (B-5) can be expressed as a compound having a ring structure represented by formula (A'-3-1) of the following scheme (16), in which $X^1$ or $X^2$ is incorporated into the fused ring B' or fused ring C', or a compound having a ring structure represented by formula (A'-3-2) or formula (A'-3-3), in which $X^1$ or $X^2$ is incorporated into the fused ring A'. Such a compound can be synthesized by applying the synthesis methods illustrated in the above schemes (1) to (13) to the intermediate represented by the following scheme (16). Note that $R^1$ to $R^{11}$, $Y^1$, $X^1$, and $X^2$ in structural formulas in scheme (16) are defined in the same manner as those in formula (A').

scheme (16)

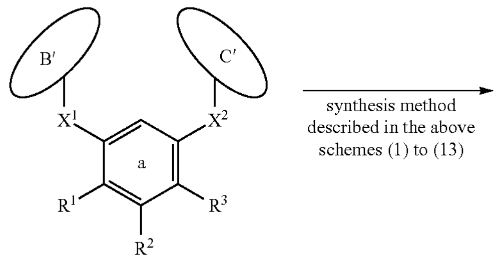

(intermediate)

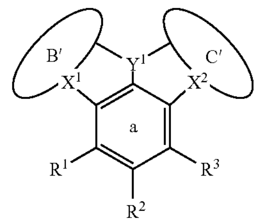

(A'-3-1)

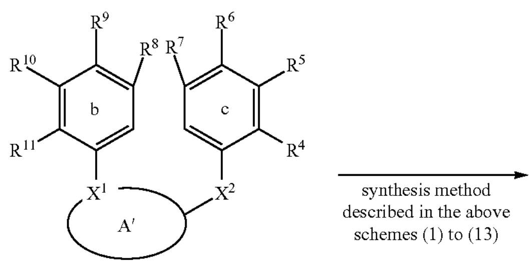

(intermediate)

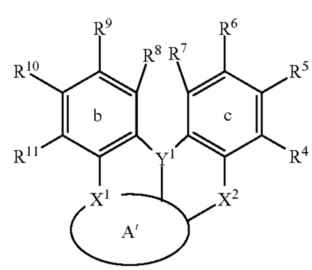

(A'-3-2)

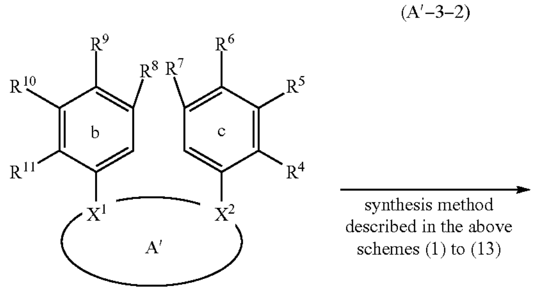

(intermediate)

-continued

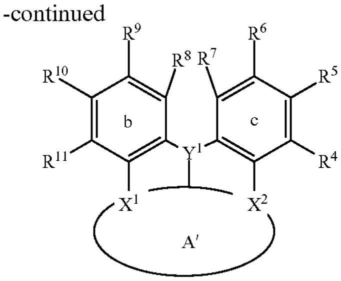

(A'-3-3)

Furthermore, there has been illustrated an example of performing a Tandem Hetero-Friedel-Crafts reaction by ortho-metalating a hydrogen atom (or a halogen atom) between $X^1$ and $X^2$ with butyllithium or the like, before boron trichloride, boron tribromide, or the like is added. However, the reaction may be caused to proceed by adding boron trichloride, boron tribromide, or the like without performing ortho-metalation using buthyllithium or the like.

Note that examples of an ortho-metalation reagent used for the above schemes include an alkyllithium such as methyllithium, n-butyllithium, sec-butyllithium, or t-butyllithium; and an organic alkali compound such as lithium diisopropylamide, lithium tetramethylpiperidide, lithium hexamethyldisilazide, or potassium hexamethyldisilazide.

Incidentally, examples of a metal exchanging reagent for metal-$Y^1$ (boron) used for the above schemes include a halide of $Y^1$ such as trifluoride of $Y^1$, trichloride of $Y^1$, tribromide of $Y^1$, or triiodide of $Y^1$; an aminated halide of $Y^1$ such as $CIPN(NEt_2)_2$; an alkoxylation product of $Y^1$; and an aryloxylation product of $Y^1$.

Incidentally, examples of the Brønsted base used for the above schemes include N,N-diisopropylethylamine, triethylamine, 2,2,6,6-tetramethylpiperidine, 1,2,2,6,6-pentamethylpiperidine, N,N-dimethylaniline, N,N-dimethyltoluidine, 2,6-lutidine, sodium tetraphenylborate, potassium tetraphenylborate, triphenylborane, tetraphenylsilane, $Ar_4BNa$, $Ar_4BK$, $Ar_3B$, and $Ar_4Si$(note that Ar represents an aryl such as phenyl).

Examples of a Lewis acid used for the above schemes include $AlCl_3$, $AlBr_3$, $AlF_3$, $BF_3$□$OEt_2$, $BCl_3$, $BBr_3$, $GaCl_3$, $GaBr_3$, $InCl_3$, $InBr_3$, $In(OTf)_3$, $SnCl_4$, $SnBr_4$, AgOTf, $ScCl_3$, $Sc(OTf)_3$, $ZnCl_2$, $ZnBr_2$, $Zn(OTf)_2$, $MgCl_2$, $MgBr_2$, $Mg(OTf)_2$, LiOTf, NaOTf, KOTf, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$.

In the above schemes, a Brønsted base or a Lewis acid may be used in order to accelerate the Tandem Hetero Friedel-Crafts reaction. However, in a case where a halide of $Y^1$ such as trifluoride of $Y^1$, trichloride of $Y^1$, tribromide of $Y^1$, or triiodide of $Y^1$ is used, an acid such as hydrogen fluoride, hydrogen chloride, hydrogen bromide, or hydrogen iodide is generated along with progress of an aromatic electrophilic substitution reaction. Therefore, it is effective to use a Brønsted base that captures an acid. On the other hand, in a case where an aminated halide of $Y^1$ or an alkoxylation product of $Y^1$ is used, an amine or an alcohol is generated along with progress of the aromatic electrophilic substitution reaction. Therefore, in many cases, it is not necessary to use a Brønsted base. However, leaving ability of an amino group or an alkoxy group is low, and therefore it is effective to use a Lewis acid that promotes leaving of these groups.

Furthermore, in order to obtain a compound substituted by a group represented by formula (FG-1), a group represented by formula (FG-2), or an alkyl having 1 to 24 carbon atoms, these groups may be introduced into an intermediate in advance, or may be introduced after the second reaction. Introduction of a deuterium atom or a halogen atom is similar.

2-2. Method for Manufacturing Compounds Represented by General Formulas (B-1) to (B-4)

Compounds represented by formulas (B-1) to (B-4) can be synthesized by a known method using a halogenated aryl derivative and an aryl boronic acid derivative as starting materials, or using a halogenated aryl boronic acid derivative, a halogenated aryl derivative, and an aryl boronic acid derivative as starting materials, by appropriately combining Suzuki Miyaura coupling, Kumada Tamao Corriu coupling, Negishi coupling, a halogenation reaction, and a boroxidation reaction.

Reactive functional groups of a halide and a boronic acid derivative in Suzuki-Miyaura coupling may be replaced with each other appropriately. In Kumada•Tamao•Corriu coupling or Negishi coupling, similarly, functional groups involved in these reactions may be replaced with each other similarly. In a case where conversion to a Grignard reagent is performed, a metallic magnesium and an isopropyl grignard reagent may be appropriately replaced with each other. A boronic acid ester may be used as it is, or may be used as a boronic acid after hydrolysis with an acid. In a case of using a boronic acid ester, an alkyl group other than the exemplified alkyl groups may be used as an alkyl group of an ester moiety.

Specific examples of a palladium catalyst used in a reaction include tetrakis(triphenylphosphine) palladium(0): $Pd(PPh_3)_4$, bis(triphenylphosphine) palladium(II) dichloride: $PdCl_2(PPh_3)_2$, palladium(II) acetate: $Pd(OAc)_2$, tris (dibenzylideneacetone) dipalladium(0): $Pd_2(dba)_3$, a tris (dibenzylideneacetone) dipalladium(0) chloroform complex: $Pd_2(dba)_3.CHCl_3$, bis(dibenzylideneacetone) palladium(0): $Pd(dba)_2$, bis(tri-t-butylphosphino) palladium(0): Pd $(t\text{-}Bu_3P)_2$, [1,1'-bis(diphenylphosphino) ferrocene] dichloropalladium(II): $Pd(dppf)Cl_2$, a [1,1'-bis(diphenylphosphino) ferrocene] dichloropalladium(II) dichloromethane complex (1:1)::$Pd(dppf)Cl_2.CH_2Cl_2$, $PdCl_2\{P(t\text{-}Bu)_2\text{-}(p\text{-}NMe_2\text{-}Ph)\}_2$: $(A\text{-}taPhos)_2PdCl_2$, palladium bis (dibenzylidene), [1,3-bis(diphenylphosphino)propane] nickel(II) dichloride, and $PdCl_2[P(t\text{-}Bu)_2\text{-}(p\text{-}NMe_2\text{-}Ph)]_2$: $(A\text{-}taPhos)_2PdCl_2$ (Pd-132: trademark; manufactured by Johnson Matthey Co., Ltd.).

In order to accelerate the reaction, a phosphine compound may be optionally added to these palladium compounds. Specific examples of the phosphine compound include tri (t-butyl) phosphine, tricyclohexylphosphine, 1-(N,N-dimethylaminomethyl)-2-(di-t-butylphosphino) ferrocene, 1-(N,N-dibutylaminomethyl)-2-(di-t-butylphosphino) ferrocene, 1-(methoxymethyl)-2-(di-t-butylphosphino) ferrocene, 1,1'-bis(di-t-butylphosphino) ferrocene, 2,2'-bis(di-t-butylphosphino)-1,1'-binaphthyl, 2-methoxy-2'-(di-t-butylphosphino)-1,1'-binaphthyl, and 2-dicyclohexylphosphino-2',6'-dimethoxybiphenyl.

Specific examples of a base used in the reaction include sodium carbonate, potassium carbonate, cesium carbonate, sodium hydrogencarbonate, sodium hydroxide, potassium hydroxide, barium hydroxide, sodium ethoxide, sodium t-butoxide, sodium acetate, potassium acetate, tripotassium phosphate, and potassium fluoride.

Specific examples of a solvent used in the reaction include benzene, toluene, xylene, 1,2,4-trimethylbenzene, anisole, acetonitrile, dimethylsulfoxide, N,N-dimethylformamide, tetrahydrofuran, diethyl ether, t-butyl methyl ether, 1,4-dioxane, methanol, ethanol, t-butyl alcohol, cyclopentyl methyl ether, and isopropyl alcohol. These solvents can be appropriately selected, and may be used singly or as a mixed solvent.

2-3. Method for Manufacturing Compound Represented by General Formula (B-6)

A compound represented by formula (B-6) can be synthesized by appropriately combining the methods described in the "method for manufacturing compounds represented by general formulas (B-1) to (B-4)".

A solvent used in the reaction may be an ether solvent and the like in addition to solvents described in the 'method for manufacturing compounds represented by general formulas (B-1) to (B-4)". Examples thereof include dimethoxyethane, 2-(2-methoxyethoxy) ethane, and 2-(2-ethoxyethoxy) ethane.

A base may be added as an aqueous solution, and a reaction may be caused in a two-phase system. In a case of a reaction in a two-phase system, a phase transfer catalyst such as a quaternary ammonium salt may be added, if necessary.

When formula (B-6) is manufactured, formula (B-6) may be manufactured in one stage or multiple stages. Formula (B-6) may be manufactured by a batch polymerization method in which a reaction is started after the whole amount of a raw material is put in a reaction vessel, by a dropping polymerization method in which a raw material is added dropwise to a reaction vessel, by a precipitation polymerization method in which a product is precipitated with progress of a reaction, or by appropriately combining these methods. For example, when a compound represented by formula (B-6) is synthesized in one stage, a reaction is caused in a state where a monomer unit (MU) and an endcap unit (EC) are added to a reaction vessel, and a desired product is thereby obtained. Furthermore, when a compound represented by formula (B-6) is synthesized in multiple stages, a monomer unit (MU) is polymerized to a target molecular weight, and then an endcap unit (EC) is added thereto for a reaction to obtain a desired product.

Furthermore, if a polymerizable group of a monomer unit (MU) is selected, a primary structure of a polymer can be controlled. For example, as illustrated in 1 to 3 of synthesis scheme (20), a polymer having a random primary structure (1 in synthesis scheme (20)), a polymer having a regular primary structure (2 and 3 in synthesis scheme (20)), and the like can be synthesized, and can be appropriately combined and used according to a desired product.

synthesis scheme (20)

1) polymer synthesized using two kinds of monomers (x—a—y) and (x—b—y)

n x—a—y + n x—b—y ⟶ - - - - a—b—a—a—b—b - - - -

A polymer in which a and b are linked to each other randomly is synthesized.

2) polymer synthesized using two kinds of monomers (x—a—x) and (y—b—y)

n x—a—x + n y—b—y ⟶ - - - - a—b—a—b—a—b - - - -

A polymer in which a and b are linked to each other alternatingly is synthesized.

-continued 3) polymer synthesized using two kinds of monomers (x—a—y) and (y—b—y)

n x—a—y + n y—b—y ⟶ - - - - a—a—b—a—b—a - - - -

A polymer in which b and b are not adjacent to each other is synthesized.

MU = a,b polymerizable group = (each of x and y is bonded)

3. Organic Electroluminescent Element

The light emitting layer-forming composition according to the present invention is used as a material of an organic EL element manufactured by a wet film formation method. Hereinafter, an organic EL element according to the present embodiment will be described in detail based on the drawings. FIG. 1 is a schematic cross-sectional view illustrating the organic EL element according to the present embodiment.

3-1. Structure of Organic Electroluminescent Element

An organic EL element 100 illustrated in FIG. 1 includes a substrate 101, a positive electrode 102 provided on the substrate 101, a hole injection layer 103 provided on the positive electrode 102, a hole transport layer 104 provided on the hole injection layer 103, a light emitting layer 105 provided on the hole transport layer 104, an electron transport layer 106 provided on the light emitting layer 105, an electron injection layer 107 provided on the electron transport layer 106, and a negative electrode 108 provided on the electron injection layer 107.

Incidentally, the organic EL element 100 may be configured, by reversing the manufacturing order, to include, for example, the substrate 101, the negative electrode 108 provided on the substrate 101, the electron injection layer 107 provided on the negative electrode 108, the electron transport layer 106 provided on the electron injection layer 107, the light emitting layer 105 provided on the electron transport layer 106, the hole transport layer 104 provided on the light emitting layer 105, the hole injection layer 103 provided on the hole transport layer 104, and the positive electrode 102 provided on the hole injection layer 103.

In general, an organic EL element having a normal manufacturing order is called an organic EL element of a forward structure, and an organic EL element having an inverse manufacturing order is called an organic EL element of a reverse structure. The same materials may be used for the organic EL element of a forward structure and the organic EL element of a reverse structure. However, as for a positive electrode and a negative electrode, a material of the positive electrode 102 of an organic EL element of a forward structure is used as a material of the negative electrode 108 of an organic EL element of a reverse structure, and a material of the negative electrode 108 of an organic EL element of a forward structure is used as a material of the positive electrode 102 of an organic EL element of a reverse structure. Unless otherwise specified, the following description will be given for an organic EL element of a forward structure.

Not all of the above layers are essential. The configuration includes the positive electrode 102, the light emitting layer 105, and the negative electrode 108 as a minimum constituent unit, while the hole injection layer 103, the hole transport layer 104, the electron transport layer 106, and the electron injection layer 107 are optionally provided. Each of the above layers may be formed of a single layer or a plurality of layers.

A form of layers constituting the organic EL element may be, in addition to the above structure form of "substrate/positive electrode/hole injection layer/hole transport layer/light emitting layer/electron transport layer/electron injection layer/negative electrode", a structure form of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

3-2. Substrate in Organic Electroluminescent Element

The substrate 101 serves as a support of the organic EL element 100, and usually, quartz, glass, metals, plastics, and the like are used. The substrate 101 is formed into a plate shape, a film shape, or a sheet shape according to a purpose, and for example, a glass plate, a metal plate, a metal foil, a plastic film, and a plastic sheet are used. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. The upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

3-3. Positive Electrode in Organic Electroluminescent Element

The positive electrode 102 plays a role of injecting a hole into the light emitting layer 105. Incidentally, in a case where the hole injection layer 103 and/or the hole transport layer 104 are/is provided between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer such as a polythiophene such as poly(3-methylthiophene), polypyrrole, or polyaniline. In addition to these compounds, a material can be appropriately selected for use from materials used as a positive electrode of an organic EL element.

A resistance of a transparent electrode is not limited as long as a sufficient current can be supplied to light emission of a luminescent element. However, low resistance is desirable from a viewpoint of consumption power of the luminescent element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of an ITO can be arbitrarily selected according to a resistance value, but an ITO having a thickness of 50 to 300 nm is usually used in many cases.

3-4. Hole Injection Layer and Hole Transport Layer in Organic Electroluminescent Element The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 to the light emitting layer 105. The hole injection layer 103 and the hole transport layer 104 are each formed by laminating and mixing one or more kinds of hole injection/transport materials, or by a mixture of hole injection/transport materials and a polymer binder. Furthermore, a layer may be formed by adding an inorganic salt such as iron(III) chloride to the hole injection/transport materials.

A hole injection/transport substance needs to efficiently inject/transport a hole from a positive electrode between electrodes to which an electric field is applied, and preferably has high hole injection efficiency and transports an injected hole efficiently. For this purpose, a substance which has low ionization potential, large hole mobility, and excellent stability, and in which impurities that serve as traps are not easily generated at the time of manufacturing and at the time of use, is preferable.

As a material to form the hole injection layer 103 and the hole transport layer 104, any compound can be selected for use among compounds that have been conventionally used as charge transport materials for holes, p-type semiconductors, and known compounds used in a hole injection layer and a hole transport layer of an organic EL element. Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-di amine, N,N'- dinaphthyl-N,N'-diphenyl-4,4'-dphenyl-1,1'-diamine, $N^4,N^{4'}$-diphenyl-$N^4,N^{4'}$-bis(9-phenyl-9H-carbazol-3-yl)-[1,1'-biphenyl]-4,4'-diamine, $N^4,N^4,N^{4'},N^{4'}$-tetra[1,1'-biphenyl]-4-yl)-[1,1'-biphenyl]-4,4'-diamine, a triphenylamine derivative such as 4,4',4"-tris(3-methylphenyl(phenyl)amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film needed for manufacturing a luminescent element, can inject a hole from a positive electrode, and can transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, "M. Pfeiffer, A. Beyer, T. Fritz, K. Leo, Appl. Phys. Lett., 73(22), 3202-3204 (1998)" and "J. Blochwitz, M. Pheiffer, T. Fritz, K. Leo, Appl. Phys. Lett., 73(6), 729-731 (1998)"). These compounds generate a so-called hole by an electron transfer process in an electron-donating type base substance (hole transporting substance). Electroconductivity of the base substance depends on the number and mobility of the holes fairly significantly. Known examples of a matrix substance having a hole transporting characteristic include a benzidine derivative (TPD and the like), a starburst amine derivative (TDATA and the like), and a specific metal phthalocyanine (particularly, zinc phthalocyanine (ZnPc) and the like) (JP2005-167175 A).

In addition, as a material for forming the hole injection layer 103 and the hole transport layer 104 by a wet film formation method, in addition to the above materials for forming the hole injection layer 103 and the hole transport layer 104 used for vapor deposition, a hole injecting and hole transporting polymer, a hole injecting and hole transporting crosslinkable polymer, a hole injecting and hole transporting polymer precursor, a polymerization initiator, and the like can be used. Examples of the material include PEDOT: PSS, polyaniline compounds (described in JP2005-108828 A, WO2010/058776 A, WO2013/042623 A, and the like), fluorene polymers (described in JP2011-251984 A, JP2011-501449 A, JP2012-533661 A, and the like), and compounds described in "$X_1$ aohui Yang, David C. Muller, Dieter Neher, Klaus Meerholz, Organic Electronics, 12, 2253-2257 (2011)", "Philipp Zacharias, Malte C. Gather, Markus Rojahn, Oskar Nuyken, Klaus Meerholz, Angew. Chem. Int. Ed., 46,4388-4392 (2007)", "Chei-Yen, Yu-Cheng Lin, Wen-Yi Hung, Ken-Tsung Wong, Raymond C. Kwong, Sean C. $X_1$ a, Yu-Hung Chen, Chih-I Wu, J. Mater. Chem., 19,3618-3626(2009)", "Fei Huang, Yen-Ju Cheng, Yong Zhang, Michelle S. Liu, Alex K.-Y. Jen, J. Mater. Chem., 18,4495-4509(2008)", "Carlos A. Zuniga, Jassem Abdallah, WojciechHaske, Yadong Zhang, Igor Coropceanu, Stephen Barlow, Bernard Kippelen, Seth R. Marder, Adv. Mater., 25, 1739-1744 (2013)", "Wen-Yi Hung, Chi-Yen Lin, Tsang-Lung Cheng, Shih-Wei Yang, Atul Chaskar, Gang-Lun Fan, Ken-Tsung Wong, Teng-Chih Chao, Mei-Rurng Tseng, Organic Electronics, 13, 2508-2515 (2012)", and the like.

3-5. Light Emitting Layer in Organic Electroluminescent Element

The light emitting layer 105 emits light by recombining a hole injected from the positive electrode 102 and an electron injected from the negative electrode 108 between electrodes to which an electric field is applied. A material to form the light emitting layer 105 is a compound excited by recombination between a hole and an electron and emits light (luminescent compound), and is a compound which can form a stable thin film shape, and exhibits strong light emission (fluorescence) efficiency in a solid state.

The light emitting layer may be formed of a single layer or a plurality of layers, and each layer is formed of a material for a light emitting layer (a host material and a dopant material). Each of the host material and the dopant material may be formed of a single kind, or a combination of a plurality of kinds. The dopant material may be included in the host material wholly or partially. The composition of the present invention can be used for forming a light emitting layer, and a compound constituting the composition, represented by formula (A) or (A') functions as a dopant material, and compounds represented by formulas (B-1) to (B-6) function as a host material.

The content of a host material in the light emitting layer is preferably from 83.3% by weight to 99.9% by weight, more preferably from 80% by weight to 99.5% by weight, and still more preferably from 90 to 1.0% by weight with respect to the total amount of a material for the light emitting layer.

The content of the dopant is preferably from 0.1% by weight to 25% by weight, more preferably from 0.5 to 20% by weight, and still more preferably from 1.0 to 10% by weight with respect to the total amount of a material for the light emitting layer. The amount of use within the above range is preferable, for example, from a viewpoint of being able to prevent a concentration quenching phenomenon.

3-6. Electron Injection Layer and Electron Transport Layer in Organic Electroluminescent Element The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108, or an electron injected from the negative electrode 108 through the electron injection layer 107 to the light emitting layer 105. The electron transport layer 106 and the electron injection layer 107 are each formed by laminating and mixing one or more kinds of electron transport/injection materials, or by a mixture of an electron transport/injection material and a polymeric binder.

An electron injection/transport layer is a layer that manages injection of an electron from a negative electrode and transport of an electron, and is preferably a layer that has high electron injection efficiency and can efficiently transport an injected electron. For this purpose, a substance which has high electron affinity, large electron mobility, and excellent stability, and in which impurities that serve as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transporting ability is not so high, an effect of enhancing light emission efficiency is equal to that of a material having high electron transporting ability. Therefore, the electron injection/transport layer according to the present embodiment may also include a function of a layer that can efficiently prevent migration of a hole.

A material (electron transport material) for forming the electron transport layer 106 or the electron injection layer 107 can be arbitrarily selected for use from a compound conventionally used as an electron transfer compound in a photoconductive material, and known compounds that are used in an electron injection layer and an electron transport layer of an organic EL element.

A material used in an electron transport layer or an electron injection layer preferably includes at least one selected from a compound formed of an aromatic ring or a heteroaromatic ring including one or more kinds of atoms selected from carbon, hydrogen, oxygen, sulfur, silicon, and phosphorus atoms, a pyrrole derivative and a fused ring derivative thereof, and a metal complex having an electron-accepting nitrogen atom. Specific examples of the material include a fused ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2':6'2"-terpyridinyl))benzene and the like), a naphthyridine derivative (bis(l-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can also be used, and examples thereof include a quinolinol-based metal complex, a hydroxyazole complex such as a hydroxyphenyloxazole complex, an azomethine complex, a tropolone-metal complex, a flavonol-metal complex, and a benzoquinoline-metal complex.

The materials described above are used singly, but may also be used in a mixture with other materials.

Among the materials described above, a quinolinol-based metal complex, a bipyridine derivative, a phenanthroline derivative, and a borane derivative are preferable.

A quinolinol-based metal complex is a compound represented by the following general formula (E-1).

(E-1)

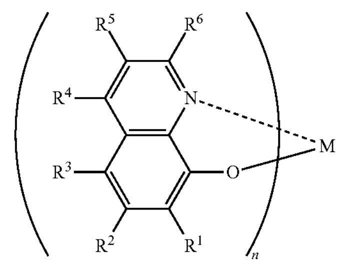

In the formula, $R^1$ to $R^6$ each independently represent a hydrogen atom, a fluorine atom, an alkyl, an aralkyl, an alkenyl, a cyano, an alkoxy, or an aryl, M represents Li, Al, Ga, Be, or Zn, and n represents an integer of 1 to 3.

Specific examples of the quinolinol-based metal complex include 8-quinolinollithium, tris(8-quinolinolato)aluminum, tris(4-methyl-8-quinolinolato)aluminum, tris(5-methyl-8-quinolinolato)aluminum, tris(3,4-dimethyl-8-quiolinolato) aluminum, tris(4,5-dimethyl-8-quinolinolato)aluminum, tris (4,6-dimethyl-8-quinolinolato)aluminum, bis(2-methyl-8-quinolinolato)(phenolato)aluminum, bis(2-methyl-8-quinolinolato)(2-methylphenolato)aluminum, bis(2-methyl-8-quinolinolato)(3-methylphenolato)aluminum, bis(2-methyl-8-quinolinolato)(4-methylphenolato)aluminum, bis (2-methyl-8-quinolinolato)(2-phenylphenolato)aluminum, bis(2-methyl-8-quinolinolato)(3-phenylphenolato)aluminum, bis(2-methyl-8-quinolinolato)(4-phenylphenolato)aluminum, bis(2-methyl-8-quinolinolato)(2,3-dimethylphenolato)aluminum, bis(2-methyl-8-quinolinolato)(2,6-dimethylphenolato)aluminum, bis(2-methyl-8-quinolinolato)(3,4-dimethylphenolato)aluminum, bis(2-methyl-8-quinolinolato)(3,5-dimethylphenolato)aluminum, bis(2-methyl-8-quinolinolato)(3,5-di-t-butylphenolato)aluminum, bis(2-methyl-8-quinolinolato)(2,6-diphenylphenolato)aluminum, bis(2-methyl-8-quinolinolato)(2,4,6-triphenylphenolato)aluminum, bis(2-methyl-8-quinolinolato)(2,4,6-trimethylphenolato)aluminum, bis(2-methyl-8-quinolinolato)(2,4,5,6-tetramethylphenolato) aluminum, bis (2-methyl-8-quinolinolato)(1-naphtholato)aluminum, bis(2-methyl-8-quinolinolato)(2-naphtholato)aluminum, bis(2,4-dimethyl-8-quinolinolato)(2-phenylphenolato)aluminum, bis(2,4-dimethyl-8-quinolinolato)(3-phenylphenolato)aluminum, bis(2,4-dimethyl-8-quinolinolato)(4-phenylphenolato)aluminum, bis(2,4-dimethyl-8-quinolinolato)(3,5-dimethylphenolato)aluminum, bis(2,4-dimethyl-8-quinolinolato)(3,5-di-t-butylphenolato)aluminum, bis(2-methyl-8-quinolinolato)aluminum-μ-oxo-bis(2-methyl-8-quinolinolato)aluminum, bis(2,4-dimethyl-8-quinolinolato) aluminum-μ-oxo-bis(2,4-dim ethyl-8-quinolinolato) aluminum, bis(2-methyl-4-ethyl-8-quinolinolato)aluminum-μ-oxo-bis(2-ethyl-4-ethyl-8-quinolinolato)aluminum, bis(2-methyl-4-methoxy-8-quinolinolato)aluminum-μ-oxo-bis(2-methyl-4-methoxy-8-quinolinolato)aluminum, bis(2-methyl-5-cyano-8-quinolinolato)aluminum-μ-oxo-bis(2-m ethyl-5-cyano-8-quinolinolato)aluminum, bis(2-methyl-5-trifluoromethyl-8-quinolinolato)aluminum-μ-oxo-bis(2-methyl-5-trifluoromethyl-8-quiolinolato)aluminum, and bis(10-hydroxybenzo[h]quinoline)beryllium.

A bipyridine derivative is a compound represented by the following general formula (E-2)

(E-2)

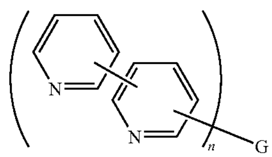

In the formula, G represents a simple bond or an n-valent linking group, and n represents an integer of 2 to 8. A carbon atom not used for a pyridine-pyridine bond or a pyridine-G bond may be substituted by an aryl, a heteroaryl, an alkyl, or a cyano.

Examples of G in general formula (E-2) include groups represented by the following structural formulas. Note that R's in the following structural formulas each independently represent a hydrogen atom, methyl, ethyl, isopropyl, cyclohexyl, phenyl, 1-naphthyl, 2-naphthyl, biphenylyl, or terphenylyl.

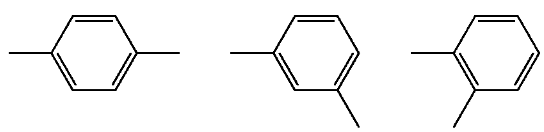

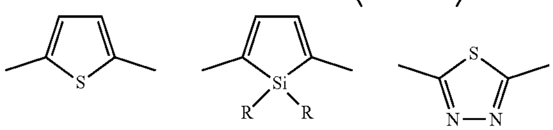

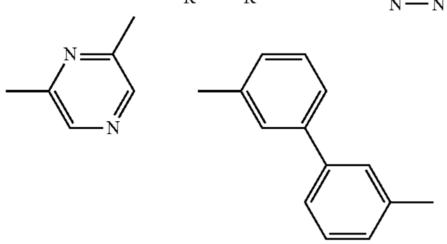

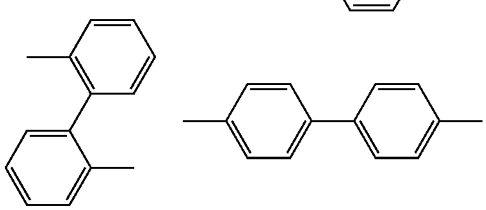

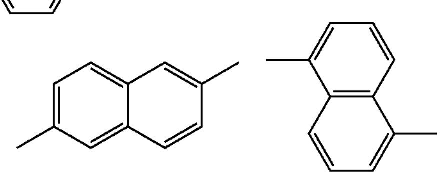

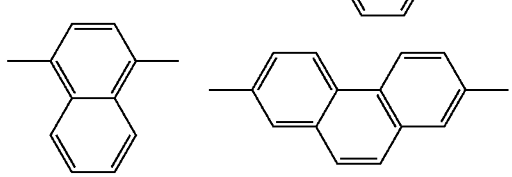

-continued

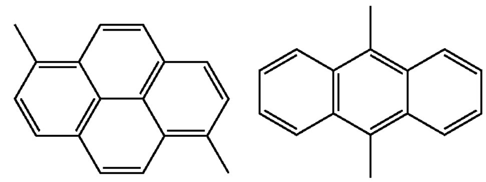

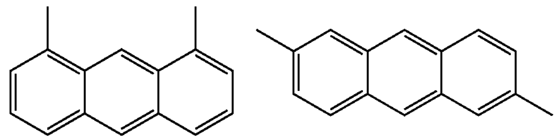

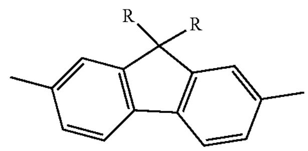

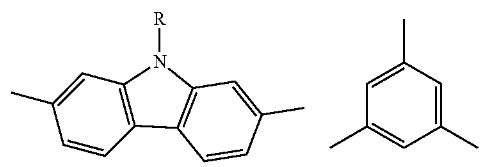

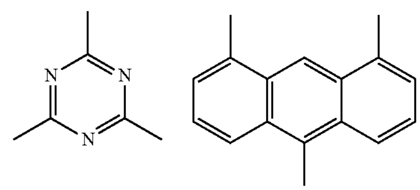

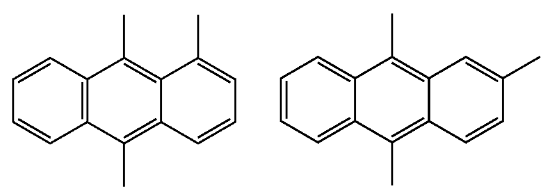

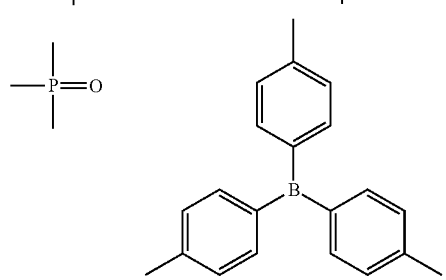

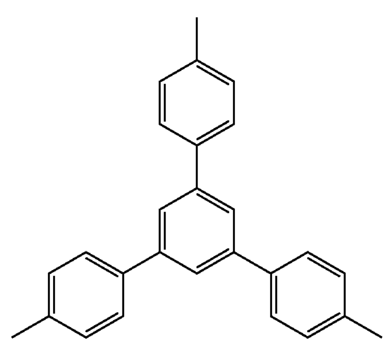

-continued

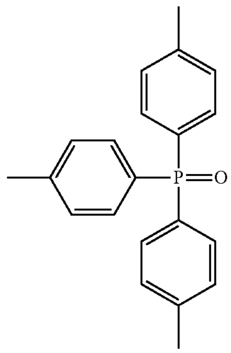

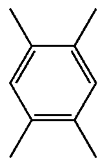

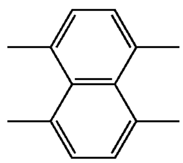

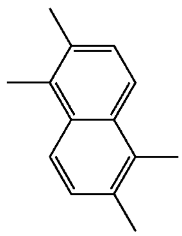

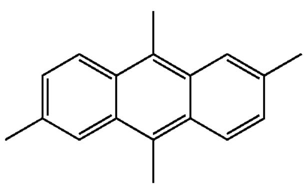

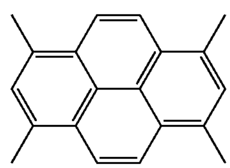

Specific examples of the pyridine derivative include 2,5-bis(2,2'-pyridin-6-yl)-1,1-dimethyl-3,4-diphenylsilole, 2,5-bis(2,2'-pyridin-6-yl)-1,1-dimethyl-3,4-dimesitylsilole, 2,5-bis(2,2'-pyridin-5-yl)-1,1-dimethyl-3,4-diphenylsilole, 2,5-bis(2,2'-pyridin-5-yl)-1,1-dimethyl-3,4-dimesitylsilole, 9,10-di(2,2'-pyridin-6-yl)anthracene, 9,10-di(2,2'-pyridin-5-yl)anthracene, 9,10-di(2,3'-pyridin-6-yl)anthracene, 9,10-di (2,3'-pyridin-5-yl)anthracene, 9,10-di(2,3'-pyridin-6-yl)-2-phenylanthracene, 9,10-di(2,3'-pyridin-5-yl)-2-phenylanthracene, 9,10-di(2,2'-pyridin-6-yl)-2-phenylanthracene, 9,10-di(2,2'-pyridin-5-yl)-2-phenylanthracene, 9,10-di(2,4'-pyridin-6-yl)-2-phenylanthracene, 9,10-di(2,4'-pyridin-5-yl)-2-phenylanthracene, 9,10-di(3,4'-pyridin-6-yl)-2-phenylanthracene, 9,10-di(3,4'-pyridin-5-yl)-2-phenylanthracene, 3,4-diphenyl-2,5-di(2,2'-pyridin-6-yl) thiophene, 3,4-diphenyl-2,5-di(2,3'-pyridin-5-yl)thiophene, and 6',6"-di(2-pyridyl)-2,2':4',4":2",2'"-quaterpyridine.

A phenanthroline derivative is a compound represented by the following general formula (E-3-1) or (E-3-2).

(E-3-1)

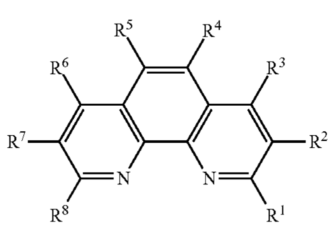

-continued (E-3-2)

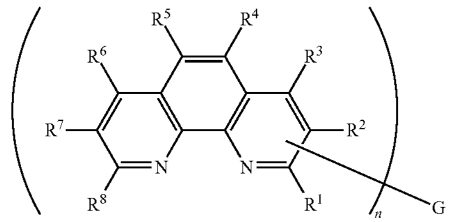

In the formula, $R^1$ to $R^8$ each independently represent a hydrogen atom, an alkyl (methyl, ethyl, isopropyl, hydroxyethyl, methoxymethyl, trifluoromethyl, t-butyl, cyclopentyl, cyclohexyl, benzyl, or the like), an alkyloxy (methoxy, ethoxy, isopropoxy, butoxy, or the like), an aryloxy (phenoxy, 1-naphthyloxy, 4-tolyloxy, or the like), a halogen atom (a fluorine atom, a chlorine atom, a bromine atom, an iodine atom, or the like), an aryl (phenyl, naphthyl, p-tolyl, p-chlorophenyl, or the like), an alkylthio (methylthio, ethylthio, isopropylthio, or the like), an arylthio (phenylthio or the like), cyano, nitro, and a heterocyclic ring (pyrrole, pyrrolidyl, pyrazolyl, imidazolyl, pyridyl, benzimidazolyl, benzthiazolyl, benzoxazolyl, or the like). An alkyl or a halogen atom is preferable. Methyl, ethyl, isopropyl, or a fluorine atom is more preferable. Adjacent groups may be bonded to each other to form a fused ring. G represents a simple bond or an n-valent linking group, and n represents an integer of 2 to 8. Examples of G of general formula (E-3-2) include the same groups as those described in the section of the bipyridine derivative. In the above formula (E-3-2), any one of $R^1$ to $R^8$ is bonded to G.

Specific examples of the phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bi(1,10-phenanthrolin-5-yl), bathocuproine, and 1,3-bis(2-phenyl-1,10-phenanthrolin-9-yl)benzene.

Particularly, a case of using a phenanthroline derivative in an electron transport layer or an electron injection layer will be described. In order to obtain stable light emission over a long time, a material having excellent thermal stability or thin film formability is desired. Among phenanthroline derivatives, a phenanthroline derivative in which a substituent itself has a three-dimensional steric structure, a phenanthroline derivative having a three-dimensional steric structure as a result of steric repulsion between a substituent and a phenanthroline skeleton or between a substituent and an adjacent substituent, or a phenanthroline derivative having a plurality of phenanthroline skeletons linked together, is preferable. Furthermore, in a case of linking a plurality of phenanthroline skeletons, a compound containing a conjugated bond, a substituted or unsubstituted aromatic hydrocarbon, or a substituted or unsubstituted heterocyclic aromatic ring in a linked unit, is more preferable.

A borane derivative is a compound represented by the following general formula (E-4). Specific examples thereof are disclosed in JP2007-27587 A.

(E-4)

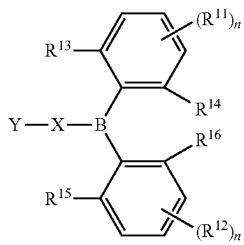

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3. Examples of a substituent in a case of being "optionally substituted" or "substituted" include an aryl, a heteroaryl, and an alkyl.

Among compounds represented by the above general formula (E-4), a compound represented by the following general formula (E-4-1), and compounds represented by the following general formulas (E-4-1-1) to (E-4-1-4) are preferable. Specific examples of the compounds include 9-[4-(4-dimesitylborylnaphthalen-1-yl)phenyl]carbazole and 9-[4-(4-dimesitylborylnaphthalen-1-yl)naphthalen-1-yl]carbazole.

(E-4-1)

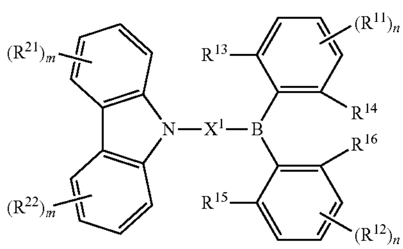

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $R^{21}$ and $R^{22}$ each independently represent at least one of a hydrogen atom, an alkyl, an optionally substituted aryl, a substituted silyl, an optionally substituted nitrogen-containing heterocyclic ring, and a cyano, $X^1$ represents an optionally substituted arylene having 20 or fewer carbon atoms, n's each independently represent an integer of 0 to 3, and m's each independently represent an integer of 0 to 4. Examples of a substituent in a case of being "optionally substituted" or "substituted" include an aryl, a heteroaryl, and an alkyl.

(E-4-1-1)

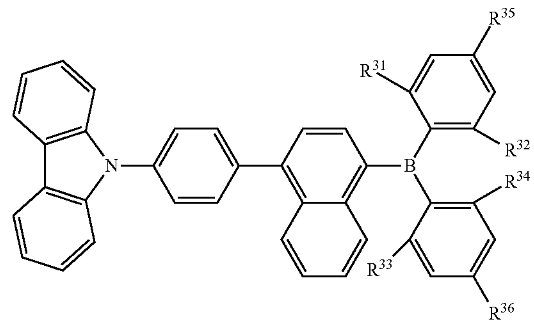

(E-4-1-2)

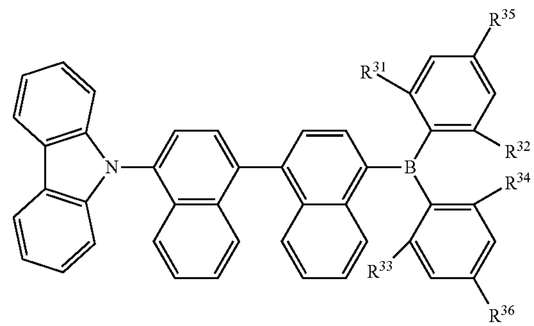

(E-4-1-3)

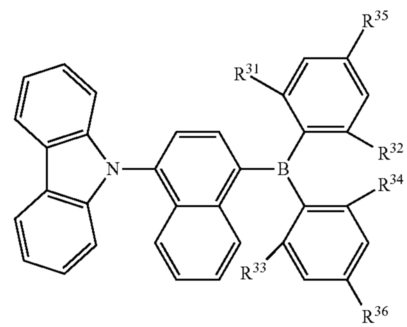

(E-4-1-4)

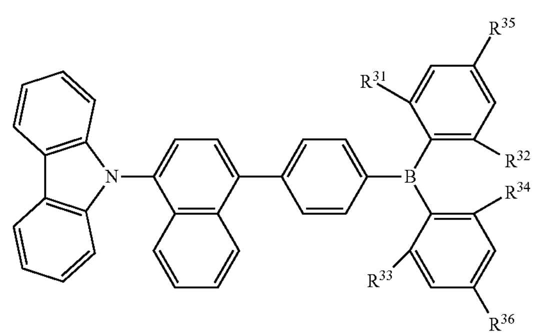

In the formula, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

Among compounds represented by the above general formula (E-4), a compound represented by the following general formula (E-4-2) and a compound represented by the following general formula (E-4-2-1) are preferable.

(E-4-2)

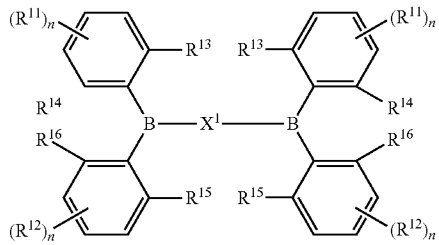

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $X^1$ represents an optionally substituted arylene having 20 or fewer carbon atoms, and n's each independently represent an integer of 0 to 3. Examples of a substituent in a case of being "optionally substituted" or "substituted" include an aryl, a heteroaryl, and an alkyl.

(E-4-2-1)

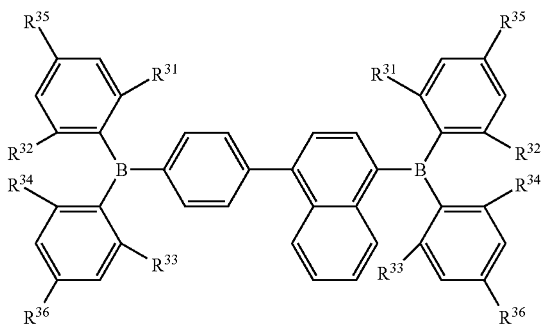

In the formula, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

Among compounds represented by the above general formula (E-4), a compound represented by the following general formula (E-4-3) and a compound represented by the following general formula (E-4-3-1) or (E-4-3-2) are preferable.

(E-4-3)

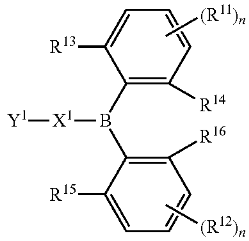

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $X^1$ represents an optionally substituted arylene having 10 or fewer carbon atoms, $Y^1$ represents an optionally substituted aryl having 14 or fewer carbon atoms, and n's each independently represent an integer of 0 to 3. Examples of a substituent in a case of being "optionally substituted" or "substituted" include an aryl, a heteroaryl, and an alkyl.

(E-4-3-1)

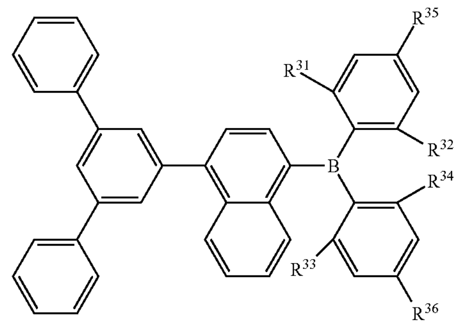

(E-4-3-2)

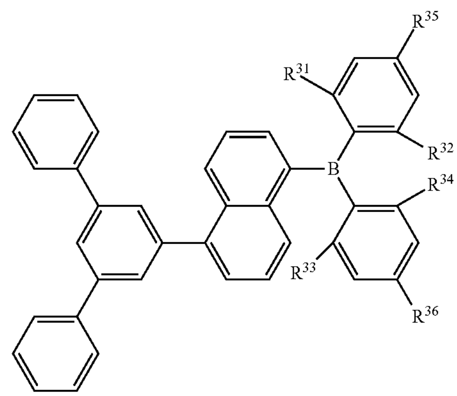

In the formula, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

A benzimidazole derivative is a compound represented by the following general formula (E-5).

(E-5)

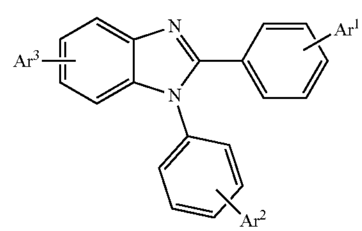

In the formula, $Ar^1$ to $Ar^3$ each independently represent a hydrogen atom or an optionally substituted aryl having 6 to 30 carbon atoms. Examples of a substituent in a case of being "optionally substituted" include an aryl, a heteroaryl, an alkyl, and a cyano. Particularly, a benzimidazole derivative in which $Ar^1$ is an anthryl optionally substituted by an aryl, a heteroaryl, an alkyl, or a cyano is preferable.

Specific examples of the aryl having 6 to 30 carbon atoms include phenyl, 1-naphthyl, 2-naphthyl, acenaphthylen-1-yl, acenaphthylen-3-yl, acenaphthylen-4-yl, acenaphthylen-5-yl, fluoren-1-yl, fluoren-2-yl, fluoren-3-yl, fluoren-4-yl, fluoren-9-yl, phenalen-1-yl, phenalen-2-yl, 1-phenanthryl, 2-phenanthryl, 3-phenanthryl, 4-phenanthryl, 9-phenanthryl, 1-anthryl, 2-anthryl, 9-anthryl, fluoranthen-1-yl, fluoranthen-2-yl, fluoranthen-3-yl, fluoranthen-7-yl, fluoranthen-8-yl, triphenylen-1-yl, triphenylen-2-yl, pyren-1-yl, pyren-2-yl, pyren-4-yl, chrysen-1-yl, chrysen-2-yl, chrysen-3-yl, chrysen-4-yl, chrysen-5-yl, chrysen-6-yl, naphthacen-1-yl, naphthacen-2-yl, naphthacen-5-yl, perylen-1-yl, perylen-2-yl, perylen-3-yl, pentacen-1-yl, pentacen-2-yl, pentacen-5-yl, and pentacen-6-yl.

Specific examples of the benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthlen-2-yl)anthracen-9-yl)-1,2-diphenyl-1H-benzo [d]imidazole, 1-(4-(10-(naphthalen-2-yl)anthracen-9-yl)phenyl)-2-phenyl-1H-benzo[d] imidazole, 2-(4-(9,10-di(naphthalen-2-yl)anthracen-2-yl) phenyl)-1-phenyl-1H-benzo[d]imidazole, 1-(4-(9,10-di (naphthalen-2-yl)anthracen-2-yl)phenyl)-2-phenyl-1H-benzo[d]imidazole, and 5-(9,10-di(naphthalen-2-yl) anthracen-2-yl)-1,2-diphenyl-1H-benzo[d]imidazole.

An electron transport layer or an electron injection layer may further contain a substance that can reduce a material to form an electron transport layer or an electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include alkali metals such as Na (work function 2.36 eV), K (work function 2.28 eV), Rb (work function 2.16 eV), and Cs (work function 1.95 eV); and alkaline earth metals such as Ca (work function 2.9 eV), Sr (work function 2.0 to 2.5 eV), and Ba (work function 2.52 eV). Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, reducing ability can be efficiently exhibited, and emission luminance of an organic EL element is enhanced or a lifetime thereof is lengthened by adding Cs to a material to form an electron transport layer or an electron injection layer.

3-7. Negative Electrode in Organic Electroluminescent Element

The negative electrode 108 plays a role of injecting an electron to the light emitting layer 105 through the electron injection layer 107 and the electron transport layer 106.

A material to form the negative electrode 108 is not particularly limited as long as being a substance capable of efficiently injecting an electron to an organic layer. However, a material similar to the materials to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and alloys thereof (a magnesium-silver alloy, a magnesium-indium alloy, an aluminum-lithium alloy such as lithium fluoride/aluminum, and the like) are preferable. In order to enhance element characteristics by increasing electron injection efficiency, lithium, sodium, potassium, cesium, calcium, magnesium, or an alloy containing these low work function-metals is effective. However, many of these low work function-metals are generally unstable in air. In order to ameliorate this problem, for example, a method for using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. A method for manufacturing these electrodes is not particularly limited as long as being able to obtain conduction, such as resistance heating, electron beam deposition, sputtering, ion plating, or coating.

3-8. Binder that May be Used in Each Layer

A material used in the above hole injection layer, hole transport layer, light emitting layer, electron transport layer, and electron injection layer can form each of the layers by being used singly. However, it is also possible to use the material by dispersing the material in a solvent-soluble resin such as polyvinyl chloride, polycarbonate, polystyrene, poly (N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin, a curable resin such as a phenolic resin, a xylene resin, a petroleum resin, a urea resin, amelamine resin, an unsaturated polyester resin, an alkyd resin, an epoxy resin, or a silicone resin, or the like.

3-9. Method for Manufacturing Organic Electroluminescent Element

Each of layers constituting an organic EL element can be formed by forming a thin film of a material to constitute each of the layers by a method such as a vapor deposition method, resistance heating deposition, electron beam deposition, sputtering, a molecular lamination method, a printing method, a spin coating method, a casting method, a coating method, or a laser heating drawing method (LITI). The film thickness of each of the layers thus formed is not particularly limited, and can be appropriately set according to a property of a material, but is usually within a range of 2 nm to 5000 nm.

3-9-1. Wet Film Formation Method

The light emitting layer-forming composition of the present invention is formed using a wet film formation method.

In the wet film formation method, generally, a coating film is formed through an applying step of applying a light emitting layer-forming composition onto a substrate and a drying step of removing a solvent from the applied light emitting layer-forming composition. According to a difference in the applying step, a method using a spin coater is referred to as a spin coating method, a method using a slit coater is referred to as a slit coating method, a method using a plate is referred to gravure, offset, reverse offset, and flexographic printing methods, a method using an ink jet printer is referred to as an ink jet method, and a method for spraying the composition is referred to as a spraying method. Examples of the drying step include methods of air drying, heating, and drying under reduced pressure. The drying step may be performed only once, or may be performed a plurality of times using different methods and conditions. Furthermore, different methods may be used in combination like calcination under reduced pressure.

The wet film formation method is a film formation method using a solution, and examples thereof include a part of printing methods (ink jet method), a spin coating method, a casting method, and a coating method. Unlike a vacuum deposition method, the wet film formation method does not need to use an expensive vacuum deposition apparatus, and a film can be formed under atmospheric pressure. In addition, the wet film formation method can increase an area and manufacture a product continuously, leading to reduction in manufacturing cost.

Meanwhile, as compared with the vacuum deposition method, lamination is difficult by the wet film formation method. In a case where a laminated film is manufactured using the wet film formation method, it is necessary to prevent dissolution of a lower layer due to a composition of an upper layer, and techniques of using a composition with controlled solubility, crosslinking the lower layer, using orthogonal solvents (solvents which are not dissolved in each other), and the like are used. However, even with these techniques, it may be difficult to use the wet film formation method for application to all the films.

Therefore, in general, a method is adopted in which only some of the layers are formed by the wet film formation method and the remaining layers are formed by the vacuum deposition method to manufacture an organic EL element.

For example, a procedure for partially applying the wet film formation method to manufacture an organic EL element will be described below.

(Procedure 1) Film formation of positive electrode by vacuum deposition method (Procedure 2) Film formation of hole injection layer by wet film formation method (Procedure 3) Film formation of hole transport layer by wet film formation method (Procedure 4) Film formation of light emitting layer-forming composition containing host material and dopant material by wet film formation method (Procedure 5) Film formation of electron transport layer by vacuum deposition method (Procedure 6) Film formation of electron injection layer by vacuum deposition method (Procedure 7) Film formation of negative electrode by vacuum deposition method Through this procedure, an organic EL element formed of anode/hole injection layer/hole transport layer/light emitting layer including a host material and a dopant material/electron transport layer/electron injection layer/negative electrode is obtained.

3-9-2. Other Film Formation Method

For film formation of the light emitting layer-forming composition, a laser heating drawing method (LITI) can be used. LITI is a method for heating and depositing a compound attached to a base material with a laser, and the light emitting layer-forming composition can be used for a material to be applied to a base material.

3-9-3. Optional Step

A suitable treatment step, washing step, and drying step may be appropriately performed before and after each of the steps of film formation. Examples of the treatment step include an exposure treatment, a plasma surface treatment, an ultrasonic treatment, an ozone treatment, a washing treatment using a suitable solvent, and a heat treatment. Examples of the treatment step further include a series of steps for manufacturing a bank.

3-9-3-1. Bank (Partition Wall Material)

A photolithography technique can be used for manufacturing a bank. As a bank material that can be used for photolithography, a positive resist material and a negative resist material can be used. A patternable printing method such as an ink jet method, gravure offset printing, reverse offset printing, or screen printing can also be used. In this case, a permanent resist material can also be used.

Examples of a material used for a bank include a polysaccharide and a derivative thereof, a homopolymer and a copolymer of a hydroxyl-containing ethylenic monomer, a biopolymer compound, a polyacryloyl compound, polyester, polystyrene, polyimide, polyamideimide, polyetherimide, polysulfide, polysulfone, polyphenylene, polyphenyl ether, polyurethane, epoxy (meth)acrylate, melamine (meth)acrylate, polyolefin, cyclic polyolefin, an acrylonitrile-butadiene-styrene copolymer (ABS), a silicone resin, polyvinyl chloride, chlorinated polyethylene, chlorinated polypropylene, polyacetate, polynorbornene, a synthetic rubber, a fluorinated polymer such as polyfluorovinylidene, polytetrafluoroethylene, or polyhexafluoropropylene pyrene, a fluoroolefin-hydrocarbon olefin copolymer, and a fluorocarbon polymer, but are not limited thereto.

3-10. Example of Manufacturing Organic Electroluminescent Element

Next, an example of a method for manufacturing an organic EL element by a vacuum deposition method and a wet film formation method using an ink jet will be described.

3-10-1. Example of Manufacturing Organic Electroluminescent Element by Vacuum Deposition Method As an example of a method for manufacturing an organic EL element by a vacuum deposition method, a method for manufacturing an organic EL element formed of positive electrode/hole injection layer/hole transport layer/light emitting layer including a host material and a dopant material/electron transport layer/electron injection layer/negative electrode will be described. A thin film of a positive electrode material is formed on an appropriate substrate to manufacture a positive electrode by a vapor deposition method or the like, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for a negative electrode is formed by a vapor deposition method or the like to obtain a negative electrode. An intended organic EL element is thereby obtained. Incidentally, in manufacturing the above organic EL element, it is also possible to manufacture the element by reversing the manufacturing order, that is, in order of a negative electrode, an electron injection layer, an electron transport layer, a light emitting layer, a hole transport layer, a hole injection layer, and a positive electrode.

3-10-2. Example of Manufacturing Organic Electroluminescent Element by Ink Jet

Figure 2:
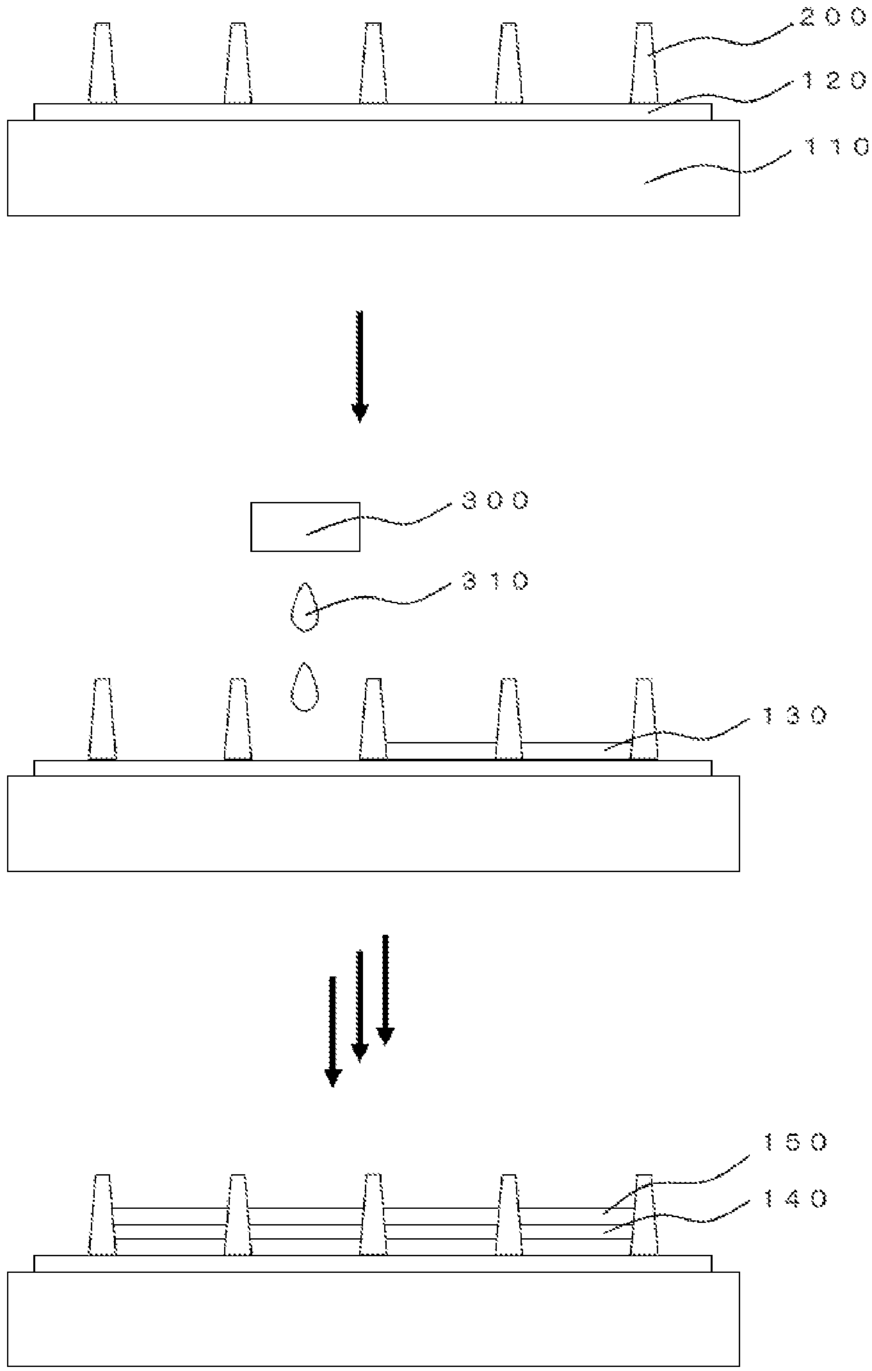
FIG. 2 is a diagram for describing a method for manufacturing an organic EL element on a substrate having a bank by an ink jet method.

With reference to FIG. 2, a method for manufacturing an organic EL element on a substrate having a bank by an ink jet method will be described. First, a bank (200) is provided on an electrode (120) on a substrate (110). In this case, a coating film (130) can be manufactured by dropping an ink droplet (310) between the banks (200) from an ink jet head (300) and drying the ink droplet (310). If this process is repeated, a subsequent coating film (140) and a light emitting layer (150) are manufactured, and an electron transport layer, an electron injection layer, and an electrode are formed by a vacuum deposition method, an organic EL element in which a light emitting part is partitioned by a bank material can be manufactured.

3-11. Confirmation of Electric Characteristics and Luminescence Characteristics of Organic Electroluminescent Element In a case where a direct current voltage is applied to the organic EL element thus obtained, it is only required to apply the voltage by using a positive electrode as a positive polarity and using a negative electrode as a negative polarity. By applying a voltage of about 2 to 40 V, light emission can be observed from a transparent or semitransparent electrode side (the positive electrode or the negative electrode, or both the electrodes). This organic EL element also emits light even in a case where a pulse current or an alternating current is applied. Note that a waveform of an alternating current applied may be any waveform.

3-12. Application Example of Organic Electroluminescent Element

The present invention can also be applied to a display apparatus including an organic EL element, a lighting apparatus including an organic EL element, or the like.

The display apparatus or lighting apparatus including an organic EL element can be manufactured by a known method such as connecting the organic EL element according to the present embodiment to a known driving apparatus, and can be driven by appropriately using a known driving method such as direct driving, pulse driving, or alternating driving.

Examples of the display apparatus include panel displays such as color flat panel displays; and flexible displays such as flexible organic electroluminescent (EL) displays (see, for example, JP13035066 A, JP2003-321546 A, JP2004-281806 A, and the like). Examples of a display method of the display include a matrix method and/or a segment method. Note that the matrix display and the segment display may co-exist in the same panel.

A matrix refers to a system in which pixels for display are arranged two-dimensionally as in a lattice form or a mosaic form, and characters or images are displayed by an assembly of pixels. The shape or size of the pixel depends on intended use. For example, for display of images and characters of a personal computer, a monitor, or a television, square pixels each having a size of 300 μm or less on each side are usually used, and in a case of a large-sized display such as a display panel, pixels having a size in the order of millimeters on each side are used. In a case of monochromic display, it is only required to arrange pixels of the same color. However, in a case of color display, display is performed by arranging pixels of red, green and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method and the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP2003-277741 A, and JP2004-119211 A). The backlight is mainly used for enhancing visibility of a display apparatus that is not self-luminous, and is used in a liquid crystal display apparatus, a timepiece, an audio apparatus, an automotive panel, a display panel, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

EXAMPLES

Hereinafter, the present invention will be described more specifically based on Examples, but the present invention is not limited to these Examples.

<Synthesis of Compound Represented by General Formula (A) Used in Examples>

Hereinafter, synthesis of a compound represented by general formula (A) used in Examples will be described.

Synthesis Example 1: Synthesis of Compound (1-1152)

(1-1152)

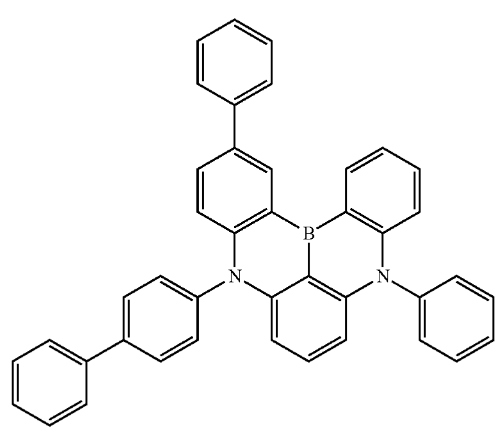

In a nitrogen atmosphere, a flask containing diphenylamine (37.5 g), 1-bromo-2,3-dichlorobenzene (50.0 g), Pd-132 (Johnson Matthey) (0.8 g), NaOtBu (32.0 g) and xylene (500 ml) was heated and stirred for four hours at 80° C. Subsequently, the temperature of the mixture was increased to 120° C., and the mixture was further heated and stirred for three hours. The reaction liquid was cooled to room temperature, subsequently water and ethyl acetate were added thereto, and the mixture was partitioned. Subsequently, purification was performed by silica gel column chromatography (developing liquid: toluene/heptane=1/20 (volume ratio)), and thus 2,3-dichloro-N,N-diphenylaniline (63.0 g) was obtained.

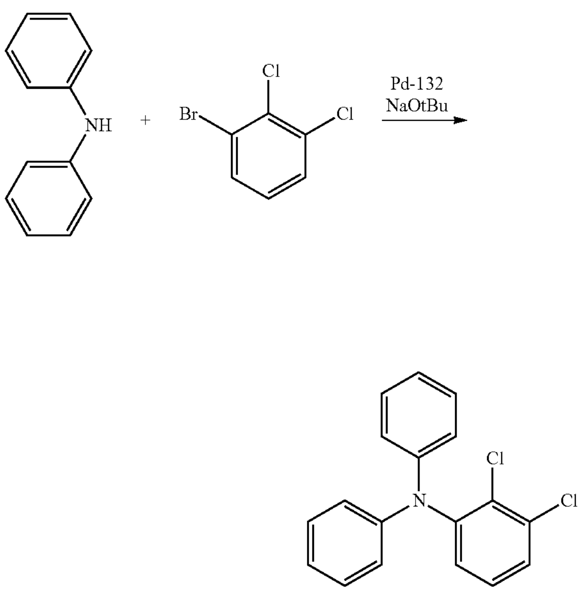

In a nitrogen atmosphere, a flask containing 2,3-dichloro-N,N-diphenylaniline (16.2 g), di([1,1'-biphenyl]-4-yl)amine (15.0 g), Pd-132 (Johnson Matthey) (0.3 g), NaOtBu (6.7 g) and xylene (150 ml) was heated and stirred for one hour at 120° C. The reaction liquid was cooled to room temperature, subsequently water and ethyl acetate were added thereto, and the mixture was partitioned. Subsequently, purification was performed using a silica gel short pass column (developing liquid: heated toluene), and the purification product was further washed with a heptane/ethyl acetate mixed solvent (1/1 (volume ratio)). Thus, $N^1$,$N^1$-di([1,1'-bipheyl]-4-yl)-2-chloro-$N^3$,$N^3$-diphenylbenzene-1,3-diamine (22.0 g) was obtained.

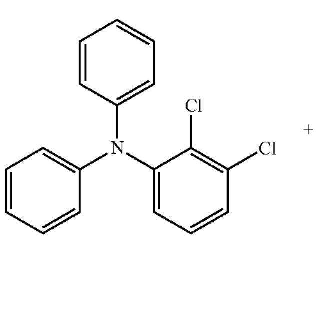

-continued

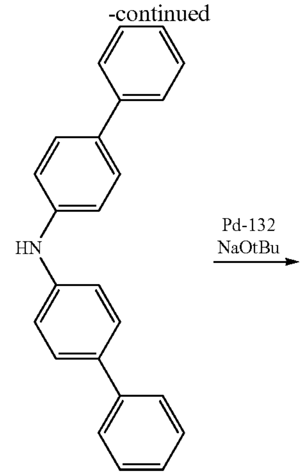

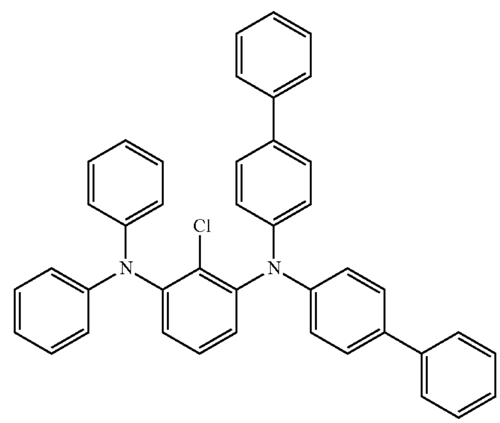

A 1.6 M tert-butyllithium pentane solution (37.5 ml) was put into a flask containing $N^1$,$N^1$-di([1,1'-biphenyl]-4-yl)-2-chloro-$N^3$,$N^3$-diphenylbenzene-1,3-diamine (22.0 g) and tert-butylbenzene (130 ml) at −30° C. in a nitrogen atmosphere. After completion of dropwise addition, the temperature of the mixture was increased to 60° C., the mixture was stirred for one hour, and then components having boiling points lower than that of tert-butylbenzene were distilled off under reduced pressure. The residue was cooled to −30° C., boron tribromide (6.2 ml) was added thereto, the temperature of the mixture was raised to room temperature, and the mixture was stirred for 0.5 hours. Thereafter, the mixture was cooled again to 0° C., N,N-diisopropylethylamine (12.8 ml) was added thereto, and the mixture was stirred at room temperature until heat generation was settled. Subsequently, the temperature of the mixture was raised to 120° C., and the mixture was heated and stirred for two hours. The reaction liquid was cooled to room temperature, an aqueous solution of sodium acetate that had been cooled in an ice bath and then ethyl acetate were added thereto, and the mixture was partitioned. Subsequently, purification was performed using a silica gel short pass column (developing liquid: heated chlorobenzene). The purification product was washed with refluxed heptane and refluxed ethyl acetate, and then was reprecipitated from chlorobenzene. Thus, a compound (5.1 g) represented by formula (1-1152) was obtained.

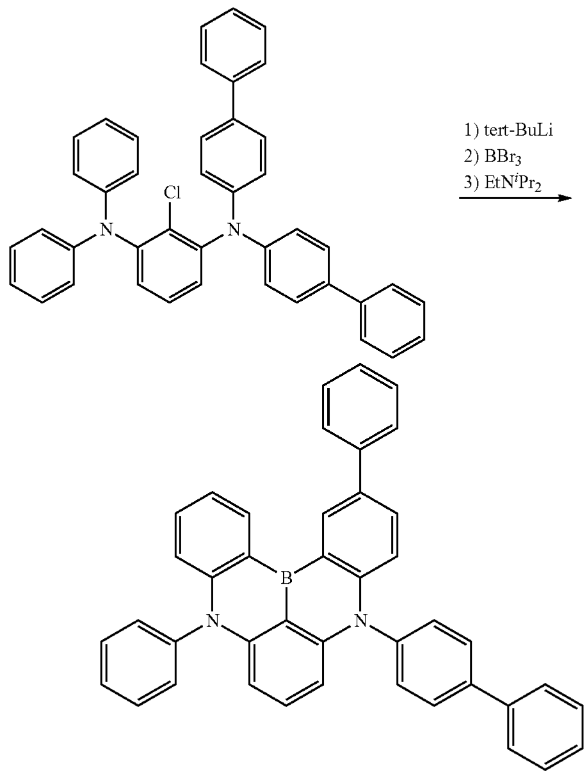

(1-1152)

Synthesis Example 2: Synthesis of Compound (1-1160-1)

(1-1160-1)

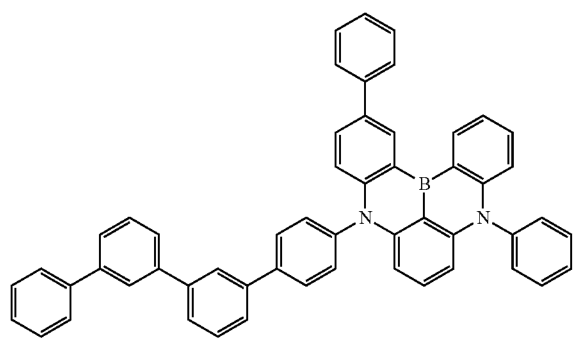

1-Bromo-3-iodobenzene (42.44 g, 150 mmol, 1.0 eq.), biphenyl-3-ylboronic acid (29.70 g, 1.0 eq.), sodium carbonate (31.80 g, 2.0 eq.), and tetrakis(triphenylphosphine) palladium(0) (3.47 g, 0.02 eq.) were weighed and put into a 1 L three-necked round bottom flask. Degassing under reduced pressure and nitrogen purge were sufficiently performed. Thereafter, toluene (360 mL), ethanol (90 mL), and water (90 mL) were added thereto in a nitrogen atmosphere, and the mixture was refluxed and stirred at 74° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through a silica gel short column chromatography using toluene as an eluent, and a fraction containing a desired product was collected and concentrated under reduced pressure. The resulting oil was caused to pass through a silica gel short column chromatography using heptane as an eluent, and a fraction containing a desired product was collected and concentrated under reduced pressure. A desired product "P3Br" was obtained as a transparent oil (yield: 26.60 g, yield: 57.3%).

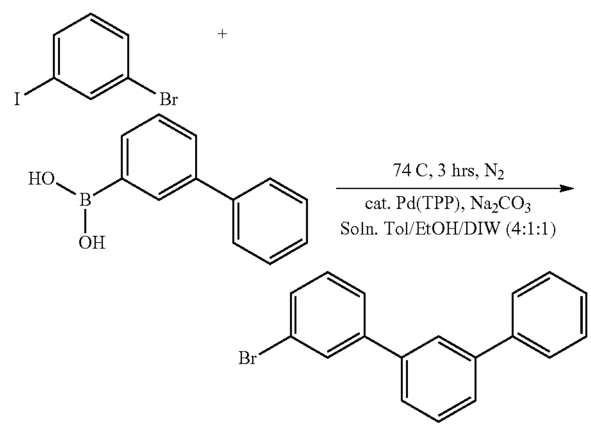

P3Br

P3Br (26.60 g, 86.03 mmol, 1.0 eq.), bispinacolato diboron (103.23 g, 1.2 eq.), potassium acetate (25.33 g, 3 eq.), and a bis(diphenylphosphino) ferrocene-palladium(II) dichloride dichloromethane complex (2.11 g, 0.03 eq.) were weighed and put into a 1 L three-necked round bottom flask. Degassing under reduced pressure and nitrogen purge were sufficiently performed. Thereafter, cyclopentyl methyl ether (300 mL) was added thereto in a nitrogen atmosphere, and the mixture was refluxed and stirred at 100° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through an activated carbon column chromatography using toluene as an eluent, and a fraction containing a desired product was collected and concentrated under reduced pressure. The resulting yellow oil was dissolved in hot methanol, was allowed to stand at room temperature, and was then cooled with ice. A desired product "P3Bpin" of precipitated acicular crystals was collected (yield: 28.48 g, yield: 92.9%).

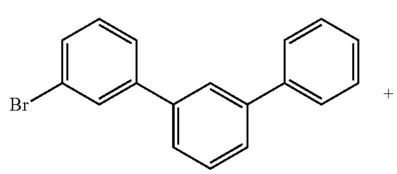

-continued

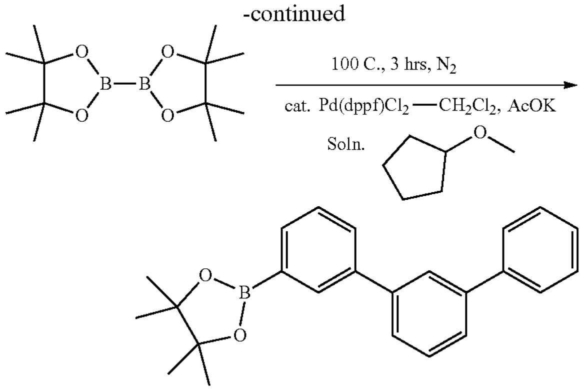

P3Bpin

N-(4-bromophenol-4-biphenylamine (9.7 g, 30 mmol, 1 eq.), P3Bpin (10.7 g, 1 eq.), sodium carbonate (9.5 g, 3.0 eq.), and tetrakis(triphenylphosphine) palladium(0) (1.04 g, 0.03 eq.) were weighed and put into a 1 L three-necked round bottom flask. Degassing under reduced pressure and nitrogen purge were sufficiently performed. Thereafter, toluene (80 mL), ethanol (20 mL), and water (20 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The mixture containing a desired product was further caused to pass through a silica gel column chromatography, and a fraction containing a desired product was collected and concentrated under reduced pressure. Thus, a desired product "P2NP4" was obtained.

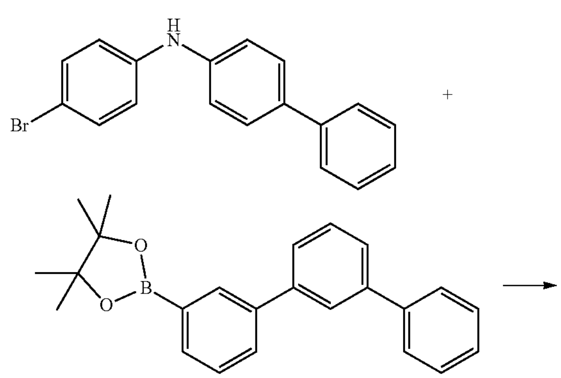

P3BPin

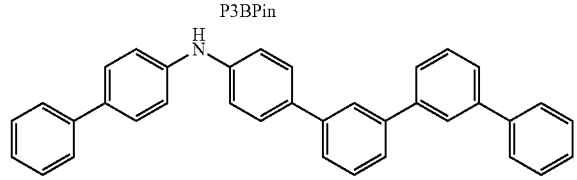

P2NP4

In a nitrogen atmosphere, a flask containing 2,3-dichloro-N,N-diphenylaniline (6.3 g, 20 mmol, 1 eq.), P2NP4 (9.5 g, 1 eq.), Pd-132 (Johnson Matthey) (0.14 g, 0.01 eq.), NaOtBu (2.5 g, 1.3 eq.), and xylene (70 ml) was heated and stirred at 120° C. After completion of the reaction, the reaction liquid was cooled to room temperature, then water and ethyl acetate were added thereto, and the mixture was partitioned. Subsequently, purification was performed with a silica gel short pass column, and recrystallization was further performed to obtain "1CL2NP246NP11".

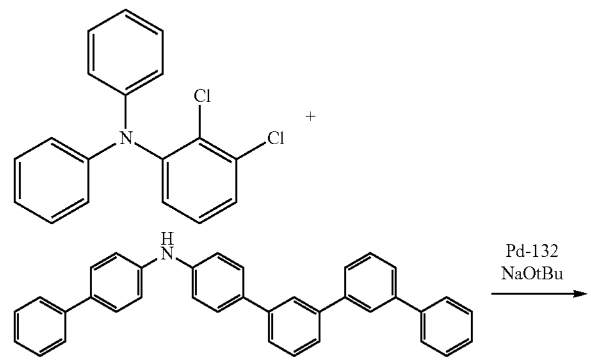

P2NP4

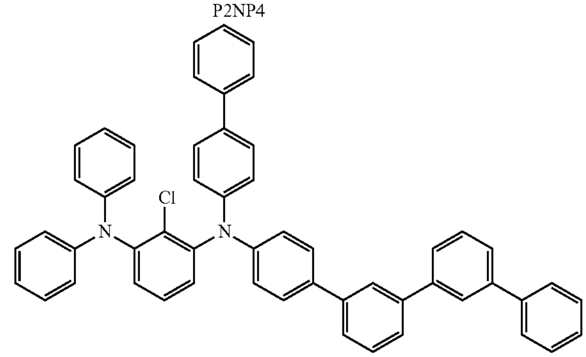

1CL2NP246NP11

A 1.6M tert-butyllithium pentane solution (7.0 ml, 1.5 eq.) was put into a flask containing 1CL2NP246NP11 (5.6 g, 7.5 mmol) and tert-butylbenzene (25 ml) at −30° C. in a nitrogen atmosphere. After completion of dropwise addition, the temperature of the mixture was raised to 60° C., and the mixture was stirred. Thereafter, a component having a boiling point lower than tert-butylbenzene was distilled off under reduced pressure. The residue was cooled to −30° C., boron tribromide (1.5 ml, 2 eq.) was added thereto, the temperature of the mixture was raised to room temperature, and the mixture was stirred for 0.5 hours. Thereafter, the mixture was cooled again to 0° C., N,N-diisopropylethylamine (0.8 ml, 3 eq.) was added thereto, and the mixture was stirred at room temperature until heat generation was settled. Subsequently, the temperature of the mixture was raised to 120° C., and the mixture was heated and stirred. After completion of the reaction, the reaction liquid was cooled to room temperature. An aqueous solution of sodium acetate that had been cooled in an ice bath was added thereto, subsequently toluene was added thereto, and the mixture was partitioned. Subsequently, purification was performed with a silica gel short pass column, and recrystallization was further performed to obtain a compound represented by formula (1-1160-1).

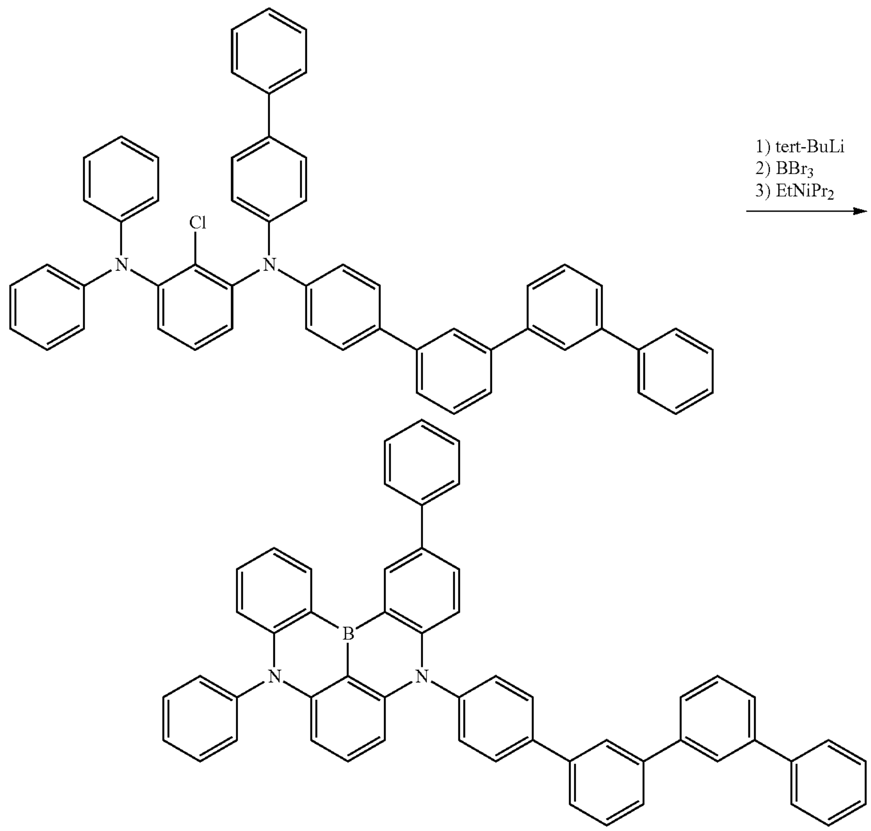

(1-1160-1)

Synthesis Example 3: Synthesis of Compound (1-2679)

(1-2679)

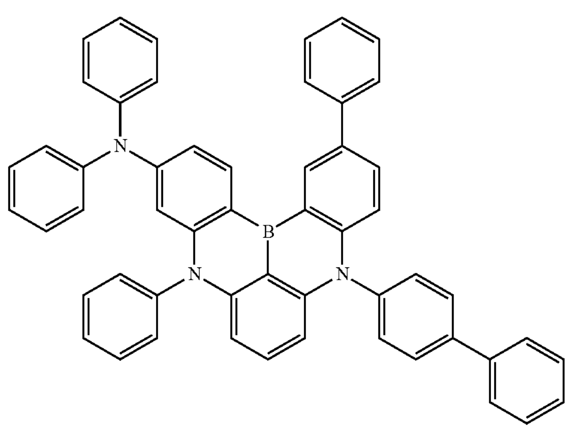

In a nitrogen atmosphere, a flask containing $N^1$,$N^1$,$N^3$-triphenylbenzene-1,3-diamine (51.7 g), 1-bromo-2,3-dichlorobenzene (35.0 g), Pd-132 (0.6 g), NaOtBu (22.4 g), and xylene (350 ml) was heated and stirred for two hours at 90° C. The reaction liquid was cooled to room temperature, subsequently water and ethyl acetate were added thereto, and the mixture was partitioned. Subsequently, purification was performed by silica gel column chromatography (developing liquid: toluene/heptane=5/5 (volume ratio)), and thus $N^1$-(2,3-dichlorophenyl)-$N^1$,$N^3$,$N^3$-triphenylbenzene-1,3-diamine (61.8 g) was obtained.

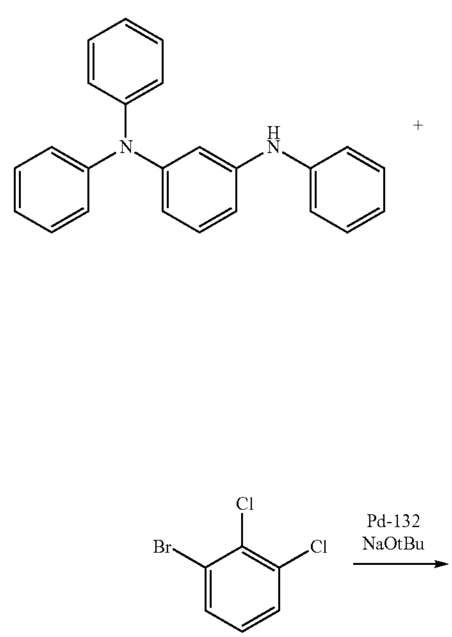

-continued

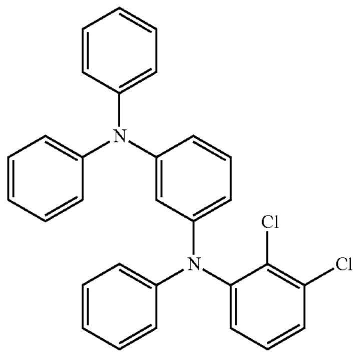

In a nitrogen atmosphere, a flask containing N-(2,3-dichlorophenyl)-N$^1$,N$^3$,N$^3$-triphenylbenzene-1,3-diamine (15.0 g), di([1,1'-biphenyl]-4-yl)amine (10.0 g), Pd-132 (0.2 g), NaOtBu (4.5 g), and xylene (70 ml) was heated and stirred for one hour at 120° C. The reaction liquid was cooled to room temperature, subsequently water and toluene were added thereto, and the mixture was partitioned. Subsequently, purification was performed using a silica gel short pass column (developing liquid: toluene). An oily material thus obtained was reprecipitated with an ethyl acetate/heptane mixed solvent, and thus N$^1$,N$^1$-di([1,1'-biphenyl]-4-yl)-2chloro-N$^3$-(3-(diphenylamino) phenyl)-N$^3$-phenylbenzene-1,3-diamine (18.5 g) was obtained.

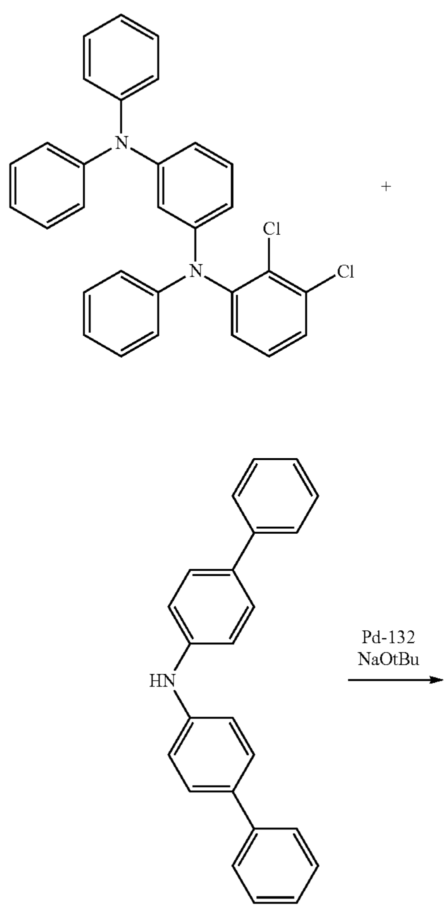

-continued

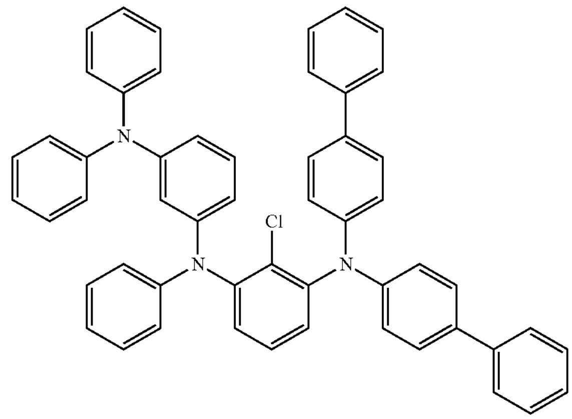

A 1.7 M t-butyllithium pentane solution (27.6 ml) was put into a flask containing N$^1$,N$^1$-di([1,1'-biphenyl]-4-yl)-2-chloro-N$^3$-(3-(diphenylamino)phenyl)-N$^3$-phenylbenzene-1,3-diamine (18.0 g) and t-butylbenzene (130 ml) in a nitrogen atmosphere, while the flask was cooled in an ice bath. After completion of dropwise addition, the temperature was increased to 60° C., the mixture was stirred for three hours, and then components having boiling points that were lower than that of t-butylbenzene were distilled off under reduced pressure. The residue was cooled to −50° C., boron tribromide (4.5 ml) was added thereto, the temperature of the mixture was raised to room temperature, and the mixture was stirred for 0.5 hours. Thereafter, the mixture was cooled again in an ice bath, and N,N-diisopropylethylamine (8.2 ml) was added thereto. The mixture was stirred at room temperature until heat generation was settled, subsequently the temperature of the mixture was raised to 120° C., and the mixture was heated and stirred for one hour. The reaction liquid was cooled to room temperature, an aqueous solution of sodium acetate that had been cooled in an ice bath and then ethyl acetate were added thereto, and the mixture was partitioned. Subsequently, dissolution in hot chlorobenzene was performed, and purification was performed using a silica gel short pass column (developing liquid: hot toluene). The purification product was further recrystallized from chlorobenzene, and thus a compound (3.0 g) represented by formula (1-2679) was obtained.

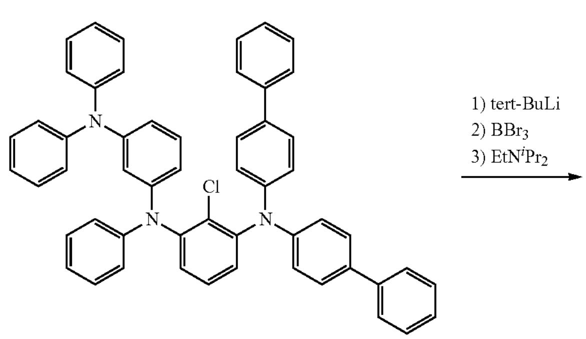

-continued

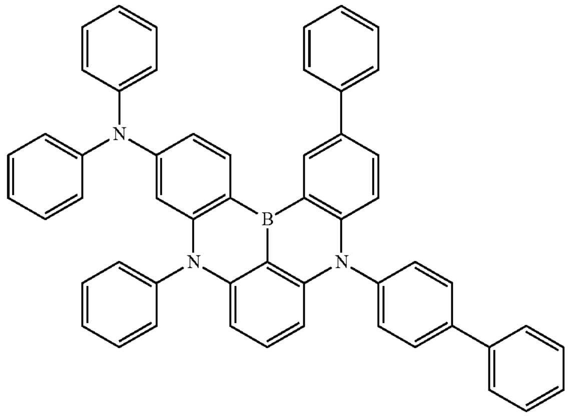

(1-2679)

Synthesis Example 4: Synthesis of Compound (1-422)

(1-422)

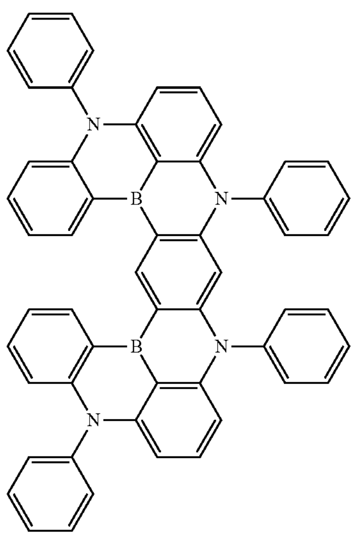

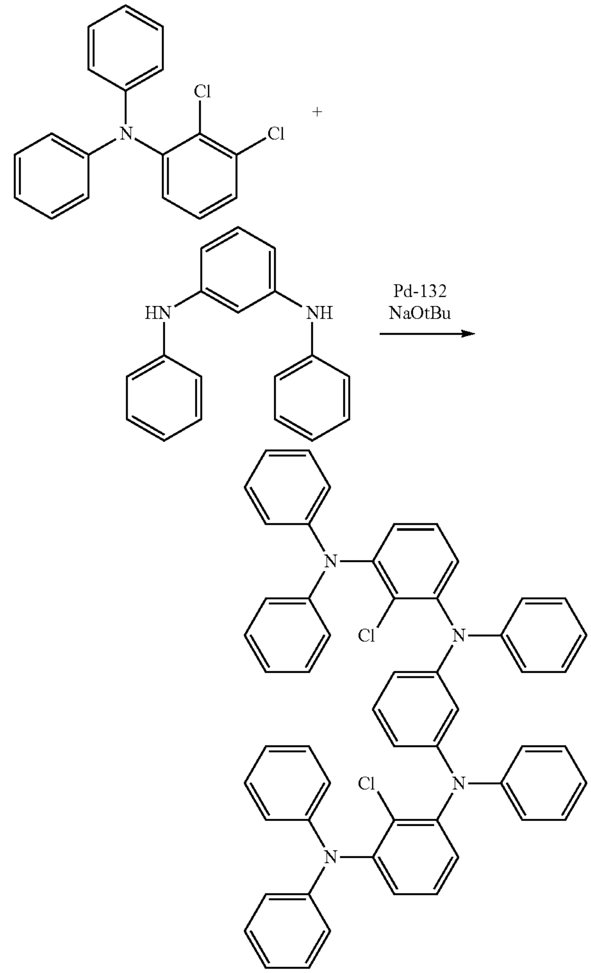

In a nitrogen atmosphere, a flask containing 2,3-dichloro-N,N-diphenylaniline (36.0 g), $N^1$,$N^3$-diphenylbenzene-1,3-diamine (12.0 g), Pd-132 (Johnson Matthey) (0.3 g), NaOtBu (11.0 g), and xylene (150 ml) was heated and stirred for three hours at 120° C. The reaction liquid was cooled to room temperature, subsequently water and ethyl acetate were added thereto, and the mixture was partitioned. Subsequently, purification was performed by silica gel column chromatography (developing liquid: toluene/heptane mixed solvent). At this time, the proportion of toluene in the developing liquid was gradually increased, and a desired product was thereby eluted. The desired product was further purified by activated carbon column chromatography (developing liquid: toluene), and thus $N^1$,$N^1$-(1,3-phenylene) bis(2-chloro-$N^1$,$N^3$,$N^3$-triphenylbenzene-1,3-diamine) (22.0 g) was obtained.

A 1.6 M tert-butyllithium pentane solution (42.0 ml) was put into a flask containing $N^1$,$N^{1'}$-(1,3-phenylene)bis(2-chloro-$N^1$,$N^3$,$N^3$-triphenylbenzene-1,3-diamine) (22.0 g) and tert-butylbenzene (150 ml) at −30° C. in a nitrogen atmosphere. After completion of dropwise addition, the temperature of the mixture was increased to 60° C., the mixture was stirred for five hours, and components having boiling points lower than that of tert-butylbenzene were distilled off under reduced pressure. The residue was cooled to −30° C., boron tribromide (7.6 ml) was added thereto, the temperature of the mixture was raised to room temperature, and the mixture was stirred for 0.5 hours. Thereafter, the mixture was cooled again to 0° C., N,N-diisopropylethylamine (18.9 ml) was added thereto, and the mixture was stirred at room temperature until heat generation was settled. Subsequently, the temperature of the mixture was raised to 120° C., and the mixture was heated and stirred for two hours. The reaction liquid was cooled to room temperature, an aqueous solution of sodium acetate that had been cooled in an ice bath was added thereto, and a solid thus precipitated was separated by filtration. A filtrate was partitioned, and the organic layer was purified by silica gel column chromatography (developing liquid: toluene/heptane=1 (volume ratio)). The solvent was distilled off under reduced pressure, a solid thus obtained was dissolved in chlorobenzene, and the solid was reprecipitated by adding ethyl acetate. Thus, a compound (0.6 g) represented by formula (1-422) was obtained.

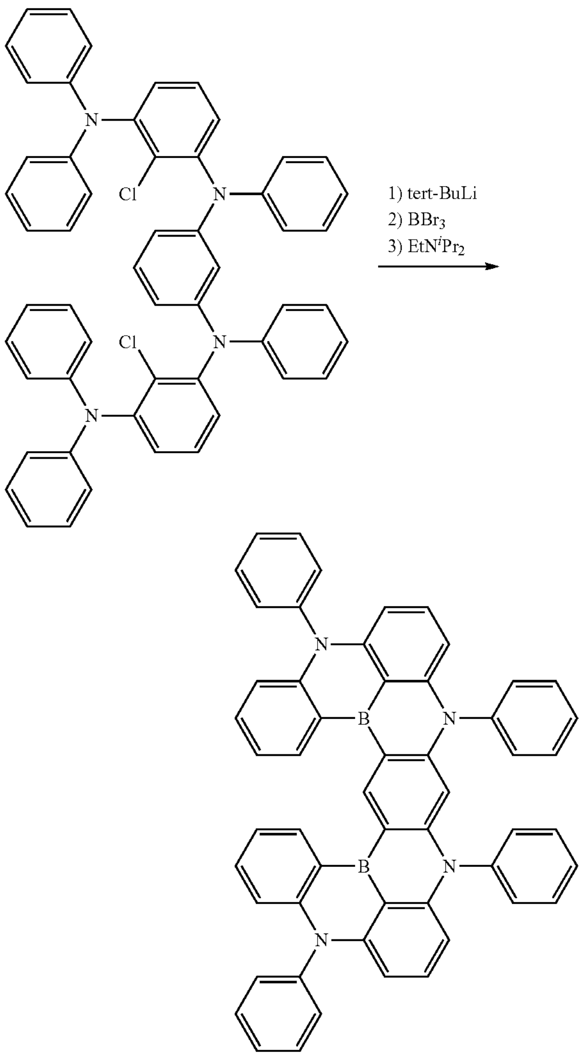

(1-422)

Synthesis Example 5: Synthesis of Compound (1-1210)

(1-1210)

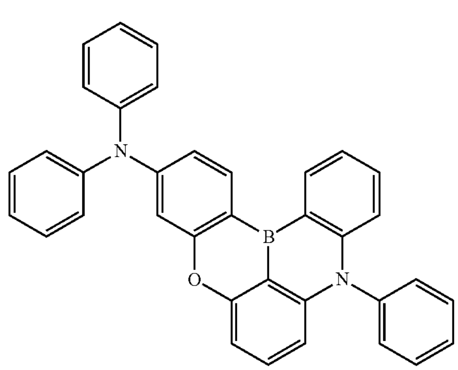

In a nitrogen atmosphere, a flask containing 1-bromo-2-chloro-3-fluorobenzene (20.0 g), 3-(diphenylamino)phenol (27.4 g), potassium carbonate (26.4 g) and NMP (150 ml) was heated and stirred for six hours at 180° C. The reaction liquid was cooled to room temperature, NMP was distilled off under reduced pressure, subsequently water and toluene were added thereto, and the mixture was partitioned. Subsequently, purification was performed by silica gel column chromatography (developing liquid: toluene/heptane=2/1 (volume ratio)), and thus 3-(3-bromo-2-chlorophenoxy)-N,N'-diphenylaniline (31.6 g) was obtained.

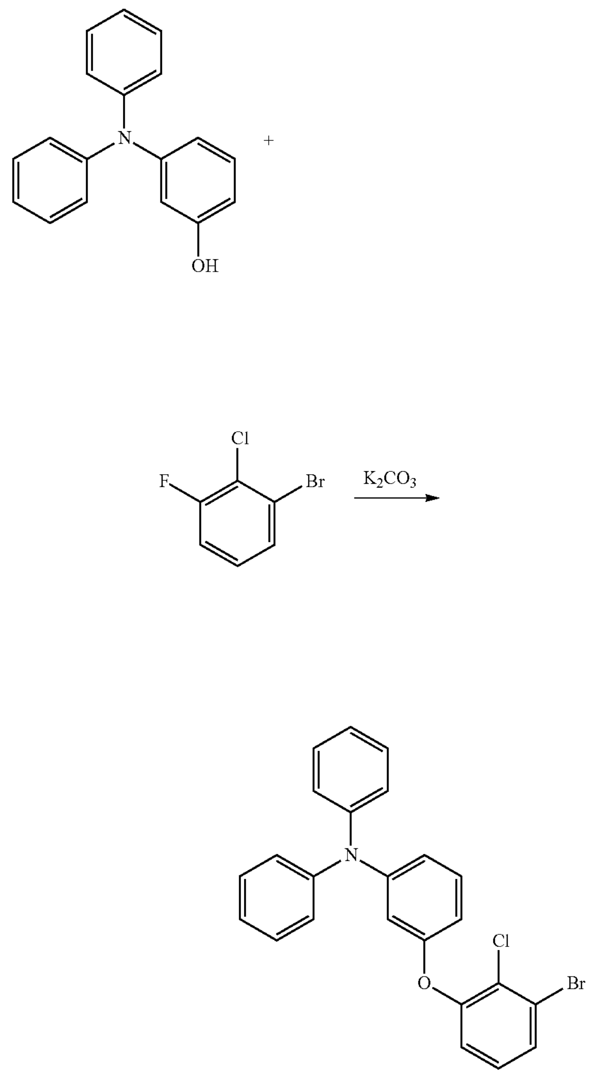

In a nitrogen atmosphere, a flask containing diphenylamine (13.0 g), 3-(3-bromo-2-chlorophenoxy)-N,N'-diphenylaniline (31.6 g), Pd-132 (Johnson Matthey) (0.5 g), NaOtBu (10.1 g), and 1,2,4-trimethylbenzene (150 ml) was heated and stirred for one hour at the reflux temperature. The reaction liquid was cooled to room temperature, and then insoluble salts were removed by suction filtration. Subsequently, the filtrate was purified using an activated carbon short pass column (developing liquid: toluene), and was further purified by silica gel column chromatography (developing liquid: toluene/heptane=1/6 (volume ratio)). Thus, 2-chloro-3-(3-diphenylamino)phenoxy-N,N-diphenylaniline (26.3 g) was obtained.

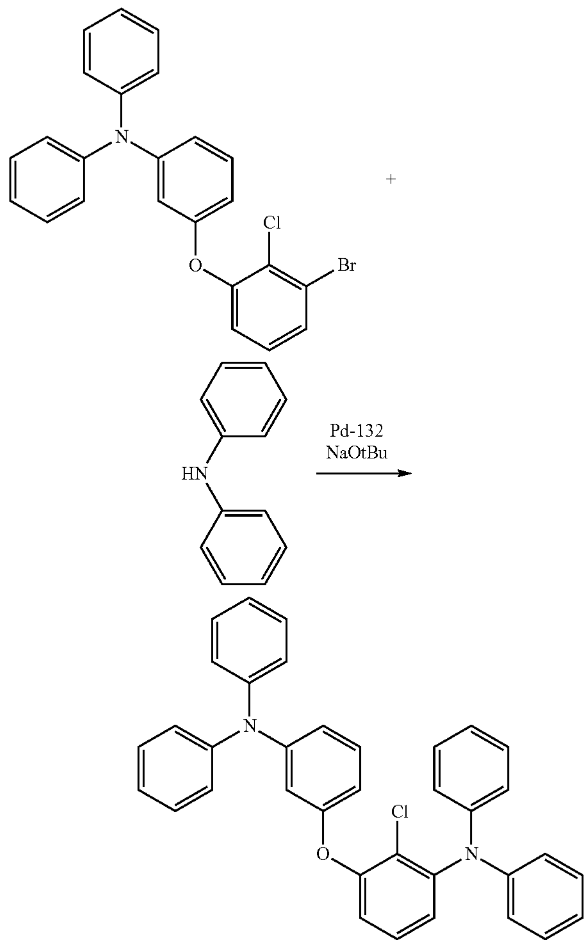

A 1.6 M tert-butyllithium pentane solution (31.4 ml) was put into a flask containing 2-chloro-3-(3-diphenylamino)phenoxy-N,N-diphenylaniline (26.3 g) and tert-butylbenzene (150 ml) at −30° C. in a nitrogen atmosphere. After completion of dropwise addition, the temperature of the mixture was raised to room temperature, and the mixture was stirred overnight. The mixture was cooled again to −30° C., and boron tribromide (5.4 ml) was added thereto. Subsequently, the temperature of the mixture was increased to 60° C. while pressure was reduced, and components having boiling points lower than that of tert-butylbenzene were distilled off under reduced pressure. Thereafter, the residue was cooled to 0° C., N,N-diisopropylethylamine (17.0 ml) was added thereto, and the mixture was stirred at room temperature until heat generation was settled. Subsequently, the temperature of the mixture was raised to 120° C., and the mixture was heated and stirred for 5.5 hours. The reaction liquid was cooled to room temperature, an aqueous solution of sodium acetate that had been cooled in an ice bath and then ethyl acetate were added thereto, and the mixture was partitioned. Purification was performed by silica gel column chromatography (developing liquid: toluene), and the purification product was recrystallized from toluene. Thus, a compound represented by formula (1-1210) (0.6 g) was obtained.

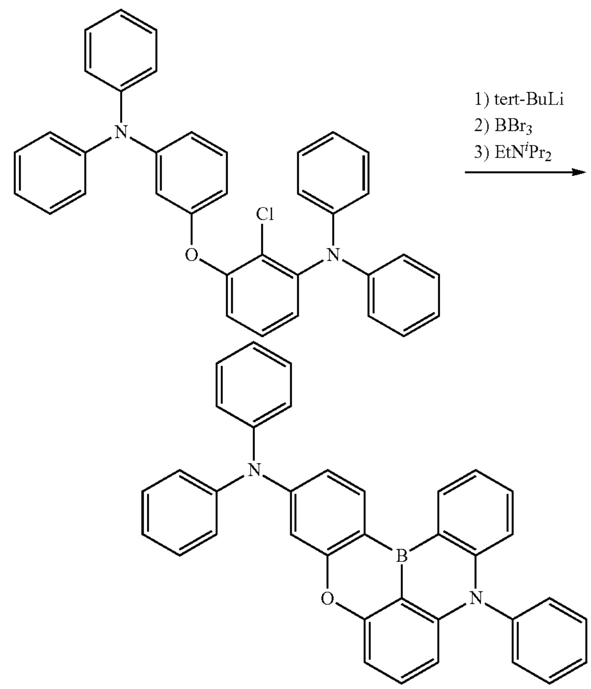

(1-1210)

Synthesis Example 6: Synthesis of Compound (1-1210-1)

(1-1210-1)

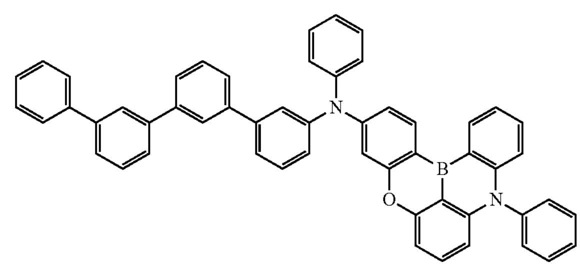

1-Bromo-3-iodobenzene (3.57 g, 12.6 mmol, 1.0 eq.), P3Bpin (4.55 g, 1.0 eq.), sodium carbonate (4.01 g, 3.0 eq.), and tetrakis(triphenylphosphine) palladium(0) (0.44 g, 0.03 eq.) were weighed and put into a 300 mL three-necked round bottom flask. Degassing under reduced pressure and nitrogen purge were sufficiently performed. Thereafter, toluene (40 mL), ethanol (10 mL), and water (10 mL) were added thereto in a nitrogen atmosphere, and the mixture was refluxed and stirred at 74° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through a silica gel short column chromatography using toluene as an eluent, and a fraction containing a desired product was collected and concentrated under reduced pressure. The resulting oil was caused to pass through a silica gel column chromatography using heptane-toluene (9:1 (volume ratio)) as an eluent, and a fraction containing a desired product was collected and concentrated under reduced pressure. A desired product "P4Br" was obtained as a transparent oil (yield: 3.97 g, yield: 80.8%).

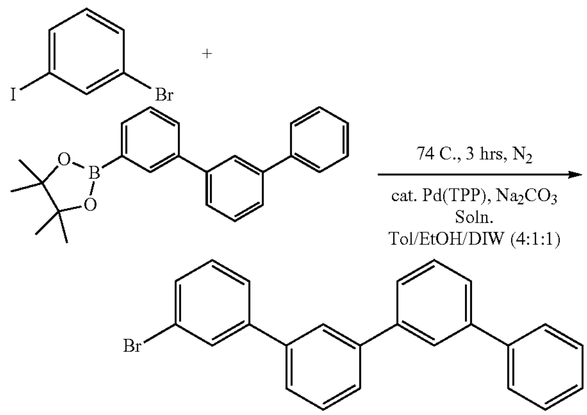

P4Br

In a nitrogen atmosphere, a flask containing 3-hydroxydiphenylamine (10.0 g, 54 mmol, 1 eq.), P4Br (20.8 g, 1 eq.), potassium carbonate (7.5 g, 1 eq.), and toluene (150 ml) was heated and stirred at 110° C. After completion of the reaction, the reaction liquid was cooled to room temperature, water and toluene were added thereto, and the mixture was partitioned. Subsequently, the resulting product was purified by silica gel column chromatography to obtain "1OH3NP14 (m)".

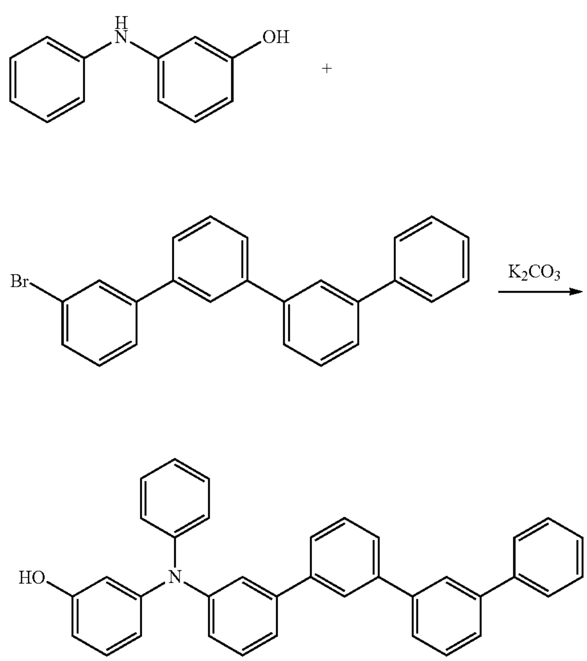

1OH3NP14(m)

In a nitrogen atmosphere, a flask containing 1-bromo-2-chloro-3-fluorobenzene (10.2 g, 49 mmol, 1 eq.), 1OH3NP14 (m) (23.8 g, 1 eq.), potassium carbonate (13.4 g, 2 eq.), and NMP (70 ml) was heated and stirred at 180° C. After completion of the reaction, the reaction liquid was cooled to room temperature, and NMP was distilled off under reduced pressure. Subsequently, water and toluene were added thereto, and the mixture was partitioned. Subsequently, purification was performed by silica gel column chromatography to obtain "1Br2CL3Px (3NP14 (m))".

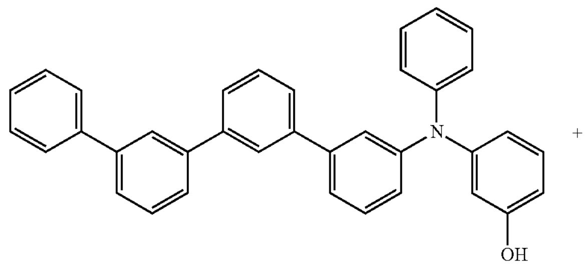

1OH3NP14(m)

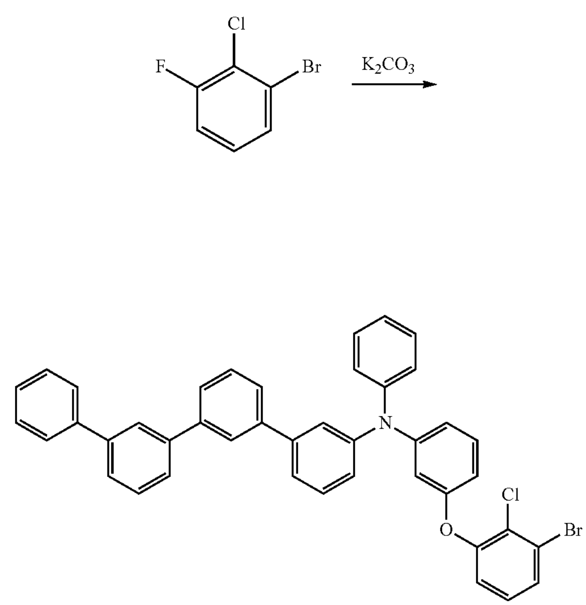

1Br2CL3Px(3NP14(m))

In a nitrogen atmosphere, a flask containing diphenylamine (6.0 g, 1 eq.), 1Br2CL3Px (3NP14(m)) (24.0 g, 35.3 mmol, 1 eq.), Pd-132 (Johnson Matthey) (0.25 g, 0.01 eq.), NaOtBu (4.4 g, 1.3 eq.), and 1,2,4-trimethylbenzene (120 ml) was heated and stirred at a reflux temperature. After completion of the reaction, the reaction liquid was cooled to room temperature, and then an insoluble salt was removed by suction filtration. Subsequently, the resulting product was purified with an activated carbon short pass column and further purified by silica gel column chromatography to obtain "1CL2Px(3PN14 (m))5NP11".

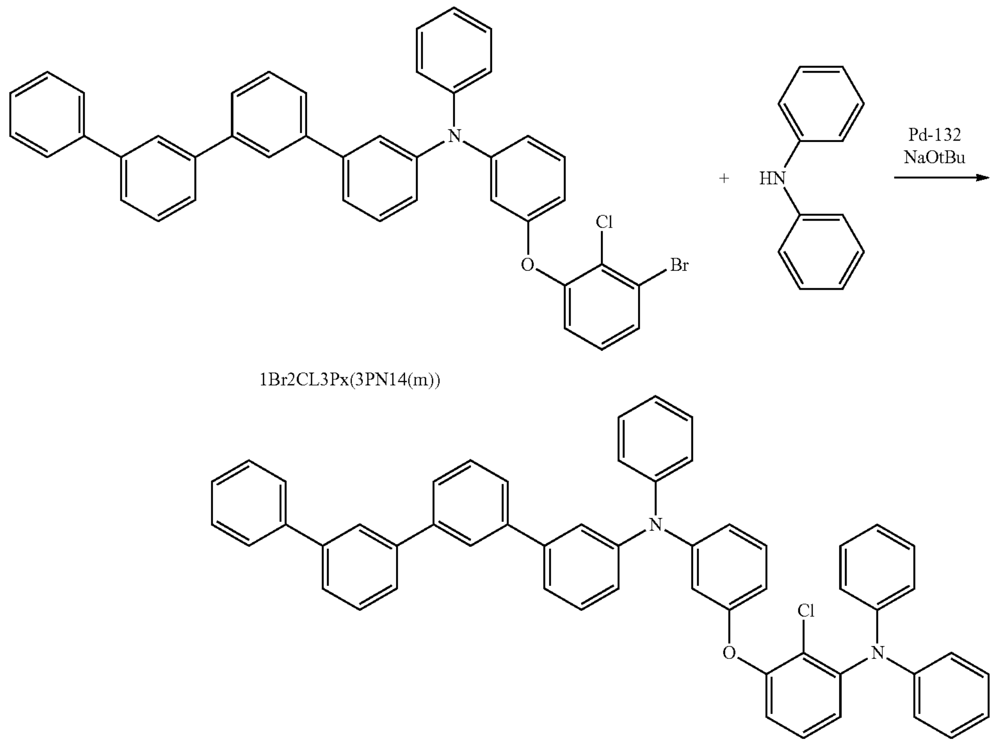

1Br2CL3Px(3PN14(m))

1CL2Px(3PN14(m))5NP11

A 1.6 M tert-butyllithiumpentane solution (30 ml, 1.5 eq.) was put into a flask containing 1CL2Px (3PN14 (m)) 5NP11 (24.5 g, 32 mmol, 1 eq.) and tert-butylbenzene (120 ml) at −30° C. in a nitrogen atmosphere. After completion of dropwise addition, the temperature of the mixture was raised to room temperature, and the mixture was stirred overnight. The mixture was cooled again to −30° C., and boron tribromide (6.1 ml, 2 eq.) was added thereto. Subsequently, the temperature of the mixture was increased to 60° C. while pressure was reduced, and components having boiling points lower than that of tert-butylbenzene were distilled off under reduced pressure. Thereafter, the residue was cooled again to 0° C., N,N-diisopropylethylamine (17.0 ml, 3 eq.) was added thereto, and the mixture was stirred at room temperature until heat generation was settled. Subsequently, the temperature of the mixture was raised to 120° C., and the mixture was heated and stirred. After completion of the reaction, the reaction liquid was cooled to room temperature. An aqueous solution of sodium acetate that had been cooled in an ice bath was added thereto, subsequently toluene was added thereto, and the mixture was partitioned. Purification was performed by silica gel column chromatography (developing liquid: toluene), and the resulting product was recrystallized from toluene. Thus, a compound represented by formula (1-1210-1) was obtained.

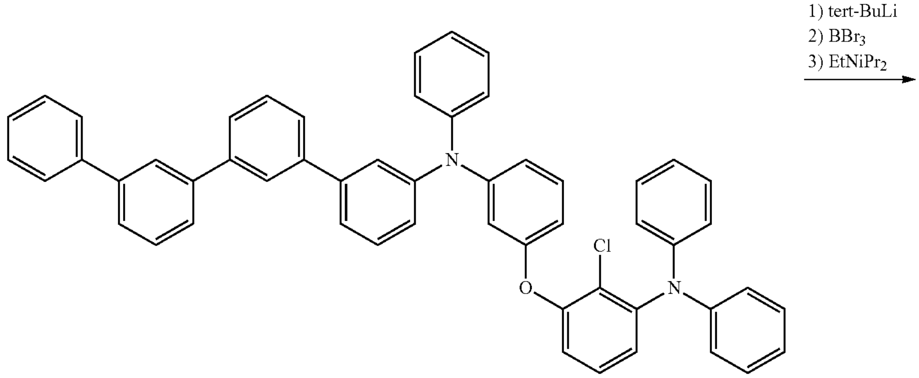

1CL2Px(3PN14(m))5NP11

-continued

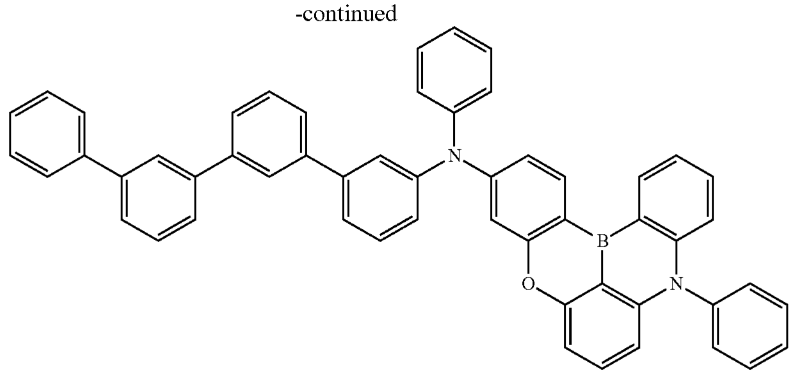

(1-1210-1)

Synthesis Example 7: Synthesis of Compound (1-1210-2)

(1-1210-2)

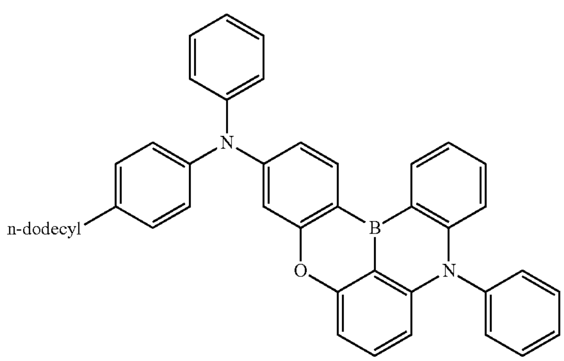

In a nitrogen atmosphere, a flask containing 3-hydroxydiphenylamine (10.0 g, 1 eq.), 1-bromo-4-dodecylbenzene (17.6 g, 54 mmol, 1 eq.), potassium carbonate (7.5 g, 1 eq.), and toluene (120 ml) was heated and stirred at 180° C. After completion of the reaction, the reaction liquid was cooled to room temperature, water and toluene were added thereto, and the mixture was partitioned. Subsequently, purification was performed by silica gel column chromatography to obtain “1OH3NP11D”.

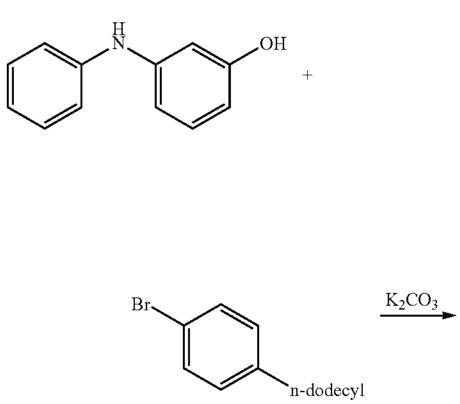

-continued

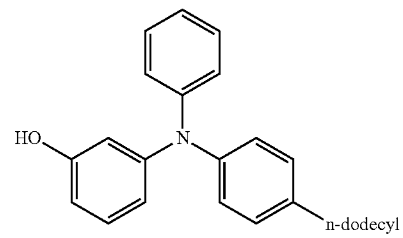

1OH3NP11D

In a nitrogen atmosphere, a flask containing 1-bromo-2-chloro-3-fluorobenzene (10.4 g, 1 eq.), 1OH3NP11D (21.3 g, 50 eq., 1 eq.), potassium carbonate (13.7 g, 2 eq.), and NMP (100 ml) was heated and stirred at 180° C. The reaction liquid was cooled to room temperature, and NMP was distilled off under reduced pressure. Subsequently, water and toluene were added thereto, and the mixture was partitioned. Subsequently, the resulting product was purified by silica gel column chromatography (developing liquid: toluene/heptane=1/1 (volume ratio)), and thus “1Br2CL3Px (3NP11D)” was obtained.

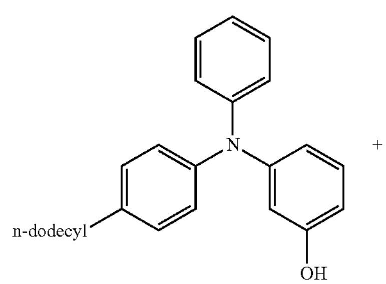

1OH3NP11D

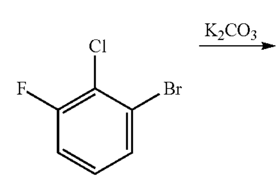

-continued

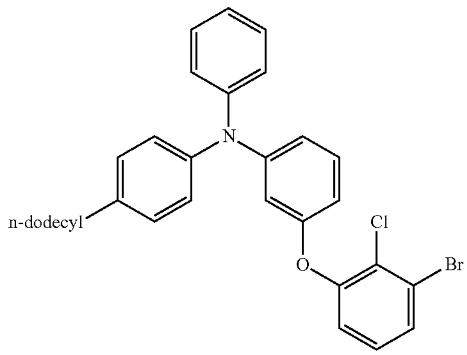

1Br2CL3Px(3NP11D)

In a nitrogen atmosphere, a flask containing diphenylamine (6.1 g, 1 eq.), 1Br2CL3Px (3NP11D)(22.2 g, 36 mmol, 1 eq.), Pd-132 (Johnson Matthey) (0.25 g), NaOtBu (4.5 g, 1.3 eq.), and 1,2,4-trimethylbenzene (120 ml) was heated and stirred at a reflux temperature. The reaction liquid was cooled to room temperature, and then an insoluble salt was removed by suction filtration. Subsequently, the resulting product was purified with an activated carbon short pass column and further purified by silica gel column chromatography to obtain "1CL2Px(3PN11D)5NP11" (20.6 g, yield: 81.2%).

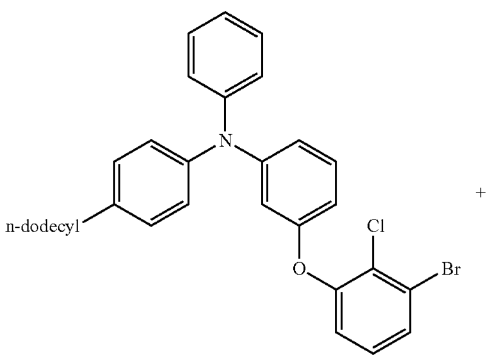

1Br2CL3Px(3PN11D)

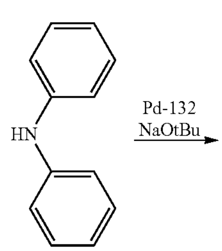

-continued

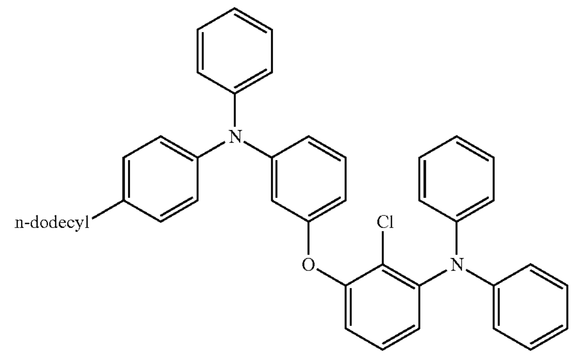

1CL2Px(3PN11D)5NP11

A 1.6 M tert-butyllithium pentane solution (27 ml, 1.5 eq.) was put into a flask containing 1CL2Px(3PN11D) 5NP11 (20.6 g, 29 mmol, 1 eq.) and tert-butylbenzene (120 ml) at −30° C. in a nitrogen atmosphere. After completion of dropwise addition, the temperature of the mixture was raised to room temperature, and the mixture was stirred. The mixture was cooled again to −30° C., and boron tribromide (5.5 ml, 2 eq.) was added thereto. After completion of the reaction, the temperature of the mixture was raised to 60° C. while pressure was reduced, and a component having a boiling point lower than tert-butylbenzene was distilled off under reduced pressure. Thereafter, the residue was cooled to 0° C., N,N-diisopropylethylamine (15 ml, 3 eq.) was added thereto, and the mixture was stirred at room temperature until heat generation was settled. Subsequently, the temperature of the mixture was raised to 120° C., and the mixture was heated and stirred. After completion of the reaction, the reaction liquid was cooled to room temperature. An aqueous solution of sodium acetate that had been cooled in an ice bath was added thereto, subsequently ethyl acetate was added thereto, and the mixture was partitioned. By purification by silica gel column chromatography, a compound represented by formula (1-1210-2) was obtained.

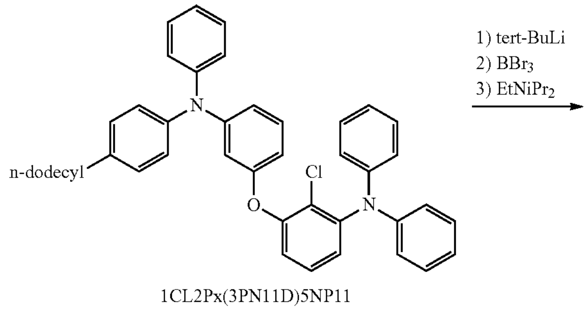

1CL2Px(3PN11D)5NP11

-continued

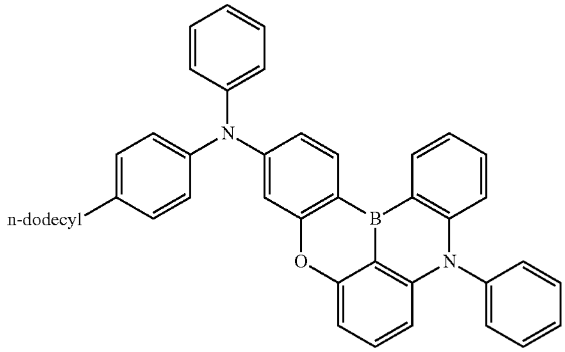

(1-1210-2)

<Synthesis of Compound Represented by General Formula (B-1) or (B-5) Used in Examples>

Hereinafter, synthesis of a compound represented by general formula (B-1) or (B-5) used in Example will be described.

Synthesis Example 8: Synthesis of Compound (B-5-91)

(B-5-91)

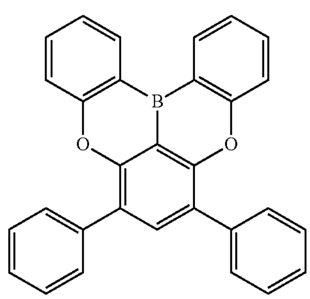

A flask containing 1,5-dibromo-2,4-difluorobenzene (30.0 g), phenol (31.2 g), potassium carbonate (45.7 g), and NMP (150 ml) was heated and stirred at 160° C. The reaction liquid was cooled to room temperature, and NMP was distilled off under reduced pressure. Subsequently, water and toluene were added thereto, and the mixture was partitioned. The solvent was distilled off under reduced pressure, and then the residue was purified using a silica gel short pass column (developing liquid: heptane/toluene=1 (volume ratio)). Thus, ((4,6-dibromo-1,3-phenylene)bis(oxy))dibenzene (44.0 g) was obtained.

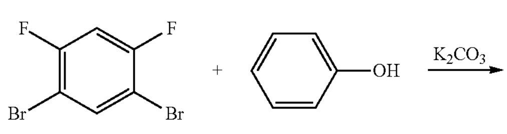

-continued

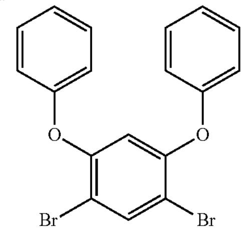

In a nitrogen atmosphere, $Pd(PPh_3)_4$ (5.5 g) was added to a suspension solution of ((4,6-dibromo-1,3-phenylene)bis(oxy))dibenzene (40.0 g), phenylboronic acid (34.8 g), sodium carbonate (60.6 g), toluene (500 ml), isopropanol (100 ml), and water (100 ml), and the mixture was stirred for eight hours at a reflux temperature. The reaction liquid was cooled to room temperature, water and toluene were added thereto, and then the mixture was partitioned. The solvent of the organic layer was distilled off under reduced pressure. The resulting solid was dissolved in heated chlorobenzene, and the solution was caused to pass through a silica gel short pass column (developing liquid: toluene). An appropriate amount of the solvent was distilled off, and then reprecipitation was performed by adding heptane to the residue. Thus, 4',6'-diphenoxy-1,1':3',1"-terphenyl (41.0 g) was obtained.

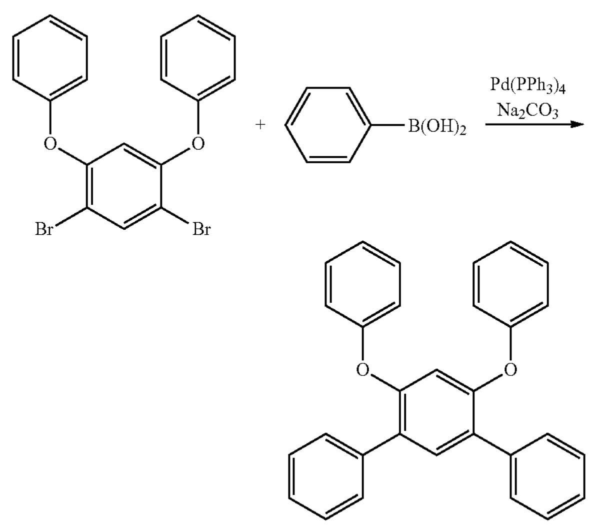

A 2.6 M n-butyllithium hexane solution (29.0 ml) was put into a flask containing 4',6'-diphenoxy-1,1':3',1"-terphenyl (30.0 g) and ortho-xylene (300 ml) at 0° C. in a nitrogen atmosphere. After completion of dropwise addition, the temperature of the mixture was raised to 70° C., and the mixture was stirred for four hours. The temperature of the mixture was further raised to 100° C., and hexane was distilled off. The mixture was cooled to −50° C., and boron tribromide (8.4 ml) was added thereto. The temperature of the mixture was raised to room temperature, and the mixture was stirred for one hour. Thereafter, the mixture was cooled to 0° C. again, N,N-diisopropylethylamine (25.0 ml) was added thereto, and the mixture was stirred at room temperature until heat generation was settled. Thereafter, the mixture was heated and stirred for four hours at 120° C. The reaction liquid was cooled to room temperature, and an organic substance was extracted with toluene. Water was added to the toluene solution thus obtained, the mixture was partitioned, and the solvent was distilled off under reduced pressure. The resulting solid was dissolved in chlorobenzene, an appropriate amount of the mixture was then distilled off under reduced pressure, and reprecipitation was performed by adding heptane thereto. Reprecipitation was further performed similarly using ethyl acetate in place of heptane. Thus, a compound (4.2 g) represented by formula (B-5-91) was obtained.

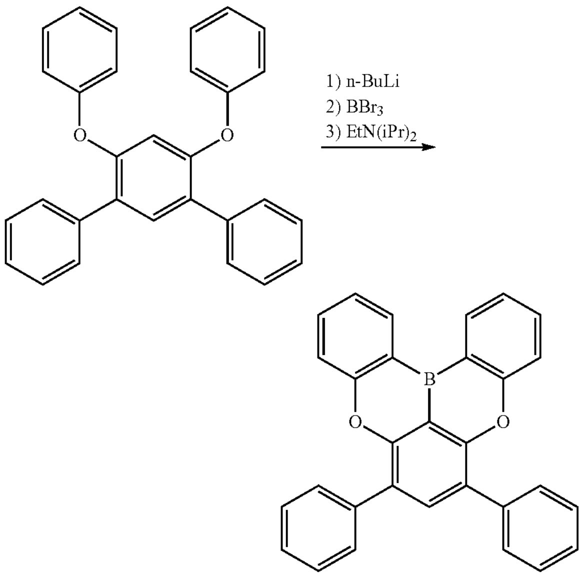

(B-5-91)

Synthesis Example 9: Synthesis of Compound (B-5-1-1)

(B-5-1-1)

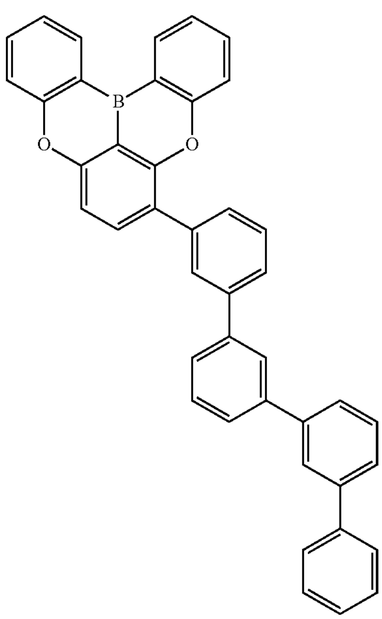

P4Br (3.97 g, 10.20 mmol, 1.0 eq.), bispinacolato diboron (3.11 g, 1.2 eq.), potassium acetate (3.00 g, 3 eq.), and a bis(diphenylphosphino) ferrocene-palladium(II) dichloride dichloromethane complex (0.25 g, 0.03 eq.) were weighed and put into a 200 mL three-necked round bottom flask. Degassing under reduced pressure and nitrogen purge were sufficiently performed. Thereafter, cyclopentyl methyl ether (40 mL) was added thereto in a nitrogen atmosphere, and the mixture was refluxed and stirred at 100° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through an activated carbon column chromatography using toluene as an eluent, and a fraction containing a desired product was collected and concentrated under reduced pressure. A desired product "P4Bpin" was obtained as a transparent oil (yield: 4.30 g, yield: 95.1%)

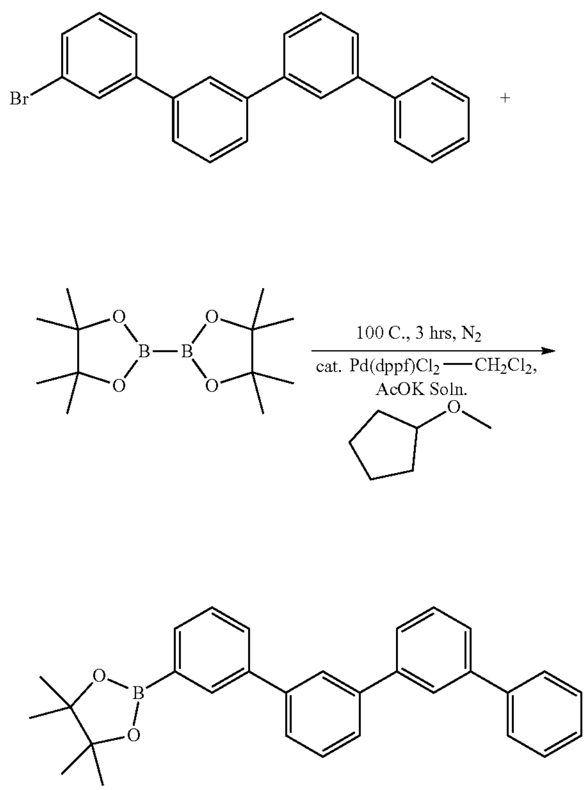

P4Bpin

In a nitrogen atmosphere, a solution of 1-bromo-2,4-difluorobenzene (23.0 g), phenol (33.6 g), potassium carbonate (49.4 g), and NMP (150 ml) was heated to 170° C. and was stirred. After completion of the reaction, the reaction liquid was cooled to room temperature, toluene and a saturated aqueous solution of sodium chloride were added thereto, and the mixture was partitioned. The solvent was distilled off under reduced pressure. Subsequently, the residue was purified by silica gel column chromatography to obtain 4-bromo-1,3-phenoxybenzene "13Px4B".

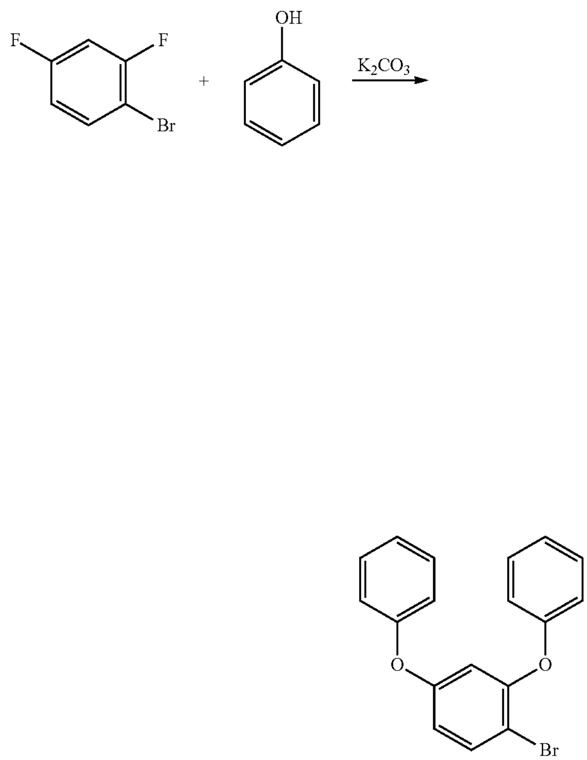

13Px4B

In a nitrogen atmosphere, $Pd(PPh_3)_4$ (0.41 g) was added to a suspension solution of 13Px4B (4.0 g), P4Bpin (5.1 g), sodium carbonate (3.7 g), toluene (36 ml), isopropanol (9 ml), and water (9 ml), and the mixture was stirred at reflux temperature. After completion of the reaction, the reaction liquid was cooled to room temperature, water and toluene were added thereto, and the mixture was partitioned. The solvent of the organic layer was distilled off under reduced pressure. The resulting mixture containing a desired product was caused to pass through a silica gel column chromatography. A fraction containing a desired product was concentrated under reduced pressure, and reprecipitation was performed to obtain "13Px4P4".

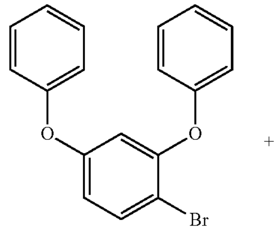

-continued

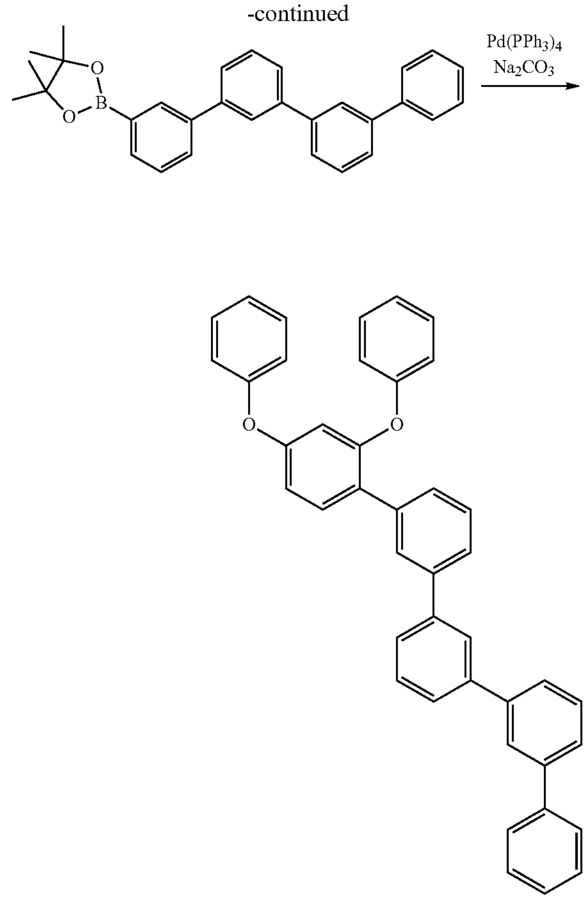

13Px4P4

A 2.6 M n-butyllithium hexane solution (5.1 ml, 1.5 eq.) was put into a flask containing 13Px4P4 (5.0 g, 8.8 mmol) and ortho-xylene (50 ml) at 0° C. in a nitrogen atmosphere. After completion of dropwise addition, the temperature of the mixture was raised to 70° C., and the mixture was stirred. The temperature of the mixture was further raised to 100° C., and hexane was distilled off. The residue was cooled to −50° C., boron tribromide (1.4 ml, 1.7 eq.) was added thereto, the temperature of the mixture was raised to room temperature, and the mixture was stirred. Thereafter, the mixture was cooled again to 0° C., N,N-diisopropylethylamine (1.0 ml, 3.0 eq.) was added thereto, and the mixture was stirred at room temperature until heat generation was settled. Subsequently, the mixture was heated and stirred at 120° C. After completion of the reaction, the reaction liquid was cooled to room temperature, and an organic material was extracted with toluene. Water was added to the toluene solution thus obtained, the mixture was partitioned, and the solvent was distilled off under reduced pressure. The resulting mixture containing a desired product was concentrated under reduced pressure. By reprecipitation and purification, a compound represented by formula (B-5-1-1) was obtained.

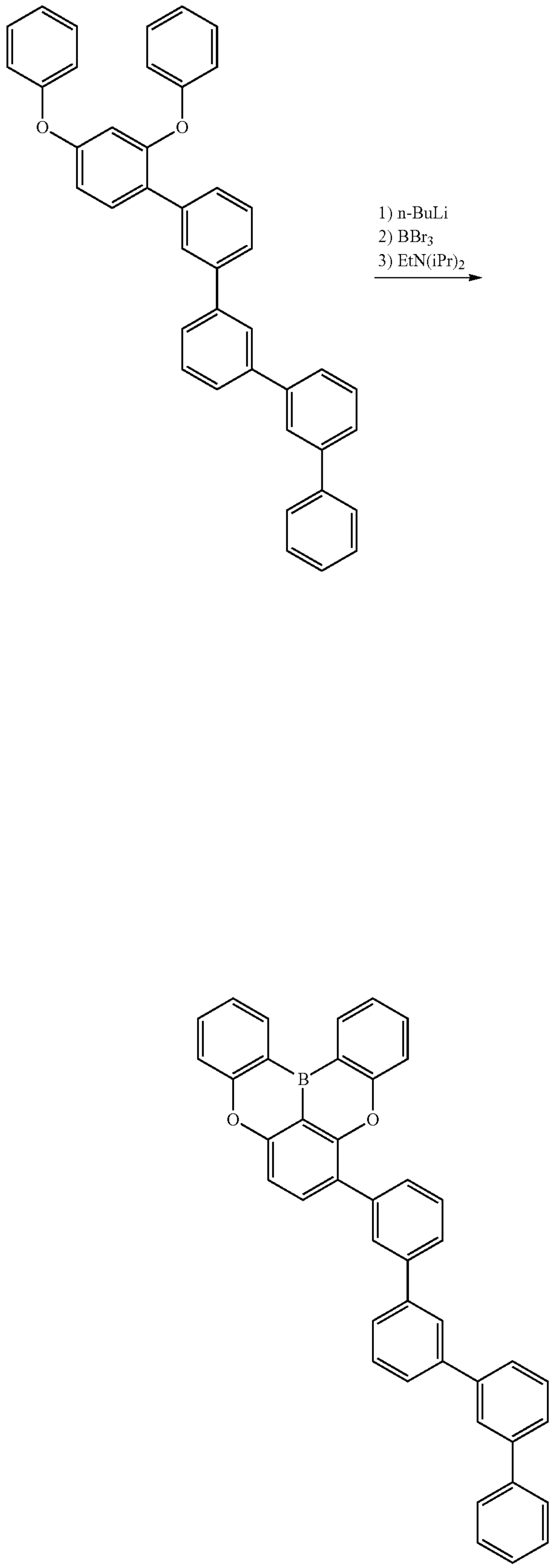

(B-5-1-1)

Synthesis Example 10: Synthesis of Compound (B-5-1-2)

(B-5-1-2)

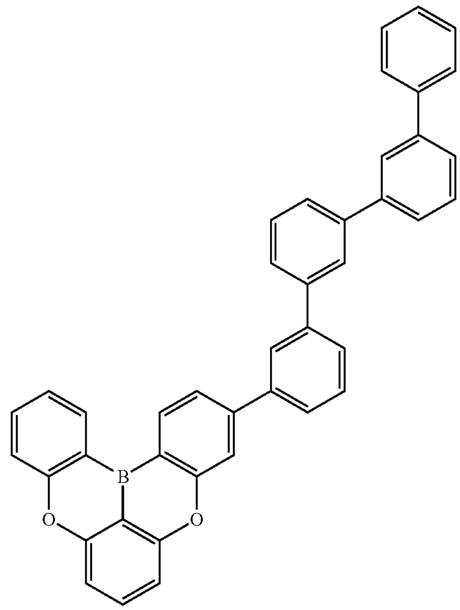

3-Bromophenol (8.0 g, 46.2 mmol, 1.0 eq.), P4Bpin (20.0 g, 1.0 eq.), sodium carbonate (14.7 g, 3.0 eq.), and tetrakis (triphenylphosphine) palladium(0) (1.6 g, 0.03 eq.) were weighed and put into a 500 mL three-necked round bottom flask. Degassing under reduced pressure and nitrogen purge were sufficiently performed. Thereafter, toluene (120 mL), ethanol (30 mL), and water (30 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The resulting product was further caused to pass through a silica gel column chromatography, and a fraction containing a desired product was collected and concentrated under reduced pressure. Thus, a desired product "P5mOH" was obtained.

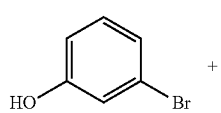

-continued

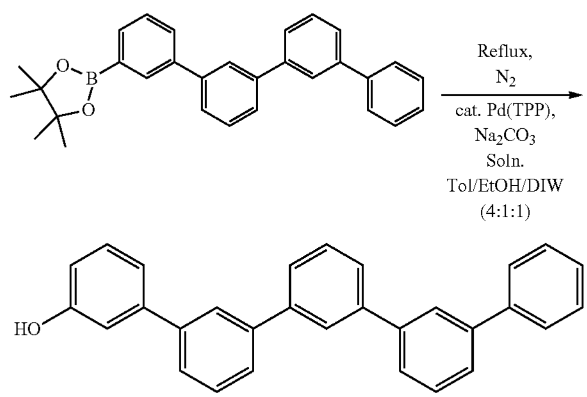

P5mOH

In a nitrogen atmosphere, copper(I) iodide (1.6 g, 0.03 eq.) and iron(III) acetylacetonate (6.1 g, 0.06 eq.) were added to an NMP (300 ml) solution of 1-bromo-3-fluorobenzene (50.0 g, 0.29 mol), phenol (30.0 g, 1.1 eq.), and potassium carbonate (79.0 g, 2.0 eq.) in a nitrogen atmosphere. The temperature of the mixture was raised to 150° C., and the mixture was stirred for four hours. The reaction liquid was cooled to room temperature, and a salt precipitated by adding ethyl acetate and aqueous ammonia thereto was removed by suction filtration using a Hirsch funnel covered with Celite. The filtrate was partitioned, and the solvent of the organic layer was distilled off under reduced pressure. Subsequently, the residue was purified using a silica gel short pass column (developing liquid: toluene/heptane=2/8 (volume ratio)), and thus 1-fluoro-3-phenoxybenzene "1F3Px" (41.0 g, 36.0%) was obtained.

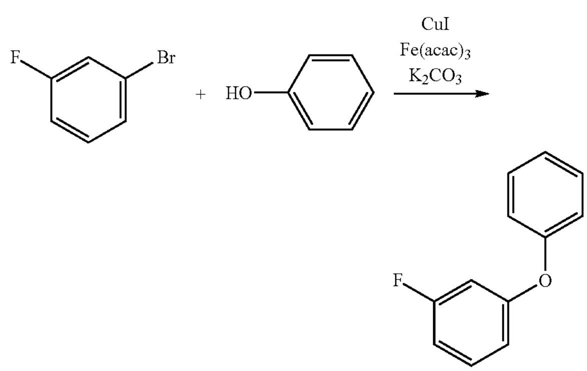

1F3Px

A flask containing 1F3Px (2.6 g, 15 mmol), P5mOH (12.0 g, 2 eq.), cesium carbonate (10.0 g, 2 eq.), and NMP (30 ml) was heated and stirred at 200° C. in a nitrogen atmosphere. After completion of the reaction, the reaction liquid was cooled to room temperature, and NMP was distilled off under reduced pressure. Subsequently, water and ethyl acetate were added to the residue, and the mixture was partitioned. The solvent was distilled off under reduced pressure, then purification was performed by silica gel column chromatography to obtain a desired product "1Px3P5".

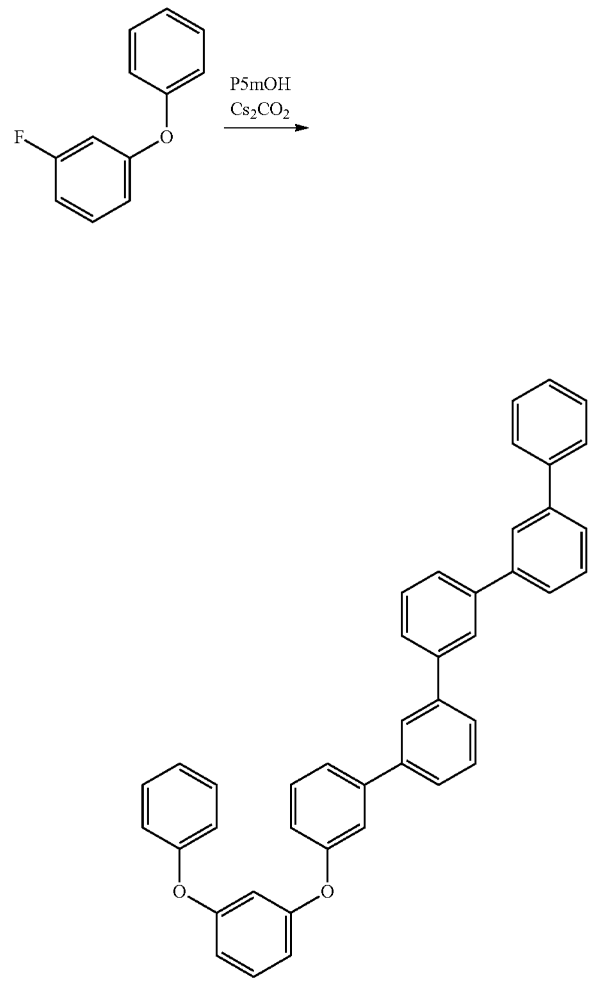

1Px3P5

A 1.0 M sec-butyllithium cyclohexane solution (5.0 ml, 1.5 eq.) was put into a flask containing 1Px3P5 (1.8 g, 3.2 mmol, 1 eq.) and xylene (10 ml) at 0° C. in a nitrogen atmosphere. After completion of dropwise addition, the temperature was increased to 70° C., and the mixture was stirred. After completion of the reaction, a component having a lower boiling point than xylene was distilled off under reduced pressure. The residue was cooled to −50° C., boron tribromide (0.5 ml) was added thereto, the temperature of the mixture was raised to room temperature, and the mixture was stirred for 0.5 hours. Thereafter, the mixture was cooled again to 0° C., N,N-diisopropylethylamine (2 ml) was added thereto, and the mixture was stirred at room temperature until heat generation was settled. Subsequently, the temperature of the mixture was raised to 120° C., and the mixture was heated and stirred. After completion of the reaction, the reaction liquid was cooled to room temperature. An aqueous solution of sodium acetate that had been cooled in an ice bath was added thereto, subsequently ethyl acetate was added thereto, and the mixture containing a desired product was purified by silica gel column chromatography. Furthermore, by recrystallization and purification, a compound represented by the formula (B-5-1-2) was obtained.

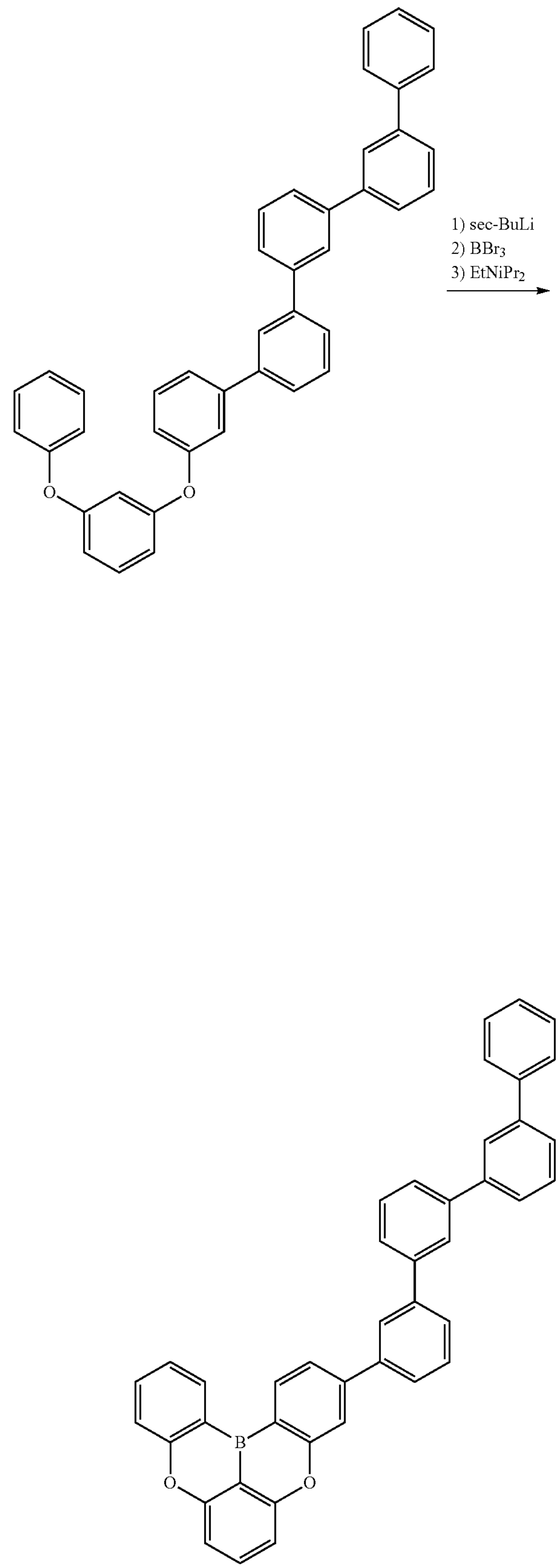

(B-5-1-2)

Synthesis Example 11; Synthesis of Compound (B-5-1-3)

(B-5-1-3)

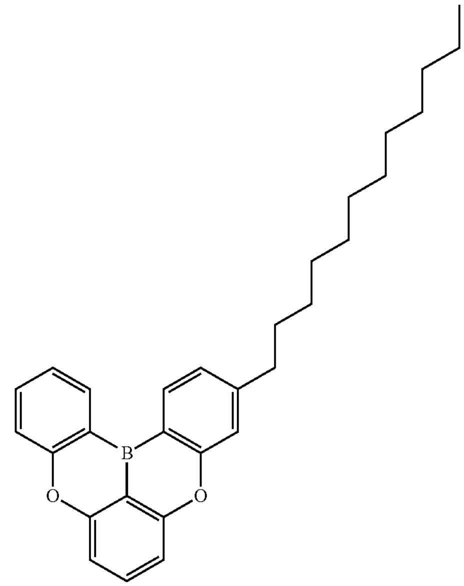

A flask containing 1F3Px (10 g, 53 mmol), 3-bromophenol (9.2 g, 1 eq.), potassium carbonate (15 g, 2 eq.), and NMP (50 ml) was heated and stirred for two hours at 200° C. in a nitrogen atmosphere. After the reaction was stopped, the reaction liquid was cooled to room temperature, and NMP was distilled off under reduced pressure. Subsequently, water and toluene were added thereto, and the mixture was partitioned. The solvent was distilled off under reduced pressure, and then the residue was purified by silica gel column chromatography (developing liquid: heptane/toluene=7/3 (volume ratio)). The resulting product was further dissolved in ethyl acetate, and then was reprecipitated by adding heptane thereto. Thus, 4',6'-bis([1,1'-biphenyl]-4-yloxy)-5'-bromo-1,1':3',1"-ter phenyl "1Px3PBr" (13.1 g, 72%) was obtained.

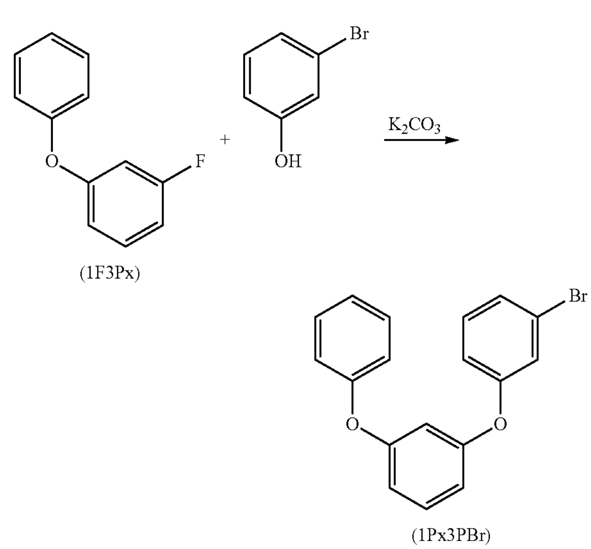

1Px3PBr (10 g, 30 mmol), [1,3-bis (diphenylphosphino) propane] nickel(II) dichloride (0.16 g), and cyclopentyl methyl ether (40 mL) were put into a flask and cooled with ice water in a nitrogen atmosphere, and a 1 mol/L dodecylmagnesium bromide diethyl ether solution (40 mL, 1.4 eq.) was slowly added dropwise such that the internal temperature did not exceed 25° C. Subsequently, the temperature was raised to room temperature, and then the resulting mixture was stirred at room temperature. After completion of the reaction, the mixture was again cooled with ice water, and water was slowly added dropwise to stop the reaction. Subsequently, the mixture was neutralized with 1N hydrochloric acid, and then the mixture was partitioned. The mixture containing a desired product was concentrated under reduced pressure, and was purified by silica gel column chromatography to obtain "1Px3PC12".

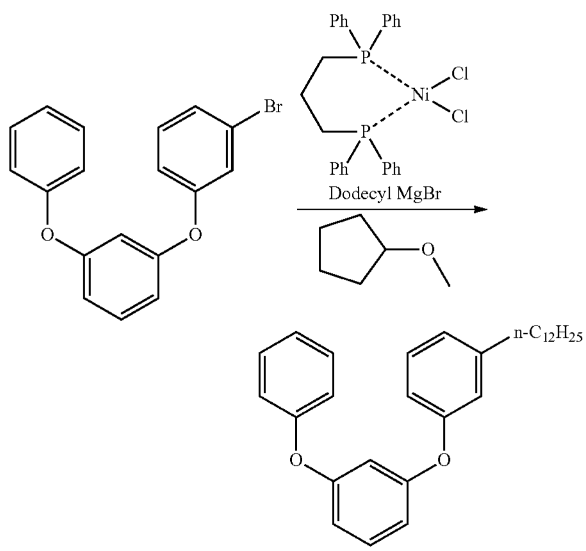

(1Px3PC12)

A 1.0 M sec-butyllithium cyclohexane solution (35 ml, 1.5 eq.) was put into a flask containing 1Px3PC12 (10 g, 0.23 mmol) and xylene (50 ml) at 0° C. in a nitrogen atmosphere. After completion of dropwise addition, the temperature was increased to 70° C., and the mixture was stirred. After completion of the reaction, a component having a lower boiling point than xylene was distilled off under reduced pressure. The residue was cooled to −50°, boron tribromide (4.0 ml, 1.7 eq.) was added thereto, the temperature of the mixture was raised to room temperature, and the mixture was stirred for 0.5 hours. Thereafter, the mixture was cooled again to 0° C., N,N-diisopropylethylamine (12 ml, 3 eq.) was added thereto, and the mixture was stirred at room temperature until heat generation was settled. Subsequently, the temperature of the mixture was raised to 120° C., and the mixture was heated and stirred. After completion of the reaction, the reaction liquid was cooled to room temperature. An aqueous solution of sodium acetate that had been cooled in an ice bath was added thereto, subsequently ethyl acetate was added thereto, and the mixture was partitioned. The resulting mixture containing a desired product was purified by silica gel column chromatography. Furthermore, by recrystallization and purification, a compound represented by the formula (B-5-1-3) was obtained.

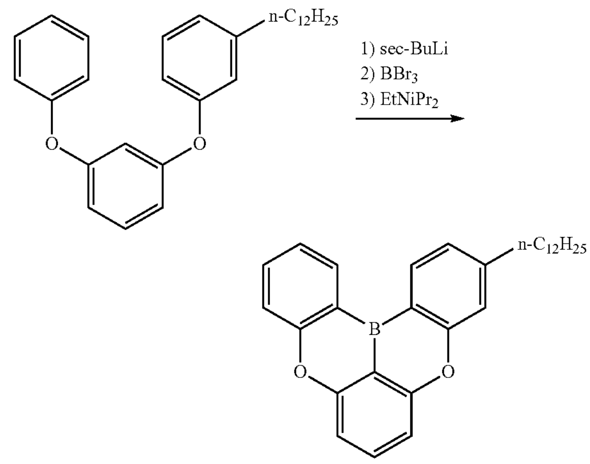

(B-5-1-3)

Synthesis Example 12: Synthesis of Compound (B-1-5)

(B-1-5)

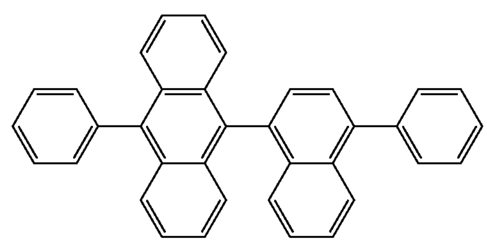

1,4-Dihydroxynaphthalene (5.00 g, 31.2 mmol, 1.0 eq.) was dissolved in pyridine (80 mL), and trifluoromethylsulfonic anhydride (12.6 mL, 74.9 mmol, 2.4 eq.) was slowly added dropwise under ice cooling. The mixture was stirred for one hour under ice cooling, and then the mixture was stirred at room temperature. After completion of the reaction, water was added, the mixture was extracted with toluene, and the unified toluene layer was dehydrated with anhydrous sodium sulfate. Sodium sulfate was filtered off. Thereafter, the residue was concentrated and was caused to pass through a silica gel column chromatography. By collecting and concentrating the fraction containing a desired product, a desired product "14NpOTf2" was obtained.

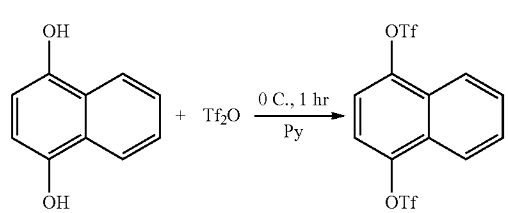

14NpOTf2

9PA10BA (3.00 g, 10.1 mmol, 1.0 eq.), 14NpOTf2 (4.26 g, 10.1 mmol, 1 eq.), potassium carbonate (4.17 g, 30.2 mmol, 3.0 eq.), and tetrakis (triphenylphosphine) palladium (0) (0.35 g, 0.03 eq.) were weighed and put into a 100 mL three-necked round bottom flask, and degassing under reduced pressure/Ar purge was performed. Degassing under reduced pressure and nitrogen purge were performed sufficiently. Thereafter, toluene (24 mL), ethanol (6 mL), and water (6 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The resulting mixture containing a desired product was caused to pass through a silica gel short column chromatography, and a fraction containing a desired product was collected and concentrated under reduced pressure. A desired product "PA4OTf" was obtained.

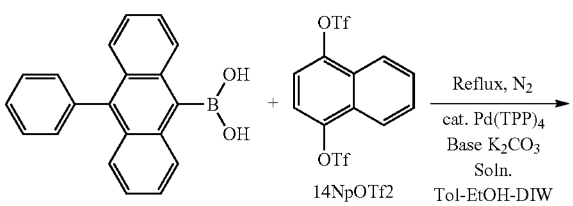

9PA10BA 14NpOTf2

-continued

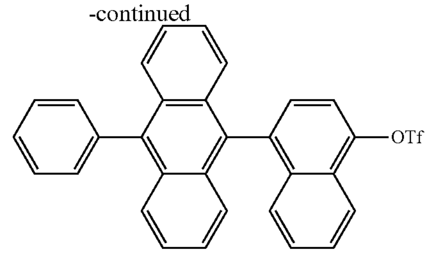

PA4OTf

PA4OTf (2.00 g, 3.8 mmol, 1.0 eq), phenylboronic acid (0.46 g, 1.0 eq.), potassium phosphate (2.41 g, 3.0 eq.), and tetrakis (triphenylphosphine) palladium(0) (0.13 g, 0.03 eq.) were weighed and put into a 100 mL three-necked round bottom flask, and degassing under reduced pressure/Ar purge was performed. Degassing under reduced pressure and nitrogen purge were performed sufficiently. Thereafter, toluene (12 mL), ethanol (3 mL), and water (3 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The resulting mixture containing a desired product was caused to pass through a silica gel short column chromatography, and a fraction containing a desired product was collected and concentrated under reduced pressure. The resulting desired product was recrystallized. The resulting desired product was purified by sublimation under reduced pressure of $2\times10^4$ Pa or less, and a compound represented by formula (B-1-5) was thereby obtained.

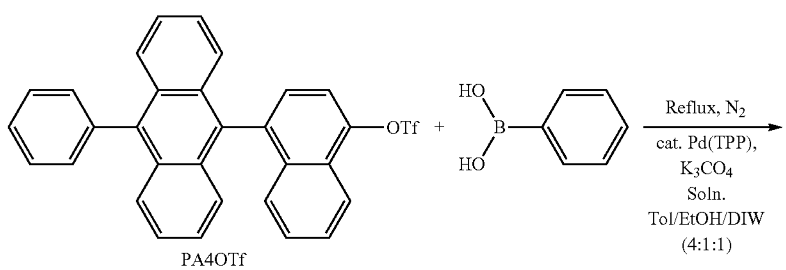

PA4OTf

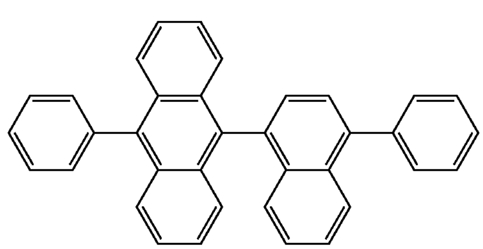

(B-1-5)

Synthesis Example 13: Synthesis of Compound (B-1-5-1)

(B-1-5-1)

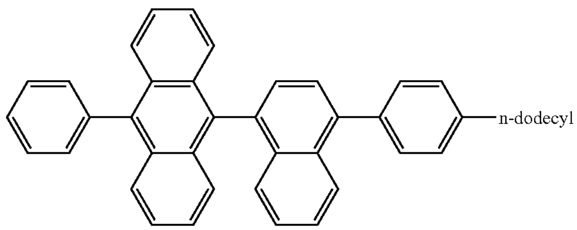

1-bromo-4-dodecylbenzene (5.0 g, 15.4 mmol, 1.0 eq.), bispinacolato diboron (4.7 g, 1.2 eq.), potassium acetate (4.5 g, 3 eq.), and a bis(diphenylphosphino) ferrocene-palladium (II) dichloride dichloromethane complex (0.38 g, 0.03 eq.) were weighed and put into a 200 mL three-necked round bottom flask. Degassing under reduced pressure and nitrogen purge were sufficiently performed. Thereafter, 50 mL of cyclopentyl methyl ether was added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The mixture containing a desired product was further caused to pass through an activated carbon column chromatography, and a fraction containing a desired product was collected and concentrated under reduced pressure. Thus, a desired product "PC12Bpin" was obtained.

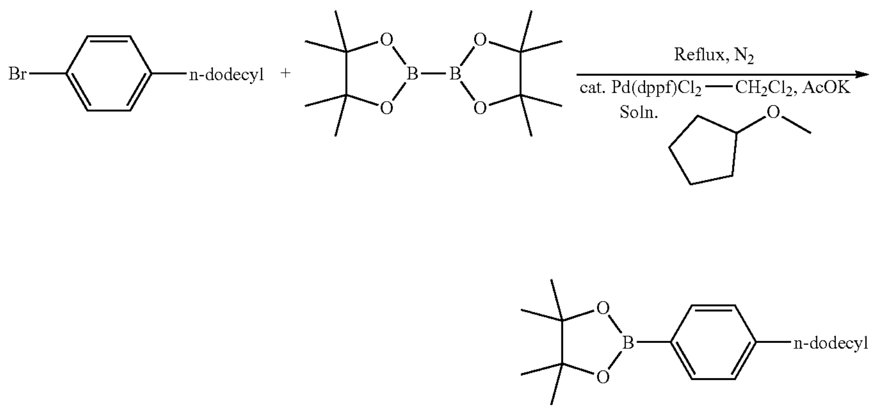

PC12Bpin

PA4OTf (2.00 g, 3.79 mmol, 1.0 eq), 4-dodecylphenylboronic acid "PC12Bpin" (1.41 g, 1.0 eq.), potassium phosphate (2.41 g, 3.0 eq.), and tetrakis (triphenylphosphine) palladium(0) (0.13 g, 0.03 eq.) were weighed and put into a 100 mL three-necked round bottom flask, and degassing under reduced pressure/Ar purge was performed. Degassing under reduced pressure and nitrogen purge were performed sufficiently. Thereafter, toluene (12 mL), ethanol (3 mL), and water (3 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The resulting mixture containing a desired product was caused to pass through a silica gel short column chromatography, and a fraction containing a desired product was collected and concentrated under reduced pressure. The resulting desired product was purified by recrystallization. The resulting desired product was purified by sublimation under reduced pressure of $2\times10^4$ Pa or less, and a compound represented by formula (B-1-5-1) was obtained.

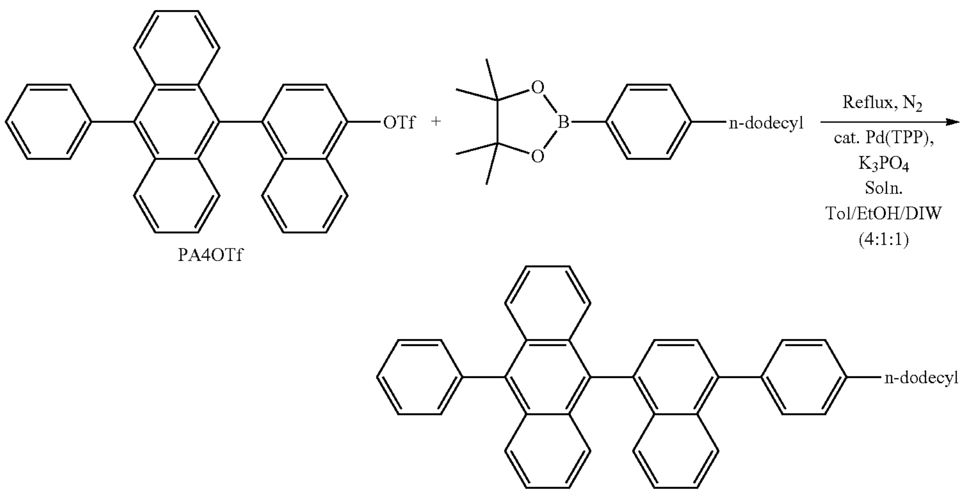

(B-1-5-1)

Synthesis Example 14: Synthesis of Compound (B-1-5-2)

(B-1-5-2)

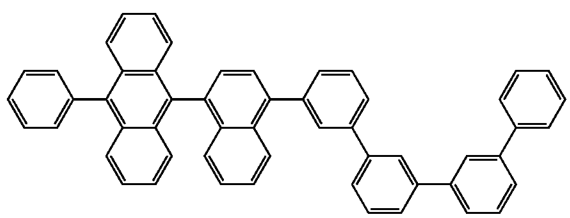

PA4OTf (2.00 g, 3.79 mmol, 1.0 eq), P4Bpin (1.64 g, 3.79 mmol, 1.0 eq.), potassium phosphate (2.41 g, 3.0 eq.), and tetrakis (triphenylphosphine) palladium(0) (0.13 g, 0.03 eq.) were weighed and put into a 100 mL three-necked round bottom flask, and degassing under reduced pressure/Ar purge was performed. Degassing under reduced pressure and nitrogen purge were performed sufficiently. Thereafter, toluene (12 mL), ethanol (3 mL), and water (3 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The resulting mixture containing a desired product was caused to pass through a silica gel short column chromatography, and a fraction containing a desired product was collected and concentrated under reduced pressure. The resulting desired product was purified by recrystallization. The resulting desired product was purified by sublimation under reduced pressure of $2\times10^4$ Pa or less, and a compound represented by formula (B-1-5-2) was thereby obtained.

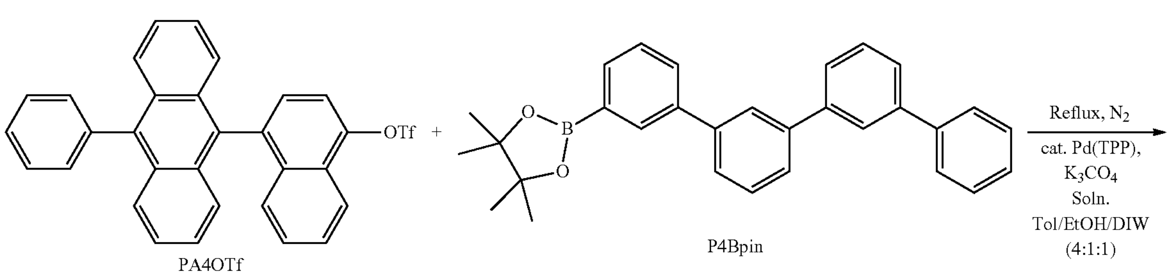

PA4OTf P4Bpin

-continued

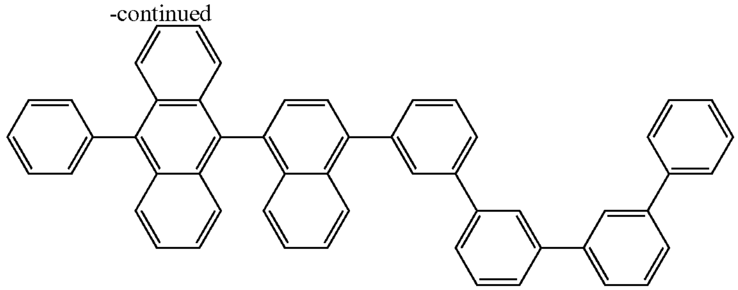

(B-1-5-2)

Synthesis Example 15: Synthesis of Compound (B-1-101-1)

(B-1-101-1)

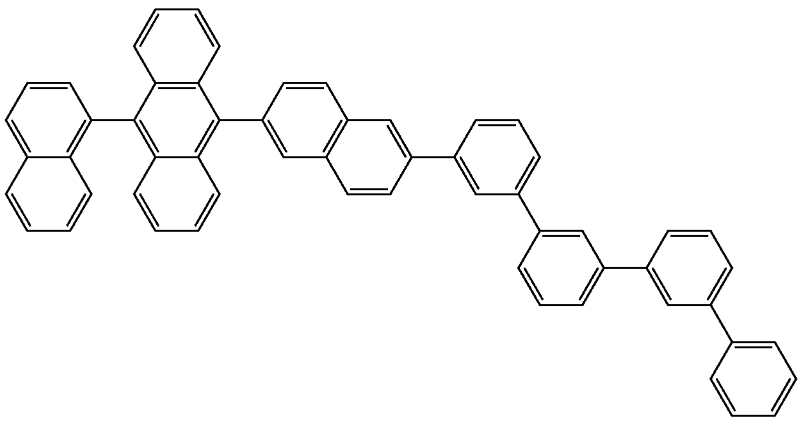

9AA10BA (25 g, 72 mmol, 1.0 eq), 2,6-dibromonaphthalene (20.5 g, 1 eq.), potassium carbonate (30 g, 3 eq.), and tetrakis (triphenylphosphine) palladium(0) (2.5 g, 0.03 eq.) were weighed and put into a 1000 mL three-necked round bottom flask, and degassing under reduced pressure/Ar purge was performed. Degassing under reduced pressure and nitrogen purge were performed sufficiently. Thereafter, toluene (24 mL), ethanol (6 mL), and water (6 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The mixture containing a desired product was caused to pass through a silica gel column chromatography, and a fraction containing a desired product was collected and concentrated under reduced pressure. Thus, a desired product "AB6Br" was obtained.

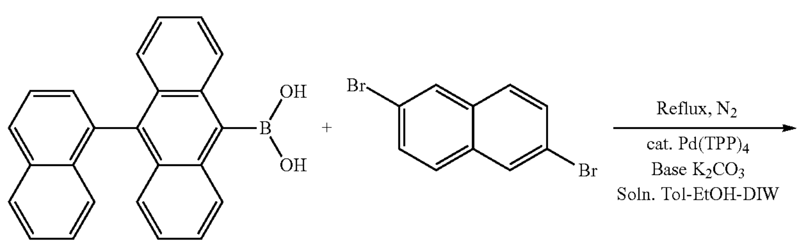

9AA10BA

-continued

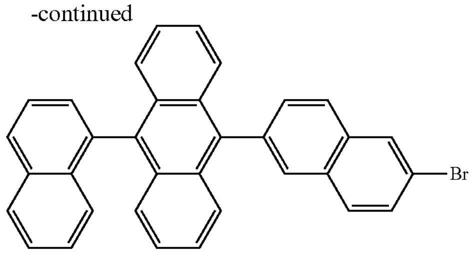

AB6Br

P4Bpin (2.5 g, 1.0 eq.), AB6Br (3.0 g, 5.9 mmol, 1.0 eq), potassium phosphate (3.8 g, 3.0 eq.), and tetrakis (triphenylphosphine) palladium(0) (0.20 g, 0.03 eq) were weighed and put into a 100 mL three-necked round bottom flask, and degassing under reduced pressure/Ar purge was performed. Degassing under reduced pressure and nitrogen purge were performed sufficiently. Thereafter, toluene (16 mL), ethanol (4 mL), and water (4 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The resulting mixture containing a desired product was caused to pass through a silica gel short column chromatography, and a fraction containing a desired product was collected and concentrated under reduced pressure. The resulting desired product was purified by recrystallization. The resulting desired product was purified by sublimation under reduced pressure of $2\times10^4$ Pa or less, and a compound represented by formula (B-1-101-1) was obtained.

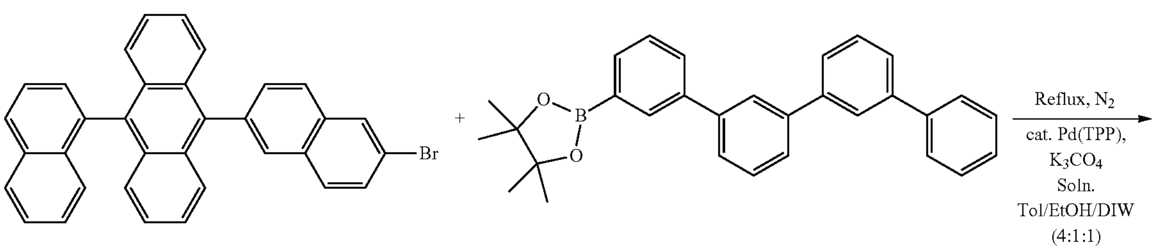

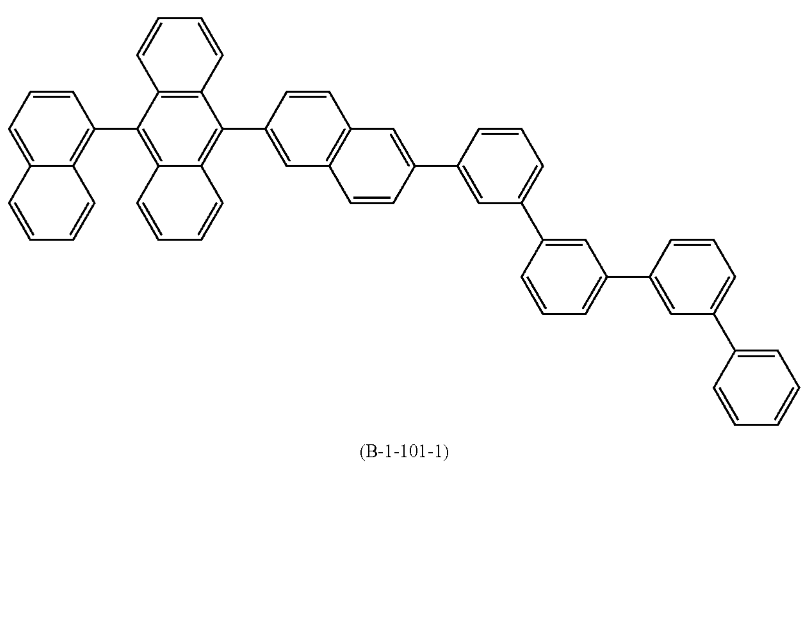

(B-1-101-1)

Synthesis Example 16: Synthesis of Compound (B-1-101-2)

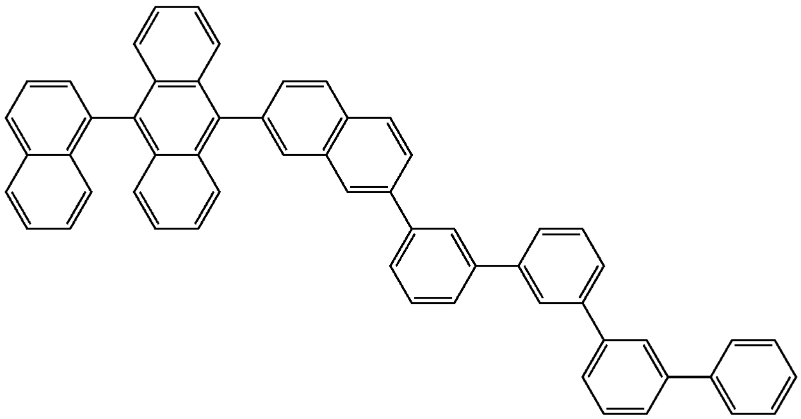

(B-1-101-2)

9AA10BA (25 g, 72 mmol, 1 eq), 2,7-dibromonaphthalene (20.5 g, 1 eq.), potassium carbonate (30 g, 3 eq.), and tetrakis (triphenylphosphine) palladium(0) (2.5 g, 0.03 eq.) were weighed and put into a 1000 mL three-necked round bottom flask, and degassing under reduced pressure/Ar purge was performed. Degassing under reduced pressure and nitrogen purge were performed sufficiently. Thereafter, toluene (160 mL), ethanol (40 mL), and water (40 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The mixture containing a desired product was caused to pass through a silica gel column chromatography, and a fraction containing a desired product was collected and concentrated under reduced pressure. Thus, a desired product "AB7Br" was obtained.

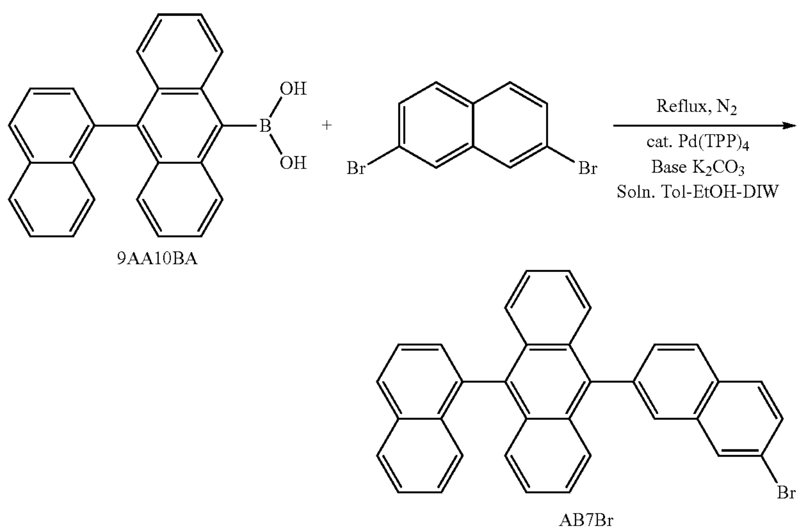

P4Bpin (3.0 g, 5.9 mmol, 1 eq.), AB7Br (2.51 g, 1 eq), potassium phosphate (2.01 g, 3 eq.), and tetrakis (triphenylphosphine) palladium(0) (0.20 g, 0.03 eq) were weighed and put into a 100 mL three-necked round bottom flask, and degassing under reduced pressure/Ar purge was performed. Degassing under reduced pressure and nitrogen purge were performed sufficiently. Thereafter, toluene (16 mL), ethanol (4 mL), and water (4 mL) were added thereto in a nitrogen atmosphere, and the mixture was refluxed and stirred. After completion of the reaction, heating was stopped, and the temperature of the reaction liquid was returned to room temperature. Extraction was performed with toluene, the organic solvent layers were then unified, anhydrous sodium sulfate was added thereto, and the mixture was allowed to stand for a while. Sodium sulfate was filtered off, and the solution was concentrated under reduced pressure. The resulting mixture containing a desired product was caused to pass through a silica gel short column chromatography, and a fraction containing a desired product was collected and concentrated under reduced pressure. The resulting mixture containing a desired product was caused to pass through a silica gel short column chromatography, and a fraction containing a desired product was collected and concentrated under reduced pressure. The resulting desired product was purified by recrystallization. The resulting desired product was purified by sublimation under reduced pressure of $2\times10^4$ Pa or less, and a compound represented by formula (B-1-101-2) was obtained.

In a nitrogen atmosphere, a flask containing 1,3-dibromo-5-fluorobenzene (50.0 g), carbazole (39.5 g), cesium carbonate (96.2 g) and DMSO (500 ml) was heated to 150° C. and stirred for 10 hours. The reaction liquid was cooled to room temperature, and a precipitate precipitated by adding water thereto was collected by suction filtration. The solid thus obtained was purified by silica gel column chromatography (developing liquid: toluene/heptane=1/10 (volume ratio)), and then the solid was recrystallized from a mixed solvent of toluene/heptane. Thus, 9-(3,5-dibromophenyl)-9H-carbazole (49.0 g) was obtained.

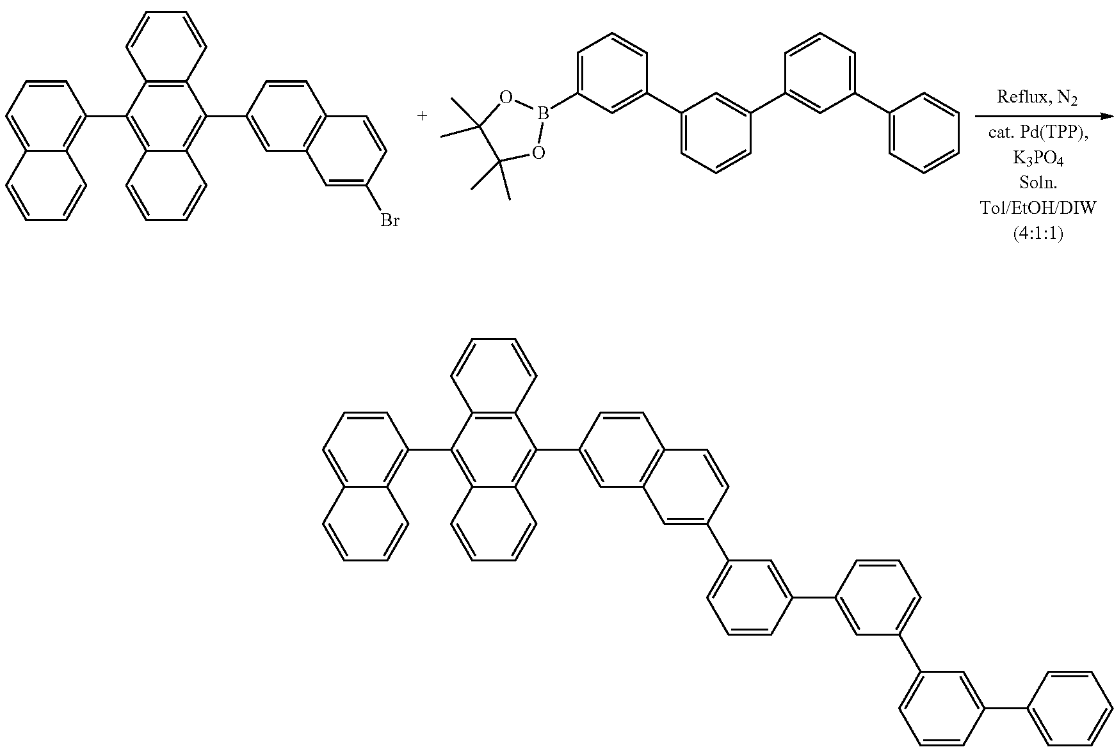

(B-1-101-2)

Synthesis Example 17: Synthesis of Compound (B-5-49)

(B-5-49)

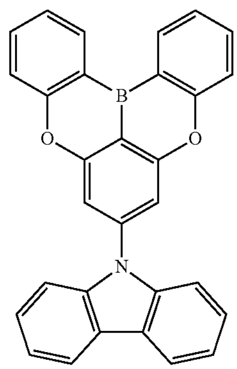

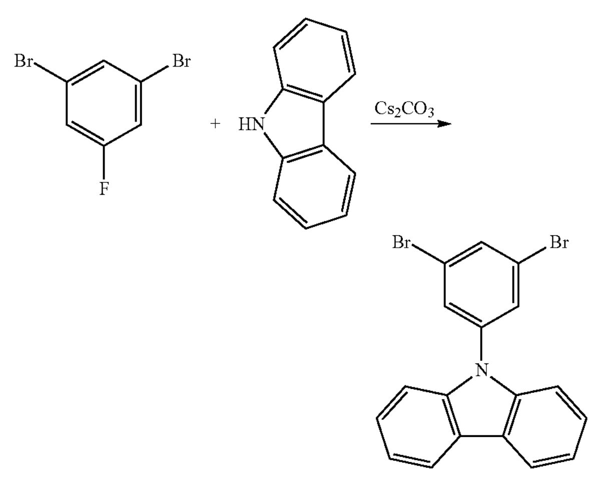

Copper(I) iodide (0.71 g) and iron(III) acetylacetonate (2.6 g) were added to an NMP (240 ml) solution of phenol (21.1 g), 9-(3,5-dibromophenyl)-9H-carbazole (30.0 g) and potassium carbonate (41.3 g) in a nitrogen atmosphere. The temperature of the mixture was increased to 150° C., and the mixture was stirred for six hours. The reaction liquid was cooled to room temperature, subsequently toluene was added thereto, and the mixture was suction filtered using a Hirsch funnel covered with Celite. A saturated sodium chloride solution was added to the filtrate, and the mixture was partitioned. Thereafter, the organic layer was distilled off under reduced pressure, and the residue was purified by silica gel column chromatography (developing liquid: toluene/heptane=2/1 (volume ratio)). Thus, 9-(3,5-diphenoxyphenyl)-9H-carbazole (27.3 g) was obtained.

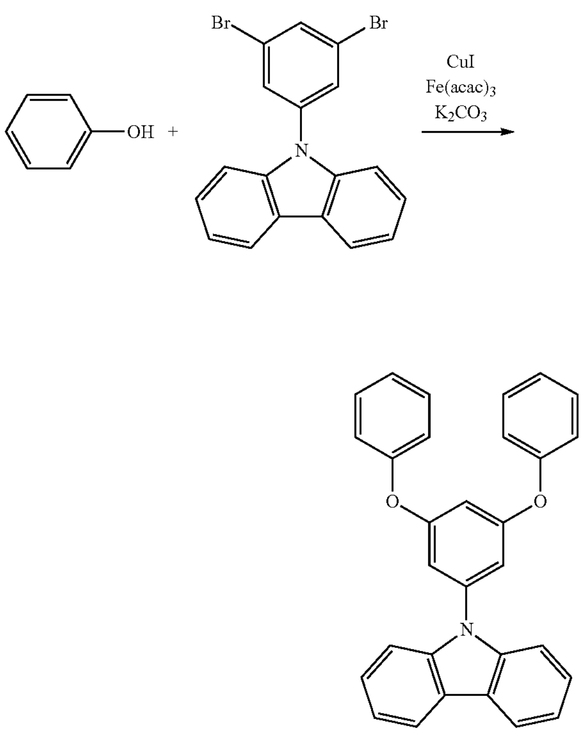

A 1.6 M n-butyllithium hexane solution (16.1 ml) was put into a flask containing 9-(3,5-diphenoxyphenyl)-9H-carbazole (10.0 g) and xylene (100 ml) at 0° C. in a nitrogen atmosphere. After completion of dropwise addition, the temperature of the mixture was raised to 70° C., and the mixture was stirred for four hours. The temperature of the mixture was further raised to 100° C., and hexane was distilled off. The mixture was cooled to −50° C., boron tribromide (2.7 ml) was added thereto, the temperature of the mixture was raised to room temperature, and the mixture was stirred for one hour. Thereafter, the mixture was cooled again to 0° C., N,N-diisopropylethylamine (8.1 ml) was added thereto, and the mixture was stirred at room temperature until heat generation was settled. Subsequently, the mixture was heated and stirred for eight hours at 120° C. The reaction liquid was cooled to room temperature, an aqueous solution of sodium acetate and toluene were added thereto, and then the mixture was partitioned. Subsequently, the solvent was distilled off under reduced pressure. The resulting solid was recrystallized from toluene, and thus a compound (1.7 g) represented by formula (B-5-49) was obtained.

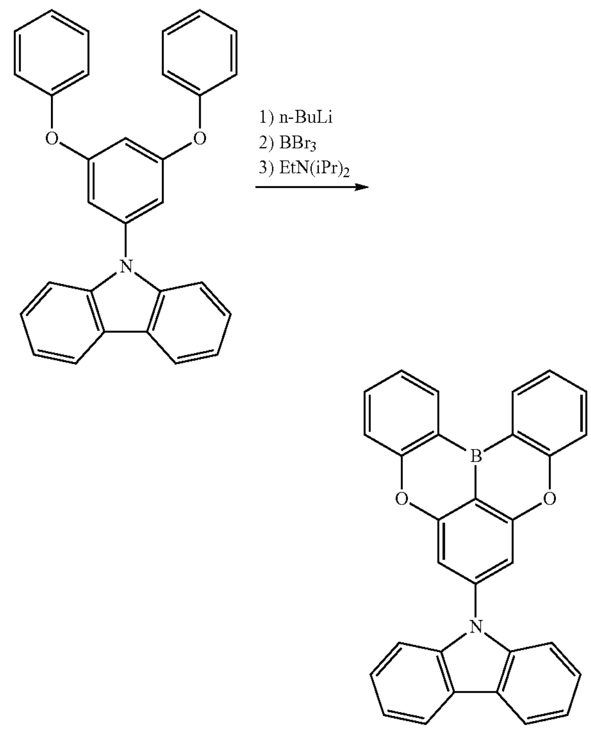

(1-49)

The structure of the compound thus obtained was identified by an NMR analysis.

$^{1}$H-NMR (400 MHz, $CDCl_3$): δ=8.75 (d, 2H), 8.18 (d, 2H), 7.75 (t, 2H), 7.71 (d, 2H), 7.58 (d, 2H), 7.50 (s, 2H), 7.42-7.49 (m, 4H), 7.35 (t, 2H).

Synthesis Example 18: Synthesis of Compound (1-2676)

(1-2676)

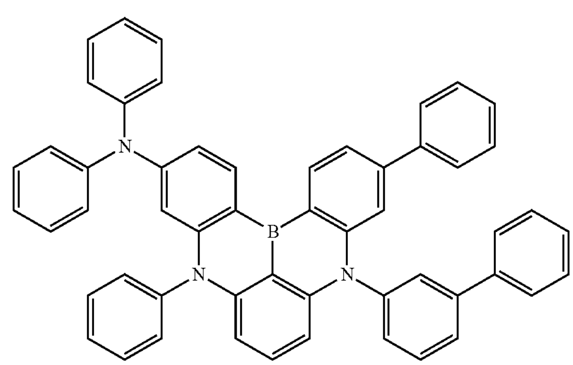

In a nitrogen atmosphere, a flask containing [1,1'-biphenyl]-3-amine (19.0 g), 3-bromo-1,1'-biphenyl (25.0 g), Pd-132 (0.8 g), NaOtBu (15.5 g), and xylene (200 ml) was heated and stirred for six hours at 120° C. The reaction liquid was cooled to room temperature, subsequently water and ethyl acetate were added thereto, and the mixture was partitioned. Subsequently, purification was performed by silica gel column chromatography (developing liquid: toluene/heptane=5/5 (volume ratio)). A solid obtained by distilling off the solvent under reduced pressure was washed with heptane, and thus di([1,1'-biphenyl]-3-yl)amine (30.0 g) was obtained.

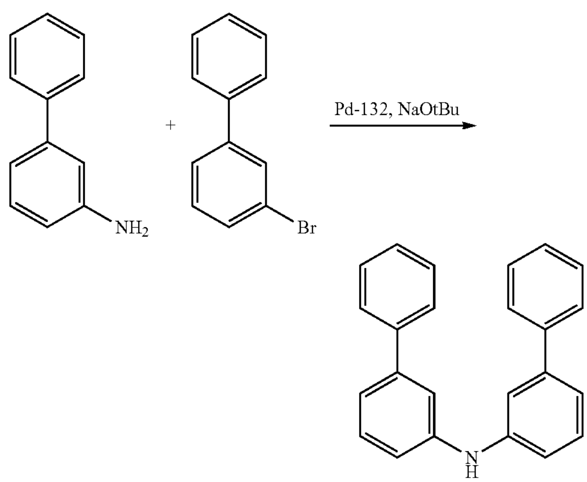

In a nitrogen atmosphere, a flask containing N[1]-(2,3-dichlorophenyl)-N[1],N[3],N[3]-triphenylbenzene-1,3-diamine (15.0 g), di([1,1'-biphenyl]-3-yl)amine (10.0 g), Pd-132 (0.2 g), NaOtBu (4.5 g), and xylene (70 ml) was heated and stirred for one hour at 120° C. The reaction liquid was cooled to room temperature, subsequently water and ethyl acetate were added thereto, and the mixture was partitioned. Subsequently, purification was performed by silica gel column chromatography (developing liquid: toluene/heptane=5/5 (volume ratio)). A fraction containing a desired product was reprecipitated by distilling off the solvent under reduced pressure, and thus N[1],N[1]-di([1,1'-biphenyl]-3-yl)-2-chloro-N[3]-(3-(diphenylamino)phenyl)-N[3]-phenylbenzene-1,3-diamine (20.3 g) was obtained.

A 1.6 M t-butyllithium pentane solution (32.6 ml) was put into a flask containing N[1],N[1]-di([1,1'-biphenyl]-3-yl)-2-chloro-N[3]-(3-(diphenylamino)phenyl)-N[3]-phenylbenzene-1,3-diamine (20.0 g) and t-butylbenzene (150 ml) in a nitrogen atmosphere, while the flask was cooled in an ice bath. After completion of dropwise addition, the temperature was increased to 60° C., the mixture was stirred for two hours, and then the components having boiling points that were lower than that of t-butylbenzene were distilled off under reduced pressure. The residue was cooled to −50° C., boron tribromide (5.0 ml) was added thereto, the temperature of the mixture was raised to room temperature, and the mixture was stirred for 0.5 hours. Thereafter, the mixture was cooled again in an ice bath, and N,N-diisopropylethylamine (9.0 ml) was added thereto. The mixture was stirred at room temperature until heat generation was settled, subsequently the temperature was raised to 120° C., and the mixture was heated and stirred for 1.5 hours. The reaction liquid was cooled to room temperature, an aqueous solution of sodium acetate that had been cooled in an ice bath and then ethyl acetate were added thereto, and the mixture was partitioned. Subsequently, purification was performed by silica gel column chromatography (developing liquid: toluene/heptane=5/5 (volume ratio)). Furthermore, the purification product was reprecipitated with a toluene/heptane mixed solvent and a chlorobenzene/ethyl acetate mixed solvent, and thus a compound (5.0 g) represented by formula (1-2676) was obtained.

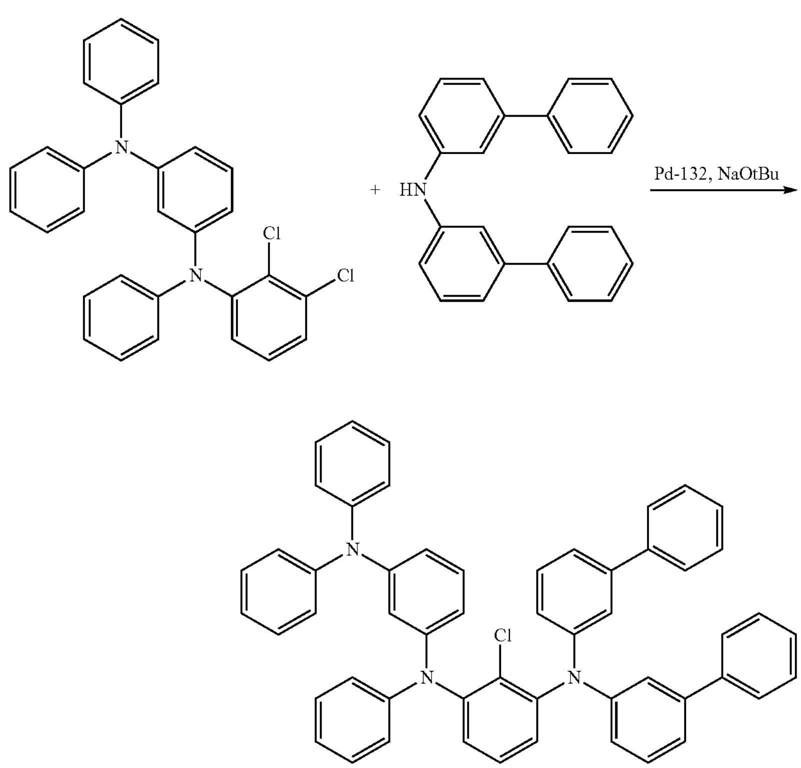

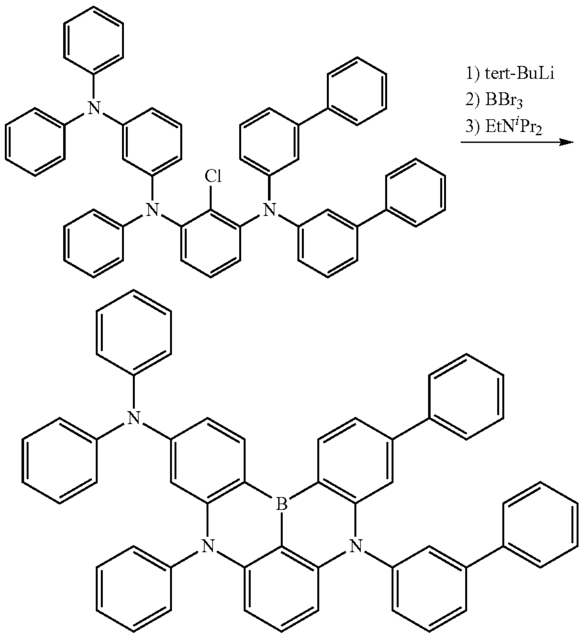

(1-2676)

Synthesis Example 19 Synthesis of Compound (1-2626)

(1-2626)

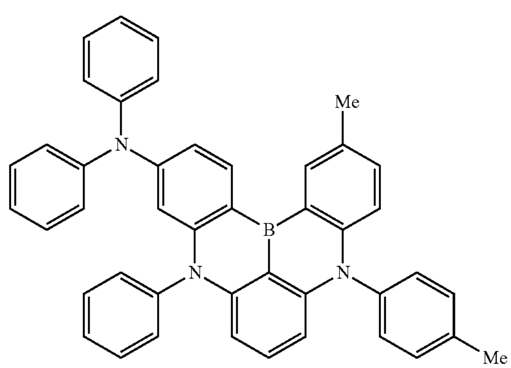

In a nitrogen atmosphere, a flask containing N[1]-(2,3-dichlorophenyl)-N[1],N[3],N[3]-triphenylbenzene-1,3-diamine (15.0 g), di-p-tolylamine (6.1 g), Pd-132 (0.2 g), NaOtBu (4.5 g), and xylene (70 ml) was heated and stirred for one hour at 120° C. The reaction liquid was cooled to room temperature, subsequently water and ethyl acetate were added thereto, and the mixture was partitioned. Subsequently, purification was performed by silica gel column chromatography (developing liquid: toluene/heptane=4/6 (volume ratio)). A fraction containing a desired product was reprecipitated by distilling off the solvent under reduced pressure, and thus 2-chloro-N[1]-(3-(diphenylamino)phenyl)-N[1]-phenyl-N[3],N[3]-di-p-tolylbenzene-1,3-diamine (15.0 g) was obtained.

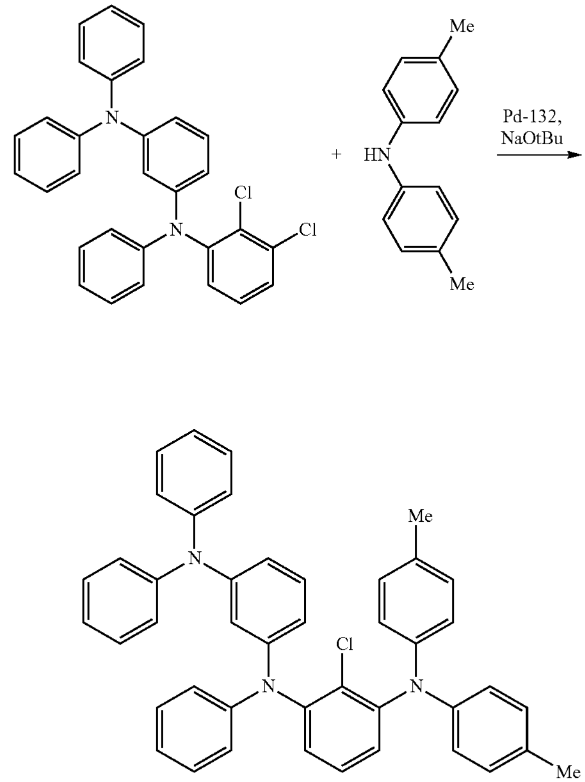

A 1.6 M t-butyllithium pentane solution (29.2 ml) was put into a flask containing 2-chloro-N[1]-(3-(diphenylamino)phenyl)-N[1]-phenyl-N[3],N[3]-di-p-tolylbenzene-1,3-diamine (15.0 g) and t-butylbenzene (100 ml) in a nitrogen atmosphere, while the flask was cooled in an ice bath. After completion of dropwise addition, the temperature was increased to 60° C., the mixture was stirred for two hours, and then the components having boiling points that were lower than that of t-butylbenzene were distilled off under reduced pressure. The residue was cooled to −50° C., boron tribromide (4.4 ml) was added thereto, the temperature of the mixture was raised to room temperature, and the mixture was stirred for 0.5 hours. Thereafter, the mixture was cooled again in an ice bath, and N,N-diisopropylethylamine (8.1 ml) was added thereto. The mixture was stirred at room temperature until heat generation was settled, subsequently the temperature of the mixture was raised to 120° C., and the mixture was heated and stirred for two hours. The reaction liquid was cooled to room temperature, an aqueous solution of sodium acetate that had been cooled in an ice bath and then ethyl acetate were added thereto, and the mixture was partitioned. Subsequently, purification was performed by silica gel column chromatography (developing liquid: toluene/heptane=4/6 (volume ratio)). The purification product was further washed with hot heptane, and then was reprecipitated with a toluene/ethyl acetate mixed solvent. Thus, a compound (2.0 g) represented by formula (1-2626) was obtained.

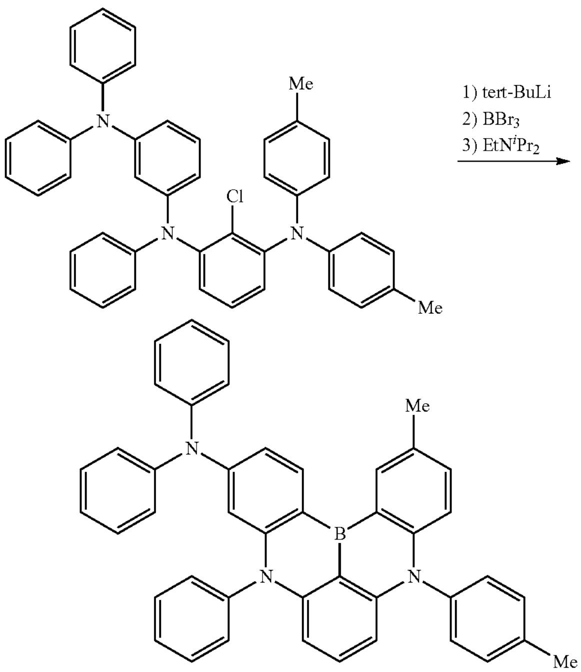

(1-2626)

Synthesis Example 20: Synthesis of Compound (1-2622)

(1-2622)

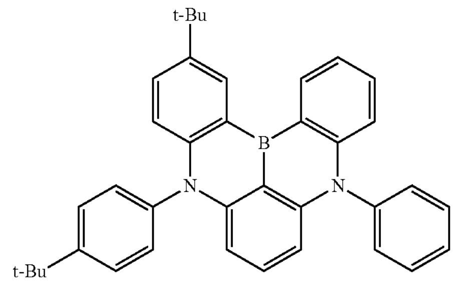

In a nitrogen atmosphere, a flask containing 2,3-dichloro-N,N-diphenylaniline (12.0 g), bis(4-tert-butyl) phenyl) amine (10.2 g), Pd-132 (0.3 g), NaOtBu (5.5 g), and xylene (90 ml) was heated and stirred for one hour at 120° C. The reaction liquid was cooled to room temperature, subsequently water and ethyl acetate were added thereto, and the mixture was partitioned. Subsequently, purification was performed with a silica gel column (developing solution: toluene/heptane=3/7 (volume ratio)) to obtain $N^1$,$N^1$-bis (4-(tert-butyl) phenyl)-2-chloro-$N^3$,$N^3$-diphenylbenzene-1,3-diamine (16.7 g)

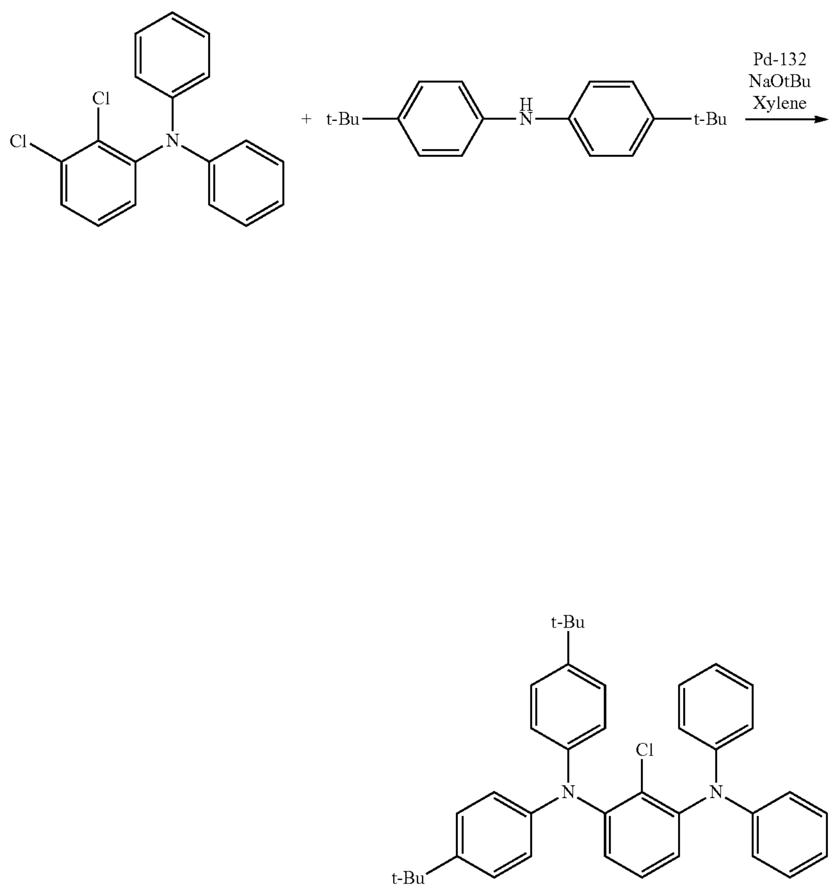

A 1.6 M t-butyllithium pentane solution (29.1 ml) was put into a flask containing $N^1$,$N^1$-bis (4-(tert-butyl) phenyl)-2-chloro-$N^3$,$N^3$-diphenylbenzene-1,3-diamine (13.0 g) and t-butylbenzene (80 ml) in a nitrogen atmosphere, while the flask was cooled in an ice bath. After completion of dropwise addition, the temperature was increased to 60° C., the mixture was stirred for two hours, and then the components having boiling points that were lower than that of t-butylbenzene were distilled off under reduced pressure. The residue was cooled to −50° C., boron tribromide (11.6 ml) was added thereto, the temperature was raised to room temperature, and the mixture was stirred for 0.5 hours. Thereafter, the mixture was cooled again in an ice bath, and N,N-diisopropylethylamine (6.0 g) was added thereto. The mixture was stirred at room temperature until heat generation was settled, subsequently the temperature of the mixture was raised to 100° C., and the mixture was heated and stirred for two hours. The reaction liquid was cooled to room temperature, an aqueous solution of sodium acetate that had been cooled in an ice bath and then ethyl acetate were added thereto, and the mixture was partitioned. Concentration was performed under reduced pressure, and the resulting solid was washed with heptane. The resulting product was reprecipitated with a chlorobenzene/heptane mixed solvent, and then was purified by silica gel column chromatography (developing liquid: toluene/heptane=5/5 (volume ratio)). The purification product was reprecipitated with a chlorobenzene/heptane mixed solvent, and thus a compound (5.0 g) represented by formula (1-2622) was obtained.

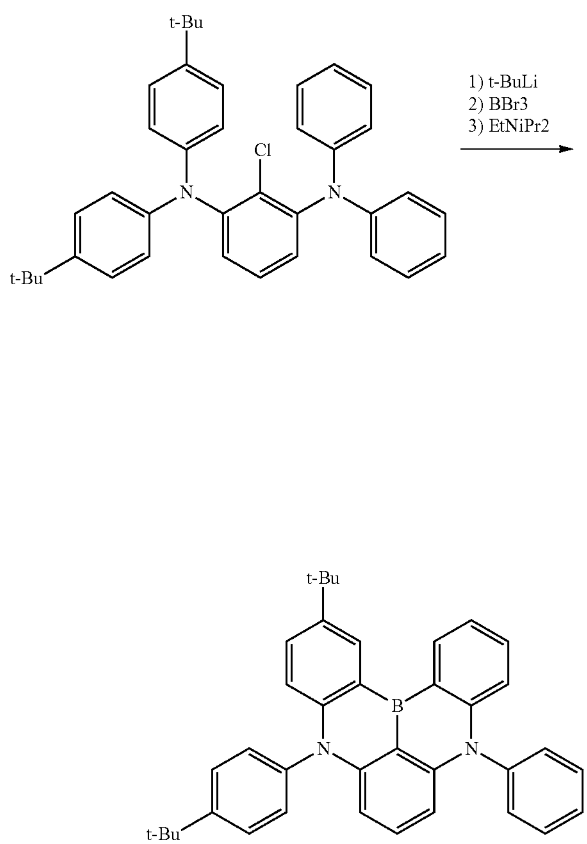

(1-2622)

Synthesis Example 20: Synthesis of Compound (1-2690)

(1-2690)

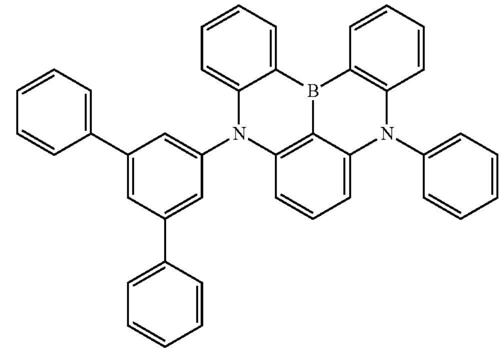

In a nitrogen atmosphere, a flask containing 5'-bromo-1,1',3',1"-terphenyl (15.0 g), aniline (5.4 g), Pd-132 (0.3 g), NaOtBu (7.0 g), and xylene (80 ml) was heated and stirred for two hours at 120° C. The reaction liquid was cooled to room temperature, subsequently water and ethyl acetate were added thereto, and the mixture was partitioned. The organic layer was concentrated under reduced pressure. Subsequently, the resulting product was purified using a silica gel short pass column (developing liquid: toluene/heptane=5/5 (volume ratio)), and thus N-phenyl-[1,1',3',1"-terphenyl]-5'-amine (15.0 g) was obtained.

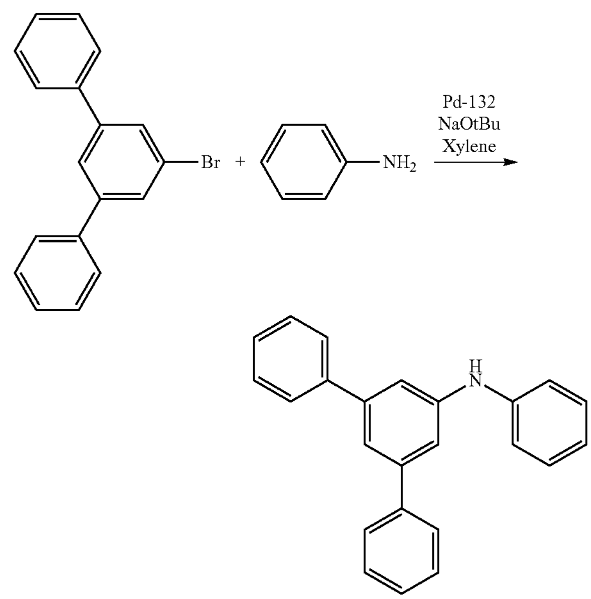

In a nitrogen atmosphere, a flask containing 2,3-dichloro-N,N-diphenylaniline (12.0 g), N-phenyl-[1,1',3',1"-terphenyl]-5'-amine (15.0 g), Pd-132 (0.25 g), NaOtBu (5.1 g), and xylene (80 ml) was heated and stirred for one hour at 120° C. The reaction liquid was cooled to room temperature, subsequently water and ethyl acetate were added thereto, and the mixture was partitioned. The organic layer was concentrated under reduced pressure. Subsequently, purification was performed with a silica gel column (developing solution: toluene/heptane (volume ratio) was gradually changed from 3/7 to 5/5) to obtain $N^1$-([1,1',3',1"-terphenyl]-5'-yl)-2-chloro-$N^1$,$N^3$,$N^3$-triphenylbenzene-1,3-diamine (18.0 g).

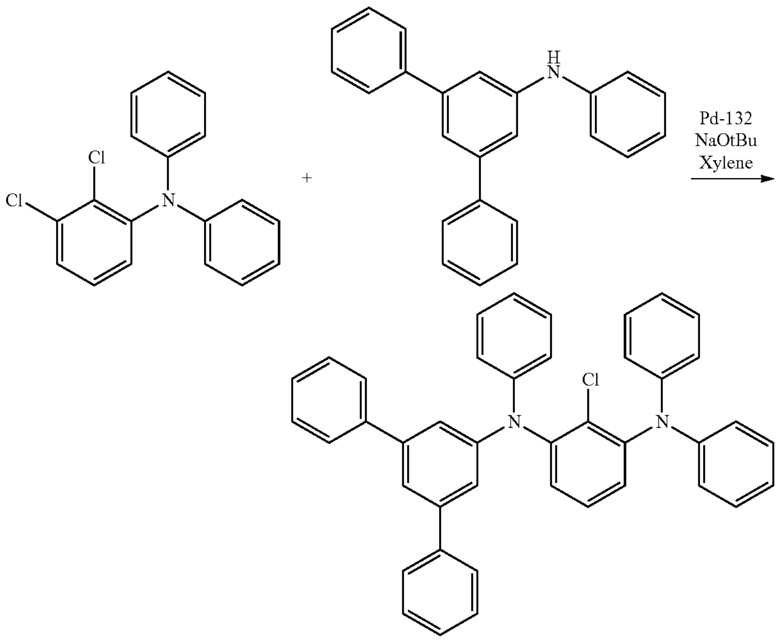

A 1.7 M t-butyllithium pentane solution (35.5 ml) was put into a flask containing $N^1$-([1,1',3',1"-terphenyl]-5'-yl)-2-chloro-$N^1$,$N^3$,$N^3$-triphenylbenzene-1,3-diamine (18.0 g) and t-butylbenzene (80 ml) in a nitrogen atmosphere, while the flask was cooled in an ice bath. After completion of dropwise addition, the temperature was raised to 60° C., the mixture was stirred for 0.5 hours, and then a component having a boiling point lower than t-butylbenzene was distilled off under reduced pressure. The mixture was cooled to −50° C., boron tribromide (15.0 g) was added thereto, and the temperature of the mixture was raised to room temperature. The mixture was cooled again in an ice bath, and N,N-diisopropylethylamine (7.8 g) was added thereto. The mixture was stirred at room temperature until heat generation was settled, subsequently the temperature was raised to 120° C., and the mixture was heated and stirred for 1.5 hours. The reaction liquid was cooled to room temperature, an aqueous solution of sodium acetate that had been cooled in an ice bath and then ethyl acetate were added thereto, and the mixture was partitioned. Concentration was performed under reduced pressure, and the resulting oil was purified by silica gel column chromatography (developing solution: toluene/heptane (volume ratio) was gradually changed from 4/6 to 5/5). The purification product was concentrated, and ethyl acetate was added thereto to precipitate a precipitate. Heptane was added thereto, followed by filtration. The resulting product was concentrated, was dissolved in toluene, and was reprecipitated twice with a toluene/ethyl acetate/heptane mixed solvent. The precipitated solid was washed with heptane, and was heated and dried at 160° C. under vacuum. The resulting product was further purified by sublimation, and thus a compound (8.7 g) represented by formula (1-2690) was obtained.

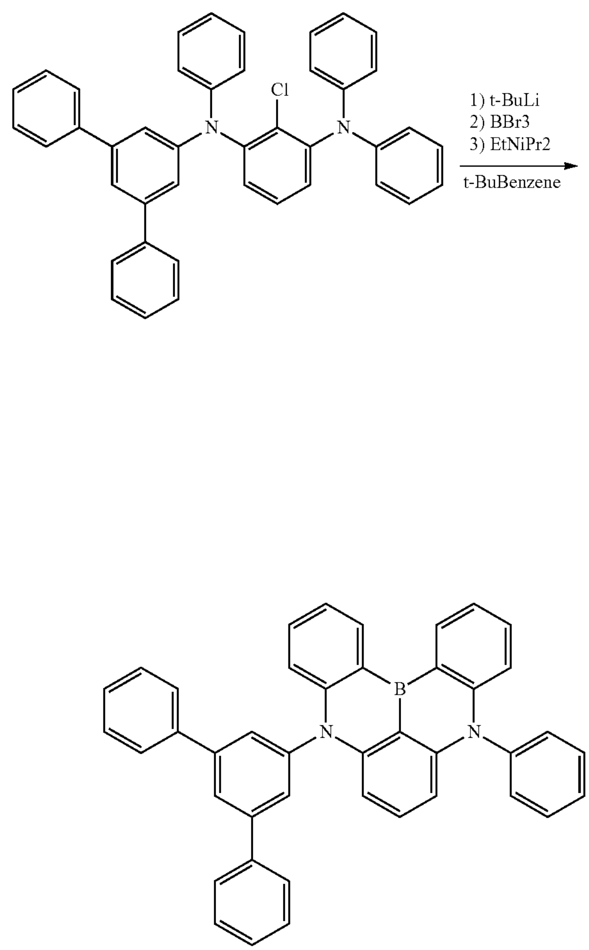

(1-2690)

Synthesis Example 21: Synthesis of Compound (B-1-102-72)

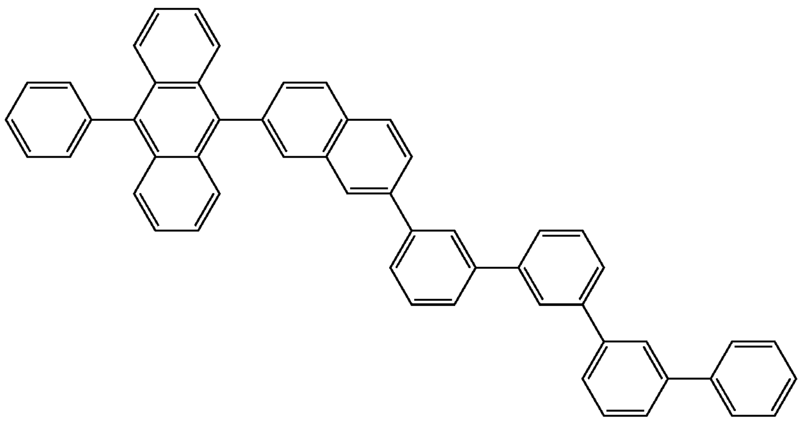

(B-1-102-72)

7-(10-phenylanthracen-9-yl) naphthalen-2-yltrifluoromethanesulfonate) (2.51 g, 1.0 eq), P4Bpin (2.11 g, 4.74 mmol, 1.0 eq.), potassium phosphate (2.01 g, 2.0 eq.), and tetrakis (triphenylphosphine) palladium(0) (0.16 g, 0.03 eq.) were weighed and put into a 100 mL three-necked round bottom flask, and degassing under reduced pressure/Ar purge was performed five times. Degassing under reduced pressure and nitrogen purge were performed sufficiently. Thereafter, toluene (16 mL), ethanol (4 mL), and water (4 mL) were added thereto in a nitrogen atmosphere, and the mixture was refluxed and stirred at 74° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through a silica gel short column chromatography using toluene as an eluent, and a fraction containing a desired product was collected and concentrated under reduced pressure. The resulting oil was caused to pass through a silica gel column chromatography using heptane-toluene (3:1 (volume ratio)) as an eluent, and a fraction containing a desired product was collected and concentrated under reduced pressure. Recrystallization of the resulting transparent oil was performed using toluene as a good solvent and methanol or heptane as a poor solvent, and a white powder was collected. The resulting powder was purified by sublimation at 340° C. under a reduced pressure of $2\times10^{-4}$ Pa or less to obtain a compound represented by formula (B-1-102-72) as a yellow-green glassy solid (yield: 1.20 g, yield: 37.0%, purity: 99.9% or more (HPLC)).

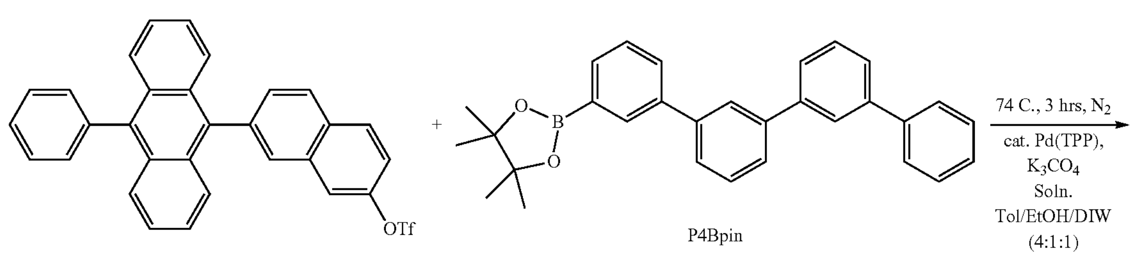

-continued

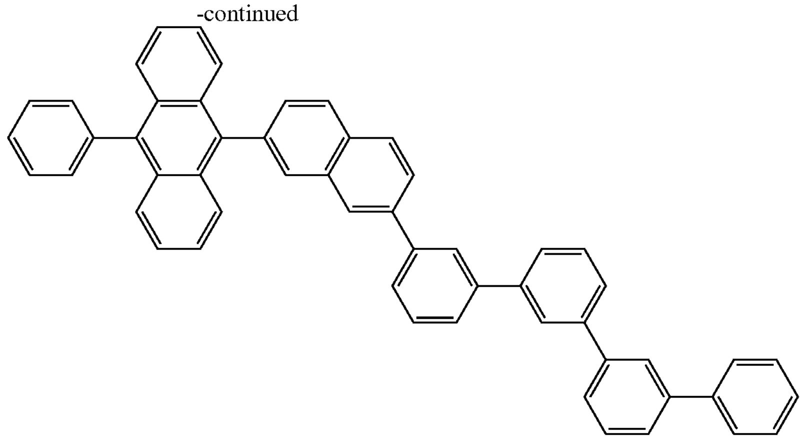

(B-1-102-72)

Synthesis Example 22: Synthesis of Compound (B-1-102-62)

(B-1-102-62)

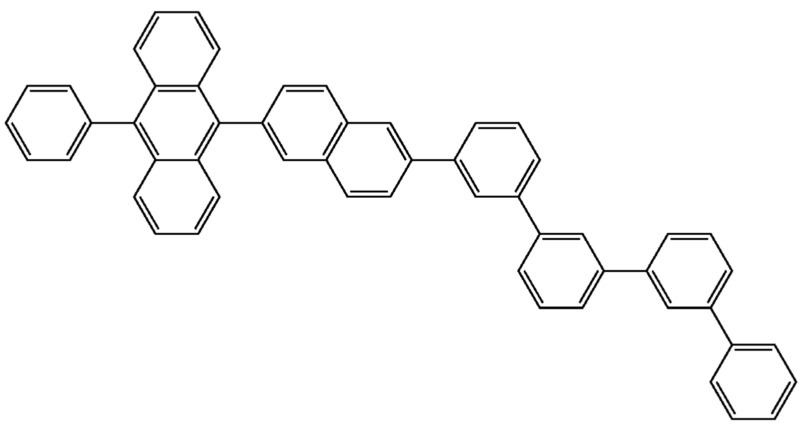

6-(10-phenylanthracen-9-yl) naphthalen-2-yltrifluoromethanesulfonate (2.64 g, 1.0 eq), P4Bpin (2.20 g, 4.96 mmol, 1.0 eq.), potassium phosphate (2.11 g, 2.0 eq.), and tetrakis (triphenylphosphine) palladium(0) (0.17 g, 0.03 eq.) were weighed and put into a 100 mL three-necked round bottom flask, and degassing under reduced pressure/Ar purge was performed five times. Degassing under reduced pressure and nitrogen purge were performed sufficiently. Thereafter, toluene (16 mL), ethanol (4 mL), and water (4 mL) were added thereto in a nitrogen atmosphere, and the mixture was refluxed and stirred at 72° C. After three hours, heating was stopped, and the temperature of the reaction liquid was returned to room temperature. Extraction was performed with toluene three times, the organic solvent layers were then unified, anhydrous sodium sulfate was added thereto, and the mixture was allowed to stand for a while. Sodium sulfate was filtered off, and the solution was concentrated under reduced pressure. The resulting oil was caused to pass through a silica gel short column chromatography using toluene as an eluent, and a fraction containing a desired product was collected and concentrated under reduced pressure. The resulting oil was caused to pass through a silica gel column chromatography using heptane-toluene (3:1 (volume ratio)) as an eluent, and a fraction containing a desired product was collected and concentrated under reduced pressure. The resulting powder was purified by sublimation at 340° C. under a reduced pressure of $2\times10^{-4}$ Pa or less to obtain a compound represented by formula (B-1-102-62) as a yellow-green glassy solid (yield: 1.26 g, yield: 37.0%, purity: 99.9% or more (HPLC)).

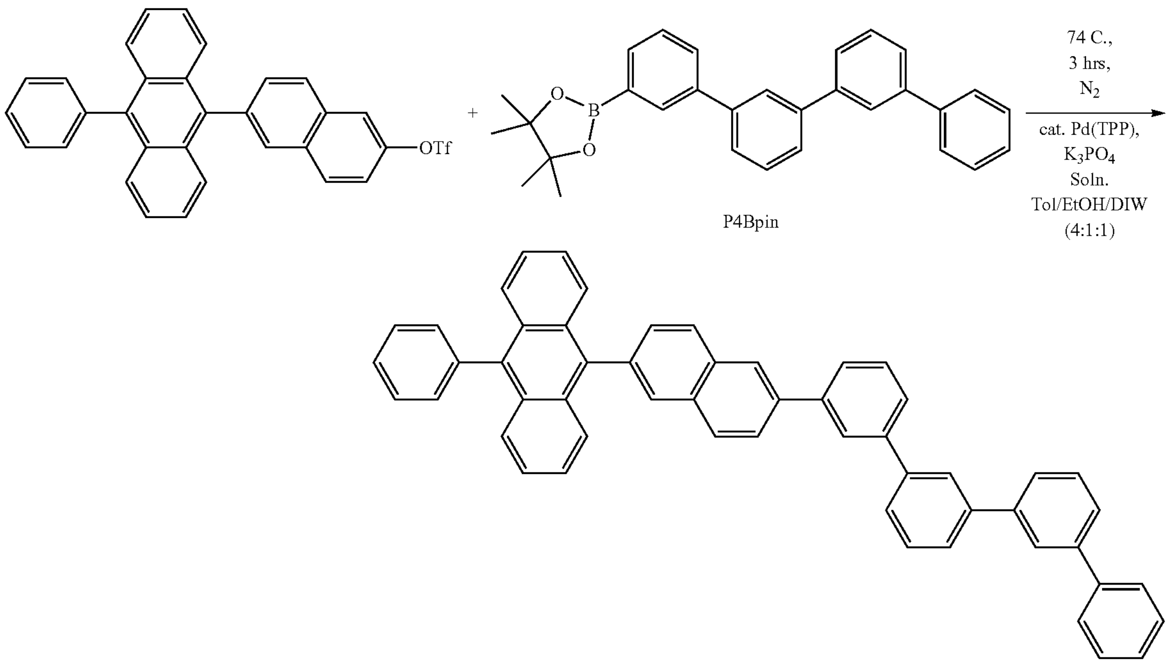

(B-1-102-62)

<Preparation of Light Emitting Layer-Forming Composition (1)>

Light emitting layer-forming compositions according to Examples 1 to 15 were prepared. Compounds used for preparation of the compositions are indicated below.

Example 1

A light emitting layer-forming composition was prepared by stirring the following components until a uniform solution was obtained.

| | |
|---|---|
| Compound (1-1152) | 0.05% by weight |
| Compound (B-1-5) | 0.95% by weight |
| Toluene | 70.00% by weight |
| Decalin | 29.00% by weight |

A coating film obtained by spin-coating the prepared light emitting layer-forming composition on a glass substrate had no film defect and had excellent coating film formability. When a fluorescence spectrum (Hitachi fluorescence spectrophotometer F-7000, excitation wavelength 360 nm) of the coating film was measured, deep blue light emission with a peak wavelength of 467 nm and full width at half maximum (FWHM) of 28 nm was observed. When a fluorescence quantum yield was measured using a coating film prepared on a quartz substrate, a high fluorescence quantum yield was obtained.

Example 2

A light emitting layer-forming composition can be prepared by stirring the following components until a uniform solution is obtained.

| | |
|---|---|
| Compound (1-1152) | 0.05% by weight |
| Compound (B-1-5-2) | 0.95% by weight |

-continued

| | |
|---|---|
| Toluene | 70.00% by weight |
| Decalin | 29.00% by weight |

Example 3

A light emitting layer-forming composition can be prepared by stirring the following components until a uniform solution is obtained.

| | |
|---|---|
| Compound (1-1160-1) | 0.05% by weight |
| Compound (B-1-5-2) | 0.95% by weight |
| Toluene | 70.00% by weight |
| Decalin | 29.00% by weight |

Example 4

A light emitting layer-forming composition can be prepared by stirring the following components until a uniform solution is obtained.

| | |
|---|---|
| Compound (1-1160-1) | 0.05% by weight |
| Compound (B-1-101-1) | 0.95% by weight |
| Toluene | 70.00% by weight |
| Decalin | 29.00% by weight |

Example 5

A light emitting layer-forming composition can be prepared by stirring the following components until a uniform solution is obtained.

| | |
|---|---|
| Compound (1-1160-1) | 0.05% by weight |
| Compound (B-1-101-2) | 0.95% by weight |
| Toluene | 70.00% by weight |
| Decalin | 29.00% by weight |

Example 6

A light emitting layer-forming composition can be prepared by stirring the following components until a uniform solution is obtained.

| | |
|---|---|
| Compound (1-1152) | 0.05% by weight |
| Compound (B-5-91) | 0.95% by weight |
| Anisole | 50.00% by weight |
| Decalin | 49.00% by weight |

Example 7

A light emitting layer-forming composition can be prepared by stirring the following components until a uniform solution is obtained.

| | |
|---|---|
| Compound (1-1160-1) | 0.05% by weight |
| Compound (B-5-1-1) | 0.95% by weight |
| Anisole | 50.00% by weight |
| Decalin | 49.00% by weight |

Example 8

A light emitting layer-forming composition can be prepared by stirring the following components until a uniform solution is obtained.

| | |
|---|---|
| Compound (1-1160-1) | 0.05% by weight |
| Compound (B-5-1-2) | 0.95% by weight |
| Anisole | 50.00% by weight |
| Decalin | 49.00% by weight |

Example 9

A light emitting layer-forming composition can be prepared by stirring the following components until a uniform solution is obtained.

| | |
|---|---|
| Compound (1-1160-1) | 0.05% by weight |
| Compound (B-5-1-3) | 0.95% by weight |
| Anisole | 50.00% by weight |
| Decalin | 49.00% by weight |

Example 10

A light emitting layer-forming composition can be prepared by stirring the following components until a uniform solution is obtained.

| | |
|---|---|
| Compound (1-422) | 0.05% by weight |
| Compound (B-1-5) | 0.95% by weight |
| Orthodichlorobenzene | 99.00% by weight |

Example 11

A light emitting layer-forming composition can be prepared by stirring the following components until a uniform solution is obtained.

| | |
|---|---|
| Compound (1-422) | 0.05% by weight |
| Compound (B-1-5-2) | 0.95% by weight |
| Orthodichlorobenzene | 99.00% by weight |

Example 12

A light emitting layer-forming composition can be prepared by stirring the following components until a uniform solution is obtained.

| | |
|---|---|
| Compound (1-2679) | 0.05% by weight |
| Compound (B-1-5-2) | 0.95% by weight |
| Toluene | 70.00% by weight |
| Decalin | 29.00% by weight |

Example 13

A light emitting layer-forming composition can be prepared by stirring the following components until a uniform solution is obtained.

| | |
|---|---|
| Compound (1-1210-1) | 0.05% by weight |
| Compound (B-1-5-2) | 0.95% by weight |
| Toluene | 70.00% by weight |
| Decalin | 29.00% by weight |

Example 14

A light emitting layer-forming composition can be prepared by stirring the following components until a uniform solution is obtained.

| | |
|---|---|
| Compound (1-1210-2) | 0.05% by weight |
| Compound (B-1-5-2) | 0.95% by weight |
| Toluene | 70.00% by weight |
| Decalin | 29.00% by weight |

Example 15

A light emitting layer-forming composition can be prepared by stirring the following components until a uniform solution is obtained.

| | |
|---|---|
| Compound (1-1210-2) | 0.05% by weight |
| Compound (B-1-5-1) | 0.95% by weight |
| Toluene | 70.00% by weight |
| Decalin | 29.00% by weight |

<Evaluation of Coating Film Formability>

A light emitting layer-forming composition was subjected to coating film formation onto a 4×4 cm glass substrate by a spin coating method, and the degree of film defects was evaluated. A product in which a film was not formed on the substrate after film formation and a product with a pinhole in a coating film were evaluated as "poor", and a product without a pinhole was evaluated as "good".

The light emitting layer-forming composition of the present invention had excellent coating film formability. The light emitting layer-forming composition containing a compound represented by general formula (A) and compounds represented by general formulas (B-1) to (B-6), substituted by a group represented by general formula (FG-1), a group represented by formula (FG-2), or an alkyl having 1 to 24 carbon atoms exhibits better coating film formability than a compound not substituted by these groups. Furthermore, when both a host compound and a dopant compound are substituted by a group represented by general formula (FG-1), a group represented by formula (FG-2), or an alkyl having 1 to 24 carbon atoms, a higher fluorescence quantum yield is obtained than a case where only either the host compound or the dopant compound is substituted by these groups.

<Evaluation of in-Plane Orientation>

In-plane orientation of a host compound in a vapor deposited film or a coating film can be calculated by evaluating anisotropy of a refractive index and an extinction coefficient with an ellipsometer (Daisuke Yokoyama, Akio Sakaguchi, Michio Suzuki, Chihaya Adachi, Applied Physics Letters, 96, 073302 (2010), Daisuke Yokoyama, Journal of Materials Chemistry, 21, 19187-19202 (2011)). Furthermore, in-plane orientation of a light-emitting compound in a vapor deposited film or a coating film can be calculated by measuring angle dependence of a light emission intensity of p-polarized light of the light-emitting compound, and comparing a measurement result with a simulation result (Jorg Frischeisen, Daisuke Yokoyama, Chihaya Adachi, Wolfgang Brutting, Applied Physics Letters, 96, 073302 (2010)

<Preparation and Evaluation of Organic EL Element>

Example 16 describes a method for manufacturing an organic EL element using a crosslinkable hole transport material. Example 17 describes a method for manufacturing an organic EL element using an orthogonal solvent system. Table 1 indicates a material configuration of each of layers in an organic EL element manufactured.

TABLE 1

| | Hole Injection layer | Hole Transport layer | Light emitting layer (20 nm) | | | Electron Transport layer | Negative electrode (1 nm/ |
|---|---|---|---|---|---|---|---|
| | (40 nm) | (30 nm) | Host | Dopant | Composition | (30 nm) | 100 nm) |
| Example 16 | PEDOT: PSS | OTPD | B-1-5-2 | 1-1160-1 | Example 3 | ET1 | LiF/Al |
| Example 17 | PEDOT: PSS | PCz | B-1-5-2 | 1-1160-1 | Example 3 | ET1 | LiF/Al |

The structures of "PEDOT:PSS", "OTPD", "PCz", and "ET1" in Table 1 are indicated below.

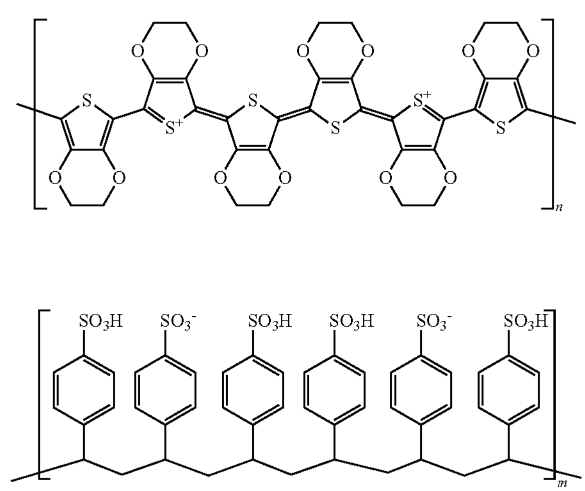

PEDOT:PSS

-continued

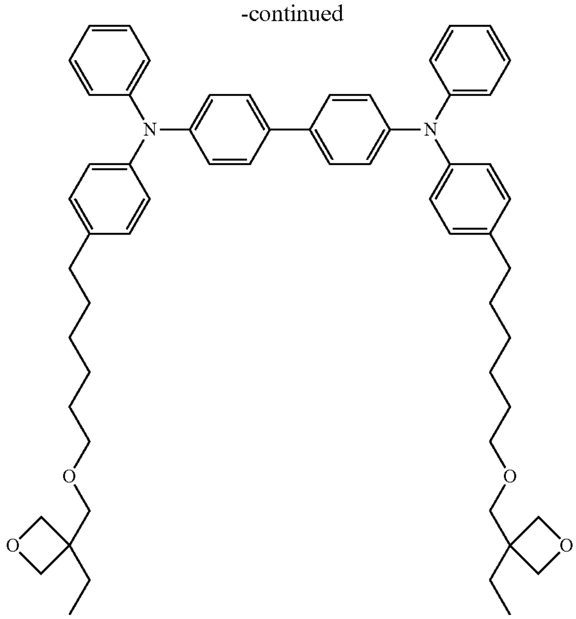

OTPD

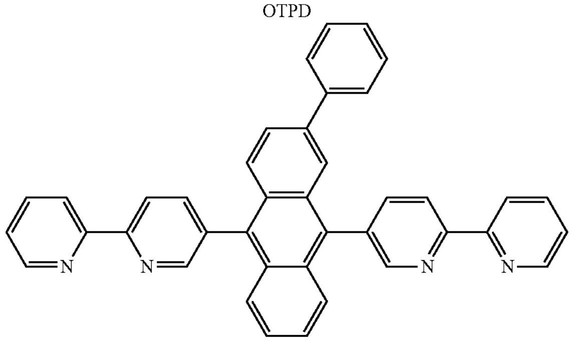

ET1

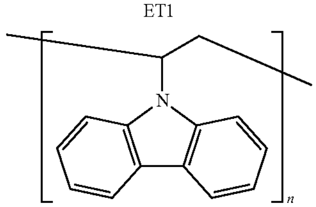

PCz

<Pedot:Pss Solution>

A commercially available PEDOT:PSS solution (Clevios™ P VP AI4083, aqueous dispersion of PEDOT:PSS, manufactured by Heraeus Holdings) was used.

<Preparation of OTPD Solution>

OTPD (LT-N159, manufactured by Luminescence Technology Corp.) and IK-2 (photocation polymerization initiator, manufactured by Sun Apro Co.) were dissolved in toluene, and an OTPD solution having an OTPD concentration of 0.7 wt % and IK-2 concentration of 0.007 wt % was prepared.

<Preparation of PCz Solution>

PCz (polyvinylcarbazole) was dissolved in dichlorobenzene to prepare a 0.7 wt % PCz solution.

Example 16

A PEDOT:PSS solution was spin-coated on a glass substrate on which ITO had been vapor-deposited so as to have a thickness of 150 nm, and was baked on a hot plate at 200° C. for one hour to form a PEDOT:PSS film with a film thickness of 40 nm (hole injection layer). Subsequently, the OTPD solution was spin-coated and dried on a hot plate at 80° C. for 10 minutes. Exposure was performed with an exposure machine at an exposure intensity of 100 mJ/cm$^2$, and baking was performed on a hot plate at 100° C. for one hour to form an OTPD film with a thickness of 30 nm, insoluble in a solution (hole transport layer). Subsequently, the light emitting layer-forming composition prepared in Example 3 was spin-coated and baked on a hot plate at 120° C. for one hour to form a light emitting layer with a thickness of 20 nm.

The prepared multilayer film was fixed to a substrate holder of a commercially available vapor deposition apparatus (manufactured by Showa Shinku Co., Ltd.). A molybdenum deposition boat containing ET1, a molybdenum deposition boat containing LiF, and a tungsten deposition boat containing aluminum were attached thereto. A vacuum chamber was evacuated to $5\times10^4$ Pa. Thereafter, the deposition boat containing ET1 was heated, and vapor deposition was performed so as to obtain a film thickness of 30 nm to form an electron transport layer. A deposition rate during formation of the electron transport layer was 1 nm/sec. Thereafter, the vapor deposition boat containing LiF was heated, and vapor deposition was performed at a deposition rate of 0.01 to 0.1 nm/sec so as to obtain a film thickness of 1 nm. Subsequently, the boat containing aluminum was heated, and vapor deposition was performed so as to obtain a film thickness of 100 nm. Thus, a negative electrode was formed. In this way, an organic EL element was obtained.

Example 17

A PEDOT:PSS solution was spin-coated on a glass substrate on which ITO had been vapor-deposited so as to have a thickness of 150 nm, and was baked on a hot plate at 200° C. for one hour to form a PEDOT:PSS film with a film thickness of 40 nm (hole injection layer). Subsequently, a PCz solution was spin-coated and baked on a hot plate at 120° C. for one hour to form a PCz film having a thickness of 30 nm (hole transport layer) Subsequently, the light emitting layer-forming composition prepared in Example 3 was spin-coated and baked on a hot plate at 120° C. for one hour to form a light emitting layer with a thickness of 20 nm. Subsequently, an electron transport layer and a negative electrode were vapor-deposited in a similar manner to Example 16 to obtain an organic EL element.

<Preparation of Light Emitting Layer-Forming Composition (2)>

Light emitting layer-forming compositions according to Examples 18 to 38 and Comparative Example 1 were prepared. Compounds used for preparation of the compositions are indicated below.

Example 18

A light emitting layer-forming composition was prepared by stirring the following components until a uniform solution was obtained.

| | |
|---|---|
| Compound (1-1152) | 0.05% by weight |
| Compound (B-1-5) | 0.95% by weight |
| Toluene | 69.70% by weight |
| Tetrahydronaphthalene | 29.30% by weight |

Example 19

A light emitting layer-forming composition was prepared by stirring the following components until a uniform solution was obtained.

| | |
|---|---|
| Compound (1-1152) | 0.03% by weight |
| Compound (B-1-5) | 0.97% by weight |
| Toluene | 69.70% by weight |
| Tetrahydronaphthalene | 29.30% by weight |

Example 20

A light emitting layer-forming composition was prepared by stirring the following components until a uniform solution was obtained.

| | |
|---|---|
| Compound (1-1152) | 0.01% by weight |
| Compound (B-1-5) | 0.99% by weight |
| Toluene | 69.70% by weight |
| Tetrahydronaphthalene | 29.30% by weight |

Example 21

A light emitting layer-forming composition was prepared by stirring the following components until a uniform solution was obtained.

| | |
|---|---|
| Compound (1-2679) | 0.05% by weight |
| Compound (B-1-5) | 0.95% by weight |
| Toluene | 69.70% by weight |
| Tetrahydronaphthalene | 29.30% by weight |

Example 22

A light emitting layer-forming composition was prepared by stirring the following components until a uniform solution was obtained.

| | |
|---|---|
| Compound (1-2679) | 0.05% by weight |
| Compound (B-1-5) | 0.95% by weight |
| O-xylene | 49.50% by weight |
| Cyclohexylbenzene | 49.50% by weight |

Example 23

A light emitting layer-forming composition was prepared by stirring the following components until a uniform solution was obtained.

| | |
|---|---|
| Compound (1-2680) | 0.10% by weight |
| Compound (B-1-5) | 1.90% by weight |
| Cyclohexylbenzene | 29.40% by weight |
| 3-Phenoxytoluene | 68.60% by weight |

Example 24

A light emitting layer-forming composition was prepared by stirring the following components until a uniform solution was obtained.

| | |
|---|---|
| Compound (1-2680) | 0.10% by weight |
| Compound (B-1-102-72) | 1.90% by weight |
| Cyclohexylbenzene | 29.40% by weight |
| 3-Phenoxytoluene | 68.60% by weight |

Example 25

A light emitting layer-forming composition was prepared by stirring the following components until a uniform solution was obtained.

| | |
|---|---|
| Compound (1-2676) | 0.10% by weight |
| Compound (B-1-5) | 1.90% by weight |
| Cyclohexylbenzene | 29.40% by weight |
| 3-Phenoxytoluene | 68.60% by weight |

Example 26

A light emitting layer-forming composition was prepared by stirring the following components until a uniform solution was obtained.

| | |
|---|---|
| Compound (1-2676) | 0.10% by weight |
| Compound (B-1-5) | 1.90% by weight |
| O-xylene | 49.00% by weight |
| Cyclohexylbenzene | 49.00% by weight |

Example 27

A light emitting layer-forming composition was prepared by stirring the following components until a uniform solution was obtained.

| | |
|---|---|
| Compound (1-2626) | 0.10% by weight |
| Compound (B-1-5) | 1.90% by weight |
| Cyclohexylbenzene | 29.40% by weight |
| 3-Phenoxytoluene | 68.60% by weight |

Example 28

A light emitting layer-forming composition was prepared by stirring the following components until a uniform solution was obtained.

| | |
|---|---|
| Compound (1-2626) | 0.10% by weight |
| Compound (B-1-5) | 1.90% by weight |
| O-xylene | 49.00% by weight |
| Cyclohexylbenzene | 49.00% by weight |

Example 29

A light emitting layer-forming composition was prepared by stirring the following components until a uniform solution was obtained.

| | |
|---|---|
| Compound (1-2622) | 0.10% by weight |
| Compound (B-1-5) | 1.90% by weight |

-continued

| | |
|---|---|
| Cyclohexylbenzene | 29.40% by weight |
| 3-Phenoxytoluene | 68.60% by weight |

Example 30

A light emitting layer-forming composition was prepared by stirring the following components until a uniform solution was obtained.

| | |
|---|---|
| Compound (1-2622) | 0.10% by weight |
| Compound (B-1-5) | 1.90% by weight |
| O-xylene | 49.00% by weight |
| Cyclohexylbenzene | 49.00% by weight |

Example 31

A light emitting layer-forming composition was prepared by stirring the following components until a uniform solution was obtained.

| | |
|---|---|
| Compound (1-2622) | 0.10% by weight |
| Compound (B-1-102-72) | 1.90% by weight |
| Cyclohexylbenzene | 29.40% by weight |
| 3-Phenoxytoluene | 68.60% by weight |

Example 32

A light emitting layer-forming composition was prepared by stirring the following components until a uniform solution was obtained.

| | |
|---|---|
| Compound (1-2622) | 0.06% by weight |
| Compound (B-1-102-72) | 1.94% by weight |
| Cyclohexylbenzene | 29.40% by weight |
| 3-Phenoxytoluene | 68.60% by weight |

Example 33

A light emitting layer-forming composition was prepared by stirring the following components until a uniform solution was obtained.

| | |
|---|---|
| Compound (1-2622) | 0.02% by weight |
| Compound (B-1-102-72) | 1.98% by weight |
| Cyclohexylbenzene | 29.40% by weight |
| 3-Phenoxytoluene | 68.60% by weight |

Example 34

A light emitting layer-forming composition was prepared by stirring the following components until a uniform solution was obtained.

| | |
|---|---|
| Compound (1-2622) | 0.10% by weight |
| Compound (B-1-102-72) | 1.90% by weight |

-continued

| | |
|---|---|
| O-xylene | 49.00% by weight |
| Cyclohexylbenzene | 49.00% by weight |

Example 35

A light emitting layer-forming composition was prepared by stirring the following components until a uniform solution was obtained.

| | |
|---|---|
| Compound (1-2622) | 0.10% by weight |
| Polyvinylcarbazole | 0.10% by weight |
| Compound (B-1-5) | 1.80% by weight |
| Cyclohexylbenzene | 29.40% by weight |
| 3-Phenoxytoluene | 68.60% by weight |

Example 36

A light emitting layer-forming composition was prepared by stirring the following components until a uniform solution was obtained.

| | |
|---|---|
| Compound (1-2622) | 0.10% by weight |
| Compound (B-1-102-62) | 1.90% by weight |
| Cyclohexylbenzene | 29.40% by weight |
| 3-Phenoxytoluene | 68.60% by weight |

Example 37

A light emitting layer-forming composition was prepared by stirring the following components until a uniform solution was obtained.

| | |
|---|---|
| Compound (1-2690) | 0.10% by weight |
| Compound (B-1-102-72) | 1.90% by weight |
| Cyclohexylbenzene | 29.40% by weight |
| 3-Phenoxytoluene | 68.60% by weight |

Example 38

A light emitting layer-forming composition was prepared by stirring the following components until a uniform solution was obtained.

| | |
|---|---|
| Compound (1-2690) | 0.10% by weight |
| Compound (B-1-102-62) | 1.90% by weight |
| Cyclohexylbenzene | 29.40% by weight |
| 3-Phenoxytoluene | 68.60% by weight |

Comparative Example 1

A light emitting layer-forming composition was prepared by stirring the following components until a uniform solution was obtained.

| | |
|---|---|
| Compound (BD-R1) | 0.10% by weight |
| Compound (B-1-5) | 1.90% by weight |

-continued

| | |
|---|---|
| Cyclohexylbenzene | 29.40% by weight |
| 3-Phenoxytoluene | 68.60% by weight |

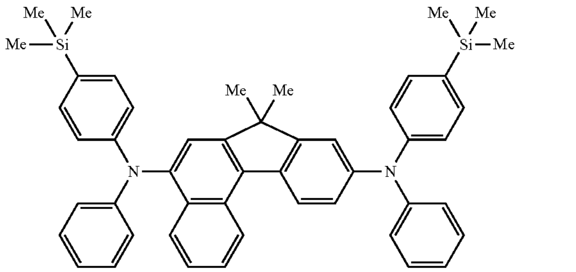

BD-R1

<Evaluation of Coating Film Formability>

Each of the light emitting layer-forming compositions according to Examples 18 to 38 and Comparative Example 1 was subjected to coating film formation onto a 4×4 cm glass substrate by a spin coating method, and the degree of film defects was evaluated. After film formation, a product in which a film was not formed on the substrate and a product in which a pinhole could be visually confirmed in a coating film were evaluated as "x", and a product in which a pinhole could not be visually confirmed was evaluated as "o". Furthermore, a coating film which was evaluated as "o" was caused to emit light using a UV lamp, and then was visually observed. A product in which no unevenness of light emission was observed at an end portion of the substrate was evaluated as "O". Table 3 indicates results thereof.

<Evaluation of Light Emitting Characteristics>

A film of each of the light emitting layer-forming compositions according to Examples 18 to 38 and Comparative Example 1 was formed on a glass (EagleXG) substrate (40 mm×40 mm) by a spin coating method. A fluorescence spectrum (Hitachi fluorescence spectrophotometer F-7000, excitation wavelength 360 nm) of the coating film in a central portion of the substrate was measured, and maximum emission wavelength (nm) and a half width (nm) were determined. Note that the half width of the spectrum was obtained as a width between upper and lower wavelengths where the intensity was 50% with respect to the maximum emission wavelength. Furthermore, a luminescence quantum yield was measured with a fluorescence quantum yield measuring apparatus (Hamamatsu Photonics) using a glass substrate (10×10 mm) with a coating film, having a central portion cut out, with reference to a glass (Eagle XG) substrate (10×10 mm)

TABLE 2

| | Solid content concentration | Host | Dopant (Concentration) | Solvent | Coatability | Maximum emission wavelength | Half width | Luminescence quantum yield |
|---|---|---|---|---|---|---|---|---|
| Example 18 | 1 | B-1-5 | 1-1152 (5) | TL + THN | ○ | 468 | 27 | +0.20 |
| Example 19 | 1 | B-1-5 | 1-1152 (3) | TL + THN | ○ | 467 | 26 | +0.42 |
| Example 20 | 1 | B-1-5 | 1-1152 (1) | TL + THN | ○ | 467 | 26 | +0.66 |
| Example 21 | 1 | B-1-5 | 1-2679 (5) | TL + THN | ○ | 463 | 27 | +0.06 |
| Example 22 | 1 | B-1-5 | 1-2679 (5) | XY + CHB | ○ | 464 | 28 | +/−0.00 |
| Example 23 | 2 | B-1-5 | 1-2980 (5) | CHB + PT | ○ | 453 | 26 | +0.30 |
| Example 24 | 2 | B-1-102-72 | 1-2980 (5) | CHB + PT | ⊙ | 453 | 26 | +0.38 |
| Example 25 | 2 | B-1-5 | 1-2676 (5) | CHB + PT | ○ | 469 | 27 | +0.26 |
| Example 26 | 2 | B-1-5 | 1-2676 (5) | XY + CHB | ○ | 469 | 27 | +0.24 |
| Example 27 | 2 | B-1-5 | 1-2626 (5) | CHB + PT | ○ | 463 | 27 | +0.04 |
| Example 28 | 2 | B-1-5 | 1-2626 (5) | XY + CHB | ○ | 463 | 27 | +0.04 |
| Example 29 | 2 | B-1-5 | 1-2622 (5) | CHB + PT | ○ | 462 | 27 | +0.20 |
| Example 30 | 2 | B-1-5 | 1-2622 (5) | XY + CHB | ○ | 462 | 27 | +0.20 |
| Example 31 | 2 | B-1-102-72 (5) | 1-2622 | CHB + PT | ⊙ | 463 | 29 | +0.24 |
| Example 32 | 2 | B-1-102-72 | 1-2622 (3) | CHB + PT | ⊙ | 463 | 28 | +0.40 |
| Example 33 | 2 | B-1-102-72 | 1-2622 (1) | CHB + PT | ⊙ | 462 | 28 | +0.58 |
| Example 34 | 2 | B-1-102-72 | 1-2622 (5) | XY + CHB | ⊙ | 463 | 29 | +0.24 |
| Example 35 | 2 | B-1-5 + PBC | 1-2622 (5) | CHB + PT | ⊙ | 465 | 31 | +/−0.00 |
| Example 36 | 2 | B-1-102-62 | 1-2622 (5) | CHB + PT | ⊙ | 464 | 30 | +0.22 |
| Example 37 | 2 | B-1-102-72 | 1-2690 (5) | CHB + PT | ⊙ | 456 | 30 | +0.30 |
| Example 38 | 2 | B-1-102-62 | 1-2690 (5) | CHB + PT | ⊙ | 457 | 31 | +0.22 |
| Comparative Example 1 | 2 | B-1-5 | BD-R1 (5) | CHB + PT | ○ | 457 | 55 | (Standard) |

In Table 2, "PBC" represents polyvinylcarbazole, "TL" represents toluene, "THN" represents tetrahydronaphthalene, "CHB" represents cyclohexylbenzene, "PT" represents 3-phenoxytoluene, and "XY" represents o-xylene. The unit of a solid content concentration is % by weight, the concentration (% by weight) of a dopant is a concentration in a solid content, and the luminescence quantum yield is a numerical value based on Comparative Example 1.

INDUSTRIAL APPLICABILITY

The polycyclic aromatic compound of the present invention has excellent solubility, film formability, wet coatability, thermal stability, and in-plane orientation, and therefore can provide a light emitting layer-forming composition having good film formability by a wet film formation method. Furthermore, use of a composition containing this polycyclic aromatic compound can provide an excellent organic EL element.

REFERENCE SIGNS LIST

100 Organic electroluminescent element (organic EL element)
101 Substrate
102 Positive electrode
103 Hole injection layer
104 Hole transport layer
105 Light emitting layer
106 Electron transport layer
107 Electron injection layer
108 Negative electrode
110 Substrate
120 Electrode
130 Coating film
140 Coating film
150 Light emitting layer
200 Bank
300 Ink jet head
310 Droplet of ink

The invention claimed is:

1. A polycyclic aromatic compound represented by the following general formula (A') or a polycyclic aromatic multimer compound having a plurality of structures represented by the following general formula (A'):

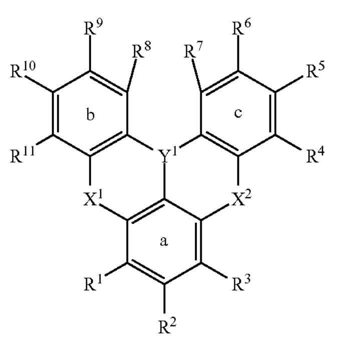

(A')

wherein in the general formula (A'), each of $R^1$ to $R^{11}$ independently represents a hydrogen atom, an aryl, a heteroaryl, a diarylamino, a diheteroarylamino, an arylheteroarylamino, or an aryloxy, while at least one hydrogen atom in these may be further substituted by an aryl, a heteroaryl, or a diarylamino, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, or an aryloxy, at least one hydrogen atom in these may be further substituted by an aryl, a heteroaryl, or a diarylamino, $Y^1$ represents B, each of $X^1$ and $X^2$ independently represents 0 or N-R, while at least one of $X^1$ and $X^2$ represents N-R, R of the N-R is an aryl or an alkyl, R in the N-R may be bonded to ring b and/or ring c with —O—, —S—, —C(—R)$_2$-, or a single bond, R in the —C(—R)$_2$—represents an alkyl having 1 to 24 carbon atoms, at least one hydrogen atom in a compound or a structure represented by the above formula (A') is substituted by a group represented by the general formula (FG-1), a group represented by the general formula (FG-2), or an alkyl having 7 to 24 carbon atoms, and at least one hydrogen atom in the compound or structure represented by the above formula (A') may be further substituted by a halogen atom or a deuterium atom, wherein the general formula (FG-1) is as follows:

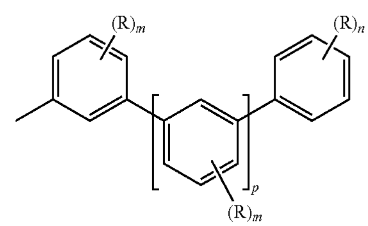

(FG-1)

wherein the above formula (FG-1), each of R's independently represents a fluorine atom, a trimethylsilyl, a trifluoromethyl, an alkyl having 1 to 24 carbon atoms, or a cycloalkyl having 3 to 24 carbon atoms, any —$CH_2$— in the alkyl may be substituted by —O—, any —$CH_2$-excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, when two adjacent R's each represent an alkyl or a cycloalkyl, these R's may be bonded to each other to form a ring, m's each independently represent an integer of 0 to 4, n represents an integer of 0 to 5, and p represents an integer of 1 to 5; and wherein the general formula (FG-2) is as follows:

(FG-2)

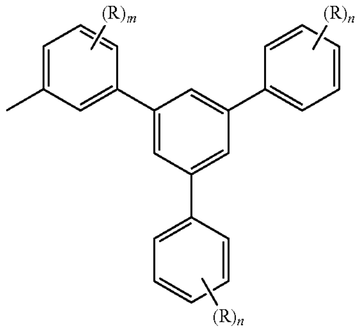

wherein in the above formula (FG-2), each of R's independently represents a fluorine atom, a trimethylsilyl, a trifluoromethyl, an alkyl having 1 to 24 carbon atoms, a cycloalkyl having 3 to 24 carbon atoms, or an aryl having 6 to 12 carbon atoms, any —$CH_2$— in the alkyl may be substituted by —O—, any-$CH_2$-excluding —$CH_2$— directly bonded to a phenyl or a phenylene in the alkyl may be substituted by an arylene having 6 to 24 carbon atoms, at least one hydrogen atom in the cycloalkyl may be substituted by an alkyl having 1 to 24 carbon atoms or an aryl having 6 to 12 carbon atoms, at least one hydrogen atom in the aryl may be substituted by an alkyl having 1 to 24 carbon atoms, when two adjacent R's each represent an alkyl or a cycloalkyl, these R's may be bonded to each other to form a ring, m represents an integer of 0 to 4, and n's each independently represent an integer of 0 to 5.

2. The polycyclic aromatic compound or the multimer thereof according to claim 1, wherein each of $R^1$ to $R^{11}$ independently represents a hydrogen atom, an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), adjacent groups among $R^1$ to $R^{11}$ may be bonded to each other to form an aryl ring having 9 to 16 carbon atoms or a heteroaryl ring having 6 to 15 carbon atoms together with ring a, ring b, or ring c, at least one hydrogen atom in the ring thus formed may be substituted by an aryl having 6 to 30 carbon atoms, a heteroaryl having 2 to 30 carbon atoms or a diarylamino (the aryl is an aryl having 6 to 12 carbon atoms), at least one hydrogen atom in these may be further substituted by an aryl having 6 to 30 carbon atoms, a heteroaryl having 2 to 30 carbon atoms or a diarylamino (the aryl is an aryl having 6 to 12 carbon atoms), $Y^1$ represents B, each of $X^1$ and $X^2$ independently represents 0 or N-R, while at least one of $X^1$ and $X^2$ represents N-R, R of the N-R is an aryl having 6 to 18 carbon atoms or an alkyl having 1 to 12 carbon atoms, at least one hydrogen atom in a compound or a structure represented by the above formula (A') is substituted by a group represented by the above formula (FG-1), a group represented by the above formula (FG-2), or an alkyl having 7 to 24 carbon atoms, and at least one hydrogen atom in the compound or structure represented by the above formula (A') may be further substituted by a halogen atom, or a deuterium atom.

3. The polycyclic aromatic compound or the multimer thereof according to claim 1, wherein the polycyclic aromatic multimer compound is a dimer compound or a trimer compound having two or three structures represented by the above formula (A').

4. The polycyclic aromatic compound or the multimer thereof according to claim 1, wherein the polycyclic aromatic multimer compound is a dimer compound having two structures represented by the above formula (A').

5. The polycyclic aromatic compound or the multimer thereof according to claim 1, wherein each $X_1$ and $X_2$ represents N-R.

6. The polycyclic aromatic compound or the multimer thereof according to claim 1, wherein $X_1$ represents 0, and $X_2$ represents N-R.

7. The polycyclic aromatic compound or the multimer thereof according to claim 1, wherein in the above formula (A'), each of $R^1$ to $R^{11}$ independently represents any one selected from the group consisting of a hydrogen atom and groups represented by the following formulas (RG-1) to (RG-10), and the groups represented by the following formulas (RG-1) to (RG-10) are each bonded to the above formula (A') at *

(RG-1)

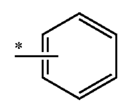

(RG-2)

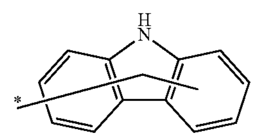

(RG-3)

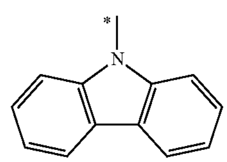

(RG-4)

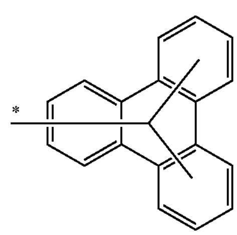

(RG-5)

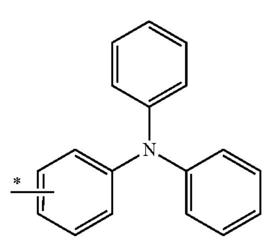

-continued
(RG-6)
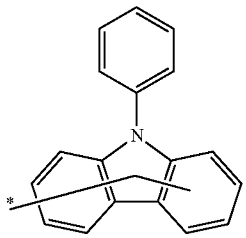
(RG-7)
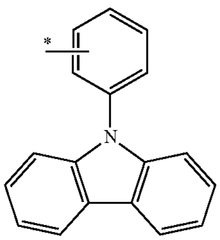
(RG-8)
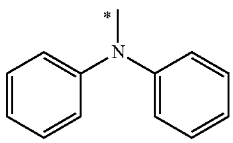
(RG-9)
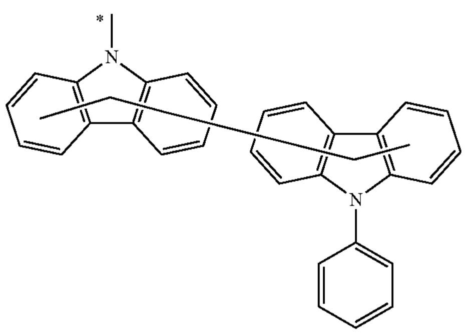
(RG-10)
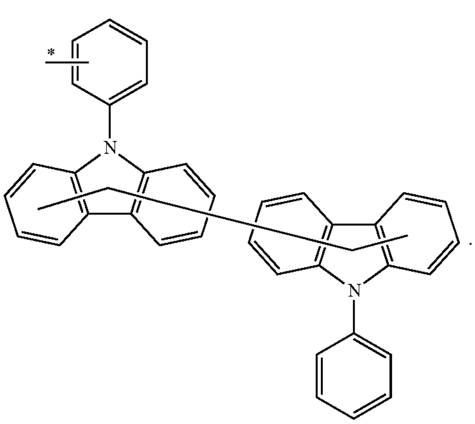
8. The polycyclic aromatic compound or the multimer thereof according to claim 1, wherein
the compound represented by the above formula (A') or the multimer thereof is a compound represented by the following formula (1-401-z), (1-411-z), (1-422-z), (1-447-z), (1-1152-z), (1-1159-z), (1-1201-z), (1-1210-z), (1-2623-z), or (1-2679-z)
(1-401-z)
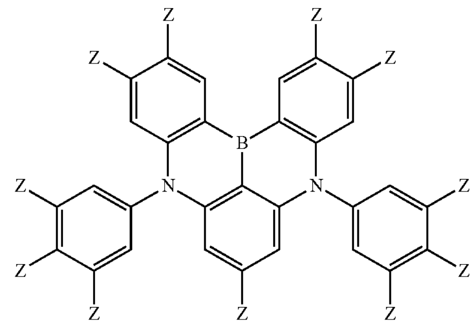
(1-411-z)
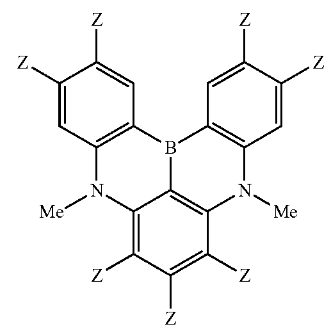
(1-422-z)
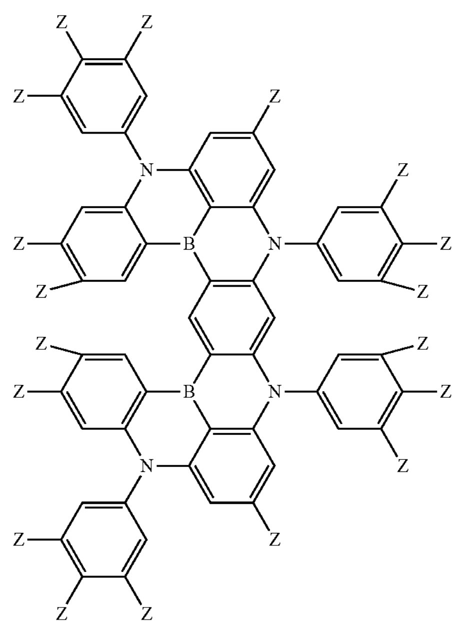

-continued
(1-447-z)
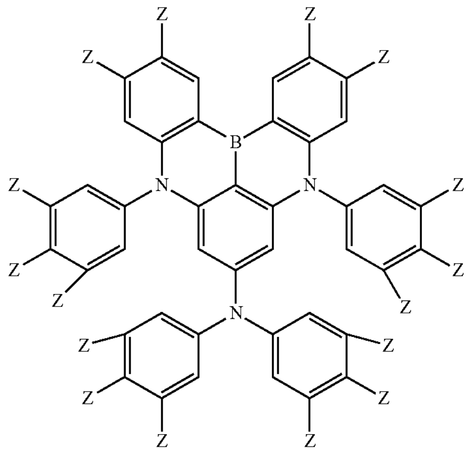
(1-1152-z)
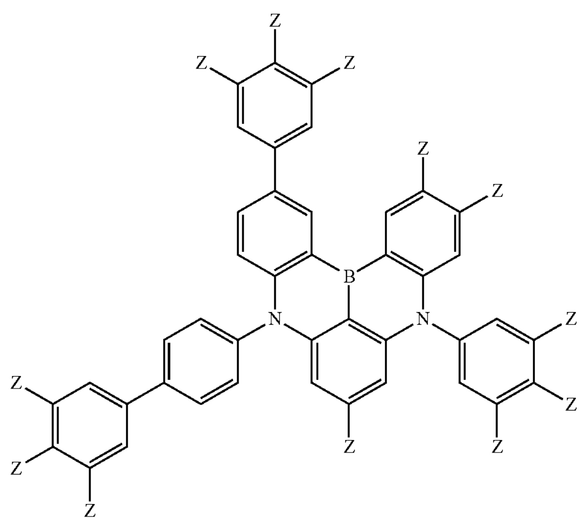
(1-1159-z)
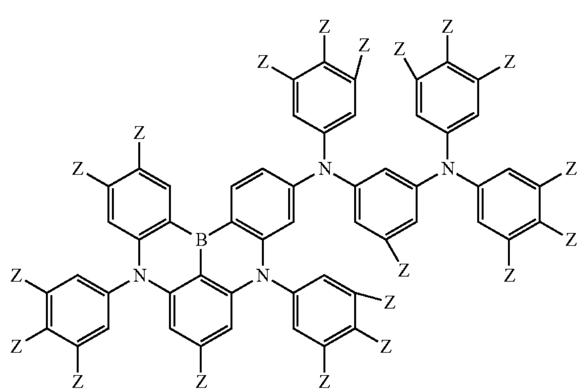
-continued
(1-1201-z)
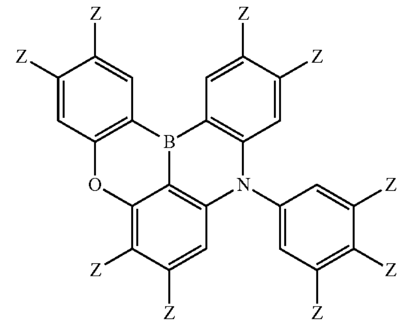
(1-1210-z)
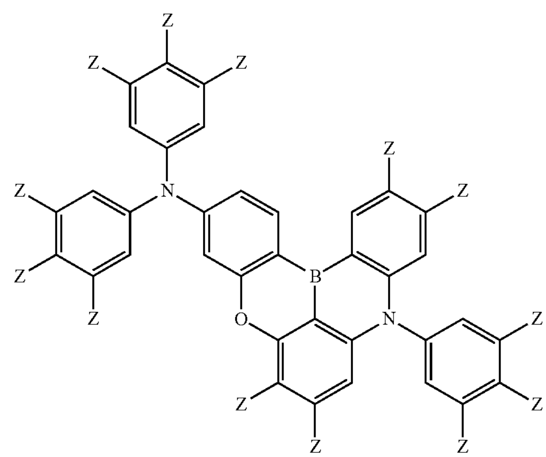
(1-2623-z)
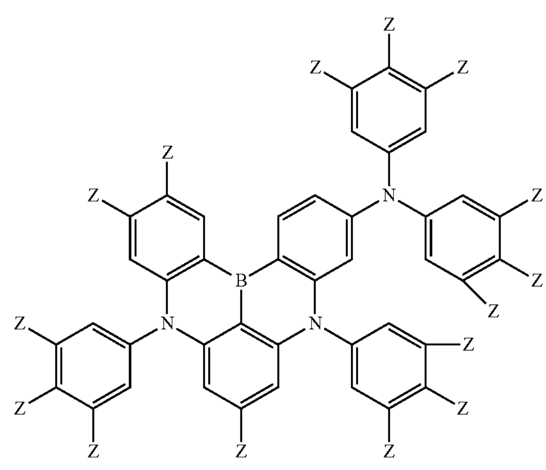

-continued (1-2679-z)

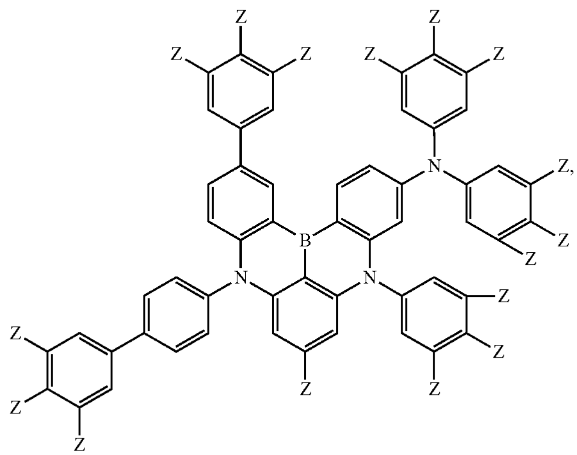

wherein each of z's in the above formulas represents a hydrogen atom, a group represented by the above formula (FG-1), a group represented by the above formula (FG-2), or an alkyl having 7 to 24 carbon atoms, and not all z's represent hydrogen atoms.

9. The polycyclic aromatic compound or the multimer thereof according to claim 8, wherein the compound represented by the above formula (A') or the multimer thereof is a compound represented by the above formula (1-422-z), (1-1152-z), or (1-2679-z).

10. The polycyclic aromatic compound or the multimer thereof according to claim 1, wherein in the above formula (FG-1), each of m and n represents 0, and p represents an integer from 1 to 3, and in the formula (FG-2), each m and n represents 0.

11. The polycyclic aromatic compound or the multimer thereof according to claim 1, wherein at least one hydrogen atom in a compound or a structure represented by the above formula IA') is substituted by a group represented by the above formula (FG-1).

* * * * *